US012176310B2

(12) United States Patent
Liu et al.

(10) Patent No.: US 12,176,310 B2
(45) Date of Patent: *Dec. 24, 2024

(54) MEMORY DEVICES HAVING VERTICAL TRANSISTORS AND METHODS FOR FORMING THE SAME

(71) Applicant: YANGTZE MEMORY TECHNOLOGIES CO., LTD., Wuhan (CN)

(72) Inventors: Wei Liu, Wuhan (CN); Hongbin Zhu, Wuhan (CN); Ziqun Hua, Wuhan (CN); Ning Jiang, Wuhan (CN); Wenyu Hua, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 398 days.

This patent is subject to a terminal disclaimer.

(21) Appl. No.: 17/553,773

(22) Filed: Dec. 16, 2021

(65) Prior Publication Data

US 2023/0062524 A1    Mar. 2, 2023

Related U.S. Application Data

(63) Continuation of application No. PCT/CN2021/115743, filed on Aug. 31, 2021.

(51) Int. Cl.
*H01L 25/065* (2023.01)
*H01L 23/00* (2006.01)
(Continued)

(52) U.S. Cl.
CPC .............. *H01L 24/08* (2013.01); *H01L 24/80* (2013.01); *H01L 25/0657* (2013.01);
(Continued)

(58) Field of Classification Search
CPC ..... H01L 24/08; H01L 24/80; H01L 25/0657; H01L 25/18; H01L 25/50;
(Continued)

(56) References Cited

U.S. PATENT DOCUMENTS 10,074,667 B1    9/2018  Kwon
10,181,472 B1    1/2019  Huang
(Continued)

FOREIGN PATENT DOCUMENTS

CN        1434515 A      8/2003
CN     108807413 A     11/2018
(Continued)

OTHER PUBLICATIONS

International Search Report issued in corresponding International Application No. PCT/CN2021/115594, mailed May 27, 2022, 4 pages.

(Continued)

*Primary Examiner* — Thanh Y. Tran
(74) *Attorney, Agent, or Firm* — BAYES PLLC

(57) ABSTRACT

In certain aspects, a three-dimensional (3D) memory device includes a first semiconductor structure, a second semiconductor structure, and a first bonding interface between the first semiconductor structure and the second semiconductor structure. The first semiconductor structure includes a peripheral circuit. The second semiconductor structure includes an array of memory cells and a plurality of bit lines coupled to the memory cells and each extending in a second direction perpendicular to the first direction. Each of the memory cells includes a vertical transistor extending in a first direction, and a storage unit coupled to the vertical transistor. A respective one of the bit lines and a respective storage unit are coupled to opposite ends of each one of the memory cells in the first direction. The array of memory (Continued)

cells is coupled to the peripheral circuit across the first bonding interface.

20 Claims, 80 Drawing Sheets

(51) Int. Cl.
    *H01L 25/00*      (2006.01)
    *H01L 25/18*      (2023.01)

(52) U.S. Cl.
    CPC .............. *H01L 25/18* (2013.01); *H01L 25/50* (2013.01); *H01L 2224/08145* (2013.01); *H01L 2224/80895* (2013.01); *H01L 2224/80896* (2013.01); *H01L 2924/1431* (2013.01); *H01L 2924/1436* (2013.01)

(58) Field of Classification Search
    CPC . H01L 2224/08145; H01L 2224/80895; H01L 2224/80896; H01L 2924/1431; H01L 2924/1436
    See application file for complete search history.

(56) References Cited

U.S. PATENT DOCUMENTS

| | | |
|---|---|---|
| 2005/0280061 A1 | 12/2005 | Lee |
| 2009/0072291 A1 | 3/2009 | Takaishi |
| 2013/0320397 A1 | 12/2013 | Sze et al. |
| 2014/0374688 A1 | 12/2014 | Wu et al. |
| 2016/0049406 A1 | 2/2016 | Sandhu |
| 2017/0213821 A1 | 7/2017 | Or-Bach |
| 2018/0061834 A1 | 3/2018 | Derner et al. |
| 2018/0061835 A1 | 3/2018 | Yang et al. |
| 2018/0204931 A1 | 7/2018 | Reboh |
| 2018/0308559 A1 | 10/2018 | Kim et al. |
| 2019/0081017 A1 | 3/2019 | Nakajima |
| 2019/0326292 A1 | 10/2019 | Mathew et al. |
| 2020/0111800 A1 | 4/2020 | Ramaswamy |
| 2020/0144330 A1 | 5/2020 | Majhi |
| 2020/0388336 A1 | 12/2020 | Yun et al. |
| 2021/0013210 A1 | 1/2021 | Lee |
| 2021/0028174 A1 | 1/2021 | Lee |
| 2021/0066278 A1 | 3/2021 | Kim et al. |
| 2021/0066281 A1 | 3/2021 | Kwon |
| 2021/0351182 A1 | 11/2021 | Yang et al. |
| 2021/0399133 A1 | 12/2021 | Li |
| 2023/0060149 A1* | 3/2023 | Zhu ........................ H01L 25/50 |
| 2023/0062083 A1* | 3/2023 | Zhu ........................ G11C 8/14 |
| 2023/0062524 A1 | 3/2023 | Liu |
| 2023/0064388 A1* | 3/2023 | Liu ........................ H10B 63/10 |
| 2023/0065806 A1* | 3/2023 | Zhu ........................ H10B 12/50 |
| 2023/0066312 A1* | 3/2023 | Zhu .................... H10B 12/0335 |
| 2023/0228739 A1 | 7/2023 | Naj et al. |

FOREIGN PATENT DOCUMENTS

| | | |
|---|---|---|
| CN | 108807660 A | 11/2018 |
| CN | 109411473 A | 3/2019 |
| CN | 109417075 A | 3/2019 |
| CN | 109461737 A | 3/2019 |
| CN | 208655644 U | 3/2019 |
| CN | 110024133 A | 7/2019 |
| CN | 110192269 A | 8/2019 |
| CN | 110265292 A | 9/2019 |
| CN | 110265397 A | 9/2019 |
| CN | 110291631 A | 9/2019 |
| CN | 110476209 A | 11/2019 |
| CN | 110537260 A | 12/2019 |
| CN | 110720145 A | 1/2020 |
| CN | 110770901 A | 2/2020 |
| CN | 110914987 A | 3/2020 |
| CN | 110945652 A | 3/2020 |
| CN | 110998844 A | 4/2020 |
| CN | 111727503 A | 9/2020 |
| CN | 112164674 A | 1/2021 |
| CN | 112470274 A | 3/2021 |
| CN | 112864158 A | 5/2021 |
| CN | 112997319 A | 6/2021 |
| CN | 113169182 A | 7/2021 |
| CN | 113506736 A | 10/2021 |
| CN | 113506737 A | 10/2021 |
| CN | 113517346 A | 10/2021 |
| CN | 113611665 A | 11/2021 |
| CN | 113611667 A | 11/2021 |
| CN | 113629013 A | 11/2021 |

OTHER PUBLICATIONS

International Search Report issued in corresponding International Application No. PCT/CN2021/115545, mailed May 31, 2022, 5 pages.
International Search Report issued in corresponding International Application No. PCT/CN2021/115704, mailed May 31, 2022, 5 pages.
International Search Report issued in corresponding International Application No. PCT/CN2021/115743, mailed May 27, 2022, 4 pages.
International Search Report issued in corresponding International Application No. PCT/CN2021/115775, mailed Jun. 6, 2022, 4 pages.
International Search Report issued in corresponding International Application No. PCT/CN2021/115820, mailed May 25, 2022, 4 pages.
International Search Report issued in corresponding International Application No. PCT/CN2021/115652, mailed Apr. 28, 2022, 4 pages.

* cited by examiner

1600

2700

MEMORY DEVICES HAVING VERTICAL TRANSISTORS AND METHODS FOR FORMING THE SAME

CROSS-REFERENCE TO RELATED APPLICATIONS

This application is a continuation of International Application No. PCT/CN2021/115743, filed on Aug. 31, 2021, entitled "MEMORY DEVICES HAVING VERTICAL TRANSISTORS AND METHODS FOR FORMING THE SAME," which is hereby incorporated by reference in its entirety. This application is also related to U.S. application Ser. No. 17/553,759, filed on Dec. 16, 2021, entitled "MEMORY DEVICES HAVING VERTICAL TRANSISTORS AND METHODS FOR FORMING THE SAME," U.S. application Ser. No. 17/553,763, filed on Dec. 16, 2021, entitled "MEMORY DEVICES HAVING VERTICAL TRANSISTORS AND METHODS FOR FORMING THE SAME," U.S. application Ser. No. 17/553,765, filed on Dec. 16, 2021 even date, entitled "MEMORY DEVICES HAVING VERTICAL TRANSISTORS AND METHODS FOR FORMING THE SAME," U.S. application Ser. No. 17/553,772, filed on Dec. 16, 2021, entitled "MEMORY DEVICES HAVING VERTICAL TRANSISTORS AND METHODS FOR FORMING THE SAME," U.S. application Ser. No. 17/553,776, filed on Dec. 16, 2021, entitled "MEMORY DEVICES HAVING VERTICAL TRANSISTORS AND METHODS FOR FORMING THE SAME," and U.S. application Ser. No. 17/553,781, filed on Dec. 16, 2021, entitled "MEMORY DEVICES HAVING VERTICAL TRANSISTORS AND METHODS FOR FORMING THE SAME," all of which are hereby incorporated by reference in their entireties.

BACKGROUND

The present disclosure relates to memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A three-dimensional (3D) memory architecture can address the density limitation in planar memory cells. The 3D memory architecture includes a memory array and peripheral circuits for facilitating operations of the memory array.

SUMMARY

In one aspect, a 3D memory device includes a first semiconductor structure, a second semiconductor structure, and a first bonding interface between the first semiconductor structure and the second semiconductor structure. The first semiconductor structure includes a peripheral circuit. The second semiconductor structure includes an array of memory cells and a plurality of bit lines coupled to the memory cells and each extending in a second direction perpendicular to the first direction. Each of the memory cells includes a vertical transistor extending in a first direction, and a storage unit coupled to the vertical transistor. A respective one of the bit lines and a respective storage unit are coupled to opposite ends of each one of the memory cells in the first direction. The array of memory cells is coupled to the peripheral circuit across the first bonding interface.

In another aspect, a memory system includes a first semiconductor structure, a second semiconductor structure, and a first bonding interface between the first semiconductor structure and the second semiconductor structure. The first semiconductor structure includes a peripheral circuit. The second semiconductor structure includes an array of memory cells and a plurality of bit lines coupled to the memory cells and each extending in a second direction perpendicular to the first direction. Each of the memory cells includes a vertical transistor extending in a first direction, and a storage unit coupled to the vertical transistor. A respective one of the bit lines and a respective storage unit are coupled to opposite ends of each one of the memory cells in the first direction. The array of memory cells is coupled to the peripheral circuit across the first bonding interface. The memory controller is configured to control the array of memory cells through the peripheral circuit and the bit lines.

In still another aspect, a method for forming a 3D memory device is disclosed. A first semiconductor structure including a peripheral circuit is formed. A second semiconductor structure is formed. To form the second semiconductor structure, an array of memory cells is formed, and a plurality of bit lines coupled to the memory cells are formed. Each of the memory cells includes a vertical transistor extending in a first direction, and a storage unit coupled to the vertical transistor. A respective one of the bit lines and a respective storage unit are coupled to opposite ends of each one of the memory cells vertically. The first semiconductor structure and the second semiconductor structure are bonded in a face-to-face manner, such that the array of memory cells is coupled to the peripheral circuit across a bonding interface.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1A:
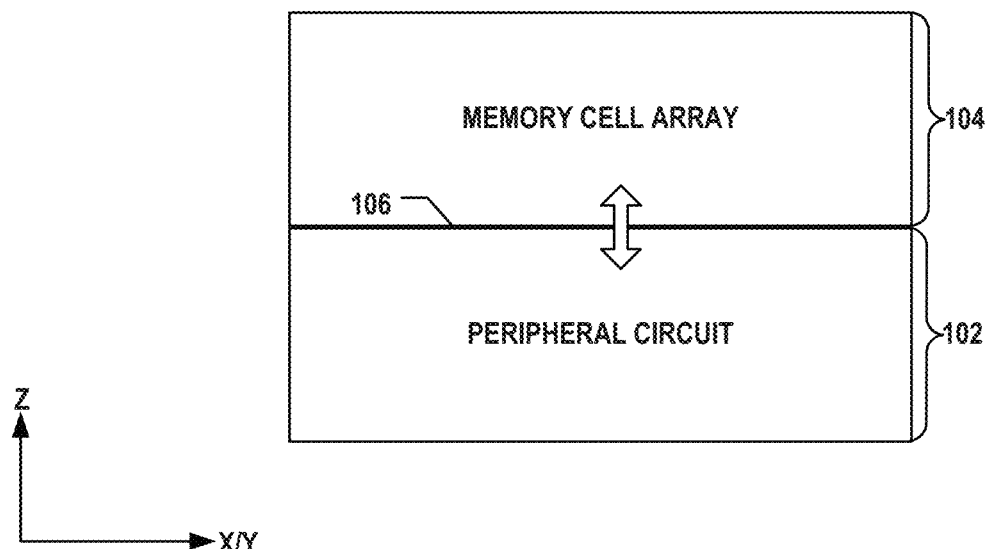
FIG. 1A illustrates a schematic view of a cross-section of a 3D memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical interconnect access (via) contacts are formed) and one or more dielectric layers.

Transistors are used as the switch or selecting devices in the memory cells of some memory devices, such as DRAM, PCM, and ferroelectric DRAM (FRAM). However, the planar transistors commonly used in existing memory cells usually have a horizontal structure with buried word lines in the substrate and bit lines above the substrate. Since the source and drain of a planar transistor are disposed laterally at different locations, which increases the area occupied by the transistor. The design of planar transistors also complicates the arrangement of interconnected structures, such as word lines and bit lines, coupled to the memory cells, for example, limiting the pitches of the word lines and/or bit lines, thereby increasing the fabrication complexity and reducing the production yield. Moreover, because the bit lines and the storage units (e.g., capacitors or PCM elements) are arranged on the same side of the planar transistors (above the transistors and substrate), the bit line process margin is limited by the storage units, and the coupling capacitance between the bit lines and storage units, such as capacitors, are increased. Planar transistors may also suffer from a high leakage current as the saturated drain current keeps increasing, which is undesirable for the performance of memory devices.

On the other hand, the memory cell array and the peripheral circuits for controlling the memory cell array are usually arranged side-by-side in the same plane. As the number of memory cells keeps increasing, to maintain the same chip size, the dimensions of the components in the memory cell array, such as transistors, word lines, and/or bit lines, need to keep decreasing in order not to significantly reduce the memory cell array efficiency.

To address one or more of the aforementioned issues, the present disclosure introduces a solution in which vertical transistors replace the planar transistors as the switch and selecting devices in a memory cell array of memory devices (e.g., DRAM, PCM, and FRAM). Compared with planar transistors, the vertically arranged transistors (e.g., the drain and source are overlapped in the plan view) can reduce the area of the transistor as well as simplify the layout of the interconnect structures, e.g., metal wiring the word lines and bit lines, which can reduce the fabrication complexity and improve the yield. For example, the pitches of word lines and/or bit lines can be reduced for ease of fabrication. The vertical structures of the transistors also allow the bit lines and storage units, such as capacitors, to be arranged on opposite sides of the transistors in the vertical direction (e.g., one above and on below the transistors), such that the process margin of the bit lines can be increased and the coupling capacitance between the bit lines and the storage units can be decreased.

Consistent with the scope of the present disclosure, according to some aspects of the present disclosure, the memory cell array having vertical transistors and the peripheral circuits of the memory cell array can be formed on different wafers and bonded together in a face-to-face manner. Thus, the thermal budget of fabricating the memory cell array does not affect the fabrication of the peripheral circuits. The stacked memory cell array and peripheral circuits can also reduce the chip size compared with the side-by-side arrangement, thereby improving the array efficiency. In some implementations, more than one memory cell array is stacked over one another using bonding techniques to further increase the array efficiency. In some implementations, the word lines and bit lines are disposed close to the bonding interface due to the vertically arranged transistors, which can be coupled to the peripheral circuits through a large number (e.g., millions) of parallel bonding contacts across the bonding interface can make direct, short-distance (e.g., micron-level) electrical connections between the memory cell array and peripheral circuits to increase the throughput and input/output (I/O) speed of the memory devices.

In some implementations, the vertical transistors disclosed herein include multi-gate transistors (e.g., gate-all-around (GAA) transistors, tri-gate transistors, or double-gate transistors), which can have a larger gate control area to achieve better channel control with a smaller subthreshold swing. Since the channel is fully depleted, the leakage current of multi-gate transistors can be significantly reduced as well. Thus, using multi-gate transistors instead of planar transistors can achieve a much better speed (saturated drain current)/leakage current performance.

In some implementations, the vertical transistors disclosed herein include single-gate transistors (a.k.a. single-side gate transistors) in a mirror-symmetric arrangement with respect to adjacent transistors in the bit line direction as a result of splitting multi-gate transistors (e.g., double-gate transistors) using trench isolations extending along the word line direction. Thus, the memory cell density in the bit line direction can be significantly increased (e.g., doubled) without unduly complicating the fabrication process compared with using processes, such as self-aligned double patterning (SADP). Also, the mirror-symmetric single-gate transistors have a larger process window for word line, bit line, and transistor pitch reduction, compared to either planar transistors or multi-gate vertical transistors, for example, with dual-side or all-around gates.

FIG. 1A illustrates a schematic view of a cross-section of a 3D memory device 100, according to some aspects of the present disclosure. 3D memory device 100 represents an example of a bonded chip. The components of 3D memory device 100 (e.g., memory cell array and peripheral circuits) can be formed separately on different substrates and then jointed to form a bonded chip. 3D memory device 100 can include a first semiconductor structure 102 including the peripheral circuits of a memory cell array. 3D memory device 100 can also include a second semiconductor structure 104 including the memory cell array. The peripheral circuits (a.k.a. control and sensing circuits) can include any suitable digital, analog, and/or mixed-signal circuits used for facilitating the operations of the memory cell array. For example, the peripheral circuit can include one or more of a page buffer, a decoder (e.g., a row decoder and a column decoder), a sense amplifier, a driver (e.g., a word line driver), an input/output (I/O) circuit, a charge pump, a voltage source or generator, a current or voltage reference, any portions (e.g., a sub-circuit) of the functional circuits mentioned above, or any active or passive components of the circuit (e.g., transistors, diodes, resistors, or capacitors). The peripheral circuits in first semiconductor structure 102 use complementary metal-oxide-semiconductor (CMOS) technology, e.g., which can be implemented with logic processes (e.g., technology nodes of 90 nm, 65 nm, 60 nm, 45 nm, 32 nm, 28 nm, 22 nm, 20 nm, 16 nm, 14 nm, 10 nm, 7 nm, 5 nm, 3 nm, 2 nm, etc.), according to some implementations.

As shown in FIG. 1A, 3D memory device 100 can also include first semiconductor structure 104 including an array of memory cells (memory cell array) that can use transistors as the switch and selecting devices. In some implementations, the memory cell array includes an array of DRAM cells. For ease of description, a DRAM cell array may be used as an example for describing the memory cell array in the present disclosure. But it is understood that the memory cell array is not limited to DRAM cell array and may include any other suitable types of memory cell arrays that can use transistors as the switch and selecting devices, such as PCM cell array, static random-access memory (SRAM) cell array, FRAM cell array, resistive memory cell array, magnetic memory cell array, spin transfer torque (STT) memory cell array, to name a few, or any combination thereof.

Second semiconductor structure 104 can be a DRAM device in which memory cells are provided in the form of an array of DRAM cells. In some embodiments, each DRAM cell includes a capacitor for storing a bit of data as a positive or negative electrical charge as well as one or more transistors (a.k.a. pass transistors) that control (e.g., switch and selecting) access to it. In some implementations, each DRAM cell is a one-transistor, one-capacitor (1T1C) cell. Since transistors always leak a small amount of charge, the capacitors will slowly discharge, causing information stored in them to drain. As such, a DRAM cell has to be refreshed to retain data, for example, by the peripheral circuit in first semiconductor structure 102, according to some implementation.

As shown in FIG. 1A, 3D memory device 100 further includes a bonding interface 106 vertically between (in the vertical direction, e.g., the z-direction in FIG. 1A) first semiconductor structure 102 and second semiconductor structure 104. As described below in detail, first and second semiconductor structures 102 and 104 can be fabricated separately (and in parallel in some implementations) such that the thermal budget of fabricating one of first and second semiconductor structures 102 and 104 does not limit the processes of fabricating another one of first and second semiconductor structures 102 and 104. Moreover, a large number of interconnects (e.g., bonding contacts) can be formed through bonding interface 106 to make direct, short-distance (e.g., micron-level) electrical connections between first semiconductor structure 102 and second semiconductor structure 104, as opposed to the long-distance (e.g., millimeter or centimeter-level) chip-to-chip data bus on the circuit board, such as printed circuit board (PCB), thereby eliminating chip interface delay and achieving high-speed I/O throughput with reduced power consumption. Data transfer between the memory cell array in second semiconductor structure 104 and the peripheral circuits in first semiconductor structure 102 can be performed through the interconnects (e.g., bonding contacts) across bonding interface 106. By vertically integrating first and second semiconductor structures 102 and 104, the chip size can be reduced, and the memory cell density can be increased.

Figure 1B:
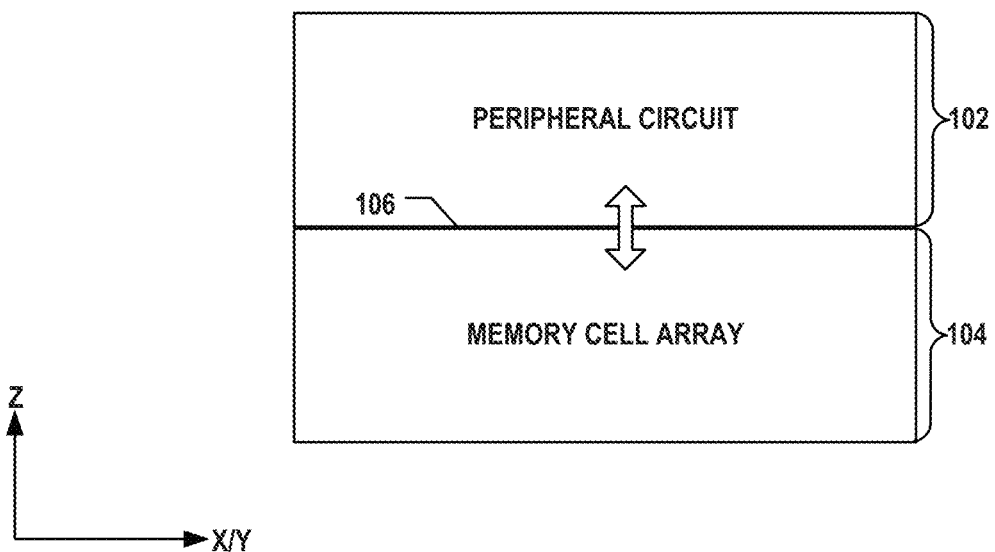
FIG. 1B illustrates a schematic view of a cross-section of another 3D memory device, according to some aspects of the present disclosure.

It is understood that the relative positions of stacked first and second semiconductor structures 102 and 104 are not limited. FIG. 1B illustrates a schematic view of a cross-section of another exemplary 3D memory device 101, according to some implementations. Different from 3D memory device 100 in FIG. 1A in which second semiconductor structure 104 including the memory cell array is above first semiconductor structure 102 including the peripheral circuits, in 3D memory device 101 in FIG. 1B, first semiconductor structure 102 including the peripheral circuit is above second semiconductor structure 104 including the memory cell array. Nevertheless, bonding interface 106 is formed vertically between first and second semiconductor structures 102 and 104 in 3D memory device 101, and first and second semiconductor structures 102 and 104 are jointed vertically through bonding (e.g., hybrid bonding) according to some implementations. Hybrid bonding, also known as "metal/dielectric hybrid bonding," is a direct bonding technology (e.g., forming bonding between surfaces without using intermediate layers, such as solder or adhesives) and can obtain metal-metal (e.g., copper-to-copper) bonding and dielectric-dielectric (e.g., silicon oxide-to-silicon oxide) bonding simultaneously. Data transfer between the memory cell array in second semiconductor structure 104 and the peripheral circuits in first semiconductor structure 102 can be performed through the interconnects (e.g., bonding contacts) across bonding interface 106.

It is noted that x, y, and z axes are included in FIGS. 1A and 1B to further illustrate the spatial relationship of the components in 3D memory devices 100 and 101. The substrate of the 3D memory device includes two lateral surfaces extending laterally in the x-y plane: a top surface on the front side of the wafer on which the semiconductor devices can be formed, and a bottom surface on the backside opposite to the front side of the wafer. The z-axis is perpendicular to both the x and y axes. As used herein, whether one component (e.g., a layer or a device) is "on," "above," or "below" another component (e.g., a layer or a device) of the 3D memory device is determined relative to the substrate of the 3D memory device in the z-direction (the vertical direction perpendicular to the x-y plane, e.g., the thickness direction of the substrate) when the substrate is positioned in the lowest plane of the 3D memory device in the z-direction. The same notion for describing the spatial relationships is applied throughout the present disclosure.

Figure 2:
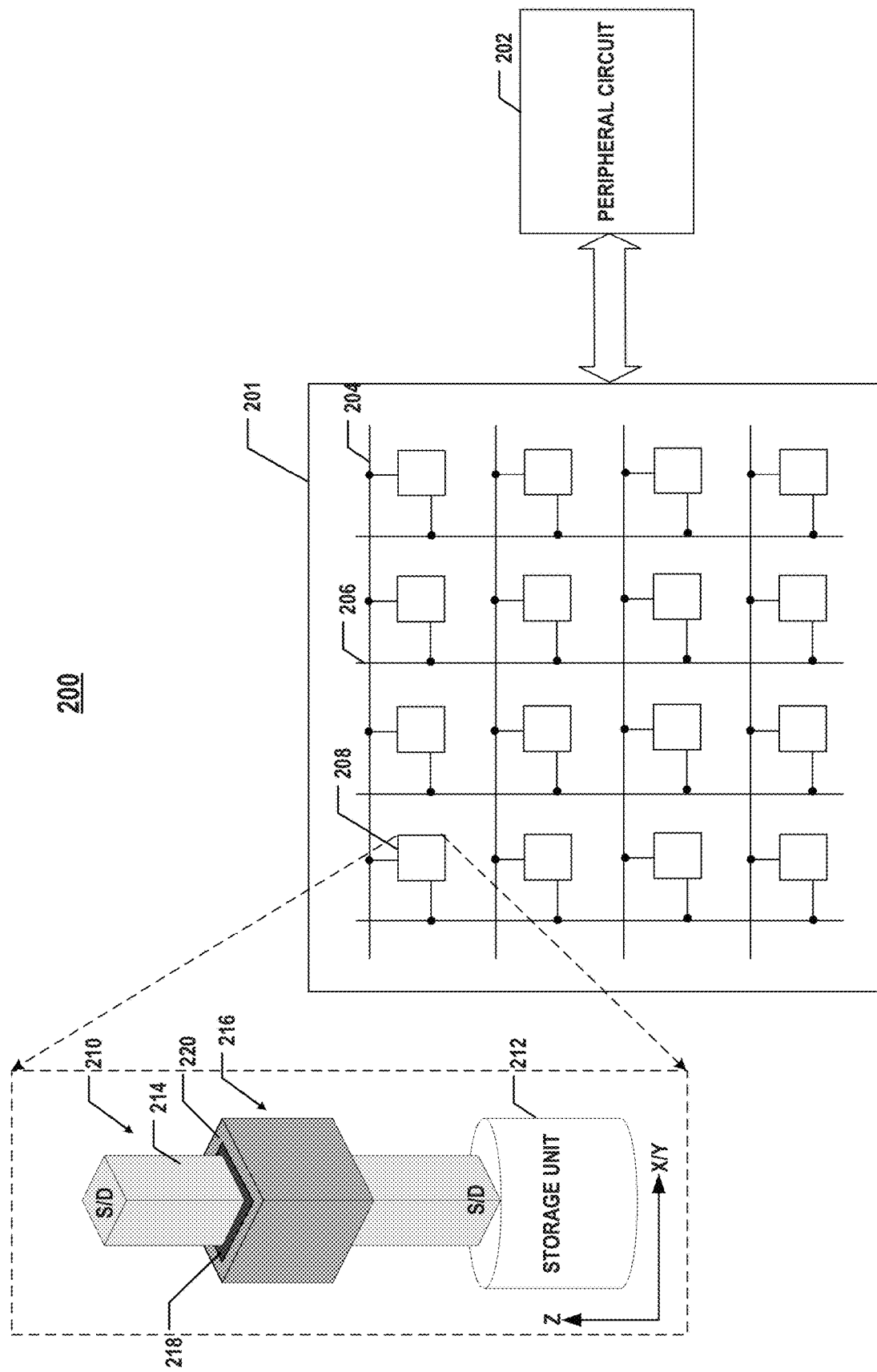
FIG. 2 illustrates a schematic diagram of a memory device including peripheral circuits and an array of memory cells each having a vertical transistor, according to some aspects of the present disclosure.

FIG. 2 illustrates a schematic diagram of a memory device 200 including peripheral circuits and an array of memory cells each having a vertical transistor, according to some aspects of the present disclosure. Memory device 200 can include a memory cell array 201 and peripheral circuits 202 coupled to memory cell array 201. 3D memory devices 100 and 101 may be examples of memory device 200 in which memory cell array 201 and peripheral circuits 202 may be included in second and first semiconductor structures 104 and 102, respectively. Memory cell array 201 can be any suitable memory cell array in which each memory cell 208 includes a vertical transistor 210 and a storage unit 212 coupled to vertical transistor 210. In some implementations, memory cell array 201 is a DRAM cell array, and storage unit 212 is a capacitor for storing charge as the binary information stored by the respective DRAM cell. In some implementations, memory cell array 201 is a PCM cell array, and storage unit 212 is a PCM element (e.g., including chalcogenide alloys) for storing binary information of the respective PCM cell based on the different resistivities of the PCM element in the amorphous phase and the crystalline phase. In some implementations, memory cell array 201 is a FRAM cell array, and storage unit 212 is a ferroelectric capacitor for storing binary information of the respective FRAM cell based on the switch between two polarization states of ferroelectric materials under an external electric field.

As shown in FIG. 2, memory cells 208 can be arranged in a two-dimensional (2D) array having rows and columns. Memory device 200 can include word lines 204 coupling peripheral circuits 202 and memory cell array 201 for controlling the switch of vertical transistors 210 in memory cells 208 located in a row, as well as bit lines 206 coupling peripheral circuits 202 and memory cell array 201 for sending data to and/or receiving data from memory cells 208 located in a column. That is, each word line 204 is coupled to a respective row of memory cells 208, and each bit line is coupled to a respective column of memory cells 208.

Consistent with the scope of the present disclosure, vertical transistors 210, such as vertical metal-oxide-semiconductor field-effect transistors (MOSFETs), can replace the planar transistors as the pass transistors of memory cells 208 to reduce the area occupied by the pass transistors, the coupling capacitance, as well as the interconnect routing complexity, as described below in detail. As shown in FIG. 2, in some implementations, different from planar transistors in which the active regions are formed in the substrates, vertical transistor 210 includes a semiconductor body 214 extending vertically (in the z-direction) above the substrate (not shown). That is, semiconductor body 214 can extend above the top surface of the substrate to allow channels to be formed not only at the top surface of semiconductor body 214, but also at one or more side surfaces thereof. As shown in FIG. 2, for example, semiconductor body 214 can have a cuboid shape to expose four sides thereof. It is understood that semiconductor body 214 may have any suitable 3D shape, such as polyhedron shapes or a cylinder shape. That is, the cross-section of semiconductor body 214 in the plan view (e.g., in the x-y plane) can have a square shape, a rectangular shape (or a trapezoidal shape), a circular (or an oval shape), or any other suitable shapes. It is understood that consistent with the scope of the present disclosure, for semiconductor bodies that have a circular or oval shape of their cross-sections in the plan view, the semiconductor bodies may still be considered as having multiple sides, such that the gate structures are in contact with more than one side of the semiconductor bodies. As described below with respect to the fabrication process, semiconductor body 214 can be formed from the substrate (e.g., by etching or epitaxy) and thus, has the same semiconductor material (e.g., silicon crystalline silicon) as the substrate (e.g., a silicon substrate).

As shown in FIG. 2, vertical transistor 210 can also include a gate structure 216 in contact with one or more sides of semiconductor body 214, e.g., in one or more planes of the side surface(s) of the active region. In other words, the active region of vertical transistor 210, e.g., semiconductor body 214, can be at least partially surrounded by gate structure 216. Gate structure 216 can include a gate dielectric 218 over one or more sides of semiconductor body 214, e.g., in contact with four side surfaces of semiconductor body 214 as shown in FIG. 2. Gate structure 216 can also include a gate electrode 220 over and in contact with gate dielectric 218. Gate dielectric 218 can include any suitable dielectric materials, such as silicon oxide, silicon nitride, silicon oxynitride, or high-k dielectrics. For example, gate dielectric 218 may include silicon oxide, which is a form of gate oxide. Gate electrode 220 can include any suitable conductive materials, such as polysilicon, metals (e.g., tungsten (W), copper (Cu), aluminum (Al), etc.), metal compounds (e.g., titanium nitride (TiN), tantalum nitride (TaN), etc.), or silicides. For example, gate electrode 220 may include doped polysilicon, which is a form of a gate poly. In some implementations, gate electrode 220 includes multiple conductive layers, such as a W layer over a TiN layer. It is understood that gate electrode 220 and word line 204 may be a continuous conductive structure in some examples. In other words, gate electrode 220 may be viewed as part of word line 204 that forms gate structure 216, or word line 204 may be viewed as the extension of gate electrode 220 to be coupled to peripheral circuits 202.

As shown in FIG. 2, vertical transistor 210 can further include a pair of a source and a drain (S/D, dope regions, a.k.a., source electrode and drain electrode) formed at the two ends of semiconductor body 214 in the vertical direction (the z-direction), respectively. The source and drain can be doped with any suitable P-type dopants, such as boron (B) or Gallium (Ga), or any suitable N-type dopants, such as phosphorus (P) or arsenic (As). The source and drain can be separated by gate structure 216 in the vertical direction (the z-direction). In other words, gate structure 216 is formed vertically between the source and drain. As a result, one or more channels (not shown) of vertical transistor 210 can be formed in semiconductor body 214 vertically between the source and drain when a gate voltage applied to gate electrode 220 of gate structure 216 is above the threshold voltage of vertical transistor 210. That is, each channel of vertical transistors 210 is also formed in the vertical direction along which semiconductor body 214 extends, according to some implementations.

In some implementations, as shown in FIG. 2, vertical transistor 210 is a multi-gate transistor. That is, gate structure 216 can be in contact with more than one side of semiconductor body 214 (e.g., four sides in FIG. 2) to form more than one gate, such that more than one channel can be formed between the source and drain in operation. That is, different from the planar transistor that includes only a single planar gate (and resulting in a single planar channel), vertical transistor 210 shown in FIG. 2 can include multiple vertical gates on multiple sides of semiconductor body 214 due to the 3D structure of semiconductor body 214 and gate structure 216 that surrounds the multiple sides of semiconductor body 214. As a result, compared with planar transistors, vertical transistor 210 shown in FIG. 2 can have a larger gate control area to achieve better channel control with a smaller subthreshold swing. Since the channel is fully depleted, the leakage current ($I_{off}$) of vertical transistor 210 can be significantly reduced a well. As described below in detail, the multi-gate vertical transistors can include double-gate vertical transistors (e.g., dual-side gate vertical transistors), tri-gate vertical transistors (e.g., tri-side gate vertical transistors), and GAA vertical transistors.

It is understood that although vertical transistor 210 is shown as a multi-gate transistor in FIG. 2, the vertical transistors disclosed herein may also include single-gate transistors as described below in detail. That is, gate structure 216 may be in contact with a single side of semiconductor body 214, for example, for the purpose of increasing the transistor and memory cell density. It is also understood that although gate dielectric 218 is shown as being separate (a separate structure) from other gate dielectrics of adjacent vertical transistors (not shown), gate dielectric 218 may be part of a continuous dielectric layer having multiple gate dielectrics of vertical transistors.

In planar transistors and some lateral multiple-gate transistors (e.g., FinFET), the active regions, such as semiconductor bodies (e.g., Fins), extend laterally (in the x-y plane), and the source and the drain are disposed at different locations in the same lateral plane (the x-y plane). In contrast, in vertical transistor 210, semiconductor body 214 extends vertically (in the z-direction), and the source and the drain are disposed in the different lateral planes, according to some implementations. In some implementations, the source and the drain are formed at two ends of semiconductor body 214 in the vertical direction (the z-direction), respectively, thereby being overlapped in the plan view. As a result, the area (in the x-y plane) occupied by vertical transistor 210 can be reduced compared with planar transistor and lateral multiple-gate transistors. Also, the metal wiring coupled to vertical transistors 210 can be simplified as well since the interconnects can be routed in different planes. For example, bit lines 206 and storage units 212 may be formed on opposite sides of vertical transistor 210. In one example, bit line 206 may be coupled to the source or the drain at the upper end of semiconductor body 214, while storage unit 212 may be coupled to the other source or the drain at the lower end of semiconductor body 214.

Figure 3:
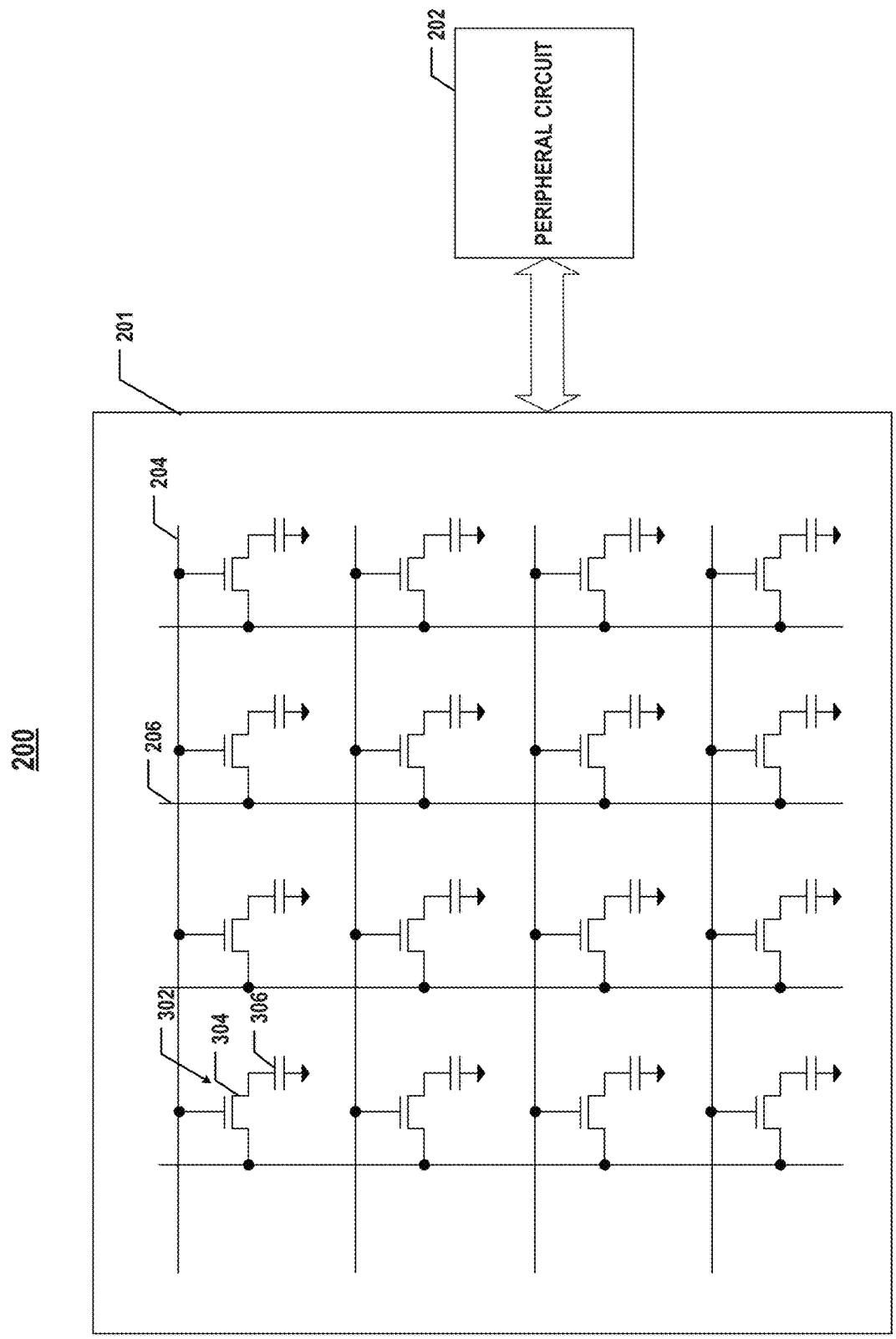
FIG. 3 illustrates a schematic circuit diagram of a memory device including peripheral circuits and an array of dynamic random-access memory (DRAM) cells, according to some aspects of the present disclosure.
Figure 4:
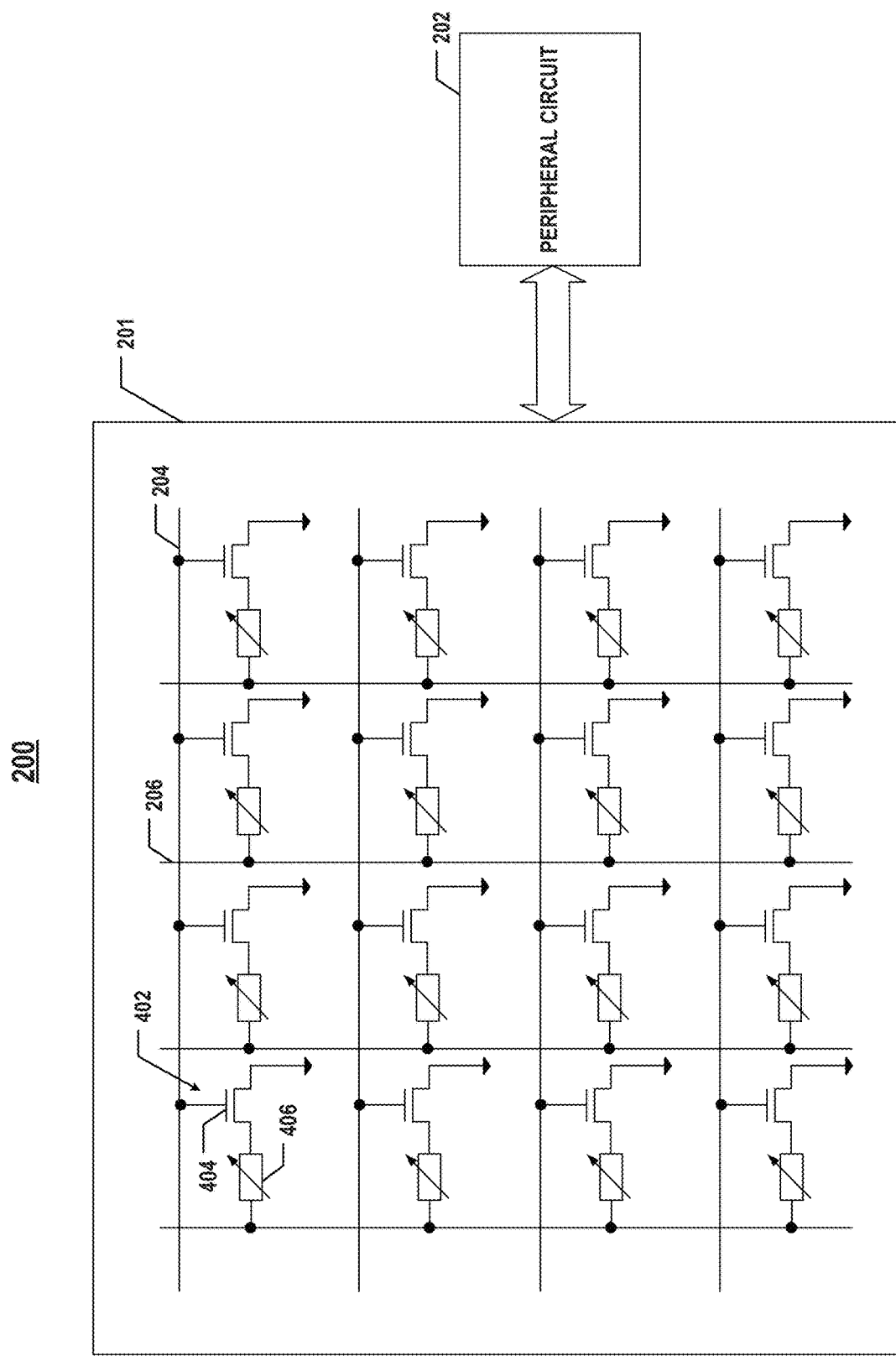
FIG. 4 illustrates a schematic circuit diagram of a memory device including peripheral circuits and an array of phase-change memory (PCM) cells, according to some aspects of the present disclosure.

As shown in FIG. 2, storage unit 212 can be coupled to the source or the drain of vertical transistor 210. Storage unit 212 can include any devices that are capable of storing binary data (e.g., 0 and 1), including but not limited to, capacitors for DRAM cells and FRAM cells, and PCM elements for PCM cells. In some implementations, vertical transistor 210 controls the selection and/or the state switch of the respective storage unit 212 coupled to vertical transistor 210. In some implementations as shown in FIG. 3, each memory cell 208 is a DRAM cell 302 including a transistor 304 (e.g., implementing using vertical transistors 210 in FIG. 2) and a capacitor 306 (e.g., an example of storage unit 212 in FIG. 2). The gate of transistor 304 (e.g., corresponding to gate electrode 220) may be coupled to word line 204, one of the source and the drain of transistor 304 may be coupled to bit line 206, the other one of the source and the drain of transistor 304 may be coupled to one electrode of capacitor 306, and the other electrode of capacitor 306 may be coupled to the ground. In some implementations as shown in FIG. 4, each memory cell 208 is a PCM cell 402 including a transistor 404 (e.g., implementing using vertical transistors 210 in FIG. 2) and a PCM element 406 (e.g., an example of storage unit 212 in FIG. 2). The gate of transistor 404 (e.g., corresponding to gate electrode 220) may be coupled to word line 204, one of the source and the drain of transistor 404 may be coupled to the ground, the other one of the source and the drain of transistor 404 may be coupled to one electrode of PCM element 406, and the other electrode of PCM element 406 may be coupled to bit line 206.

Peripheral circuits 202 can be coupled to memory cell array 201 through bit lines 206, word lines 204, and any other suitable metal wirings. As described above, peripheral circuits 202 can include any suitable circuits for facilitating the operations of memory cell array 201 by applying and sensing voltage signals and/or current signals through word lines 204 and bit lines 206 to and from each memory cell 208. Peripheral circuits 202 can include various types of peripheral circuits formed using CMOS technologies.

Figure 5:
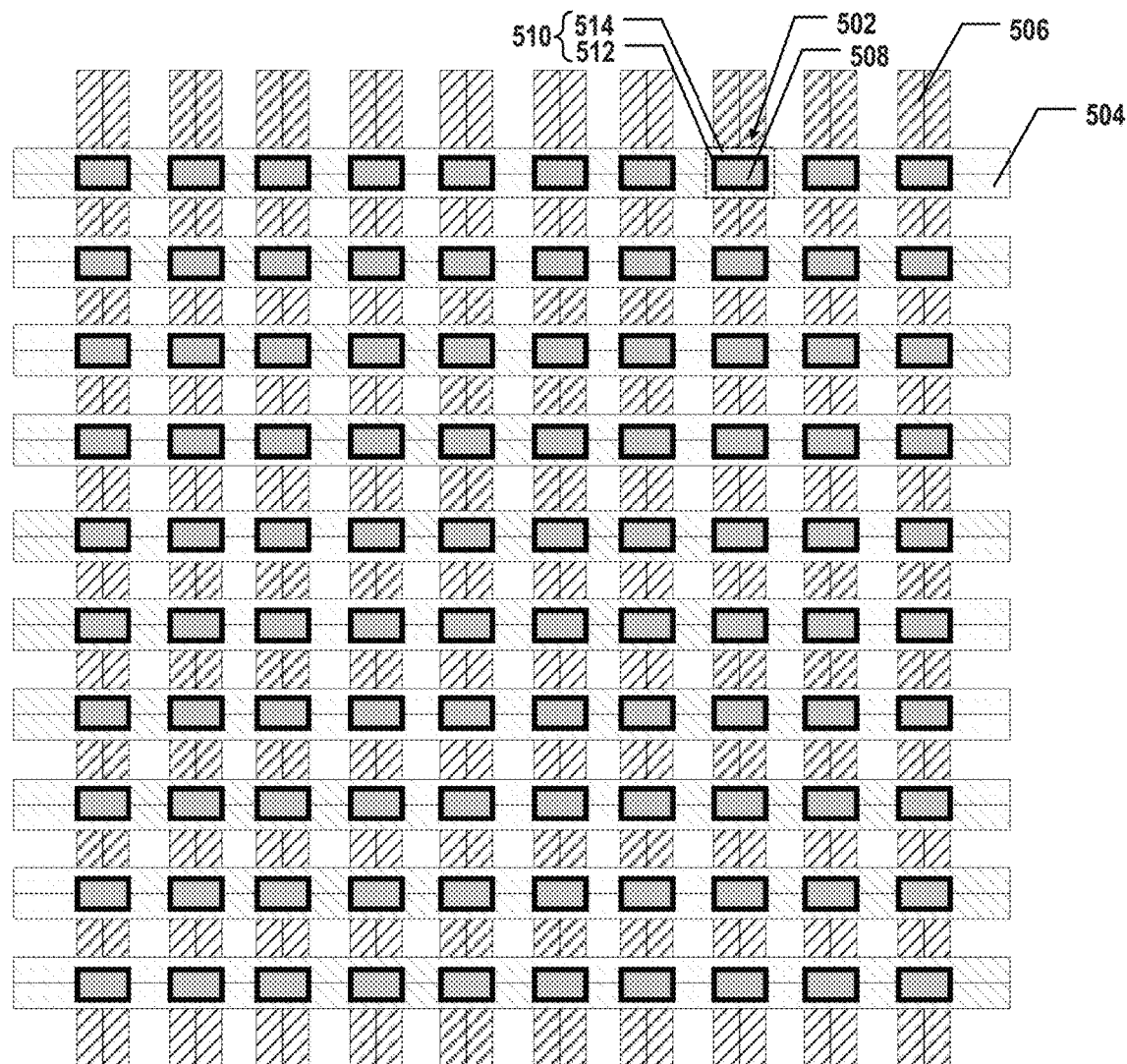
FIG. 5 illustrates a plan view of an array of memory cells each including a vertical transistor in a memory device, according to some aspects of the present disclosure.

According to some aspects of the present disclosure, the vertical transistors of memory cells in a memory device (e.g., memory device 200) are multi-gate transistors, and the gate dielectrics of vertical transistors in the word line direction are separate. For example, FIG. 5 illustrates a plan view of an array of memory cells 502 each including a vertical transistor in a memory device 500, according to some aspects of the present disclosure. As shown in FIG. 5, memory device 500 can include a plurality of word lines 504 each extending in a first lateral direction (the x-direction, referred to as the word line direction). Memory device 500 can also include a plurality of bit lines 506 each extending in a second lateral direction perpendicular to the first lateral direction (the y-direction, referred to as the bit line direction). It is understood that FIG. 5 does not illustrate a cross-section of memory device 500 in the same lateral plane, and word lines 504 and bit lines 506 may be formed in different lateral planes for ease of routing as described below in detail.

Memory cells 502 can be formed at the intersections of word lines 504 and bit lines 506. In some implementations, each memory cell 502 includes a vertical transistor (e.g., vertical transistor 210 in FIG. 2) having a semiconductor body 508 and a gate structure 510. Semiconductor body 508 can extend in the vertical direction (the z-direction, not shown) perpendicular to the first and second lateral directions. The vertical transistor can be a multi-gate transistor in which gate structure 510 is in contact with a plurality of sides (e.g., all 4 sides in FIG. 5) of semiconductor body 508 (the active region in which channels are formed). As shown in FIG. 5, the vertical transistor is a GAA transistor in which gate structure 510 fully circumscribes semiconductor body 508 in the plan view. That is, gate structure 510 circumscribes (e.g., surrounding and contacting) all four sides of semiconductor body 508 (having a rectangle or square-shaped cross-section) in the plan view, according to some implementations. Gate structure 510 can include a gate dielectric 512 fully circumscribes semiconductor body 508 in the plan view, and a gate electrode 514 fully circumscribes gate dielectric 512. In some implementation, gate dielectric 512 is laterally between gate electrode 514 and semiconductor body 508 in the bit line direction and in the word line direction. As described above, gate electrode 514 may be part of word line 504, and word line 504 may be an extension of gate electrode 514. In some implementations, gate structures 510 of a row of the vertical transistors are continuous in the x-direction, as a shown in FIG. 5.

As shown in FIG. 5, gate electrodes 514 of adjacent vertical transistors in the word line direction (the x-direction) are continuous, e.g., parts of a continuous conductive layer having gate electrodes 514 and 504. In contrast, gate dielectrics 512 of adjacent vertical transistors in the word line direction are separate, e.g., not parts of a continuous dielectric layer having gate dielectrics 512.

Figure 6A:
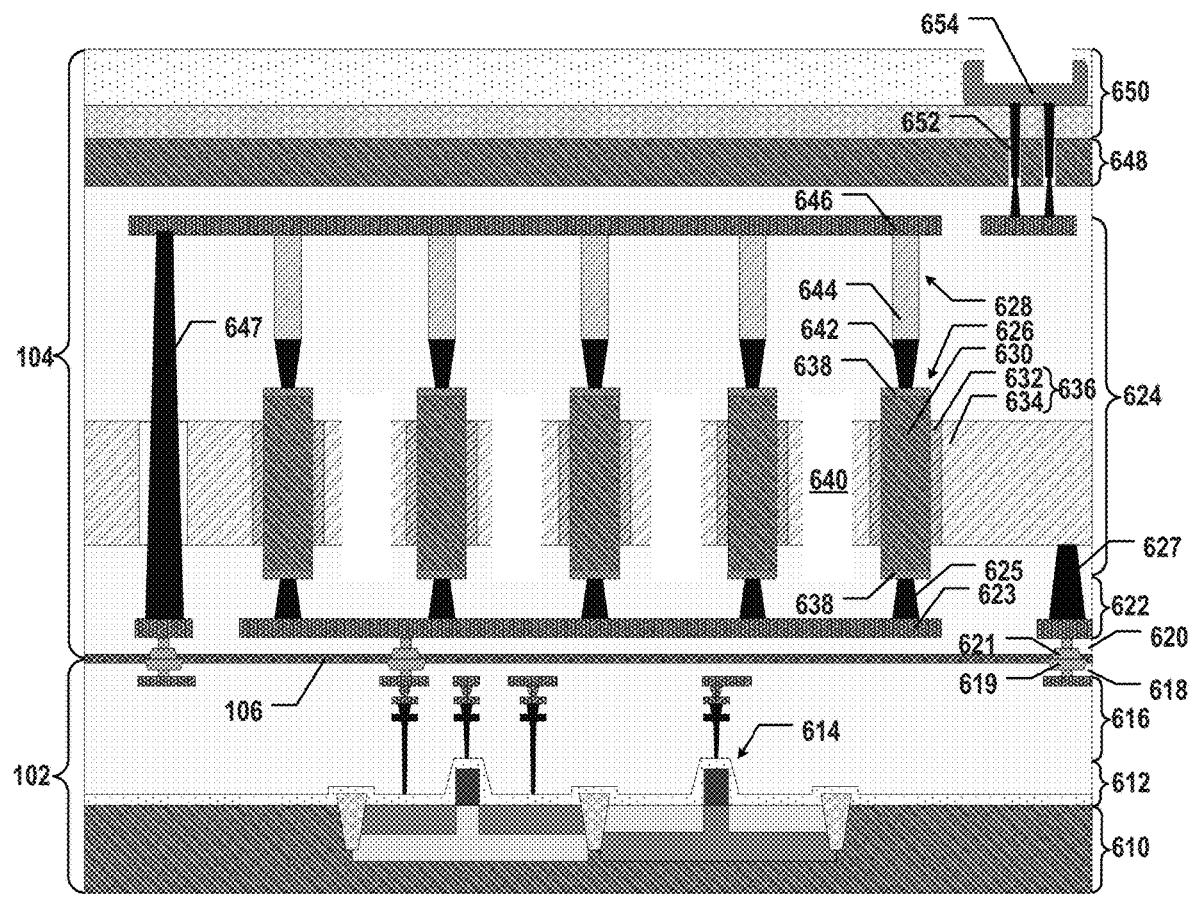
FIG. 6A illustrates a side view of a cross-section of a 3D memory device including vertical transistors, according to some aspects of the present disclosure.

FIG. 6A illustrates a side view of a cross-section of a 3D memory device 600 including vertical transistors, according to some aspects of the present disclosure. 3D memory device 600 may be one example of memory device 500 including multi-gate vertical transistors in which gate structures fully circumscribes semiconductor bodies in the plan view, e.g., GAA vertical transistors. It is understood that FIG. 6A is for illustrative purposes only and may not necessarily reflect the actual device structure (e.g., interconnections) in practice. As one example of 3D memory device 100 described above with respect to FIG. 1A, 3D memory device 600 is a bonded chip including first semiconductor structure 102 and second semiconductor structure 104 stacked over first semiconductor structure 102. First and second semiconductor structures 102 and 104 are jointed at bonding interface 106 therebetween, according to some implementations. As shown in FIG. 6A, first semiconductor structure 102 can include a substrate 610, which can include silicon (e.g., single crystalline silicon, c-Si), silicon germanium (SiGe), gallium arsenide (GaAs), germanium (Ge), silicon-on-insulator (SOI), or any other suitable materials.

First semiconductor structure 102 can include peripheral circuits 612 on substrate 610. In some implementations, peripheral circuits 612 includes a plurality of transistors 614 (e.g., planar transistors and/or 3D transistors). Trench isolations (e.g., shallow trench isolations (STIs)) and doped regions (e.g., wells, sources, and drains of transistors 614) can be formed on or in substrate 610 as well.

In some implementations, first semiconductor structure 102 further includes an interconnect layer 616 above peripheral circuits 612 to transfer electrical signals to and from peripheral circuits 612. Interconnect layer 616 can include a plurality of interconnects (also referred to herein as "contacts"), including lateral interconnect lines and vertical interconnect access (VIA) contacts. As used herein, the term "interconnects" can broadly include any suitable types of interconnects, such as middle-end-of-line (MEOL) interconnects and back-end-of-line (BEOL) interconnects. Interconnect layer 616 can further include one or more interlayer dielectric (ILD) layers (also known as "intermetal dielectric (IMD) layers") in which the interconnect lines and via contacts can form. That is, interconnect layer 616 can include interconnect lines and via contacts in multiple ILD layers. In some implementations, peripheral circuits 612 are coupled to one another through the interconnects in interconnect layer 616. The interconnects in interconnect layer 616 can include conductive materials including, but not limited to, W, Co, Cu, Al, doped silicon, silicides, or any combination thereof. The ILD layers can be formed with dielectric materials including, but not limited to, silicon oxide, silicon nitride, silicon oxynitride, low-k dielectrics, or any combination thereof.

As shown in FIG. 6A, first semiconductor structure 102 can further include a bonding layer 618 at bonding interface 106 and above interconnect layer 616 and peripheral circuits 612. Bonding layer 618 can include a plurality of bonding contacts 619 and dielectrics electrically isolating bonding contacts 619. Bonding contacts 619 can include conductive materials, such as Cu. The remaining area of bonding layer 618 can be formed with dielectric materials, such as silicon oxide. Bonding contacts 619 and surrounding dielectrics in bonding layer 618 can be used for hybrid bonding. Similarly, as shown in FIG. 6A, second semiconductor structure 104 can also include a bonding layer 620 at bonding interface 106 and above bonding layer 618 of first semiconductor structure 102. Bonding layer 620 can include a plurality of bonding contacts 621 and dielectrics electrically isolating bonding contacts 621. Bonding contacts 621 can include conductive materials, such as Cu. The remaining area of bonding layer 620 can be formed with dielectric materials, such as silicon oxide. Bonding contacts 621 and surrounding dielectrics in bonding layer 620 can be used for hybrid bonding. Bonding contacts 621 are in contact with bonding contacts 619 at bonding interface 106, according to some implementations. In some implementations, bonding layer 620 includes a dielectric layer opposing DRAM cells 624 with bit line 623 positioned between the dielectric layer and DRAM cells 624, as shown in FIG. 6A. The dielectric layer can include bonding interface 106 having bonding contacts 621.

Second semiconductor structure 104 can be bonded on top of first semiconductor structure 102 in a face-to-face manner at bonding interface 106. In some implementations, bonding interface 106 is disposed between bonding layers 620 and 618 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some implementations, bonding interface 106 is the place at which bonding layers 620 and 618 are met and bonded. In practice, bonding interface 106 can be a layer with a certain thickness that includes the top surface of bonding layer 618 of first semiconductor structure 102 and the bottom surface of bonding layer 620 of second semiconductor structure 104.

In some implementations, second semiconductor structure 104 further includes an interconnect layer 622 including bit lines 623 above bonding layer 620 to transfer electrical signals. Interconnect layer 622 can include a plurality of interconnects, such as MEOL interconnects and BEOL interconnects. In some implementations, the interconnects in interconnect layer 622 also include local interconnects, such as bit lines 623 (e.g., an example of bit lines 506 in FIG. 5), bit line contacts 625 (which may be omitted in some examples), and word line contacts 627. Interconnect layer 622 can further include one or more ILD layers in which the interconnect lines and via contacts can form. The interconnects in interconnect layer 622 can include conductive materials including, but not limited to, W, Co, Cu, Al, doped silicon, silicides, or any combination thereof. The ILD layers can be formed with dielectric materials including, but not limited to, silicon oxide, silicon nitride, silicon oxynitride, low-k dielectrics, or any combination thereof. In some implementations, peripheral circuits 612 includes a word line driver/row decoder coupled to word line contacts 627 in interconnect layer 622 through bonding contacts 621 and 619 in bonding layers 620 and 618 and interconnect layer 616. In some implementations, peripheral circuits 612 includes a bit line driver/column decoder coupled to bit lines 623 and bit line contacts 625 in interconnect layer 622 through bonding contacts 621 and 619 in bonding layers 620 and 618 and interconnect layer 616. In some implementations, bit line 623 is a metal bit line, as opposed to semiconductor bit lines (e.g., doped silicon bit lines). For example, bit line 623 may include W, Co, Cu, Al, or any other suitable metals having higher conductivities than doped silicon. In some implementations, bit line contact 625 is an ohmic contact, such as a metal silicide contact, as opposed to a Schottky contact. For example, bit line contact 625 may include metal silicides, such as WSi, CoSi, CuSi, AlSi, or any other suitable metal silicides having higher conductivities than doped silicon.

In some implementations, second semiconductor structure 104 includes a DRAM device in which memory cells are provided in the form of an array of DRAM cells 624 (e.g., an example of memory cells 502 in FIG. 5) above interconnect layer 622 and bonding layer 620. That is, interconnect layer 622 including bit lines 623 can be disposed between bonding layer 620 and array of DRAM cells 624. It is understood that the cross-section of 3D memory device 600 in FIG. 6A may be made along the bit line direction (the y-direction), and one bit line 623 in interconnect layer 622 extending laterally in the y-direction may be coupled to a column of DRAM cells 624.

Each DRAM cell 624 can include a vertical transistor 626 (e.g., an example of vertical transistors 210 in FIG. 2) and capacitor 628 (e.g., an example of storage unit 212 in FIG. 2) coupled to the vertical transistor 626. DRAM cell 624 can be a 1T1C cell consisting of one transistor and one capacitor.

It is understood that DRAM cell 624 may be of any suitable configurations, such as 2T1C cell, 3T1C cell, etc.

Vertical transistor 626 can be a MOSFET used to switch a respective DRAM cell 624. In some implementations, vertical transistor 626 includes a semiconductor body 630 (the active region in which multiple channels can form) extending vertically (in the z-direction), and a gate structure 636 in contact with a plurality of sides of semiconductor body 630. As described above, as in a GAA vertical transistor, semiconductor body 630 can have a cuboid shape or a cylinder shape, and gate structure 636 can fully circumscribe semiconductor body 630 in the plan view, for example, as shown in FIG. 5. Gate structure 636 includes a gate electrode 634 and a gate dielectric 632 laterally between gate electrode 634 and semiconductor body 630, according to some implementations. For example, for semiconductor body 630 having a cylinder shape, semiconductor body 630, gate dielectric 632, and gate electrode 634 may be disposed radially from the center of vertical transistor 626 in this order. In some implementations, gate dielectric 632 surrounds and contacts semiconductor body 630, and gate electrode 634 surrounds and contacts gate dielectric 632.

As shown in FIG. 6A, in some implementations, semiconductor body 630 has two ends (the upper end and lower end) in the vertical direction (the z-direction), and both ends extend beyond gate structure 636, respectively, in the vertical direction (the z-direction) into ILD layers. That is, semiconductor body 630 can have a larger vertical dimension (e.g., the depth) than that of gate structure 636 (e.g., in the z-direction), and neither the upper end nor the lower end of semiconductor body 630 is flush with the respective end of gate structure 636. Thus, short circuits between bit lines 623 and word lines/gate electrodes 634 or between word lines/gate electrodes 634 and capacitors 628 can be avoided. In some implementations, the two ILD layers into which semiconductor body 630 extends (e.g., the ILD layer vertically between bit line contacts 625 and word lines 634, and the ILD layer vertically between word lines 634 and capacitors 628) include the same dielectric material, such as silicon oxide. Vertical transistor 626 can further include a source and a drain (both referred to as 638 as their locations may be interchangeable) disposed at the two ends (the upper end and lower end) of semiconductor body 630, respectively, in the vertical direction (the z-direction). In some implementations, one of source and drain 638 (e.g., at the upper end in FIG. 6A) is coupled to capacitor 628, and the other one of source and drain 638 (e.g., at the lower end in FIG. 6A) is coupled to bit line 623 (e.g., through bit line contact 625 or directly). That is, vertical transistor 626 can have a first terminal in the positive z-direction and a second terminal opposite the first terminal in the negative z-direction, as shown in FIG. 6A. In some implementations, a metal bit line (e.g., bit line 623 made of a metal material) is coupled to the second terminal of vertical transistor 626 via an ohmic contact (e.g., bit line contact 625 made of a metal silicide material).

In some implementations, semiconductor body 630 includes semiconductor materials, such as single crystalline silicon, polysilicon, amorphous silicon, Ge, any other semiconductor materials, or any combinations thereof. In one example, semiconductor body 630 may include single crystalline silicon. Source and drain 638 can be doped with N-type dopants (e.g., P or As) or P-type dopants (e.g., B or Ga) at a desired doping level. In some implementations, a silicide layer, such as a metal silicide layer, is formed between source/drain 638 of vertical transistor 626 and bit line 623 as bit line contact 625 or between source/drain 638 of vertical transistor 626 and the first electrode of capacitor 628 as capacitor contact 642 to reduce the contact resistance. In some implementations, gate dielectric 632 includes dielectric materials, such as silicon oxide, silicon nitride, or high-k dielectrics including, but not limited to, aluminum oxide ($Al_2O_3$), hafnium oxide ($HfO_2$), tantalum oxide ($Ta_2O_5$), zirconium oxide ($ZrO_2$), titanium oxide ($TiO_2$), or any combination thereof. In some implementations, gate electrode 634 includes conductive materials including, but not limited to W, Co, Cu, Al, TiN, TaN, polysilicon, silicides, or any combination thereof. In some implementations, gate electrode 634 includes multiple conductive layers, such as a W layer over a TiN layer. In one example, gate structure 636 may be a "gate oxide/gate poly" gate in which gate dielectric 632 includes silicon oxide and gate electrode 634 includes doped polysilicon. In another example, gate structure 636 may be a high-k metal gate (HKMG) in which gate dielectric 632 includes a high-k dielectric and gate electrode 634 includes a metal.

As described above, since gate electrode 634 may be part of a word line or extend in the word line direction (e.g., the x-direction in FIG. 5) as a word line, although not directly shown in FIG. 6A, second semiconductor structure 104 of 3D memory device 600 can also include a plurality of word lines (e.g., an example of word lines 504 in FIG. 5, referred to as 634 as well) each extending in the word line direction (the x-direction). Each word line 634 can be coupled to a row of DRAM cells 624. That is, bit line 623 and word line 634 can extend in two perpendicular lateral directions, and semiconductor body 630 of vertical transistor 626 can extend in the vertical direction perpendicular to the two lateral directions in which bit line 623 and word line 634 extend. Word lines 634 are in contact with word line contacts 627, according to some implementations. In some implementations, word lines 634 include conductive materials including, but not limited to, W, Co, Cu, Al, TiN, TaN, polysilicon, silicides, or any combination thereof. In some implementations, word line 634 includes multiple conductive layers, such as a W layer over a TiN layer.

As shown in FIG. 6A, vertical transistor 626 extends vertically through and contacts word lines 634, and source or drain 638 of vertical transistor 626 at the lower end thereof is in contact with bit line contact 625 or in contact with bit line 623 directly, according to some implementations. Accordingly, word lines 634 and bit lines 623 can be disposed in different planes in the vertical direction due to the vertical arrangement of vertical transistor 626, which simplifies the routing of word lines 634 and bit lines 623. In some implementations, bit lines 623 are disposed vertically between bonding layer 620 and word lines 634, and word lines 634 are disposed vertically between bit lines 623 and capacitors 628. Word lines 634 can be coupled to peripheral circuits 612 in first semiconductor structure 102 through word line contacts 627 in interconnect layer 622, bonding contacts 621 and 619 in bonding layers 620 and 618, and the interconnects in interconnect layer 616. Similarly, bit lines 623 in interconnect layer 622 can be coupled to peripheral circuits 612 in first semiconductor structure 102 through bonding contacts 621 and 619 in bonding layers 620 and 618 and the interconnects in interconnect layer 616.

In some implementations, second semiconductor structure 104 further includes a plurality of air gaps 640 each disposed laterally between adjacent word lines 634. Each air gap 640 can be a trench extending in the word line direction (e.g., the x-direction) in parallel with word lines 634 to separate adjacent rows of vertical transistors 626. As described below with respect to the fabrication process, air gaps 640 may be formed due to the relatively small pitches of word lines 634 (and rows of DRAM cells 624) in the bit line direction (e.g., the y-direction). On the other hand, the relatively large dielectric constant of air in air gaps 640 (e.g., about 4 times of the dielectric constant of silicon oxide) can improve the insulation effect between word lines 634 (and rows of DRAM cells 624) compared with some dielectrics (e.g., silicon oxide).

As shown in FIG. 6A, in some implementations, capacitor 628 includes a first electrode above and coupled to source or drain 638 of vertical transistor 626, e.g., the upper end of semiconductor body 630, via a capacitor contact 642. In some implementations, capacitor contact 642 is an ohmic contact, such as a metal silicide contact, as opposed to a Schottky contact. For example, capacitor contact 642 may include metal silicides, such as WSi, CoSi, CuSi, AlSi, or any other suitable metal silicides having higher conductivities than doped silicon. Capacitor 628 can also include a capacitor dielectric above and in contact with the first electrode, and a second electrode above and in contact with the capacitor dielectric. That is, capacitor 628 can be a vertical capacitor in which the electrodes and capacitor dielectric are stacked vertically (in the z-direction), and the capacitor dielectric can be sandwiched between the electrodes. In some implementations, each first electrode is coupled to source or drain 638 of a respective vertical transistor 626 in the same DRAM cell, while all second electrodes are coupled to a common plate 646 coupled to the ground, e.g., a common ground. Capacitor 628 can have a first end in the negative z-direction and a second end opposite the first end in the positive z-direction, as shown in FIG. 6A. In some implementations, the first end of capacitor 628 is coupled to the first terminal of vertical transistor 626 via an ohmic contact (e.g., capacitor contact 642 made of a metal silicide material). It is understood that in some examples, the capacitor contacts described herein (e.g., 642, 1024, 1124, 1224, 1324, 1742, 2142, and 2228) may not be included in the memory devices. As shown in FIG. 6A, second semiconductor structure 104 can further include a capacitor contact 647 (e.g., a conductor) in contact with common plate 646 for coupling capacitors 628 to peripheral circuits 612 or to the ground directly. In some implementations, capacitor contact 647 (e.g., a conductor) extends in the z-direction from the dielectric layer of bonding layer 620 to couple to the second end of capacitor 628 via common plate 646, as shown in FIG. 6A. In some implementation, the ILD layer in which capacitors 628 are formed has the same dielectric material as the two ILD layers into which semiconductor body 630 extends, such as silicon oxide.

It is understood that the structure and configuration of capacitor 628 are not limited to the example in FIG. 6A and may include any suitable structure and configuration, such as a planar capacitor, a stack capacitor, a multi-fins capacitor, a cylinder capacitor, a trench capacitor, or a substrate-plate capacitor. In some implementations, the capacitor dielectric includes dielectric materials, such as silicon oxide, silicon nitride, or high-k dielectrics including, but not limited to, $Al_2O_3$, $HfO_2$, $Ta_2O_5$, $ZrO_2$, $TiO_2$, or any combination thereof. It is understood that in some examples, capacitor 628 may be a ferroelectric capacitor used in a FRAM cell, and the capacitor dielectric may be replaced by a ferroelectric layer having ferroelectric materials, such as lead zirconate titanate (PZT) or strontium bismuth tantalate (SBT). In some implementations, the electrodes include conductive materials including, but not limited to W, Co, Cu, Al, TiN, TaN, polysilicon, silicides, or any combination thereof.

As shown in FIG. 6A, vertical transistor 626 extends vertically through and contacts word lines 634, source or drain 638 of vertical transistor 626 at the lower end thereof is in contact with bit line contact 625, and source or drain 638 of vertical transistor 626 at the upper end thereof is in contact with capacitor contact 642, according to some implementations. That is, bit line 623 and capacitor 628 can be disposed in different planes in the vertical direction and coupled to opposite ends of vertical transistor 626 of DRAM cell 624 in the vertical direction due to the vertical arrangement of vertical transistor 626. In some implementations, bit line 623 and capacitor 628 are disposed on opposite sides of vertical transistor 626 in the vertical direction, which simplifies the routing of bit lines 623 and reduces the coupling capacitance between bit lines 623 and capacitors 628 compared with DRAM cells in which the bit lines and capacitors are disposed on the same side of the planar transistors.

As shown in FIG. 6A, in some implementations, vertical transistors 626 are disposed vertically between capacitors 628 and bonding interface 106. That is, vertical transistors 626 can be arranged closer to peripheral circuits 614 of first semiconductor structure 102 and bonding interface 106 than capacitors 628. Since bit lines 623 and capacitors 628 are coupled to opposite ends of vertical transistors 626, as described above, bit lines 623 (as part of interconnect layer 622) are disposed vertically between vertical transistors 626 and bonding interface 106, according to some implementations. As a result, interconnect layer 622 including bit lines 623 can be arranged close to bonding interface 106 to reduce the interconnect routing distance and complexity.

In some implementations, second semiconductor structure 104 further includes a substrate 648 disposed above DRAM cells 624. As described below with respect to the fabrication process, substrate 648 can be part of a carrier wafer. It is understood that in some examples, substrate 648 may not be included in second semiconductor structure 104.

As shown in FIG. 6A, second semiconductor structure 104 can further include a pad-out interconnect layer 650 above substrate 648 and DRAM cells 624. Pad-out interconnect layer 650 can include interconnects, e.g., contact pads 654, in one or more ILD layers. Pad-out interconnect layer 650 and interconnect layer 622 can be formed on opposite sides of DRAM cells 624. Capacitors 628 are disposed vertically between vertical transistors 626 and pad-out interconnect layer 650, according to some implementations. In some implementations, the interconnects in pad-out interconnect layer 650 can transfer electrical signals between 3D memory device 600 and outside circuits, e.g., for pad-out purposes. In some implementations, second semiconductor structure 104 further includes one or more contacts 652 extending through substrate 648 and part of pad-out interconnect layer 650 to couple pad-out interconnect layer 650 to DRAM cells 624 and interconnect layer 622. As a result, peripheral circuits 612 can be coupled to DRAM cells 624 through interconnect layers 616 and 622 as well as bonding layers 620 and 618, and peripheral circuits 612 and DRAM cells 624 can be coupled to outside circuits through contacts 652 and pad-out interconnect layer 650. Contact pads 654 and contacts 652 can include conductive materials including, but not limited to, W, Co, Cu, Al, silicides, or any combination thereof. In one example, contact pad 654 may include Al, and contact 652 may include W. In some implementations, contact 652 includes a via surrounded by a dielectric spacer (e.g., having silicon oxide) to electrically separate the via from substrate 648. Depending on the thickness of substrate 648, contact 652 can be an interlayer via (ILV) having a depth in the submicron-level (e.g., between 10 nm and 1 µm), or a through substrate via (TSV) having a depth in the micron- or tens micron-level (e.g., between 1 µm and 100 µm).

Figure 6B:
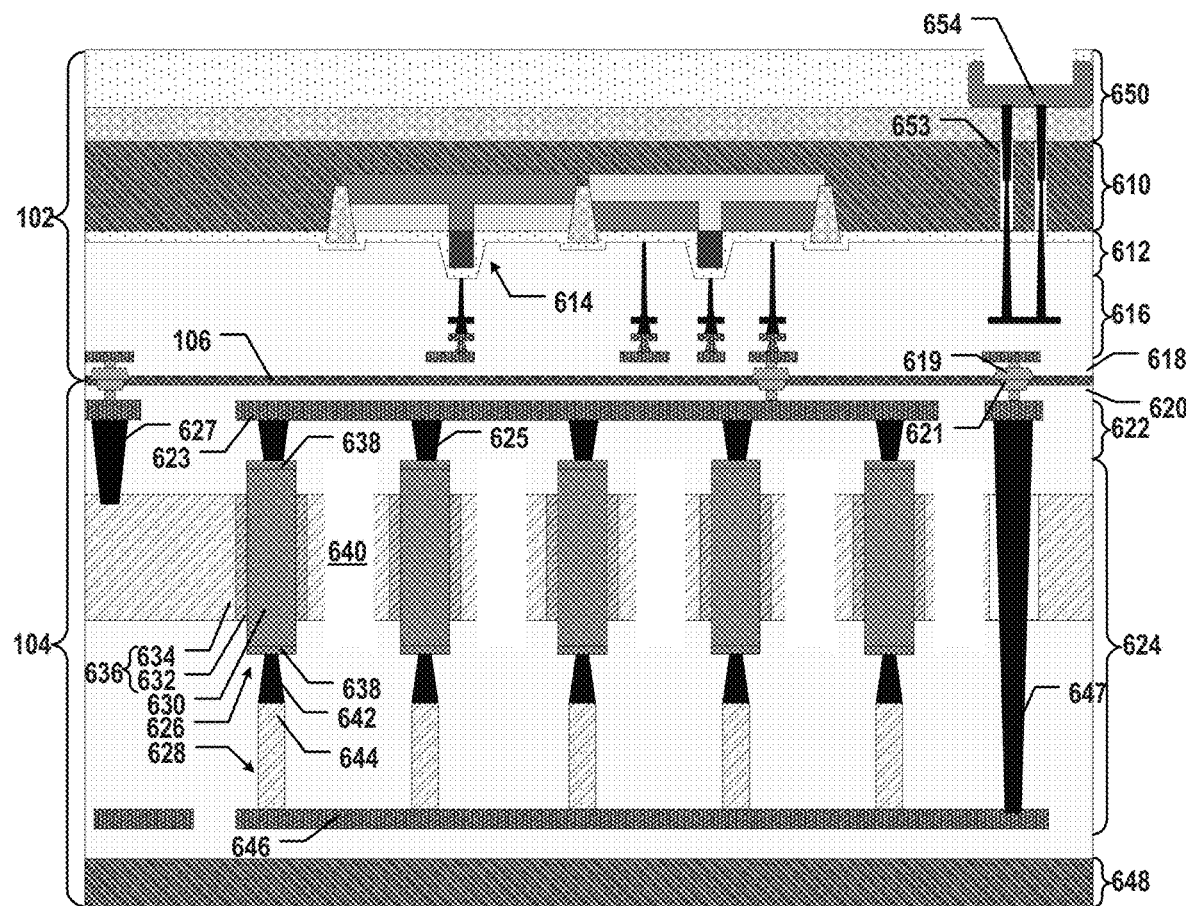
FIG. 6B illustrates a side view of a cross-section of another 3D memory device including vertical transistors, according to some aspects of the present disclosure.

It is understood that the pad-out of 3D memory devices is not limited to from second semiconductor structure 104 having DRAM cells 624 as shown in FIG. 6A and may be from first semiconductor structure 102 having peripheral circuit 612. For example, as shown in FIG. 6B, a 3D memory device 601 may include pad-out interconnect layer 650 in first semiconductor structure 102. Pad-out interconnect layer 650 can be disposed above and in contact with substrate 610 of first semiconductor structure 102 on which transistors 614 of peripheral circuit 612 are formed. In some implementations, first semiconductor structure 102 further includes one or more contacts 653 extending vertically through substrate 610. In some implementations, contact 653 couples the interconnects in interconnect layer 616 in first semiconductor structure 102 to contact pads 654 in pad-out interconnect layer 650 to make an electrical connection through substrate 610. Contacts 653 can include conductive materials including, but not limited to, W, Co, Cu, Al, silicides, or any combination thereof. In one example, contact 653 may include W. In some implementations, contact 653 includes a via surrounded by a dielectric spacer (e.g., having silicon oxide) to electrically separate the via from substrate 610. It is understood that in some examples, substrate 610 in FIG. 6B may be a thinned substrate, e.g., compared with substrate 610 in FIG. 6A. Depending on the thickness of substrate 610, contact 653 can be an ILV having a depth in the submicron-level (e.g., between 10 nm and 1 µm), or a TSV having a depth in the micron- or tens micron-level (e.g., between 1 µm and 100 µm). It is understood that the details of the same components (e.g., materials, fabrication process, functions, etc.) in both 3D memory devices 600 and 601 are not repeated for ease of description. Pad-out from first semiconductor structure 102 including peripheral circuits 612 can reduce the interconnect distance between contact pad 654 and peripheral circuits 612, thereby decreasing the parasitic capacitance from the interconnects and improving the electrical performance of 3D memory device 601.

Figure 6C:
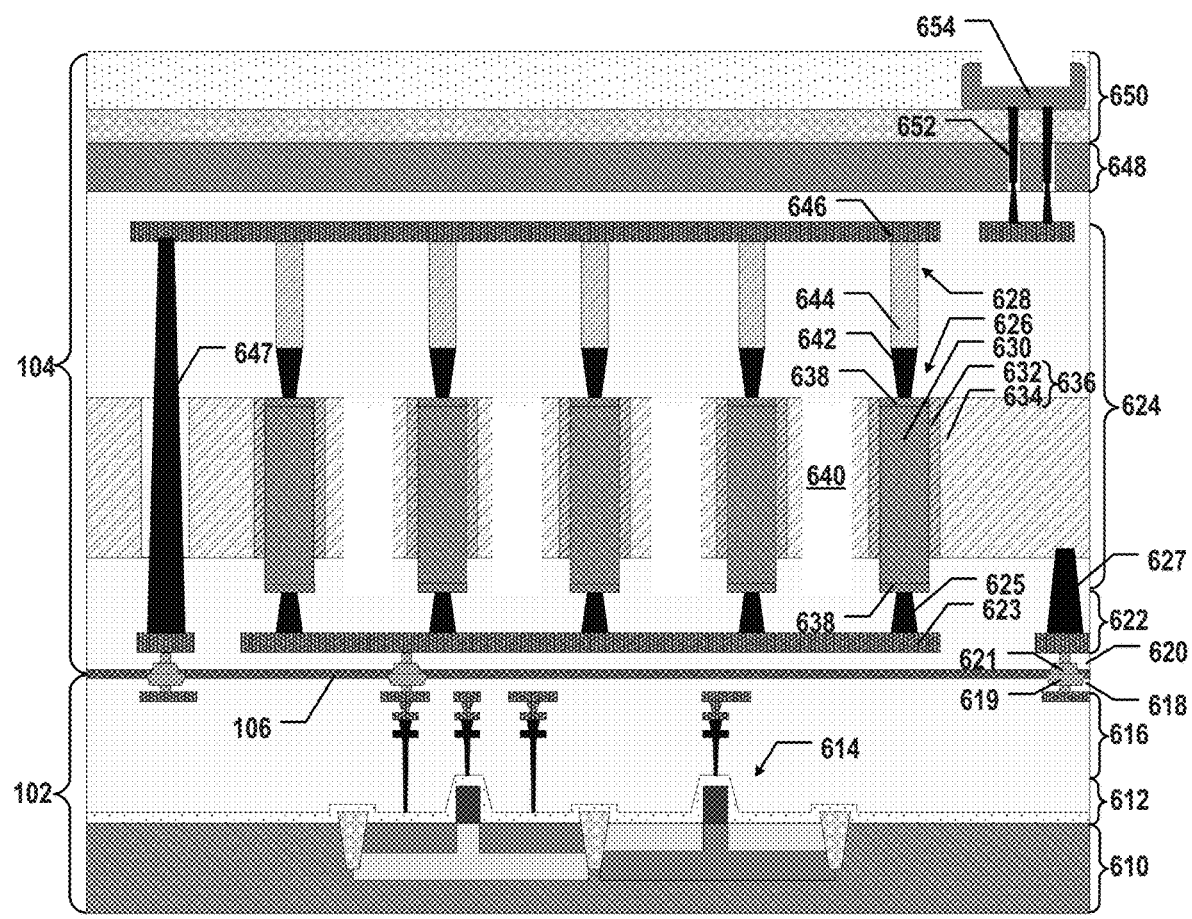
FIG. 6C illustrates a side view of a cross-section of still another 3D memory device including vertical transistors, according to some aspects of the present disclosure.

It is also understood that the relative vertical positions between the semiconductor body and the respective gate structure and word line are not limited to the example shown in FIG. 6A in which both the upper and lower ends of semiconductor body 630 extend beyond gate structure 636 (and word line 634), respectively, depending on the various fabrication processes as described below in detail. For example, as shown in FIG. 6C, a 3D memory device 603 may include vertical transistors 626 each having semiconductor body 630 and gate structure 636, and one end of semiconductor body 630 in the vertical direction (the z-direction) may be flush with gate structure 636. In some implementations, the upper or lower end of semiconductor body 630 that is in contact with capacitor contact 642 is flush with the respective end of gate structure 636 and word line 634. That is, one of the upper and lower ends of semiconductor body 630 that is in contact with capacitor 628 does not extend beyond the respective end of gate structure 636 and word line 634, according to some implementations. In some implementations, as shown in FIG. 6C, the other end of semiconductor body 630 in the vertical direction that is in contact with bit line contact 625 still extends beyond the respective end of gate structure 636 and word line 634 into an ILD layer, which is vertically between bit line contacts 625 and word lines 634. It is understood that the details of the same components (e.g., materials, fabrication process, functions, etc.) in both 3D memory devices 600 and 603 are not repeated for ease of description.

Figure 6D:
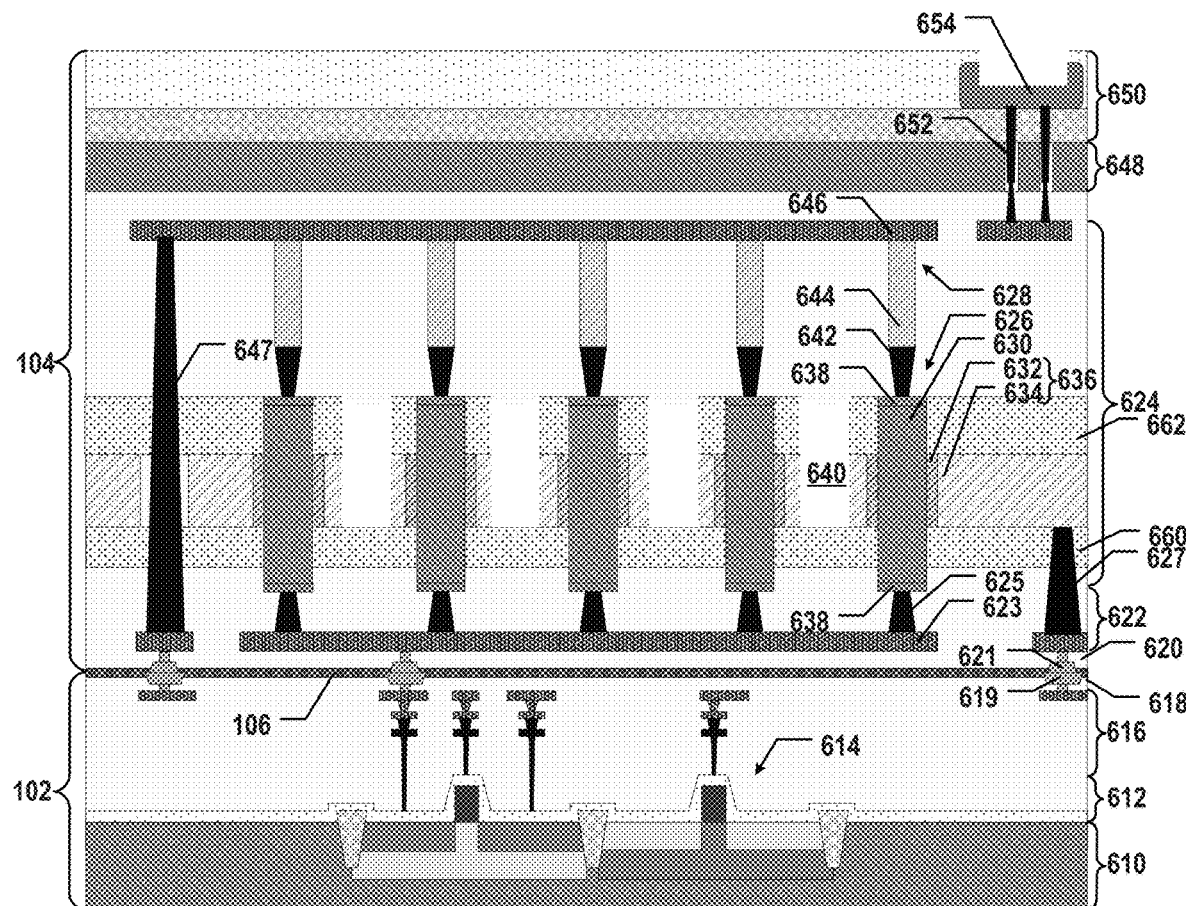
FIG. 6D illustrates a side view of a cross-section of yet another 3D memory device including vertical transistors, according to some aspects of the present disclosure.

It is further understood that the dielectric materials of the ILD layers into which the semiconductor bodies extend are not limited to the example shown in FIG. 6A in which the ILD layers include silicon oxide, e.g., the same material as the ILD layer in which capacitors 628 are formed, depending on the various fabrication processes as described below in detail. For example, as shown in FIG. 6D, a 3D memory device 605 may include two ILD layers 660 and 662 into which semiconductor body 630 extends. ILD layer 660 is vertically between bit line contacts 625 and word lines 634, and ILD layer 662 is vertically between word lines 634 and capacitor contact 642, according to some implementations. ILD layers 660 and 662 can include a dielectric material that is different from the dielectric material of the ILD layer in which capacitors 628 are formed. In some implementations, ILD layers 660 and 662 include silicon nitride, while the ILD layer of capacitors 628 includes silicon oxide. As shown in FIG. 6D, in some implementations, one end of semiconductor body 630 in the vertical direction (the z-direction) that is in contact with capacitor 628 is flush with the respective end of ILD layer 662. In some implementations, air gap 640 extends vertically through ILD layer 662 to separate ILD layer 662, but does not extend further into ILD layer 660, e.g., being stopped by ILD layer 660. It is understood that the details of the same components (e.g., materials, fabrication process, functions, etc.) in both 3D memory devices 600 and 605 are not repeated for ease of description.

Figure 6E:
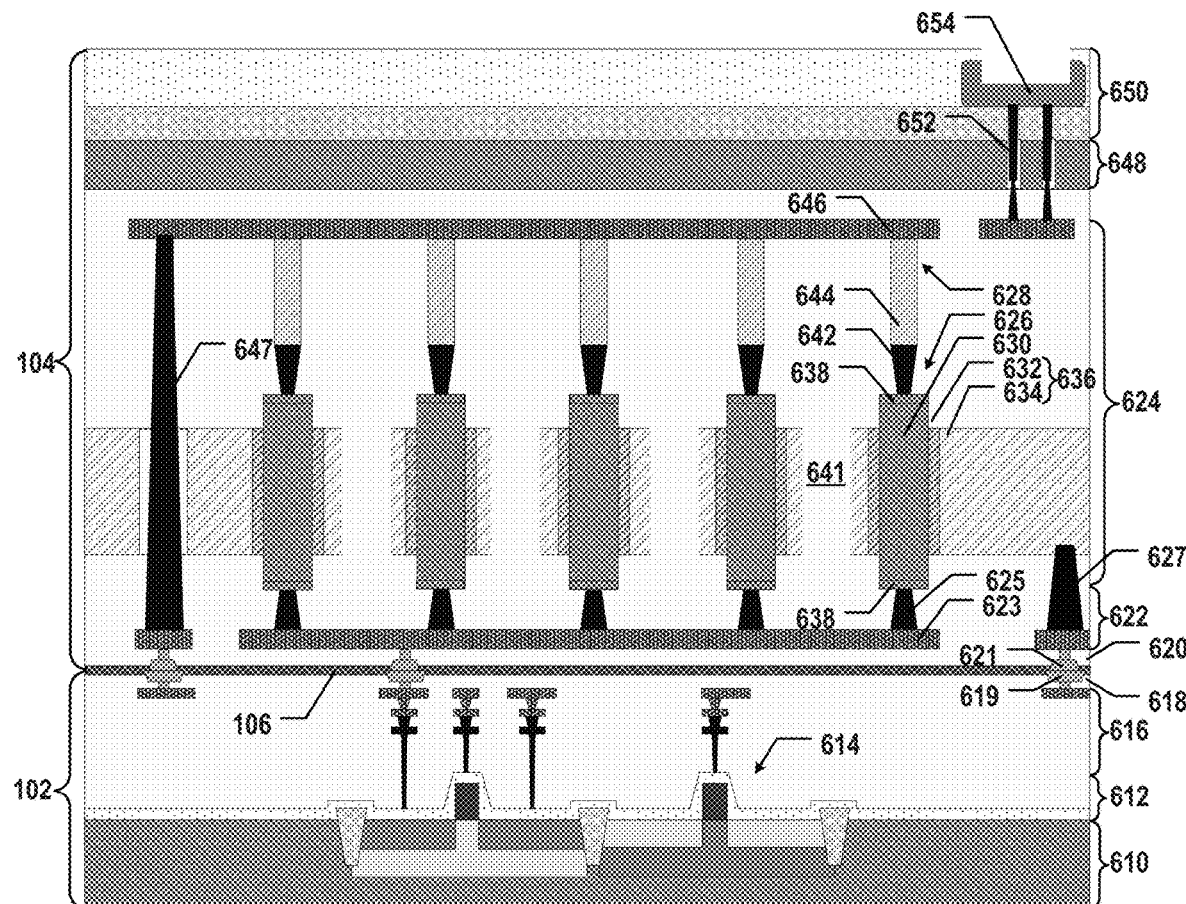
FIG. 6E illustrates a side view of a cross-section of yet another 3D memory device including vertical transistors, according to some aspects of the present disclosure.

It is further understood that the air gaps between word lines may be partially or fully filled with dielectrics. For example, as shown in FIG. 6E, a memory device 607 may not include air gaps (e.g., air gaps 640 in FIG. 6A) between adjacent word lines 634. Instead, memory device 607 can include dielectric wall structures 641 (e.g., filled with dielectrics, such as silicon oxide) each formed between adjacent word lines 634. It is understood that in some examples (not shown), air gaps 640 may still exist between word lines 634, but with a smaller vertical dimension (depth) compared with word liens 634. It is understood that the details of the same components (e.g., materials, fabrication process, functions, etc.) in both 3D memory devices 600 and 607 are not repeated for ease of description.

Figure 7:
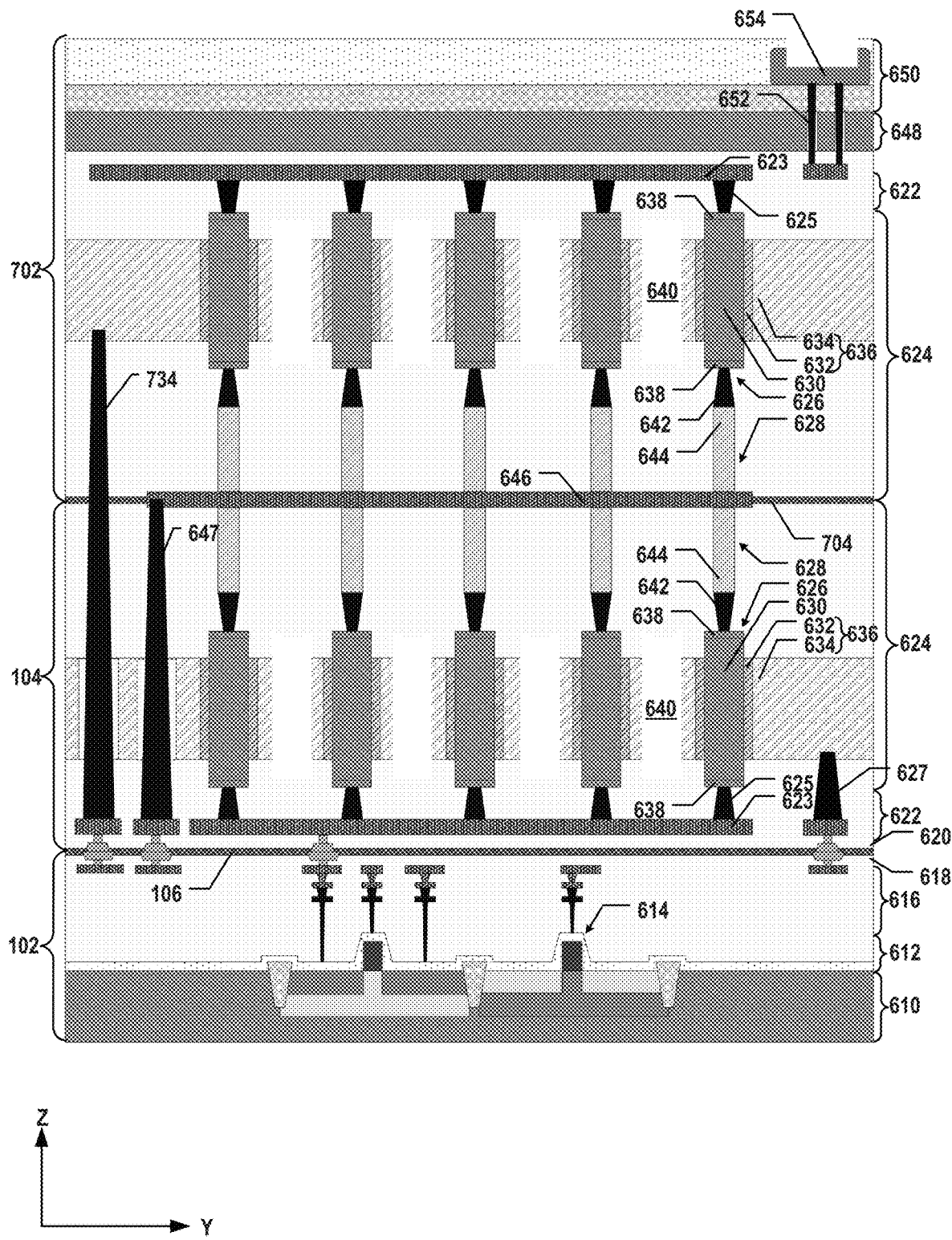
FIG. 7 illustrates a side view of a cross-section of yet another 3D memory device including vertical transistors, according to some aspects of the present disclosure.

It is further understood that more than one DRAM cell array may be stacked over one another to vertically scale up the number of DRAM cells. For example, as shown in FIG. 7, a memory device 700 may further include a third semiconductor structure 702 having an array of DRAM cells 624 stacked over second and first semiconductor structures 104 and 102. Third and second semiconductor structures 702 and 104 are jointed at another bonding interface 704 therebetween, according to some implementations. Third and second semiconductor structures 702 and 104 may have the same arrays of DRAM cells 624 and interconnect layers 622 and thus, the details of DRAM cells 624 and interconnect layer 622 in third semiconductor structure 702 are not repeated for ease of description.

Third and second semiconductor structures 702 and 104 can be bonded in a face-to-face manner, such that at least some components (e.g., DRAM cells 624) in third and second semiconductor structures 702 and 104 can be symmetric with respect bonding interface 704, according to some implementations. Bonding interface 704 can be formed vertically between DRAM cells 624 in third semiconductor structure 702 and DRAM cells 624 in second semiconductor structure 104. As shown in FIG. 7, in some implementations, capacitors 628 in second semiconductor structure 104 are disposed vertically between bonding interface 704 and vertical transistors 626 in second semiconductor structure 104, and capacitors 628 in third semiconductor structure 702 are disposed vertically between bonding interface 704 and vertical transistors 626 in third semiconductor structure 702. That is, capacitors 628 in second semiconductor structure 104 and capacitors 628 in third semiconductor structure 702 can be disposed on opposite sides of bonding interface 704. In some implementations, the second electrodes of capacitors 628 in third semiconductor structure 702 are in contact with common plate 646 at bonding interface 704.

In some implementations, 3D memory device 700 includes additional interconnects that couple DRAM cells 624 in third semiconductor structure 702 to peripheral circuits 612 across bonding interfaces 704 and 106, such as word line contacts 734 coupling word lines 634 in third semiconductor structure 702 and peripheral circuits 612 in first semiconductor structure 102. As shown in FIG. 7, third semiconductor structure 702, as opposed to first or second semiconductor structure 102 or 104, can include pad-out interconnect layer 650. In some implementations, vertical transistors 626 in third semiconductor structure 702 are disposed vertically between capacitors 628 in third semiconductor structure 702 and pad-out interconnect layer 650. It is understood that the details of the same components (e.g., materials, fabrication process, functions, etc.) in both 3D memory devices 600 and 700 are not repeated for ease of description.

It is understood that the architecture of multiple memory cell arrays shown in FIG. 7 is not limited to the design of DRAM cells 624 and may be applied to any suitable memory cells disclosed herein. It is also understood that various designs of memory cells disclosed herein may be mixed in the architecture of multiple memory cell arrays shown in FIG. 7. For example, second and third semiconductor structures 104 and 702 may include different designs of memory cells disclosed herein.

Figure 8:
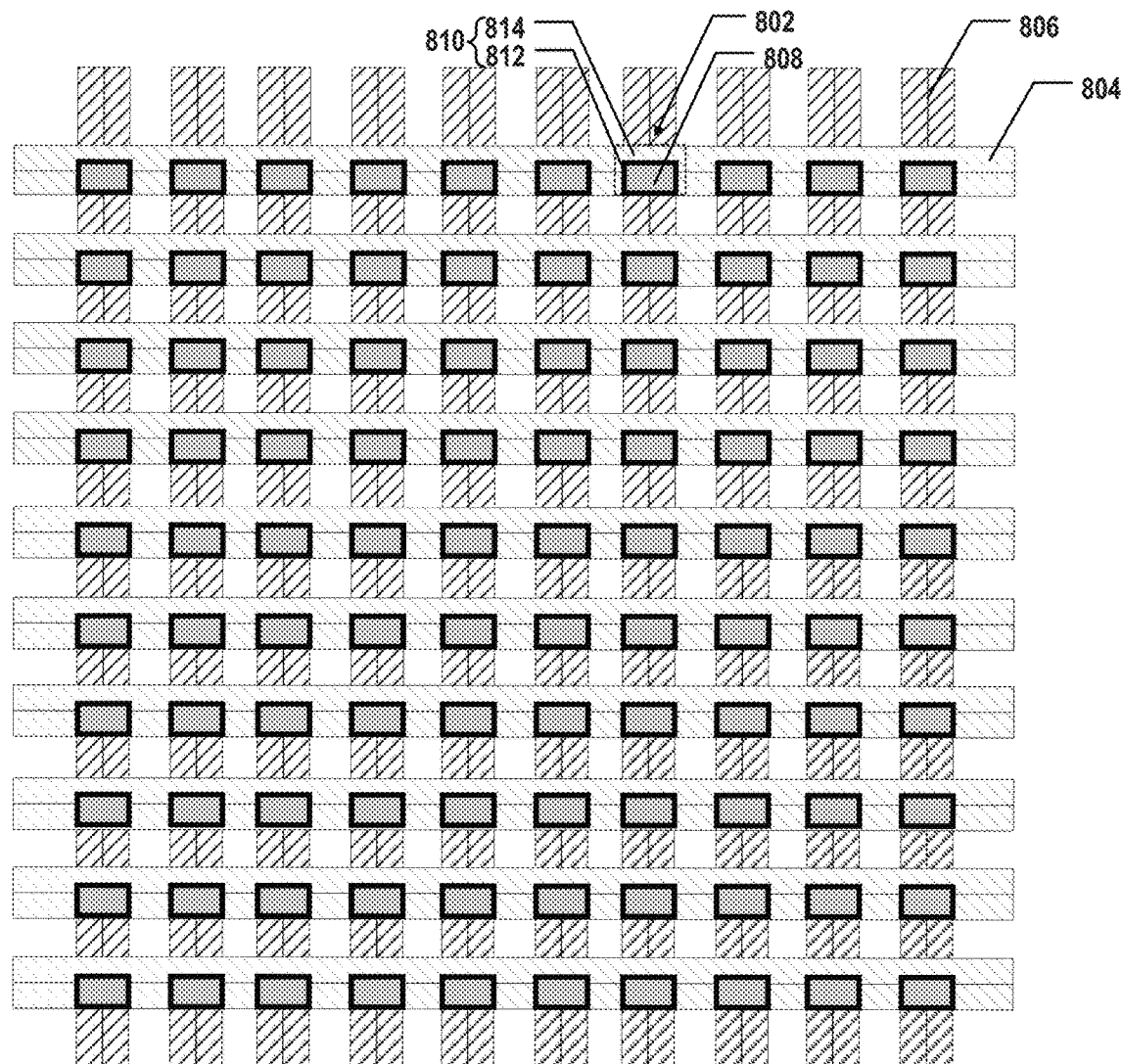
FIG. 8 illustrates a plan view of another array of memory cells each including a vertical transistor in a memory device, according to some aspects of the present disclosure.

It is further understood that the memory cell array is not limited to the example shown in FIGS. 5, 6A-6D, and 7 in which the vertical transistors are GAA transistors and may be any other suitable multi-gate vertical transistors. For example, FIG. 8 illustrates a plan view of another array of memory cells 802 each including a vertical transistor in a memory device 800, according to some aspects of the present disclosure. As shown in FIG. 8, memory device 800 can include a plurality of word lines 804 each extending in a first lateral direction (the x-direction, referred to as the word line direction). Memory device 800 can also include a plurality of bit lines 806 each extending in a second lateral direction perpendicular to the first lateral direction (the y-direction, referred to as the bit line direction). It is understood that FIG. 8 does not illustrate a cross-section of memory device 800 in the same lateral plane, and word lines 804 and bit lines 806 may be formed in different lateral planes for ease of routing as described below in detail.

Memory cells 802 can be formed at the intersections of word lines 804 and bit lines 806. In some implementations, each memory cell 802 includes a vertical transistor (e.g., vertical transistor 210 in FIG. 2) having a semiconductor body 808 and a gate structure 810. The vertical transistor of memory cell 802 in FIG. 8 may be an example of a tri-gate vertical transistor (e.g., tri-side gate vertical transistor). Semiconductor body 808 can extend in the vertical direction (the z-direction, not shown) perpendicular to the first and second lateral directions. Gate structure 810 can be in contact with a plurality of sides (e.g., three of all four sides in FIG. 8) of semiconductor body 808 (the active region in which channels are formed). That is, different from the GAA vertical transistor in memory cell 502 in FIG. 5, gate structure 810 of the vertical transistor in memory cell 802 partially circumscribes semiconductor body 808 in the plan view. That is, gate structure 810 circumscribes (e.g., surrounding and contacting) three of all four sides of semiconductor body 808 (having a rectangle or square-shaped cross-section) in the plan view, according to some implementations. Gate structure 810 does not surround and contact at least one side of semiconductor body 808, according to some implementations. Gate structure 810 can include a gate dielectric 812 partially or fully circumscribes semiconductor body 808 in the plan view, and a gate electrode 814 partially circumscribes gate dielectric 812. Thus, the vertical transistor having gate structure 810 may be viewed as a "tri-gate" vertical transistor in which gate structure 810 is in contact with two opposite sides of semiconductor body 808 in the word line direction (the x-direction) and one side of semiconductor body 808 in the bit line direction (the y-direction). As described above, gate electrode 814 may be part of word line 804, and word line 804 may be an extension of gate electrode 814. For example, as shown in FIG. 8, one edge of each word line 804 may be formed aligned with the same side of each semiconductor body 808, such that gate electrode 814 may not extend to the side of semiconductor body 808 to form a GAA transistor. By arranging semiconductor bodies 808 of memory cells 802 to be aligned with one side of word lines 804, the pitch of word lines 804 and/or the pitch of memory cells 802 in the bit line direction (the y-direction) can be further increased to reduce the fabrication complexity and increase the production yield. In some implementations, gate structures 810 of a row of the vertical transistors are continuous in the x-direction, as a shown in FIG. 8.

Similar to memory device 500 in FIG. 5, as shown in FIG. 8, gate electrodes 814 of adjacent vertical transistors in the word line direction (the x-direction) are continuous, e.g., parts of a continuous conductive layer having gate electrodes 814 and 804. In contrast, gate dielectrics 812 of adjacent vertical transistors in the word line direction are separate, e.g., not parts of a continuous dielectric layer having gate dielectrics 812.

Figure 9:
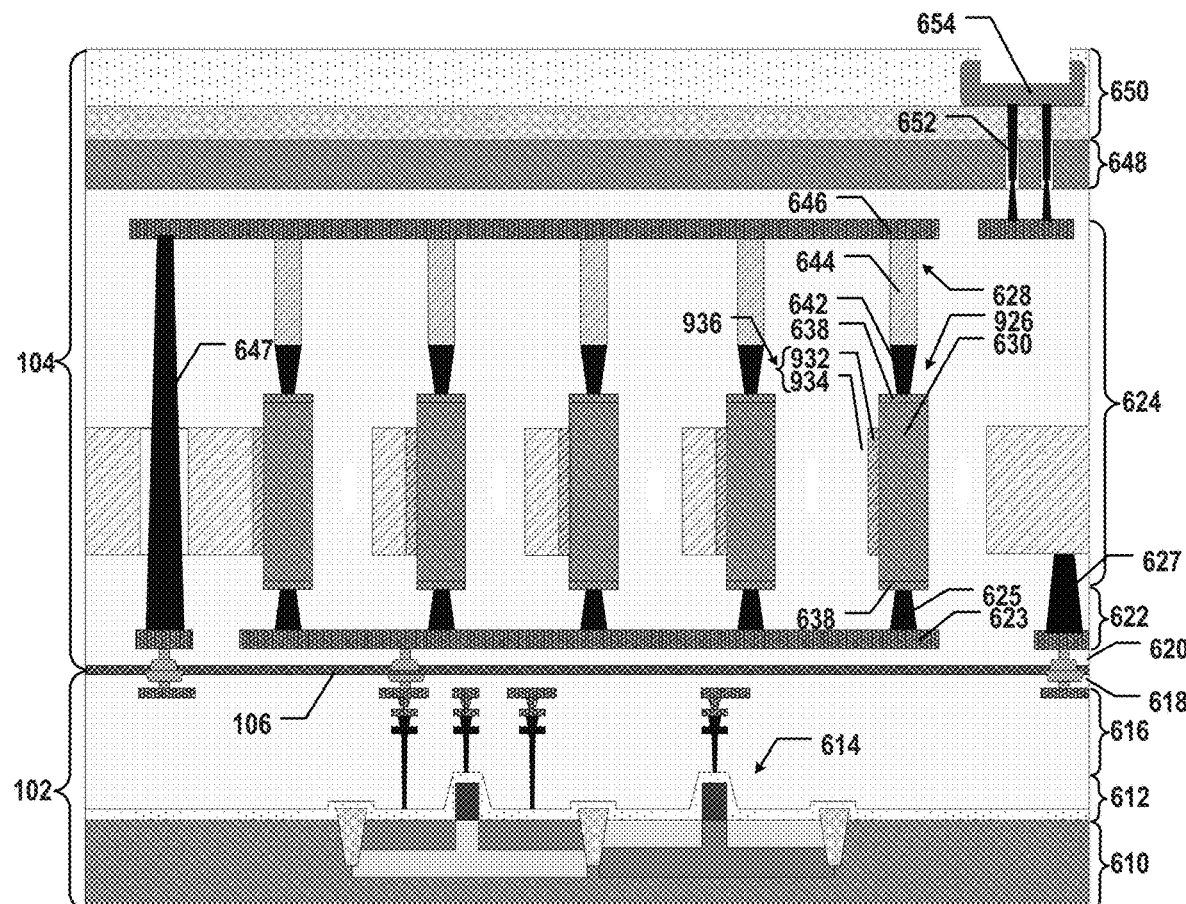
FIG. 9 illustrates a side view of a cross-section of yet another 3D memory device including vertical transistors, according to some aspects of the present disclosure.

FIG. 9 illustrates a side view of a cross-section of a 3D memory device 900 including vertical transistors, according to some aspects of the present disclosure. 3D memory device 900 may be one example of memory device 800 including multi-gate vertical transistors in which gate structures partially circumscribes semiconductor bodies in the plan view. 3D memory device 900 is similar to 3D memory device 600 in FIG. 6A except for the different structures of multi-gate vertical transistors in DRAM cells 624. It is understood that the details of the same components (e.g., materials, fabrication process, functions, etc.) in both 3D memory devices 600 and 900 are not repeated for ease of description. Similar to FIG. 6A, the cross-section of 3D memory device 900 in FIG. 9 may be made along the bit line direction (the y-direction).

Vertical transistor 926 can be a MOSFET used to switch a respective DRAM cell 624. In some implementations, vertical transistor 926 includes semiconductor body 630 (the active region in which multiple channels can form) extending vertically (in the z-direction), and a gate structure 936 in contact with a plurality of sides of semiconductor body 630. Semiconductor body 630 can have a cuboid shape or a cylinder shape, and gate structure 936 can partially circumscribe semiconductor body 630 in the plan view, for example, as shown in FIG. 8. As shown in FIG. 9, gate structure 936 does not extend to at least one side of semiconductor body 630, according to some implementations. Gate structure 936 includes a gate electrode 934 and a gate dielectric 932 laterally between gate electrode 934 and semiconductor body 630, according to some implementations. As shown in FIG. 9, gate electrode 934 does not extend to at least one side of semiconductor body 630, according to some implementation. Due to the increased pitch of word lines 934 and/or the pitch of DRAM cells 624 in the bit line direction (they-direction), the air gaps between word lines 934 may be partially or fully filled with dielectrics.

It is also understood that the number of gates in multi-gate transistors may vary, e.g., not limited by the GAA vertical transistor example in FIG. 5 and the tri-gate vertical transistor example in FIG. 8. For example, multi-gate vertical transistors may also include double-gate vertical transistors (a.k.a. dual-side gate vertical transistors) in which the gate structure is in contact with two sides of the semiconductor body, such as the two opposite sides in the bit line direction or in the word line direction.

It is further understood that although storage units are described as capacitors 628 in FIGS. 6A-6D, 7, and 9, storage units may include any other suitable devices, such as PCM elements, as described above with respect to FIG. 4 in some examples. For example, the capacitor dielectric of capacitor 628 may be replaced with a phase-change material layer, such as chalcogenide alloys, vertically sandwiched between the electrodes to form a PCM element. Also, instead of coupling source or drain 638 of vertical transistor 626 or 926 to bit line 623, the electrode of the PCM element may be coupled to bit line 623, while source or drain 638 of vertical transistor 626 or 926 may be coupled to the ground, e.g., a common ground plate.

Figure 16:
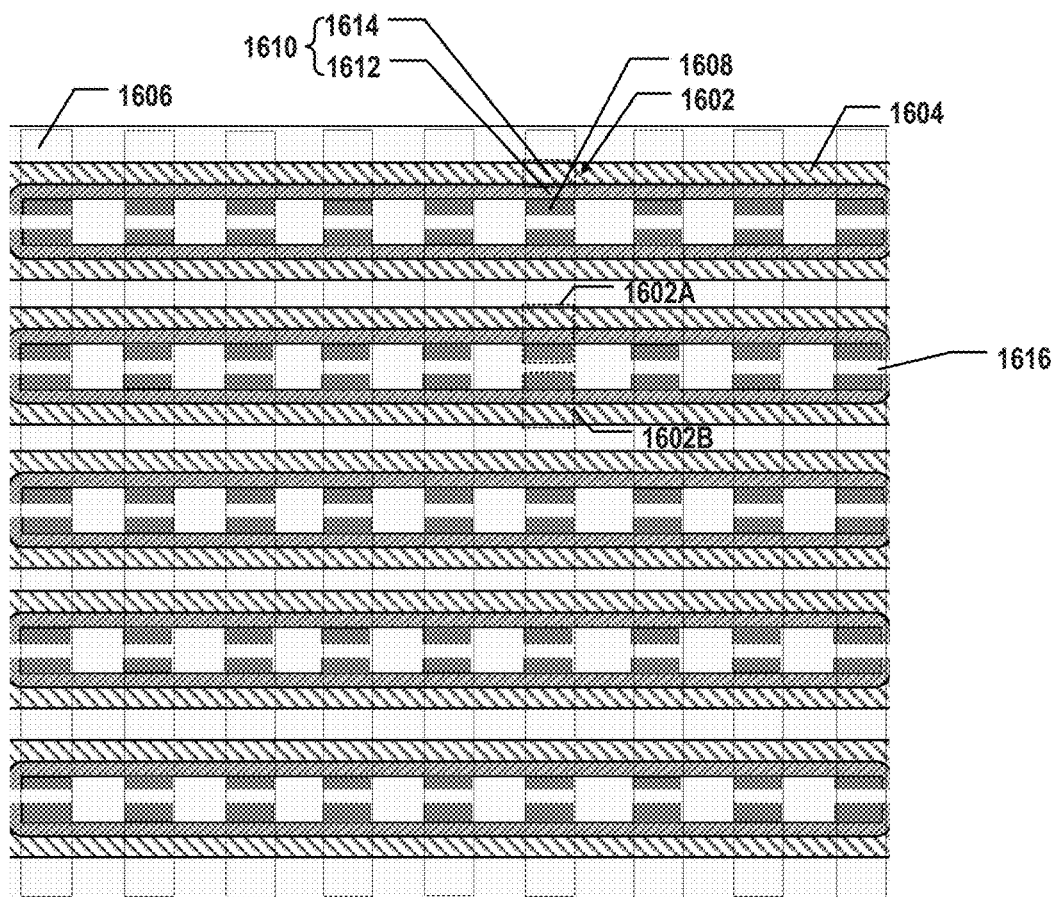
FIG. 16 illustrates a plan view of still another array of memory cells each including a vertical transistor in a memory device, according to some aspects of the present disclosure.

According to some aspects of the present disclosure, the vertical transistors of memory cells in a memory device (e.g., memory device 200) are single-gate transistors, and the gate dielectrics of vertical transistors in the word line direction are continuous. For example, FIG. 16 illustrates a plan view of still another array of memory cells 1602 each including a vertical transistor in a memory device 1600, according to some aspects of the present disclosure. As shown in FIG. 16, memory device 1600 can include a plurality of word lines 1604 each extending in a first lateral direction (the x-direction, referred to as the word line direction). Memory device 1600 can also include a plurality of bit lines 1606 each extending in a second lateral direction perpendicular to the first lateral direction (the y-direction, referred to as the bit line direction). It is understood that FIG. 16 does not illustrate a cross-section of memory device 1600 in the same lateral plane, and word lines 1604 and bit lines 1606 may be formed in different lateral planes for ease of routing as described below in detail.

Memory cells 1602 can be formed at the intersections of word lines 1604 and bit lines 1606. In some implementations, each memory cell 1602 includes a vertical transistor (e.g., vertical transistor 210 in FIG. 2) having a semiconductor body 1608 and a gate structure 1610. Semiconductor body 1608 can extend in a substrate in the vertical direction (the z-direction, not shown) perpendicular to the first and second lateral directions. The vertical transistor can be a single-gate transistor in which gate structure 1610 is in contact with a single side (e.g., one of four sides in FIG. 16) of semiconductor body 1608 (the active region in which channels are formed). As shown in FIG. 16, the vertical transistor is a single-gate transistor in which gate structure 1610 abuts one side of semiconductor body 1608 (having a rectangle or square-shaped cross-section) in the bit line direction (the y-direction) in the plan view. Gate structure 1610 does not surround and contact other three sides of semiconductor body 1608, according to some implementations. Gate structure 1610 can include a gate dielectric 1612 abuts one side of semiconductor body 1608 in the plan view, and a gate electrode 1614 in contact with gate dielectric 1612. In some implementations, gate dielectric 1612 is laterally between gate electrode 1614 and semiconductor body 1608 in the bit line direction (the y-direction). As described above, gate electrode 1614 may be part of word line 1604, and word line 1604 may be an extension of gate electrode 1614. That is, gate electrodes 1614 of adjacent vertical transistors in the word line direction (the x-direction) are continuous, e.g., parts of a continuous conductive layer having gate electrodes 1614 and 1604. In some implementations, gate structures 1610 of a row of the vertical transistors are continuous in the x-direction, as a shown in FIG. 16.

Different from separate gate dielectrics 512 and 812 in FIGS. 5 and 8, as shown in FIG. 16, gate dielectrics 1612 of adjacent vertical transistors in the word line direction are continuous, e.g., parts of a continuous dielectric layer having gate dielectrics 1612 and extending in the word line direction to abut vertical transistors in the same row on the same side. Gate structures 1610 can be thus viewed as parts of a continuous structure extending in the word line direction at which the continuous structure abut vertical transistors in the same row on the same side.

As shown in FIG. 16, two adjacent vertical transistors of memory cells (e.g., 1602A and 1602B) in the bit line direction (the y-direction) are mirror-symmetric to one another, according to some implementations. As described below with respect to the fabrication process, semiconductor bodies 1608 of each pair of two adjacent vertical transistors of memory cells (e.g., 1602A and 1602B) in the bit line direction (the y-direction) can be formed by separating a semiconductor pillar into two pieces using a trench isolation 1616 extending in the word line direction (the x-direction) and in parallel with word lines 1604. Trench isolations 1616 and word lines 1604 can be disposed in an interleaved manner in the bit line direction. In some implementations, trench isolation 1616 is formed in the middle of the semiconductor pillars (not shown) such that the resulting pair of semiconductor bodies 1608 are mirror-symmetric to one another with respect to trench isolation 1616, so are the pair of vertical transistors having semiconductor bodies 1608 when the respective gate structures 1610 are mirror-symmetric to one another with respect to trench isolation 1616 as well.

It is understood that in some examples, trench isolations 1616 extending in the word line directions may not be formed such that two adjacent semiconductor bodies 1608 separated by a respective trench isolation 1616 may be merged as a single semiconductor body having two opposite sides in the bit line direction in contact with gate structure 1610. That is, without trench isolations 1616, the adjacent single-gate vertical transistors may be merged to form a double-gate vertical transistor with increased gate control area and lower leakage current. The gate structure of the double-gate vertical transistor may include two mirror-symmetric gate structures 1610 in FIG. 16, such that both sides of the merged semiconductor body 1608 in the bit line direction may be in contact with the gate structure in the double-gate vertical transistor. On the other hand, by splitting the double-gate vertical transistors into single-gate vertical transistors using trench isolations 1616, the number of memory cells 1602 (and the cell density) in the bit line direction can be doubled compared to double-gate vertical transistors without unduly complexing the fabrication process (e.g., compared with using SADP process).

Figure 17:
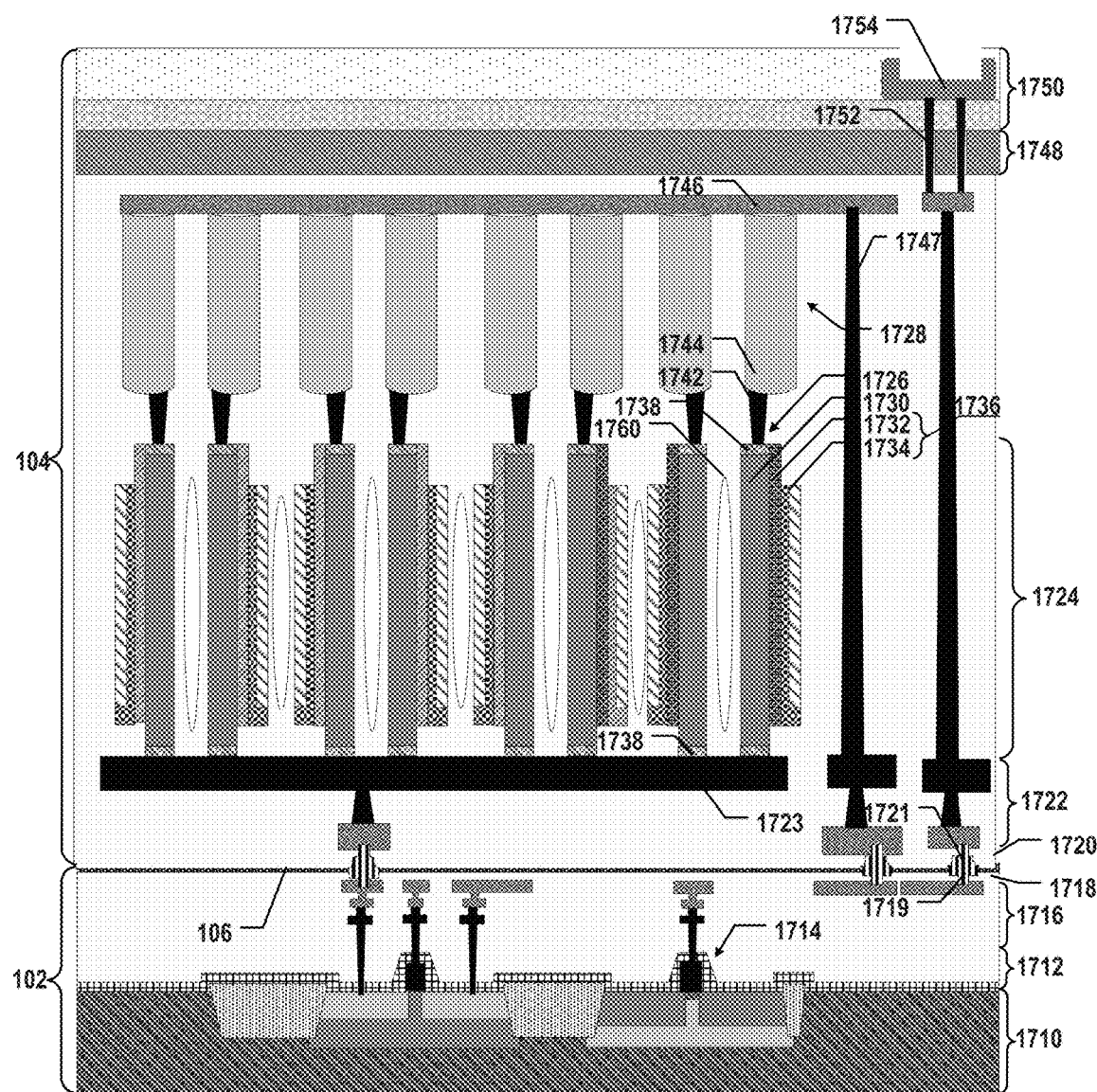
FIG. 17 illustrates a side view of a cross-section of yet another 3D memory device including vertical transistors, according to some aspects of the present disclosure.

FIG. 17 illustrates a side view of a cross-section of yet another 3D memory device 1700 including vertical transistors, according to some aspects of the present disclosure. 3D memory device 1700 may be one example of memory device 1600 including single-gate vertical transistors in which gate structures abut a single side of semiconductor bodies in the plan view. It is understood that FIG. 17 is for illustrative purposes only and may not necessarily reflect the actual device structure (e.g., interconnections) in practice. As one example of 3D memory device 100 described above with respect to FIG. 1A, 3D memory device 1700 is a bonded chip including first semiconductor structure 102 and second semiconductor structure 104 stacked over first semiconductor structure 102. First and second semiconductor structures 102 and 104 are jointed at bonding interface 106 therebetween, according to some implementations. As shown in FIG. 17, first semiconductor structure 102 can include a substrate 1710, which can include silicon (e.g., single crystalline silicon, c-Si), SiGe, GaAs, Ge, SOI, or any other suitable materials.

First semiconductor structure 102 can include peripheral circuits 1712 on substrate 1710. In some implementations, peripheral circuits 1712 include a plurality of transistors 1714 (e.g., planar transistors and/or 3D transistors). Trench isolations (e.g., shallow trench isolations (STIs)) and doped regions (e.g., wells, sources, and drains of transistors 1714) can be formed on or in substrate 1710 as well.

In some implementations, first semiconductor structure 102 further includes an interconnect layer 1716 above peripheral circuits 1712 to transfer electrical signals to and from peripheral circuits 1712. Interconnect layer 1716 can include a plurality of interconnects (also referred to herein as "contacts"), including lateral interconnect lines and VIA contacts. Interconnect layer 1716 can further include one or more ILD layers in which the interconnect lines and via contacts can form. That is, interconnect layer 1716 can include interconnect lines and via contacts in multiple ILD layers. In some implementations, peripheral circuits 1712 are coupled to one another through the interconnects in interconnect layer 1716. The interconnects in interconnect layer 1716 can include conductive materials including, but not limited to, W, Co, Cu, Al, doped silicon, silicides, or any combination thereof. The ILD layers can be formed with dielectric materials including, but not limited to, silicon oxide, silicon nitride, silicon oxynitride, low-k dielectrics, or any combination thereof.

As shown in FIG. 17, first semiconductor structure 102 can further include a bonding layer 1718 at bonding interface 106 and above interconnect layer 1716 and peripheral circuits 1712. Bonding layer 1718 can include a plurality of bonding contacts 1719 and dielectrics electrically isolating bonding contacts 1719. Bonding contacts 1719 can include conductive materials, such as Cu. The remaining area of bonding layer 1718 can be formed with dielectric materials, such as silicon oxide. Bonding contacts 1719 and surrounding dielectrics in bonding layer 1718 can be used for hybrid bonding. Similarly, as shown in FIG. 17, second semiconductor structure 104 can also include a bonding layer 1720 at bonding interface 106 and above bonding layer 1718 of first semiconductor structure 102. Bonding layer 1720 can include a plurality of bonding contacts 1721 and dielectrics electrically isolating bonding contacts 1721. Bonding contacts 1721 can include conductive materials, such as Cu. The remaining area of bonding layer 1720 can be formed with dielectric materials, such as silicon oxide. Bonding contacts 1721 and surrounding dielectrics in bonding layer 1720 can be used for hybrid bonding. Bonding contacts 1721 are in contact with bonding contacts 1719 at bonding interface 106, according to some implementations. In some implementations, bonding layer 1720 includes a dielectric layer opposing DRAM cells 1724 with bit line 1723 positioned between the dielectric layer and DRAM cells 1724, as shown in FIG. 17. The dielectric layer can include bonding interface 106 having bonding contacts 1721.

Second semiconductor structure 104 can be bonded on top of first semiconductor structure 102 in a face-to-face manner at bonding interface 106. In some implementations, bonding interface 106 is disposed between bonding layers 1720 and 1718 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some implementations, bonding interface 106 is the place at which bonding layers 1720 and 1718 are met and bonded. In practice, bonding interface 106 can be a layer with a certain thickness that includes the top surface of bonding layer 1718 of first semiconductor structure 102 and the bottom surface of bonding layer 1720 of second semiconductor structure 104.

In some implementations, second semiconductor structure 104 further includes an interconnect layer 1722 including bit lines 1723 above bonding layer 1720 to transfer electrical signals. Interconnect layer 1722 can include a plurality of interconnects, such as MEOL interconnects and BEOL interconnects. In some implementations, the interconnects in interconnect layer 1722 also include local interconnects, such as bit lines 1723 (e.g., an example of bit lines 1606 in FIG. 16) and word line contacts (not shown). Interconnect layer 1722 can further include one or more ILD layers in which the interconnect lines and via contacts can form. The interconnects in interconnect layer 1722 can include conductive materials including, but not limited to, W, Co, Cu, Al, doped silicon, silicides, or any combination thereof. The ILD layers can be formed with dielectric materials including, but not limited to, silicon oxide, silicon nitride, silicon oxynitride, low-k dielectrics, or any combination thereof. In some implementations, peripheral circuits 1712 include a word line driver/row decoder coupled to the word line contacts in interconnect layer 1722 through bonding contacts 1721 and 1719 in bonding layers 1720 and 1718 and interconnect layer 1716. In some implementations, peripheral circuits 1712 include a bit line driver/column decoder coupled to bit lines 1723 and bit line contacts (not shown in FIG. 17, e.g., bit line contacts 625 in FIGS. 6A-6E) in interconnect layer 1722 through bonding contacts 1721 and 1719 in bonding layers 1720 and 1718 and interconnect layer 1716. In some implementations, bit line 1723 is a metal bit line, as opposed to semiconductor bit lines (e.g., doped silicon bit lines). For example, bit line 1723 may include W, Co, Cu, Al, or any other suitable metals having higher conductivities than doped silicon. In some implementations, the bit line contact (not shown in FIG. 17, e.g., bit line contacts 625 in FIGS. 6A-6E) is an ohmic contact, such as a metal silicide contact, as opposed to a Schottky contact. For example, the bit line contact may include metal silicides, such as WSi, CoSi, CuSi, AlSi, or any other suitable metal silicides having higher conductivities than doped silicon.

In some implementations, second semiconductor structure 104 includes a DRAM device in which memory cells are provided in the form of an array of DRAM cells 1724 (e.g., an example of memory cells 1602 in FIG. 16) above interconnect layer 1722 and bonding layer 1720. That is, interconnect layer 1722 including bit lines 1723 can be disposed between bonding layer 1720 and array of DRAM cells 1724. It is understood that the cross-section of 3D memory device 1700 in FIG. 17 may be made along the bit line direction (the y-direction), and one bit line 1723 in interconnect layer 1722 extending laterally in the y-direction may be coupled to a column of DRAM cells 1724.

Figure 18:
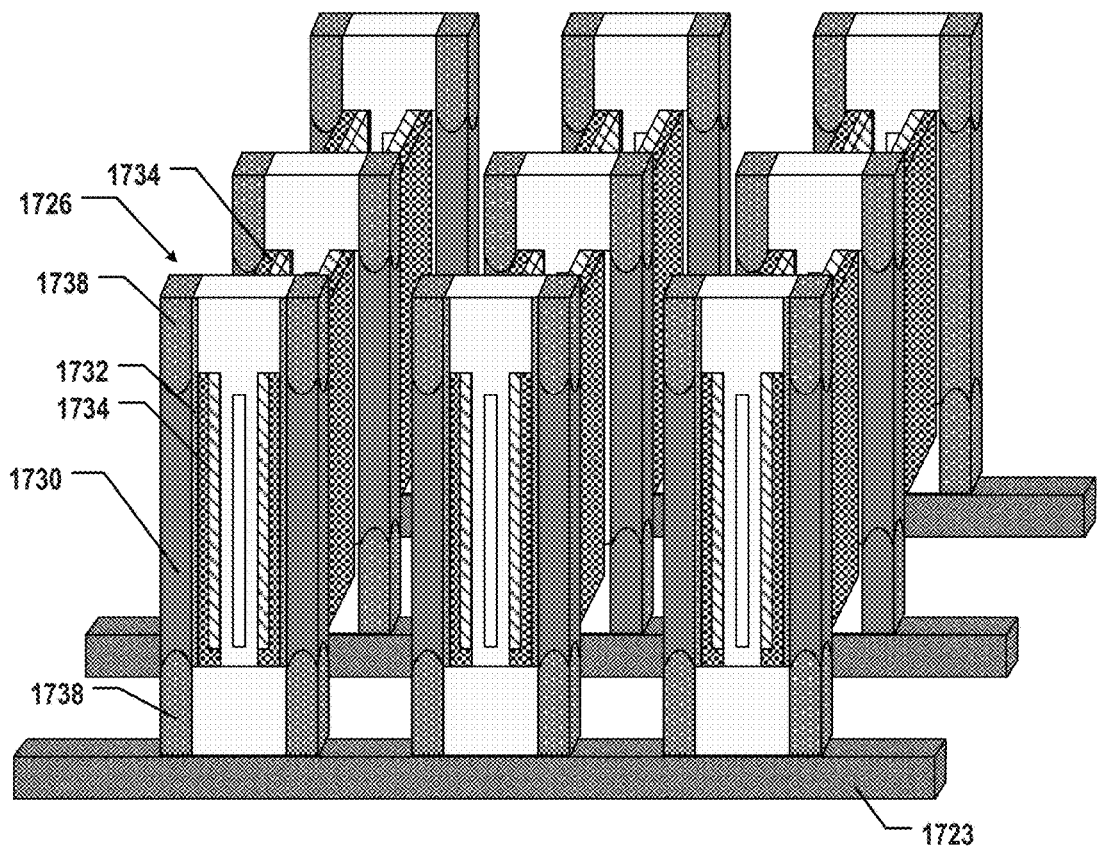
FIG. 18 illustrates a perspective view of an array of vertical transistors, according to some aspects of the present disclosure.

Each DRAM cell 1724 can include a vertical transistor 1726 (e.g., an example of vertical transistors 210 in FIG. 2) and capacitor 1728 (e.g., an example of storage unit 212 in FIG. 2) coupled to the vertical transistor 1726. DRAM cell 1724 can be a 1T1C cell consisting of one transistor and one capacitor. It is understood that DRAM cell 1724 may be of any suitable configurations, such as 2T1C cell, 3T1C cell, etc. To better illustrate vertical transistor 1726, FIG. 18 illustrates a perspective view of an array of vertical transistor 1726, according to some aspects of the present disclosure. FIGS. 17 and 18 will be described together when describing vertical transistors 1726.

Vertical transistor 1726 can be a MOSFET used to switch a respective DRAM cell 1724. In some implementations, vertical transistor 1726 includes a semiconductor body 1730 (the active region in which a channel can form) extending vertically (in the z-direction), and a gate structure 1736 in contact with one side of semiconductor body 1730 in the bit line direction (the y-direction). As described above, as in a single-gate vertical transistor, semiconductor body 1730 can have a cuboid shape or a cylinder shape, and gate structure 1736 can abut a single side of semiconductor body 1730 in the plan view, for example, as shown in FIGS. 17 and 18. Gate structure 1736 includes a gate electrode 1734 and a gate dielectric 1732 laterally between gate electrode 1734 and semiconductor body 1730 in the bit line direction, according to some implementations. In some implementations, gate dielectric 1732 abuts one side of semiconductor body 1730, and gate electrode 1734 abuts gate dielectric 1732.

As shown in FIGS. 17 and 18, in some implementations, semiconductor body 1730 has two ends (the upper end and lower end) in the vertical direction (the z-direction), and at least one end (e.g., the lower end in FIGS. 17 and 18) extends beyond gate dielectric 1732 in the vertical direction (the z-direction) into ILD layers. In some implementations, one end (e.g., the upper end in FIGS. 17 and 18) of semiconductor body 1730 is flush with the respective end (e.g., the upper end in FIGS. 17 and 18) of gate dielectric 1732. In some implementations, both ends (the upper end and lower end) of semiconductor body 1730 extend beyond gate electrode 1734, respectively, in the vertical direction (the z-direction) into ILD layers. That is, semiconductor body 1730 can have a larger vertical dimension (e.g., the depth) than that of gate electrode 1734 (e.g., in the z-direction), and neither the upper end nor the lower end of semiconductor body 1730 is flush with the respective end of gate electrode 1734. Thus, short circuits between bit lines 1723 and word lines/gate electrodes 1734 or between word lines/gate electrodes 1734 and capacitors 1728 can be avoided. Vertical transistor 1726 can further include a source and a drain (both referred to as 1738 as their locations may be interchangeable) disposed at the two ends (the upper end and lower end) of semiconductor body 1730, respectively, in the vertical direction (the z-direction). In some implementations, one of source and drain 1738 (e.g., at the upper end in FIGS. 17 and 18) is coupled to capacitor 1728, and the other one of source and drain 1738 (e.g., at the lower end in FIGS. 17 and 18) is coupled to bit line 1723. That is, vertical transistor 1726 can have a first terminal in the positive z-direction and a second terminal opposite the first terminal in the negative z-direction, as shown in FIG. 17. In some implementations, a metal bit line (e.g., bit line 1723 made of a metal material) is coupled to the second terminal of vertical transistor 1726 via an ohmic contact (e.g., a bit line contact made of a metal silicide material).

In some implementations, semiconductor body 1730 includes semiconductor materials, such as single crystalline silicon, polysilicon, amorphous silicon, Ge, any other semiconductor materials, or any combinations thereof. In one example, semiconductor body 1730 may include single crystalline silicon. Source and drain 1738 can be doped with N-type dopants (e.g., P or As) or P-type dopants (e.g., B or Ga) at a desired doping level. In some implementations, a silicide layer, such as a metal silicide layer, is formed between source/drain 1738 of vertical transistor 1726 and bit line 1723 as the bit line contact or between source/drain 1738 of vertical transistor 1726 and the first electrode of capacitor 1728 as capacitor contact 1742 to reduce the contact resistance. In some implementations, gate dielectric 1732 includes dielectric materials, such as silicon oxide, silicon nitride, or high-k dielectrics including, but not limited to, $Al_2O_3$, $HfO_2$, $Ta_2O_5$, $ZrO_2$, $TiO_2$, or any combination thereof. In some implementations, gate electrode 1734 includes conductive materials including, but not limited to W, Co, Cu, Al, TiN, TaN, polysilicon, silicides, or any combination thereof. In some implementations, gate electrode 1734 includes multiple conductive layers, such as a W layer over a TiN layer, as shown in FIGS. 17 and 18. In one example, gate structure 1736 may be a "gate oxide/gate poly" gate in which gate dielectric 1732 includes silicon oxide and gate electrode 1734 includes doped polysilicon. In another example, gate structure 1736 may be an HKMG in which gate dielectric 1732 includes a high-k dielectric and gate electrode 1734 includes a metal.

As described above, since gate electrode 1734 may be part of a word line or extend in the word line direction (e.g., the x-direction in FIG. 18) as a word line, as shown in FIG. 18, second semiconductor structure 104 of 3D memory device 1700 can also include a plurality of word lines (e.g., an example of word lines 1604 in FIG. 16, referred to as 1734 as well) each extending in the word line direction (the x-direction). Each word line 1734 can be coupled to a row of DRAM cells 1724. That is, bit line 1723 and word line 1734 can extend in two perpendicular lateral directions, and semiconductor body 1730 of vertical transistor 1726 can extend in the vertical direction perpendicular to the two lateral directions in which bit line 1723 and word line 1734 extend. Word lines 1734 are in contact with word line contacts (not shown), according to some implementations. In some implementations, word lines 1734 include conductive materials including, but not limited to W, Co, Cu, Al, TiN, TaN, polysilicon, silicides, or any combination thereof. In some implementations, word line 1734 includes multiple conductive layers, such as a W layer over a TiN layer, as shown in FIG. 17.

As shown in FIGS. 17 and 18, vertical transistor 1726 extends vertically through and contacts word lines 1734, and source or drain 1738 of vertical transistor 1726 at the lower end thereof is in contact with bit line 1723 (or bit line contact if any), according to some implementations. Accordingly, word lines 1734 and bit lines 1723 can be disposed in different planes in the vertical direction due to the vertical arrangement of vertical transistor 1726, which simplifies the routing of word lines 1734 and bit lines 1723. In some implementations, bit lines 1723 are disposed vertically between bonding layer 1720 and word lines 1734, and word lines 1734 are disposed vertically between bit lines 1723 and capacitors 1728. Word lines 1734 can be coupled to peripheral circuits 1712 in first semiconductor structure 102 through word line contacts (not shown) in interconnect layer 1722, bonding contacts 1721 and 1719 in bonding layers 1720 and 1718, and the interconnects in interconnect layer 1716. Similarly, bit lines 1723 in interconnect layer 1722 can be coupled to peripheral circuits 1712 in first semiconductor structure 102 through bonding contacts 1721 and 1719 in bonding layers 1720 and 1718 and the interconnects in interconnect layer 1716.

As described above with respect to FIG. 16, vertical transistors 1726 can be arranged in a mirror-symmetric manner to increase the density of DRAM cells 1724 in the bit line direction (the y-direction). As shown in FIG. 17, two adjacent vertical transistors 1726 in the bit line direction are mirror-symmetric to one another with respect to a trench isolation 1760 (e.g., corresponding to trench isolation 1616 in FIG. 16), according to some implementations. That is, second semiconductor structure 104 can include a plurality of trench isolations 1760 each extending in the word line direction (the x-direction) in parallel with word lines 1734 and disposed between semiconductor bodies 1730 of two adjacent rows of vertical transistors 1726. In some implementations, the rows of vertical transistors 1726 separated by trench isolation 1760 are mirror-symmetric to one another with respect to trench isolation 1760. Trench isolation 1760 can be formed with dielectric materials including, but not limited to, silicon oxide, silicon nitride, silicon oxynitride, low-k dielectrics, or any combination thereof. It is understood that trench isolation 1760 may include an air gap each disposed laterally between adjacent semiconductor bodies 1730. As described below with respect to the fabrication process, air gaps may be formed due to the relatively small pitches of vertical transistors 1726 in the bit line direction (e.g., the y-direction). On the other hand, the relatively large dielectric constant of air in air gaps (e.g., about 4 times of the dielectric constant of silicon oxide) can improve the insulation effect between vertical transistors 1726 (and rows of DRAM cells 1724) compared with some dielectrics (e.g., silicon oxide). Similarly, in some implementations, air gaps are formed laterally between word lines/gate electrodes 1734 in the bit line direction as well, depending on the pitches of word lines/gate electrodes 1734 in the bit line direction.

As shown in FIG. 17, in some implementations, capacitor 1728 includes a first electrode above and coupled to source or drain 1738 of vertical transistor 1726, e.g., the upper end of semiconductor body 1730, via a capacitor contact 1742. In some implementations, capacitor contact 1742 is an ohmic contact, such as a metal silicide contact, as opposed to a Schottky contact. For example, capacitor contact 1742 may include metal silicides, such as WSi, CoSi, CuSi, AlSi, or any other suitable metal silicides having higher conductivities than doped silicon. Capacitor 1728 can also include a capacitor dielectric above and in contact with the first electrode, and a second electrode above and in contact with the capacitor dielectric. That is, capacitor 1728 can be a vertical capacitor in which the electrodes and capacitor dielectric are stacked vertically (in the z-direction), and the capacitor dielectric can be sandwiched between the electrodes. In some implementations, each first electrode is coupled to source or drain 1738 of a respective vertical transistor 1726 in the same DRAM cell, while all second electrodes are coupled to a common plate 1746 coupled to the ground, e.g., a common ground. Capacitor 1728 can have a first end in the negative z-direction and a second end opposite the first end in the positive z-direction, as shown in FIG. 17. In some implementations, the first end of capacitor 1728 is coupled to the first terminal of vertical transistor 1726 via an ohmic contact (e.g., capacitor contact 1742 made of a metal silicide material). As shown in FIG. 17, second semiconductor structure 104 can further include a capacitor contact 1747 (e.g., a conductor) in contact with common plate 1746 for coupling capacitors 1728 to peripheral circuits 1712 or to the ground directly. In some implementations, capacitor contact 1747 (e.g., a conductor) extends in the z-direction from the dielectric layer of bonding layer 1720 to couple to the second end of capacitor 1728 via common plate 1746, as shown in FIG. 17. In some implementation, the ILD layer in which capacitors 1728 are formed has the same dielectric material as the two ILD layers into which semiconductor body 1730 extends, such as silicon oxide.

It is understood that the structure and configuration of capacitor 1728 are not limited to the example in FIG. 17 and may include any suitable structure and configuration, such as a planar capacitor, a stack capacitor, a multi-fins capacitor, a cylinder capacitor, a trench capacitor, or a substrate-plate capacitor. In some implementations, the capacitor dielectric includes dielectric materials, such as silicon oxide, silicon nitride, or high-k dielectrics including, but not limited to, $Al_2O_3$, $HfO_2$, $Ta_2O_5$, $ZrO_2$, $TiO_2$, or any combination thereof. It is understood that in some examples, capacitor 1728 may be a ferroelectric capacitor used in a FRAM cell, and the capacitor dielectric may be replaced by a ferroelectric layer having ferroelectric materials, such as PZT or SBT. In some implementations, the electrodes include conductive materials including, but not limited to, W, Co, Cu, Al, TiN, TaN, polysilicon, silicides, or any combination thereof.

As shown in FIG. 17, vertical transistor 1726 extends vertically through and contacts word lines 1734, source or drain 1738 of vertical transistor 1726 at the lower end thereof is in contact with bit line 1723, and source or drain 1738 of vertical transistor 1726 at the upper end thereof is coupled to capacitor 1728, according to some implementations. That is, bit line 1723 and capacitor 1728 can be disposed in different planes in the vertical direction and coupled to opposite ends of vertical transistor 1726 of DRAM cell 1724 in the vertical direction due to the vertical arrangement of vertical transistor 1726. In some implementations, bit line 1723 and capacitor 1728 are disposed on opposite sides of vertical transistor 1726 in the vertical direction, which simplifies the routing of bit lines 1723 and reduces the coupling capacitance between bit lines 1723 and capacitors 1728 compared with DRAM cells in which the bit lines and capacitors are disposed on the same side of the planar transistors.

As shown in FIG. 17, in some implementations, vertical transistors 1726 are disposed vertically between capacitors 1728 and bonding interface 106. That is, vertical transistors 1726 can be arranged closer to peripheral circuits 1714 of first semiconductor structure 102 and bonding interface 106 than capacitors 1728. Since bit lines 1723 and capacitors 1728 are coupled to opposite ends of vertical transistors 1726, as described above, bit lines 1723 (as part of interconnect layer 1722) are disposed vertically between vertical transistors 1726 and bonding interface 106, according to some implementations. As a result, interconnect layer 1722 including bit lines 1723 can be arranged close to bonding interface 106 to reduce the interconnect routing distance and complexity.

In some implementations, second semiconductor structure 104 further includes a substrate 1748 disposed above DRAM cells 1724. As described below with respect to the fabrication process, substrate 1748 can be part of a carrier wafer. It is understood that in some examples, substrate 1748 may not be included in second semiconductor structure 104.

As shown in FIG. 17, second semiconductor structure 104 can further include a pad-out interconnect layer 1750 above substrate 1748 and DRAM cells 1724. Pad-out interconnect layer 1750 can include interconnects, e.g., contact pads 1754, in one or more ILD layers. Pad-out interconnect layer 1750 and interconnect layer 1722 can be formed on opposite sides of DRAM cells 1724. Capacitors 1728 are disposed vertically between vertical transistors 1726 and pad-out interconnect layer 1750, according to some implementations. In some implementations, the interconnects in pad-out interconnect layer 1750 can transfer electrical signals between 3D memory device 1700 and outside circuits, e.g., for pad-out purposes. In some implementations, second semiconductor structure 104 further includes one or more contacts 1752 extending through substrate 1748 and part of pad-out interconnect layer 1750 to couple pad-out interconnect layer 1750 to DRAM cells 1724 and interconnect layer 1722. As a result, peripheral circuits 1712 can be coupled to DRAM cells 1724 through interconnect layers 1716 and 1722 as well as bonding layers 1720 and 1718, and peripheral circuits 1712 and DRAM cells 1724 can be coupled to outside circuits through contacts 1752 and pad-out interconnect layer 1750. Contact pads 1754 and contacts 1752 can include conductive materials including, but not limited to, W, Co, Cu, Al, silicides, or any combination thereof. In one example, contact pad 1754 may include Al, and contact 1752 may include W. In some implementations, contact 1752 includes a via surrounded by a dielectric spacer (e.g., having silicon oxide) to electrically separate the via from substrate 1748. Depending on the thickness of substrate 1748, contact 1752 can be an ILV having a depth in the submicron-level (e.g., between 10 nm and 1 μm), or a TSV having a depth in the micron- or tens micron-level (e.g., between 1 μm and 100 μm).

Although not shown, it is understood that the pad-out of 3D memory devices is not limited to from second semiconductor structure 104 having DRAM cells 1724 as shown in FIG. 17 and may be from first semiconductor structure 102 having peripheral circuit 1712 in the similar manner as described above with respect to FIG. 6B. Although not shown, it is also understood that the air gaps between word lines 1734 and/or between semiconductor bodies 1730 may be partially or fully filled with dielectrics in the similar manner as described above with respect to FIG. 6E. Although not shown, it is further understood that more than one array of DRAM cells 1724 may be stacked over one another to vertically scale up the number of DRAM cells 1724 in the similar manner as described above with respect to FIG. 7.

Figure 20:
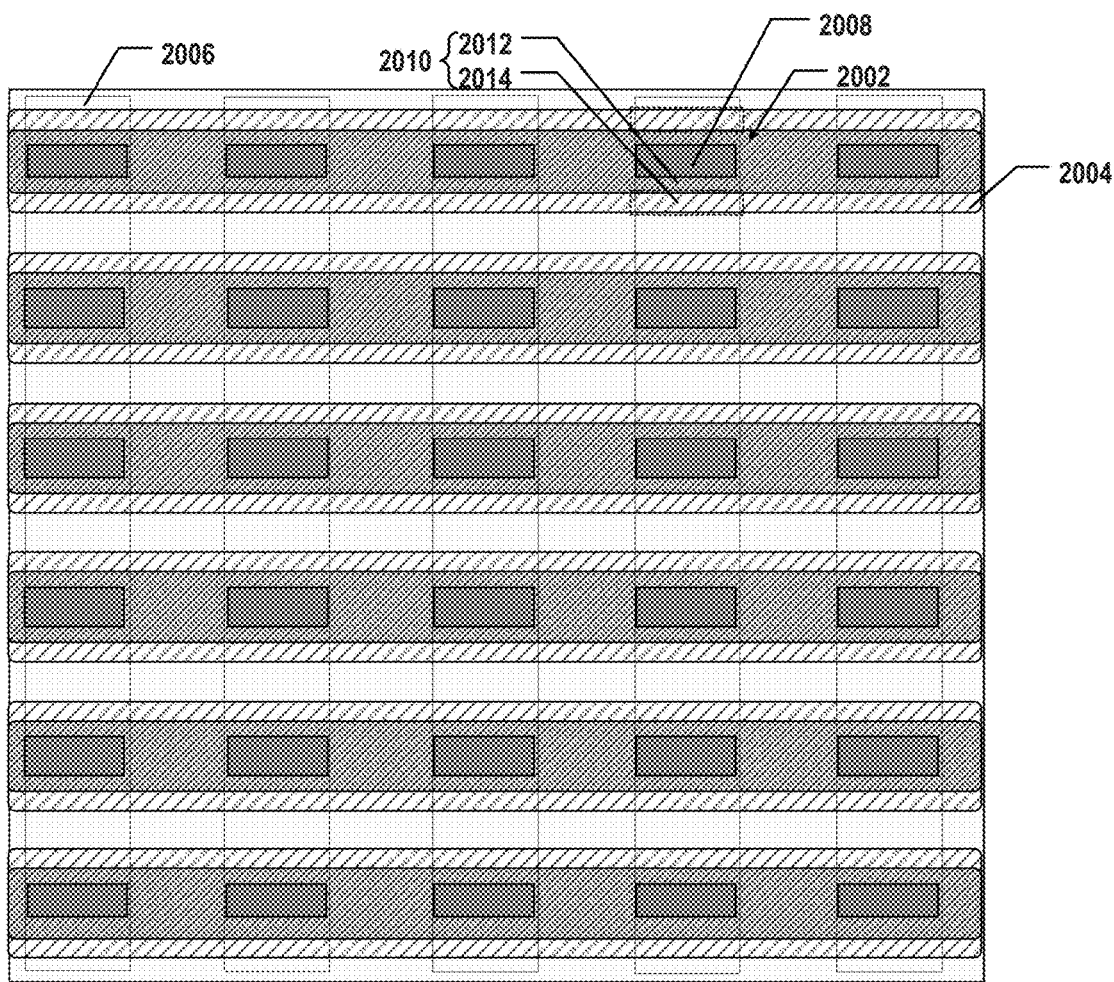
FIG. 20 illustrates a plan view of yet another array of memory cells each including a vertical transistor in a memory device, according to some aspects of the present disclosure.

As described above, in some examples, trench isolations 1616 extending in the word line directions in FIG. 16 may not be formed such that two adjacent semiconductor bodies 1608 separated by a respective trench isolation 1616 may be merged as a single semiconductor body having two opposite sides in the bit line direction in contact with gate structure 1610. That is, without trench isolations 1616, the adjacent single-gate vertical transistors may be merged to form a double-gate vertical transistor (e.g., dual-side gate vertical transistor) with increased gate control area and lower leakage current. For example, FIG. 20 illustrates a plan view of yet another array of memory cells 2002 each including a vertical transistor in a memory device 2000, according to some aspects of the present disclosure. As shown in FIG. 20, memory device 2000 can include a plurality of word lines 2004 each extending in a first lateral direction (the x-direction, referred to as the word line direction). Memory device 2000 can also include a plurality of bit lines 2006 each extending in a second lateral direction perpendicular to the first lateral direction (the y-direction, referred to as the bit line direction). It is understood that FIG. 20 does not illustrate a cross-section of memory device 2000 in the same lateral plane, and word lines 2004 and bit lines 2006 may be formed in different lateral planes for ease of routing as described below in detail.

Memory cells 2002 can be formed at the intersections of word lines 2004 and bit lines 2006. In some implementations, each memory cell 2002 includes a vertical transistor (e.g., vertical transistor 210 in FIG. 2) having a semiconductor body 2008 and a gate structure 2010. Semiconductor body 2008 can extend in a substrate in the vertical direction (the z-direction, not shown) perpendicular to the first and second lateral directions. The vertical transistor can be a double-gate transistor in which gate structure 2010 is in contact with two sides (e.g., two of four sides in FIG. 20) of semiconductor body 2008 (the active region in which channels are formed). As shown in FIG. 20, the vertical transistor is a double-gate transistor in which gate structure 2010 abuts two opposite sides of semiconductor body 1608 (having a rectangle or square-shaped cross-section) in the bit line direction (the y-direction) in the plan view. Gate structure 2010 does not surround and contact the other two sides of semiconductor body 2008 in the word line direction (the x-direction), according to some implementations. That is, gate structure 2010 can partially circumscribes semiconductor body 2008 in the plan view. Gate structure 2010 can include a gate dielectric 2012 abuts two opposite sides of semiconductor body 2008 in the plan view, and a gate electrode 2014 in contact with gate dielectric 2012. In some implementations, gate dielectric 2012 is laterally between gate electrode 2014 and semiconductor body 2008 in the bit line direction (the y-direction). As described above, gate electrode 2014 may be part of word line 2004, and word line 2004 may be an extension of gate electrode 2014. That is, gate electrodes 1614 of adjacent vertical transistors in the word line direction (the x-direction) are continuous, e.g., parts of a continuous conductive layer having gate electrodes 1614 and 1604. In some implementations, gate structures 2010 of a row of the vertical transistors are continuous in the x-direction, as a shown in FIG. 20.

Different from separate gate dielectrics 512 and 812 in FIGS. 5 and 8, as shown in FIG. 20, gate dielectrics 2012 of adjacent vertical transistors in the word line direction are continuous, e.g., parts of a continuous dielectric layer having gate dielectrics 2012 and extending in the word line direction. Gate structures 2010 can be thus viewed as parts of a continuous structure extending in the word line direction at which the continuous structure intersects vertical transistors in the same row.

Figure 21:
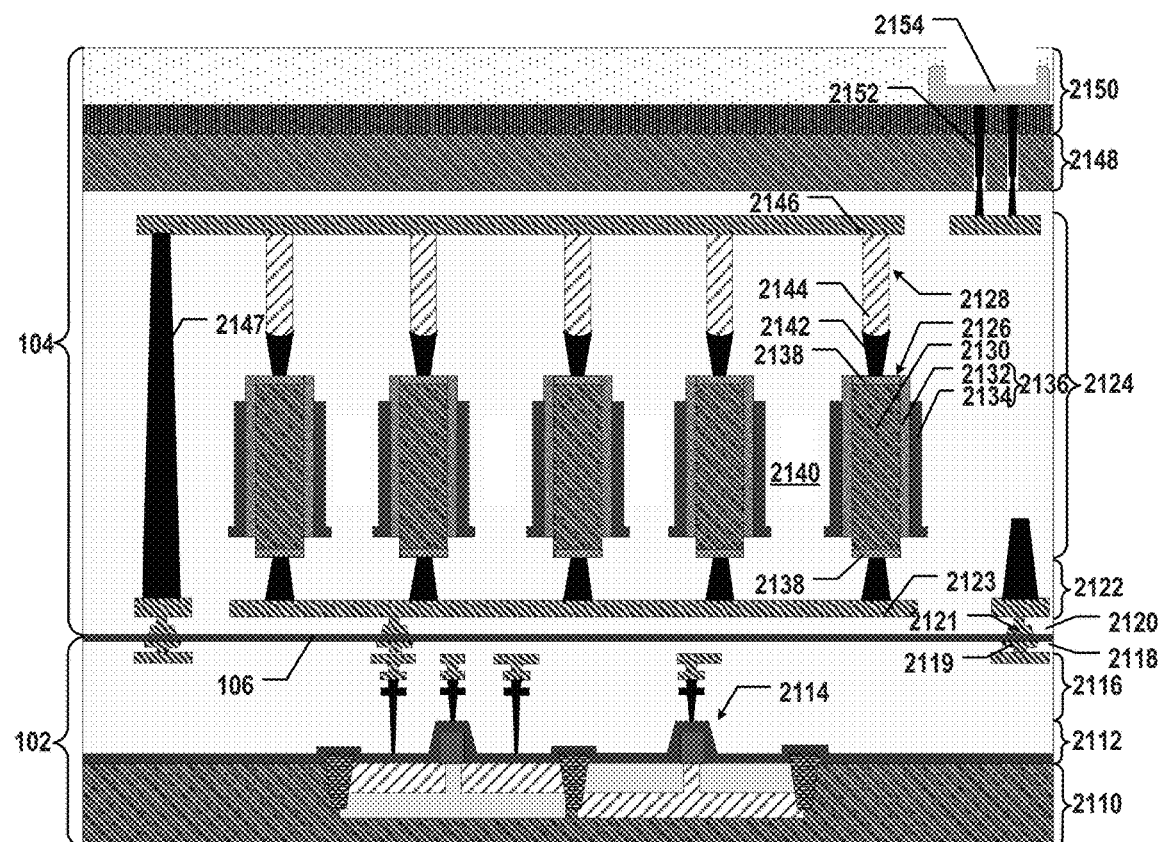
FIG. 21 illustrates a side view of a cross-section of yet another 3D memory device including vertical transistors, according to some aspects of the present disclosure.

FIG. 21 illustrates a side view of a cross-section of yet another 3D memory device 2100 including vertical transistors, according to some aspects of the present disclosure. 3D memory device 2100 may be one example of memory device 2000 including double-gate vertical transistors in which gate structures abut two sides of semiconductor bodies in the plan view. It is understood that FIG. 21 is for illustrative purposes only and may not necessarily reflect the actual device structure (e.g., interconnections) in practice. As one example of 3D memory device 100 described above with respect to FIG. 1A, 3D memory device 2100 is a bonded chip including first semiconductor structure 102 and second semiconductor structure 104 stacked over first semiconductor structure 102. First and second semiconductor structures 102 and 104 are jointed at bonding interface 106 therebetween, according to some implementations. As shown in FIG. 21, first semiconductor structure 102 can include a substrate 2110, which can include silicon (e.g., single crystalline silicon, c-Si), SiGe, GaAs, Ge, SOI, or any other suitable materials.

First semiconductor structure 102 can include peripheral circuits 2112 on substrate 2110. In some implementations, peripheral circuits 2112 include a plurality of transistors 2114 (e.g., planar transistors and/or 3D transistors). Trench isolations (e.g., shallow trench isolations (STIs)) and doped regions (e.g., wells, sources, and drains of transistors 2114) can be formed on or in substrate 2110 as well.

In some implementations, first semiconductor structure 102 further includes an interconnect layer 2116 above peripheral circuits 2112 to transfer electrical signals to and from peripheral circuits 2112. Interconnect layer 2116 can include a plurality of interconnects (also referred to herein as "contacts"), including lateral interconnect lines and VIA contacts. Interconnect layer 1716 can further include one or more ILD layers in which the interconnect lines and via contacts can form. That is, interconnect layer 2116 can include interconnect lines and via contacts in multiple ILD layers. In some implementations, peripheral circuits 2112 are coupled to one another through the interconnects in interconnect layer 2116. The interconnects in interconnect layer 2116 can include conductive materials including, but not limited to, W, Co, Cu, Al, doped silicon, silicides, or any combination thereof. The ILD layers can be formed with dielectric materials including, but not limited to, silicon oxide, silicon nitride, silicon oxynitride, low-k dielectrics, or any combination thereof.

As shown in FIG. 21, first semiconductor structure 102 can further include a bonding layer 2118 at bonding interface 106 and above interconnect layer 2116 and peripheral circuits 2112. Bonding layer 2118 can include a plurality of bonding contacts 2119 and dielectrics electrically isolating bonding contacts 2119. Bonding contacts 2119 can include conductive materials, such as Cu. The remaining area of bonding layer 2118 can be formed with dielectric materials, such as silicon oxide. Bonding contacts 2119 and surrounding dielectrics in bonding layer 2118 can be used for hybrid bonding. Similarly, as shown in FIG. 21, second semiconductor structure 104 can also include a bonding layer 2120 at bonding interface 106 and above bonding layer 2118 of first semiconductor structure 102. Bonding layer 2120 can include a plurality of bonding contacts 2121 and dielectrics electrically isolating bonding contacts 2121. Bonding contacts 2121 can include conductive materials, such as Cu. The remaining area of bonding layer 2120 can be formed with dielectric materials, such as silicon oxide. Bonding contacts 2121 and surrounding dielectrics in bonding layer 2120 can be used for hybrid bonding. Bonding contacts 2121 are in contact with bonding contacts 2119 at bonding interface 106, according to some implementations. In some implementations, bonding layer 2120 includes a dielectric layer opposing DRAM cells 2124 with bit line 2123 positioned between the dielectric layer and DRAM cells 2124, as shown in FIG. 21. The dielectric layer can include bonding interface 106 having bonding contacts 2121.

Second semiconductor structure 104 can be bonded on top of first semiconductor structure 102 in a face-to-face manner at bonding interface 106. In some implementations, bonding interface 106 is disposed between bonding layers 2120 and 2118 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some implementations, bonding interface 106 is the place at which bonding layers 2120 and 2118 are met and bonded. In practice, bonding interface 106 can be a layer with a certain thickness that includes the top surface of bonding layer 2118 of first semiconductor structure 102 and the bottom surface of bonding layer 2120 of second semiconductor structure 104.

In some implementations, second semiconductor structure 104 further includes an interconnect layer 2122 including bit lines 2123 above bonding layer 2120 to transfer electrical signals. Interconnect layer 2122 can include a plurality of interconnects, such as MEOL interconnects and BEOL interconnects. In some implementations, the interconnects in interconnect layer 2122 also include local interconnects, such as bit lines 2123 (e.g., an example of bit lines 2006 in FIG. 20) and word line contacts (not shown). Interconnect layer 2122 can further include one or more ILD layers in which the interconnect lines and via contacts can form. The interconnects in interconnect layer 2122 can include conductive materials including, but not limited to, W, Co, Cu, Al, doped silicon, silicides, or any combination thereof. The ILD layers can be formed with dielectric materials including, but not limited to, silicon oxide, silicon nitride, silicon oxynitride, low-k dielectrics, or any combination thereof. In some implementations, peripheral circuits 2112 include a word line driver/row decoder coupled to the word line contacts in interconnect layer 2122 through bonding contacts 2121 and 2119 in bonding layers 2120 and 2118 and interconnect layer 2116. In some implementations, peripheral circuits 2112 include a bit line driver/column decoder coupled to bit lines 2123 and the bit line contacts in interconnect layer 2122 through bonding contacts 2121 and 2119 in bonding layers 2120 and 2118 and interconnect layer 2116. In some implementations, bit line 2123 is a metal bit line, as opposed to semiconductor bit lines (e.g., doped silicon bit lines). For example, bit line 2123 may include W, Co, Cu, Al, or any other suitable metals having higher conductivities than doped silicon. In some implementations, the bit line contact is an ohmic contact, such as a metal silicide contact, as opposed to a Schottky contact. For example, the bit line contact may include metal silicides, such as WSi, CoSi, CuSi, AlSi, or any other suitable metal silicides having higher conductivities than doped silicon.

In some implementations, second semiconductor structure 104 includes a DRAM device in which memory cells are provided in the form of an array of DRAM cells 2124 (e.g., an example of memory cells 2002 in FIG. 20) above interconnect layer 2122 and bonding layer 2120. That is, interconnect layer 2122 including bit lines 2123 can be disposed between bonding layer 2120 and array of DRAM cells 2124. It is understood that the cross-section of 3D memory device 2100 in FIG. 21 may be made along the bit line direction (the y-direction), and one bit line 2123 in interconnect layer 2122 extending laterally in the y-direction may be coupled to a column of DRAM cells 2124.

Each DRAM cell 2124 can include a vertical transistor 2126 (e.g., an example of vertical transistors 210 in FIG. 2) and capacitor 2128 (e.g., an example of storage unit 212 in FIG. 2) coupled to the vertical transistor 2126. DRAM cell 2124 can be a 1T1C cell consisting of one transistor and one capacitor. It is understood that DRAM cell 2124 may be of any suitable configurations, such as 2T1C cell, 3T1C cell, etc.

Vertical transistor 2126 can be a MOSFET used to switch a respective DRAM cell 2124. In some implementations, vertical transistor 2126 includes a semiconductor body 2130 (the active region in which channels can form) extending vertically (in the z-direction), and a gate structure 2136 in contact with two opposite sides of semiconductor body 2130 in the bit line direction (the y-direction). As described above, as in a double-gate vertical transistor, semiconductor body 2130 can have a cuboid shape or a cylinder shape, and gate structure 2136 can abut two sides of semiconductor body 2130 in the plan view, for example, as shown in FIG. 21. Gate structure 2136 includes a gate electrode 2134 and a gate dielectric 2132 laterally between gate electrode 2134 and semiconductor body 2130 in the bit line direction, according to some implementations. In some implementations, gate dielectric 2132 abuts two sides of semiconductor body 2130, and gate electrode 2134 abuts gate dielectric 2132.

As shown in FIG. 21, in some implementations, semiconductor body 2130 has two ends (the upper end and lower end) in the vertical direction (the z-direction), and at least one end (e.g., the lower end in FIG. 21) extends beyond gate dielectric 2132 in the vertical direction (the z-direction) into ILD layers. In some implementations, one end (e.g., the upper end in FIG. 21) of semiconductor body 2130 is flush with the respective end (e.g., the upper end in FIG. 21) of gate dielectric 2132. In some implementations, both ends (the upper end and lower end) of semiconductor body 2130 extend beyond gate electrode 2134, respectively, in the vertical direction (the z-direction) into ILD layers. That is, semiconductor body 2130 can have a larger vertical dimension (e.g., the depth) than that of gate electrode 2134 (e.g., in the z-direction), and neither the upper end nor the lower end of semiconductor body 2130 is flush with the respective end of gate electrode 2134. Thus, short circuits between bit lines 2123 and word lines/gate electrodes 2134 or between word lines/gate electrodes 2134 and capacitors 2128 can be avoided. Vertical transistor 2126 can further include a source and a drain (both referred to as 2138 as their locations may be interchangeable) disposed at the two ends (the upper end and lower end) of semiconductor body 2130, respectively, in the vertical direction (the z-direction). In some implementations, one of source and drain 2138 (e.g., at the upper end in FIG. 21) is coupled to capacitor 2128, and the other one of source and drain 2138 (e.g., at the lower end in FIG. 21) is coupled to bit line 2123. That is, vertical transistor 2126 can have a first terminal in the positive z-direction and a second terminal opposite the first terminal in the negative z-direction, as shown in FIG. 21. In some implementations, a metal bit line (e.g., bit line 2123 made of a metal material) is coupled to the second terminal of vertical transistor 2126 via an ohmic contact (e.g., a bit line contact made of a metal silicide material).

In some implementations, semiconductor body 2130 includes semiconductor materials, such as single crystalline silicon, polysilicon, amorphous silicon, Ge, any other semiconductor materials, or any combinations thereof. In one example, semiconductor body 2130 may include single crystalline silicon. Source and drain 2138 can be doped with N-type dopants (e.g., P or As) or P-type dopants (e.g., B or Ga) at a desired doping level. In some implementations, a silicide layer, such as a metal silicide layer, is formed between source/drain 2138 of vertical transistor 2126 and bit line 2123 as the bit line contact or between source/drain 1738 of vertical transistor 2126 and the first electrode of capacitor 2128 as capacitor contact 2142 to reduce the contact resistance. In some implementations, gate dielectric 2132 includes dielectric materials, such as silicon oxide, silicon nitride, or high-k dielectrics including, but not limited to, $Al_2O_3$, $HfO_2$, $Ta_2O_5$, $ZrO_2$, $TiO_2$, or any combination thereof. In some implementations, gate electrode 2134 includes conductive materials including, but not limited to W, Co, Cu, Al, TiN, TaN, polysilicon, silicides, or any combination thereof. In some implementations, gate electrode 2134 includes multiple conductive layers, such as a W layer over a TiN layer. In one example, gate structure 2136 may be a "gate oxide/gate poly" gate in which gate dielectric 2132 includes silicon oxide and gate electrode 2134 includes doped polysilicon. In another example, gate structure 2136 may be an HKMG in which gate dielectric 2132 includes a high-k dielectric and gate electrode 2134 includes a metal.

As described above, since gate electrode 2134 may be part of a word line or extend in the word line direction as a word line, second semiconductor structure 104 of 3D memory device 2100 can also include a plurality of word lines (e.g., an example of word lines 2004 in FIG. 20, referred to as 2134 as well) each extending in the word line direction. Each word line 2134 can be coupled to a row of DRAM cells 2124. That is, bit line 2123 and word line 2134 can extend in two perpendicular lateral directions, and semiconductor body 2130 of vertical transistor 2126 can extend in the vertical direction perpendicular to the two lateral directions in which bit line 2123 and word line 2134 extend. Word lines 2134 are in contact with word line contacts (not shown), according to some implementations. In some implementations, word lines 2134 include conductive materials including, but not limited to W, Co, Cu, Al, TiN, TaN, polysilicon, silicides, or any combination thereof. In some implementations, word line 2134 includes multiple conductive layers, such as a W layer over a TiN layer.

As shown in FIG. 21, vertical transistor 2126 extends vertically through and contacts word lines 2134, and source or drain 2138 of vertical transistor 2126 at the lower end thereof is in contact with bit line 2123 (or bit line contact if any), according to some implementations. Accordingly, word lines 2134 and bit lines 2123 can be disposed in different planes in the vertical direction due to the vertical arrangement of vertical transistor 2126, which simplifies the routing of word lines 2134 and bit lines 2123. In some implementations, bit lines 2123 are disposed vertically between bonding layer 2120 and word lines 2134, and word lines 2134 are disposed vertically between bit lines 2123 and capacitors 2128. Word lines 2134 can be coupled to peripheral circuits 2112 in first semiconductor structure 102 through word line contacts in interconnect layer 2122, bonding contacts 2121 and 2119 in bonding layers 2120 and 2118, and the interconnects in interconnect layer 2116. Similarly, bit lines 2123 in interconnect layer 2122 can be coupled to peripheral circuits 2112 in first semiconductor structure 102 through bonding contacts 2121 and 2119 in bonding layers 2120 and 2118 and the interconnects in interconnect layer 2116.

In some implementations, second semiconductor structure 104 further includes a plurality of air gaps 2140 each disposed laterally between adjacent word lines 2134. Each air gap 2140 can be a trench extending in the word line direction (e.g., the x-direction) in parallel with word lines 2134 to separate adjacent rows of vertical transistors 2126. As described below with respect to the fabrication process, air gaps 2140 may be formed due to the relatively small pitches of word lines 2134 (and rows of DRAM cells 2124) in the bit line direction (e.g., the y-direction). On the other hand, the relatively large dielectric constant of air in air gaps 2140 (e.g., about 4 times of the dielectric constant of silicon oxide) can improve the insulation effect between word lines 2134 (and rows of DRAM cells 2124) compared with some dielectrics (e.g., silicon oxide).

As shown in FIG. 21, in some implementations, capacitor 2128 includes a first electrode above and coupled to source or drain 2138 of vertical transistor 2126, e.g., the upper end of semiconductor body 2130, via a capacitor contact 2142. In some implementations, capacitor contact 2142 is an ohmic contact, such as a metal silicide contact, as opposed to a Schottky contact. For example, capacitor contact 2142 may include metal silicides, such as WSi, CoSi, CuSi, AlSi, or any other suitable metal silicides having higher conductivities than doped silicon. Capacitor 2128 can also include a capacitor dielectric above and in contact with the first electrode, and a second electrode above and in contact with the capacitor dielectric. That is, capacitor 2128 can be a vertical capacitor in which the electrodes and capacitor dielectric are stacked vertically (in the z-direction), and the capacitor dielectric can be sandwiched between the electrodes. In some implementations, each first electrode is coupled to source or drain 2138 of a respective vertical transistor 2126 in the same DRAM cell, while all second electrodes are coupled to a common plate 2146 coupled to the ground, e.g., a common ground. Capacitor 2128 can have a first end in the negative z-direction and a second end opposite the first end in the positive z-direction, as shown in FIG. 21. In some implementations, the first end of capacitor 2128 is coupled to the first terminal of vertical transistor 2126 via an ohmic contact (e.g., capacitor contact 2142 made of a metal silicide material). As shown in FIG. 21, second semiconductor structure 104 can further include a capacitor contact 2147 (e.g., a conductor) in contact with common plate 2146 for coupling capacitors 2128 to peripheral circuits 2112 or to the ground directly. In some implementations, capacitor contact 2147 (e.g., a conductor) extends in the z-direction from the dielectric layer of bonding layer 2120 to couple to the second end of capacitor 2128 via common plate 2146, as shown in FIG. 21. In some implementation, the ILD layer in which capacitors 2128 are formed has the same dielectric material as the two ILD layers into which semiconductor body 2130 extends, such as silicon oxide.

It is understood that the structure and configuration of capacitor 2128 are not limited to the example in FIG. 21 and may include any suitable structure and configuration, such as a planar capacitor, a stack capacitor, a multi-fins capacitor, a cylinder capacitor, a trench capacitor, or a substrate-plate capacitor. In some implementations, the capacitor dielectric includes dielectric materials, such as silicon oxide, silicon nitride, or high-k dielectrics including, but not limited to, $Al_2O_3$, $HfO_2$, $Ta_2O_5$, $ZrO_2$, $TiO_2$, or any combination thereof. It is understood that in some examples, capacitor 2128 may be a ferroelectric capacitor used in a FRAM cell, and the capacitor dielectric may be replaced by a ferroelectric layer having ferroelectric materials, such as PZT or SBT. In some implementations, the electrodes include conductive materials including, but not limited to W, Co, Cu, Al, TiN, TaN, polysilicon, silicides, or any combination thereof.

As shown in FIG. 21, vertical transistor 2126 extends vertically through and contacts word lines 2134, source or drain 2138 of vertical transistor 2126 at the lower end thereof is in contact with bit line 2123 directly or through the bit line contact, and source or drain 2138 of vertical transistor 2126 at the upper end thereof is coupled to capacitor 2128, according to some implementations. That is, bit line 2123 and capacitor 2128 can be disposed in different planes in the vertical direction and coupled to opposite ends of vertical transistor 2126 of DRAM cell 2124 in the vertical direction due to the vertical arrangement of vertical transistor 2126. In some implementations, bit line 2123 and capacitor 2128 are disposed on opposite sides of vertical transistor 2126 in the vertical direction, which simplifies the routing of bit lines 2123 and reduces the coupling capacitance between bit lines 2123 and capacitors 2128 compared with DRAM cells in which the bit lines and capacitors are disposed on the same side of the planar transistors.

As shown in FIG. 21, in some implementations, vertical transistors 2126 are disposed vertically between capacitors 2128 and bonding interface 106. That is, vertical transistors 2126 can be arranged closer to peripheral circuits 2114 of first semiconductor structure 102 and bonding interface 106 than capacitors 2128. Since bit lines 2123 and capacitors 2128 are coupled to opposite ends of vertical transistors 2126, as described above, bit lines 2123 (as part of interconnect layer 2122) are disposed vertically between vertical transistors 2126 and bonding interface 106, according to some implementations. As a result, interconnect layer 2122 including bit lines 2123 can be arranged close to bonding interface 106 to reduce the interconnect routing distance and complexity.

In some implementations, second semiconductor structure 104 further includes a substrate 2148 disposed above DRAM cells 2124. As described below with respect to the fabrication process, substrate 2148 can be part of a carrier wafer. It is understood that in some examples, substrate 2148 may not be included in second semiconductor structure 104.

As shown in FIG. 21, second semiconductor structure 104 can further include a pad-out interconnect layer 2150 above substrate 2148 and DRAM cells 2124. Pad-out interconnect layer 2150 can include interconnects, e.g., contact pads 2154, in one or more ILD layers. Pad-out interconnect layer 2150 and interconnect layer 2122 can be formed on opposite sides of DRAM cells 2124. Capacitors 2128 are disposed vertically between vertical transistors 2126 and pad-out interconnect layer 2150, according to some implementations. In some implementations, the interconnects in pad-out interconnect layer 2150 can transfer electrical signals between 3D memory device 2100 and outside circuits, e.g., for pad-out purposes. In some implementations, second semiconductor structure 104 further includes one or more contacts 2152 extending through substrate 2148 and part of pad-out interconnect layer 2150 to couple pad-out interconnect layer 2150 to DRAM cells 2124 and interconnect layer 2122. As a result, peripheral circuits 2112 can be coupled to DRAM cells 2124 through interconnect layers 2116 and 2122 as well as bonding layers 2120 and 2118, and peripheral circuits 2112 and DRAM cells 2124 can be coupled to outside circuits through contacts 2152 and pad-out interconnect layer 2150. Contact pads 2154 and contacts 2152 can include conductive materials including, but not limited to, W, Co, Cu, Al, silicides, or any combination thereof. In one example, contact pad 2154 may include Al, and contact 2152 may include W. In some implementations, contact 2152 includes a via surrounded by a dielectric spacer (e.g., having silicon oxide) to electrically separate the via from substrate 2148. Depending on the thickness of substrate 2148, contact 2152 can be an ILV having a depth in the submicron-level (e.g., between 10 nm and 1 µm), or a TSV having a depth in the micron- or tens micron-level (e.g., between 1 µm and 100 µm).

Although not shown, it is understood that the pad-out of 3D memory devices is not limited to from second semiconductor structure 104 having DRAM cells 2124 as shown in FIG. 21 and may be from first semiconductor structure 102 having peripheral circuit 2112 in the similar manner as described above with respect to FIG. 6B. Although not shown, it is also understood that the air gaps between word lines 2134 may be partially or fully filled with dielectrics in the similar manner as described above with respect to FIG. 6E. Although not shown, it is further understood that more than one array of DRAM cells 2124 may be stacked over one another to vertically scale up the number of DRAM cells 2124 in the similar manner as described above with respect to FIG. 7.

Figure 27:
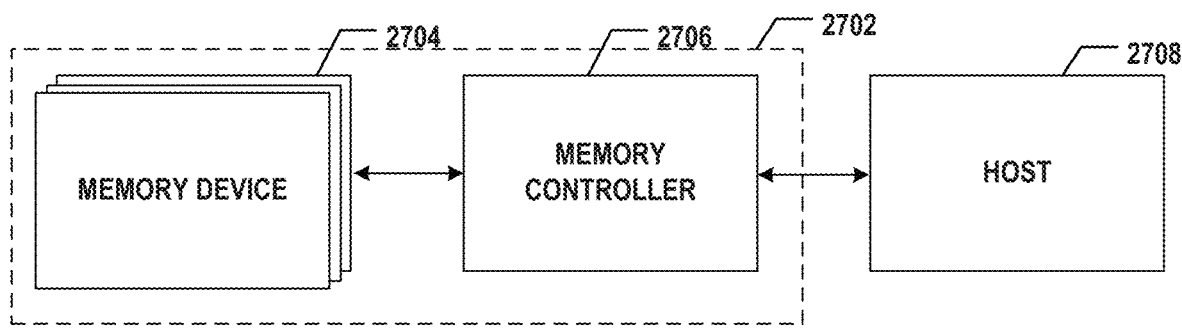
FIG. 27 illustrates a block diagram of an exemplary system having a memory device, according to some aspects of the present disclosure.

FIG. 27 illustrates a block diagram of a system 2700 having a memory device, according to some aspects of the present disclosure. System 2700 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 27, system 2700 can include a host 2708 and a memory system 2702 having one or more memory devices 2704 and a memory controller 2706. Host 2708 can be a processor of an electronic device, such as a central processing unit (CPU), or a system-on-chip (SoC), such as an application processor (AP). Host 2708 can be configured to send or receive the data to or from memory devices 2704.

Memory device 2704 can be any memory devices disclosed herein, such as 3D memory devices 100 and 101, memory devices 200, 500, 800, 1600, and 2000, and 3D memory devices 600, 601, 603, 605, 607, 700, 900, 1700, and 2100. In some implementations, memory device 2704 includes an array of memory cells each including a vertical transistor, as described above in detail.

Memory controller 2706 is coupled to memory device 2704 and host 2708 and is configured to control memory device 2704, according to some implementations. Memory controller 2706 can manage the data stored in memory device 2704 and communicate with host 2708. Memory controller 2706 can be configured to control operations of memory device 2704, such as read, write, and refresh operations. Memory controller 2706 can also be configured to manage various functions with respect to the data stored or to be stored in memory device 2704 including, but not limited to refresh and timing control, command/request translation, buffer and schedule, and power management. In some implementations, memory controller 2706 is further configured to determines the maximum memory capacity that the computer system can use, the number of memory banks, memory type and speed, memory particle data depth and data width, and other important parameters. Any other suitable functions may be performed by memory controller 2706 as well. Memory controller 2706 can communicate with an external device (e.g., host 2708) according to a particular communication protocol. For example, memory controller 2706 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 22A:
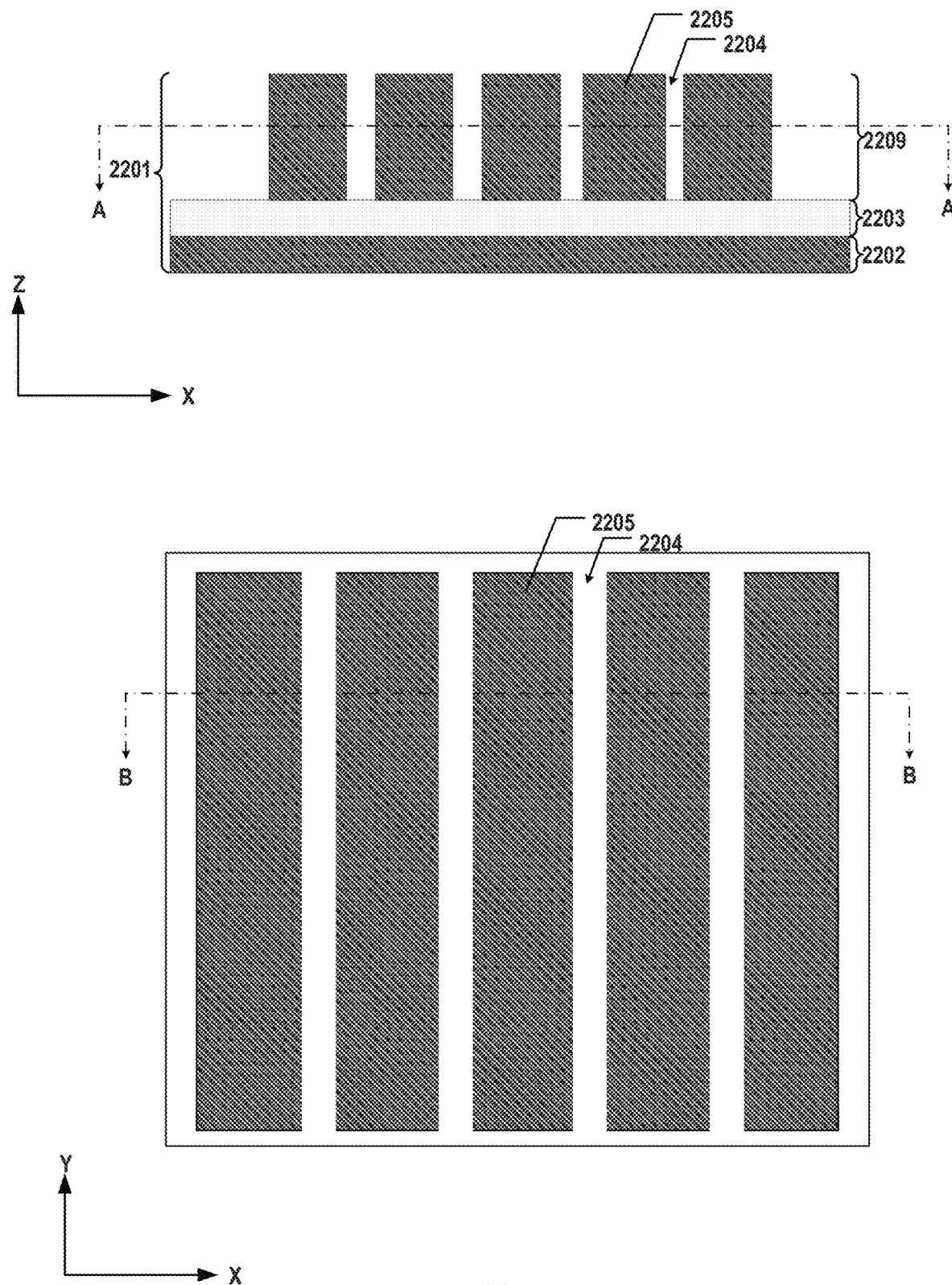
FIGS. 22A-22M illustrate a fabrication process for forming yet another 3D memory device including vertical transistors, according to some aspects of the present disclosure.
Figure 22B:
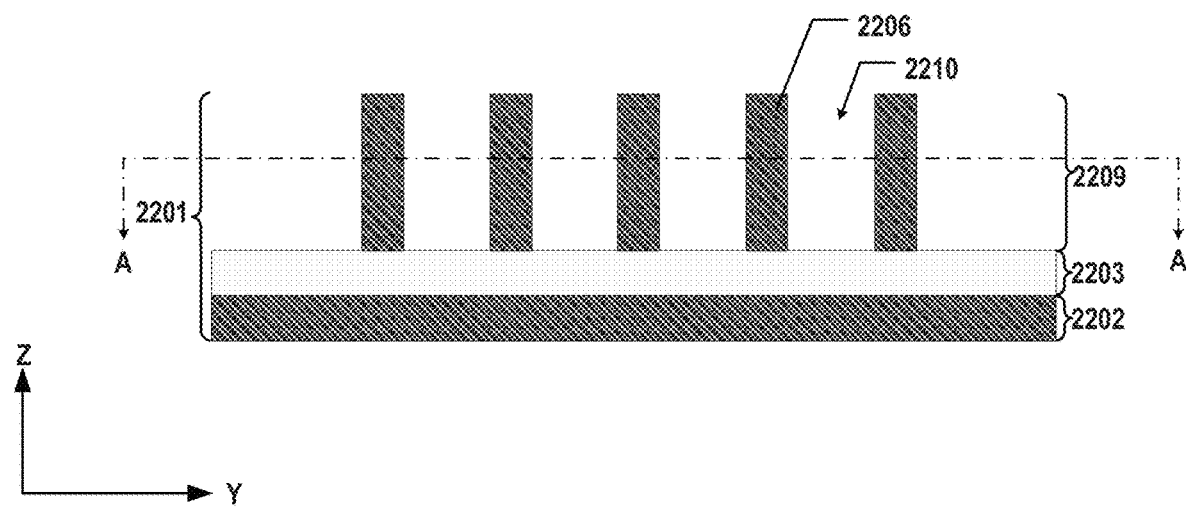
Figure 22B:
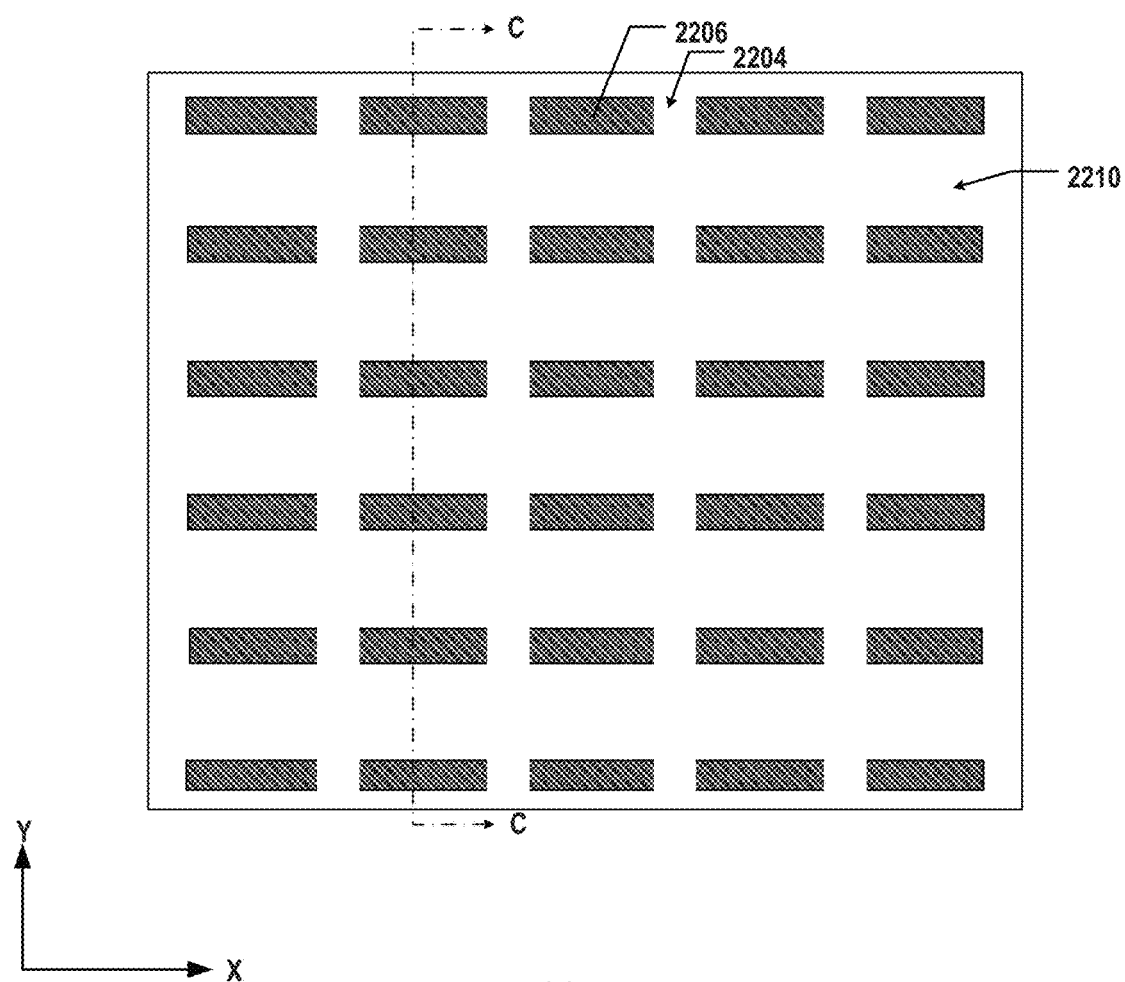
Figure 22C:
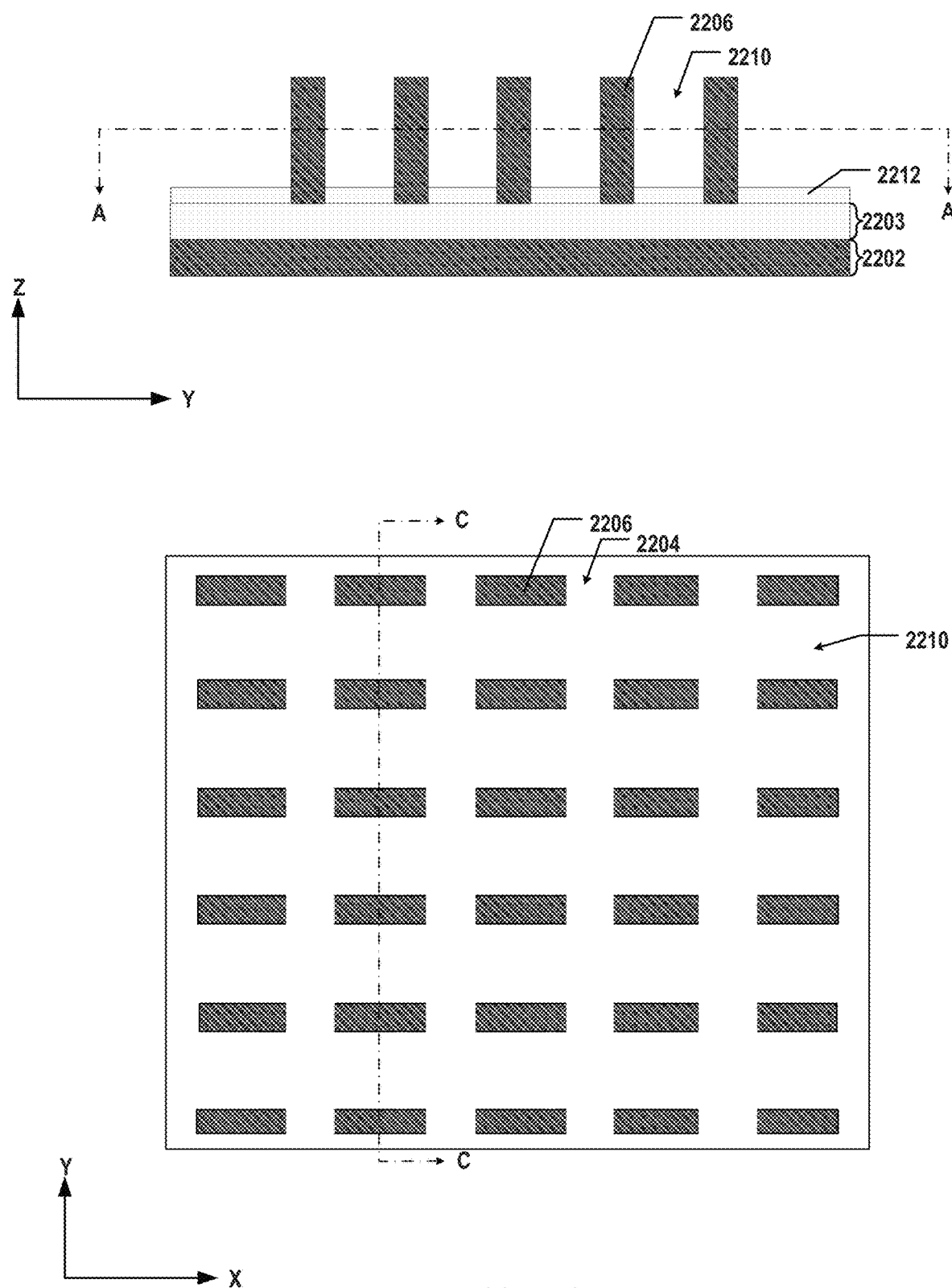
Figure 22D:
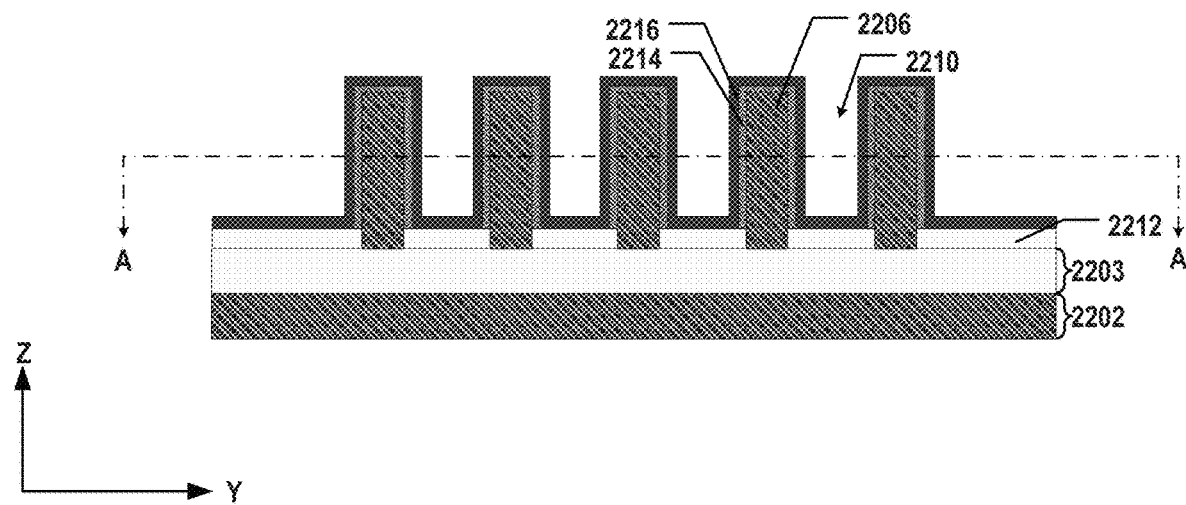
Figure 22D:
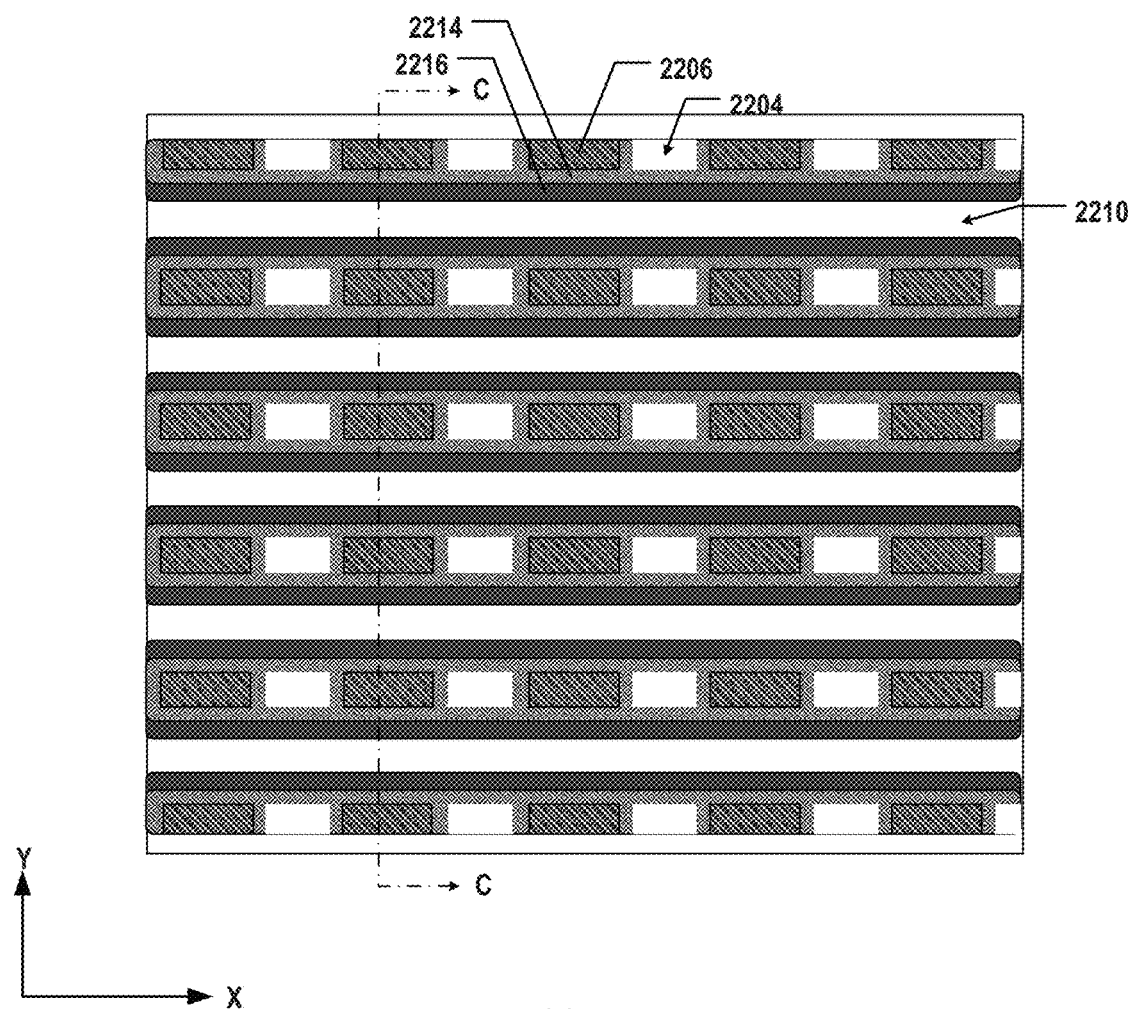
Figure 22E:
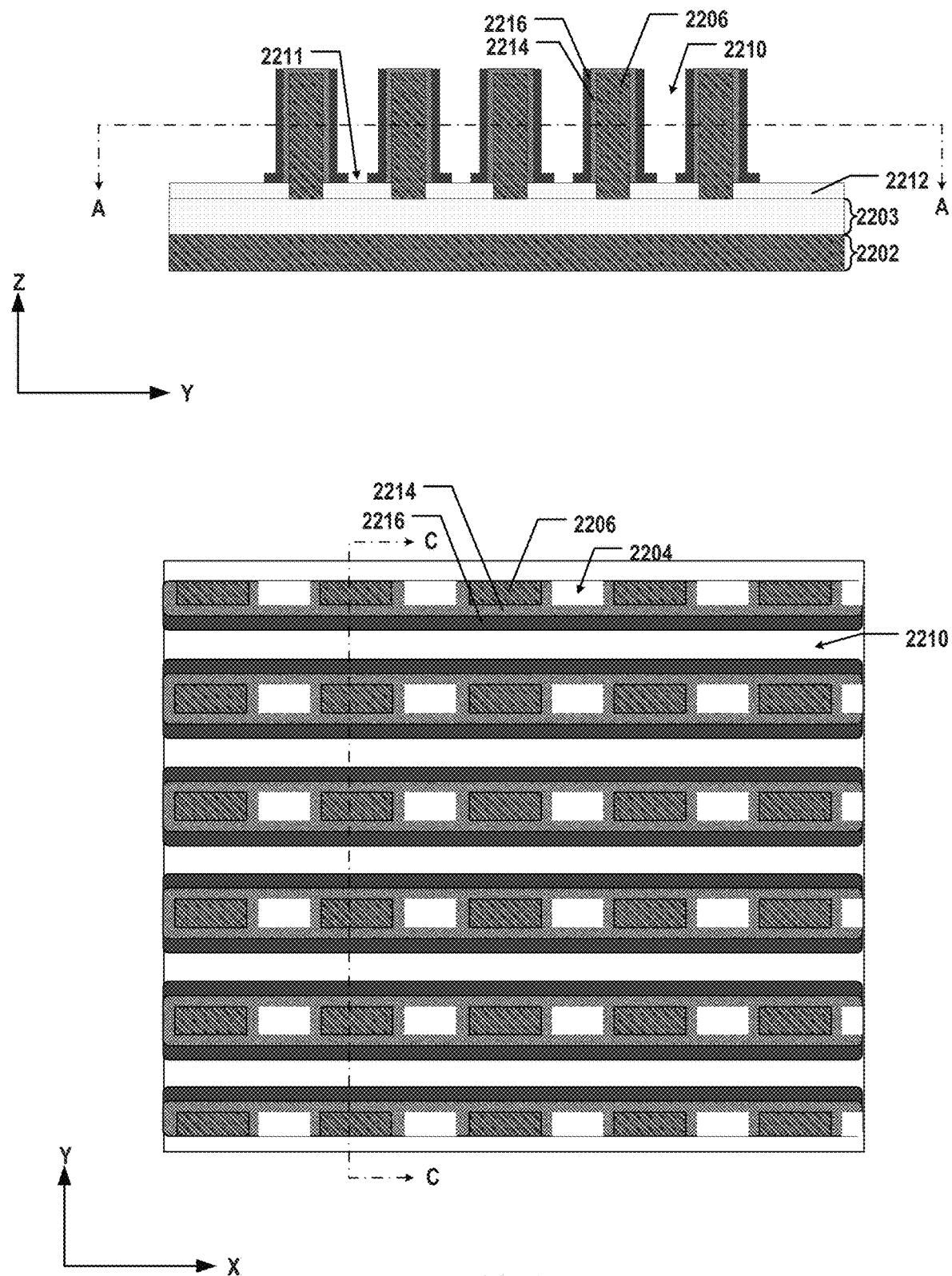
Figure 22F:
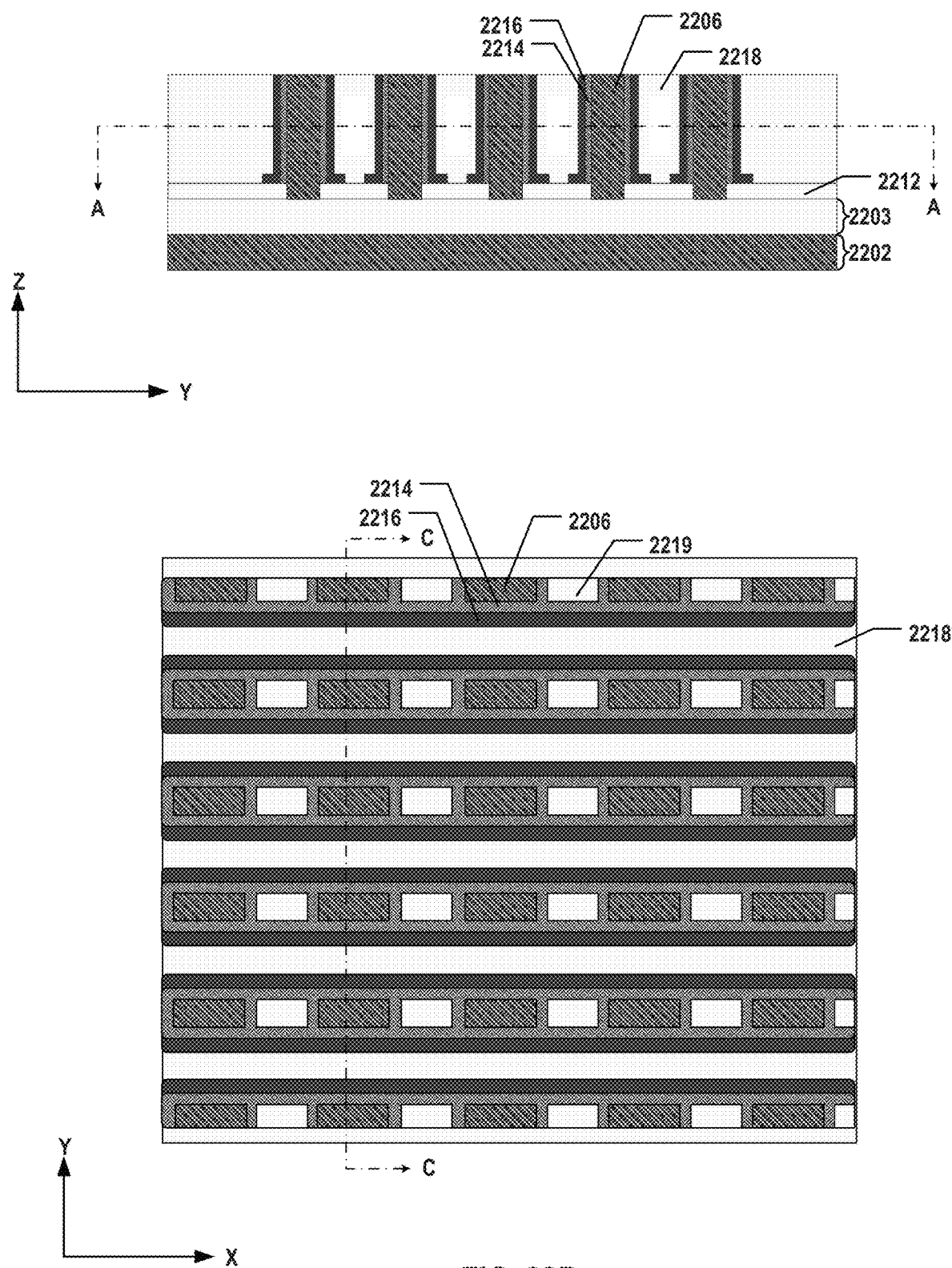
Figure 22G:
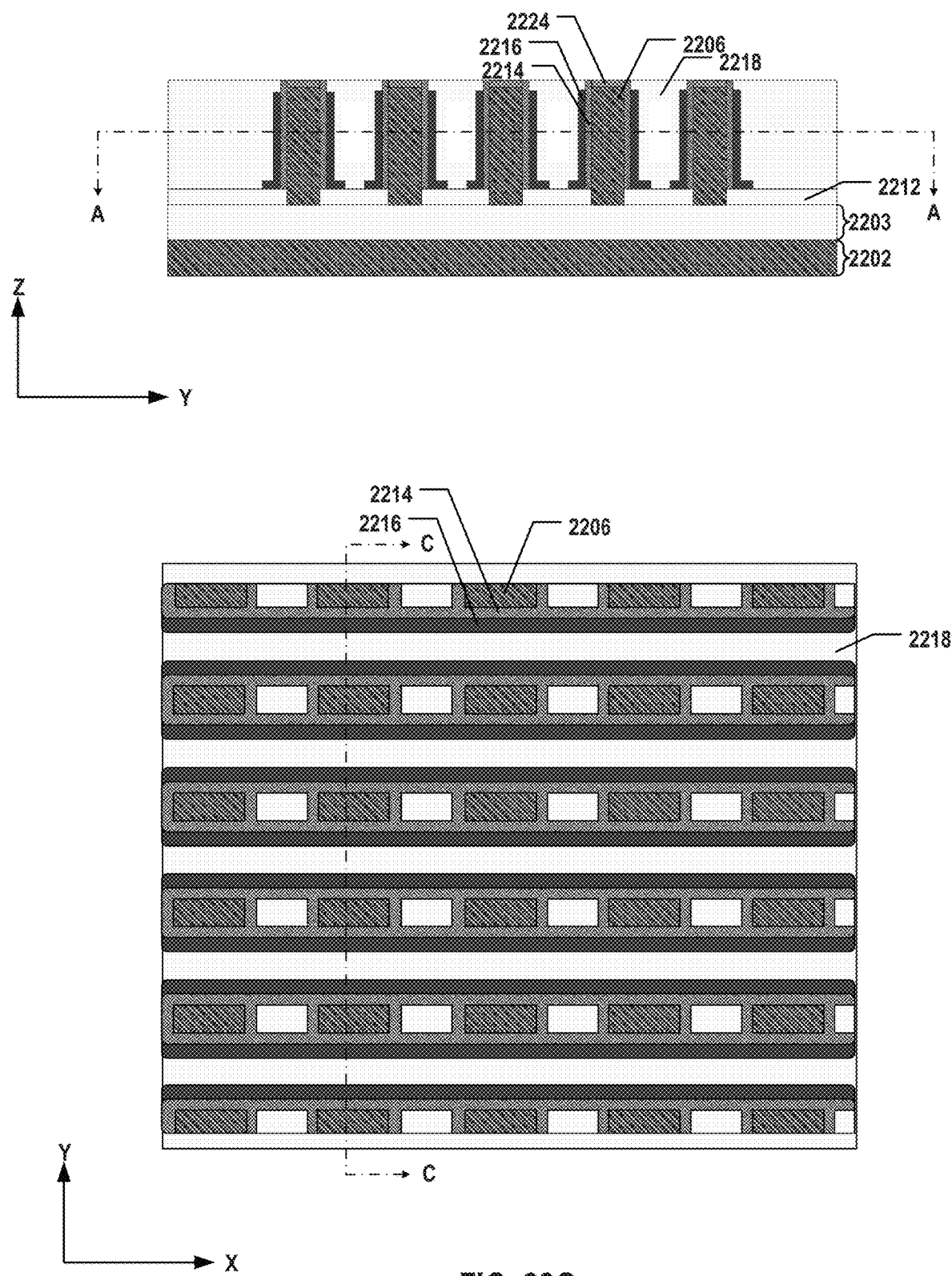
Figure 22H:
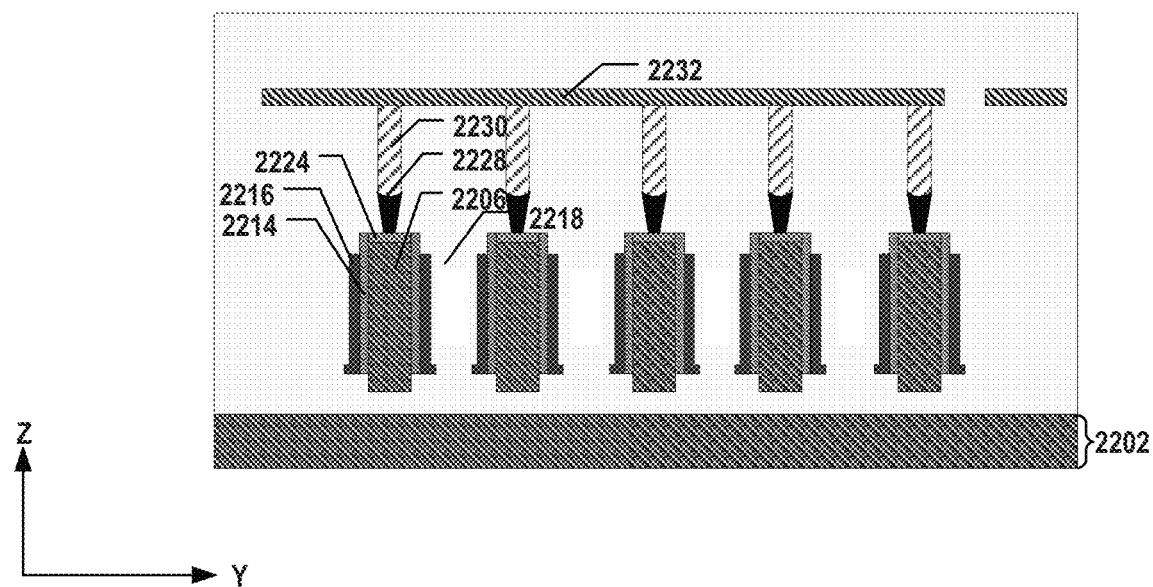
Figure 22I:
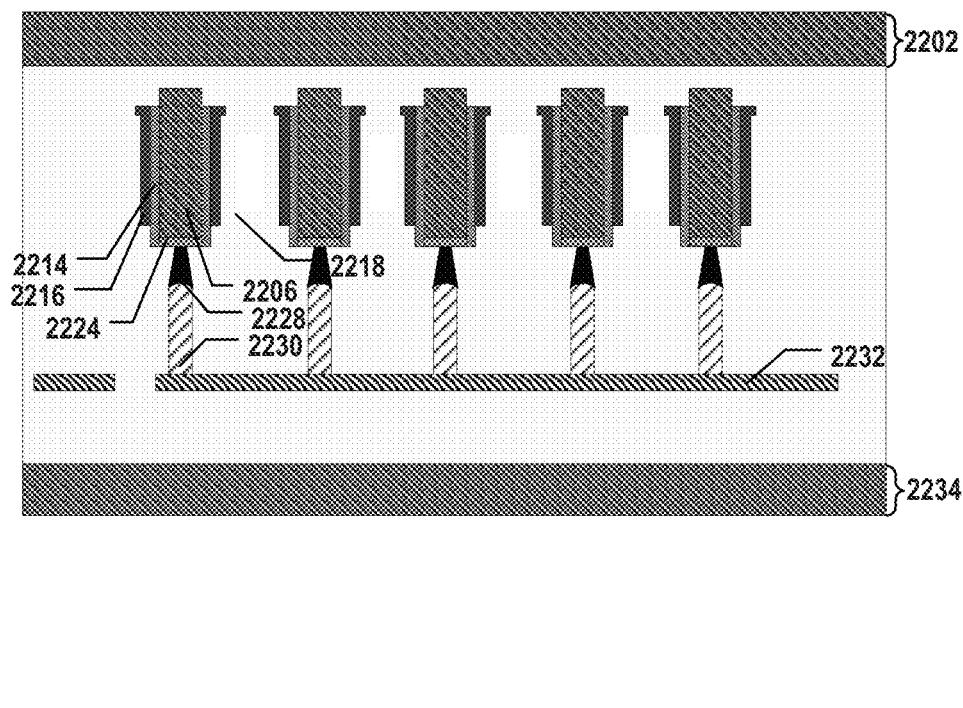
Figure 22J:
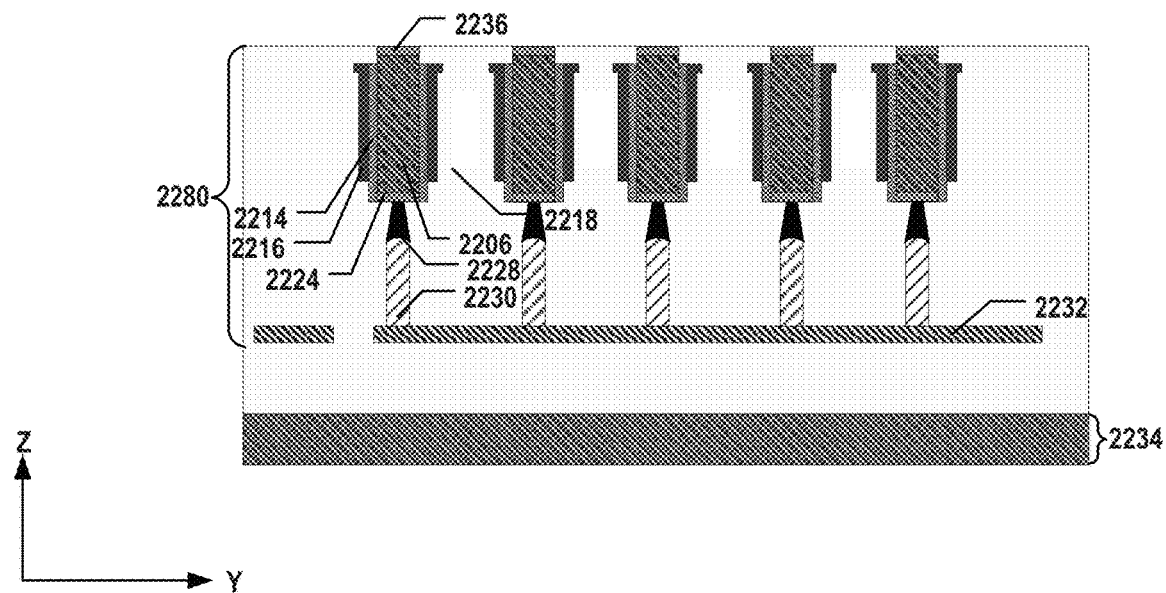
Figure 22K:
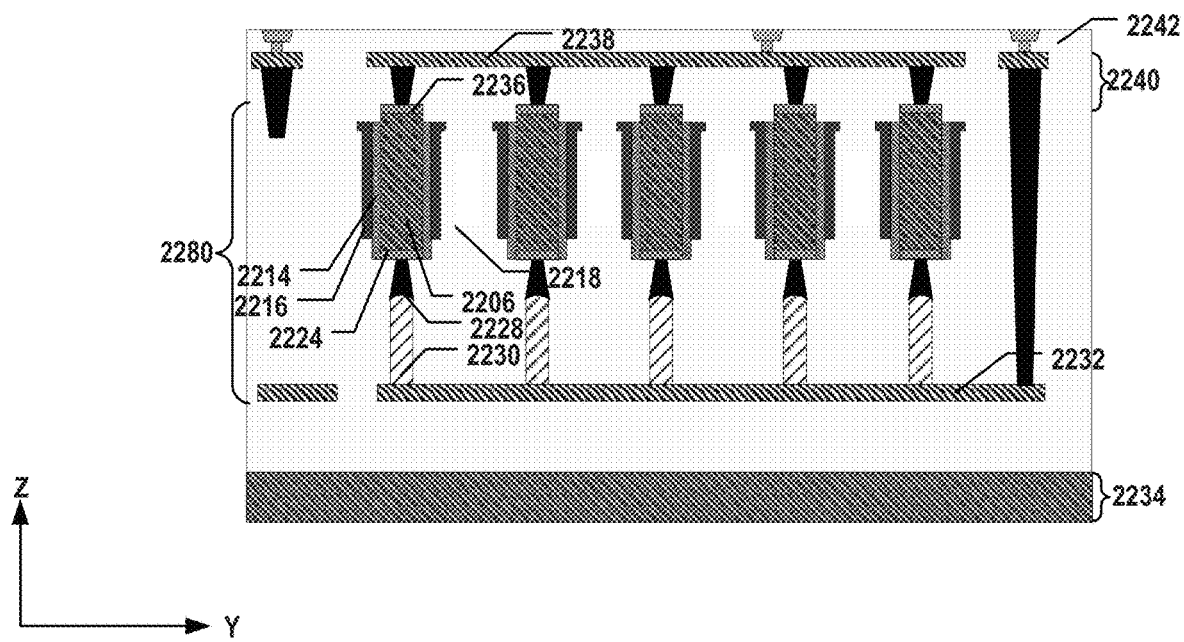

FIGS. 10A-10M illustrate a fabrication process for forming a 3D memory device including vertical transistors, according to some aspects of the present disclosure. FIGS. 11A-11I illustrate a fabrication process for forming another 3D memory device including vertical transistors, according to some aspects of the present disclosure. FIGS. 12A-12H illustrate a fabrication process for forming still another 3D memory device including vertical transistors, according to some aspects of the present disclosure. FIGS. 13A-13H illustrate a fabrication process for forming yet another 3D memory device including vertical transistors, according to some aspects of the present disclosure. FIGS. 14A-14E illustrate a fabrication process for forming yet another 3D memory device including vertical transistors, according to some aspects of the present disclosure. FIGS. 15A-15D illustrate a fabrication process for forming yet another 3D memory device including vertical transistors, according to some aspects of the present disclosure. FIGS. 19A-19M illustrate a fabrication process for forming yet another 3D memory device including vertical transistors, according to some aspects of the present disclosure. FIGS. 22A-22M illustrate a fabrication process for forming yet another 3D memory device including vertical transistors, according to some aspects of the present disclosure. FIG. 23 illustrates a flowchart of a method 2300 for forming a 3D memory device including vertical transistors, according to some aspects of the present disclosure. Examples of the 3D memory devices depicted in FIGS. 10A-10M include 3D memory devices 600 and 601 depicted in FIGS. 6A and 6B. Examples of the 3D memory devices depicted in FIGS. 11A-11I include 3D memory device 900 depicted in FIG. 9. Examples of the 3D memory devices depicted in FIGS. 12A-12H include 3D memory device 603 depicted in FIG. 6C. Examples of the 3D memory devices depicted in FIGS. 13A-13H include 3D memory device 605 depicted in FIG. 6D. Examples of the 3D memory devices depicted in FIGS. 14A-14E and 15A-15D include 3D memory device 700 depicted in FIG. 7. Examples of the 3D memory devices depicted in FIGS. 19A-19M include 3D memory device 1700 depicted in FIG. 17. Examples of the 3D memory devices depicted in FIGS. 22A-22M include 3D memory device 2100 depicted in FIG. 21. FIGS. 10A-10M, 11A-11I, 12A-12H, 13A-13H, 14A-14E, 15A-15D, 19A-19M, 22A-22M, and 23 will be described together. It is understood that the operations shown in method 2300 are not exhaustive and that other operations can be performed as well before, after, or between any of the illustrated operations. Further, some of the operations may be performed simultaneously, or in a different order than shown in FIG. 2300.

In some implementations, a first semiconductor structure including a peripheral circuit is formed. As depicted in FIG. 10L or 19L, a first semiconductor structure including peripheral circuits is formed. In some implementations, a second semiconductor structure including a first array of memory cells and a plurality of bit lines coupled to the memory cells is formed. Each of the memory cells can include a vertical transistor, and a storage unit coupled to the vertical transistor. A respective one of the bit lines and a respective storage unit are coupled to opposite ends of each one of the memory cells vertically. As depicted in FIG. 10L, 11I, 12H, 13H, 19L, or 22L, a second semiconductor structure including an array of DRAM cells, each of which includes a vertical transistor, and a capacitor coupled to the vertical transistor, is formed. The second semiconductor structure also includes a plurality of bit lines coupled to the memory cells, and a respective one of the bit lines and a respective storage unit are coupled to opposite ends of each one of the memory cells vertically. In some implementations, the first semiconductor structure and the second semiconductor structure are bonded in a face-to-face manner, such that the first array of memory cells is coupled to the peripheral circuit across a bonding interface. As depicted in FIGS. 10L and 10M, 19L, or 22L, the first and second semiconductor structures are bonded in a face-to-face manner, such that the array of DRAM cells is coupled to the peripheral circuit across a bonding interface.

Referring to FIG. 23, method 2300 starts at operation 2302, in which a peripheral circuit is formed on a first substrate. The first substrate can include a silicon substrate. In some implementations, an interconnect layer is formed above the peripheral circuit. The interconnect layer can include a plurality of interconnects in one or more ILD layers.

As illustrated in FIG. 10L, a plurality of transistors 1042 are formed on a silicon substrate 1038. Transistors 1042 can be formed by a plurality of processes including, but not limited to, photolithography, dry/wet etch, thin film deposition, thermal growth, implantation, chemical mechanical polishing (CMP), and any other suitable processes. In some implementations, doped regions are formed in silicon substrate 1038 by ion implantation and/or thermal diffusion, which function, for example, as the source and drain of transistors 1042. In some implementations, isolation regions (e.g., STIs) are also formed in silicon substrate 1038 by wet/dry etch and thin film deposition. Transistors 1042 can form peripheral circuits 1040 on silicon substrate 1038.

As illustrated in FIG. 10L, an interconnect layer 1044 can be formed above peripheral circuits 1040 having transistors 1042. Interconnect layer 1044 can include interconnects of MEOL and/or BEOL in a plurality of ILD layers to make electrical connections with peripheral circuits 1040. In some implementations, interconnect layer 1044 includes multiple ILD layers and interconnects therein formed in multiple processes. For example, the interconnects in interconnect layers 1044 can include conductive materials deposited by one or more thin film deposition processes including, but not limited to, chemical vapor deposition (CVD), physical vapor deposition (PVD), atomic layer deposition (ALD), electroplating, electroless plating, or any combination thereof. Fabrication processes to form the interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 10L can be collectively referred to as interconnect layer 1044.

Method 2300 proceeds to operation 2304, as illustrated in FIG. 23, in which a first bonding layer is formed above the peripheral circuit (and the interconnect layer). The first bonding layer can include a first bonding contact. As illustrated in FIG. 10L, a bonding layer 1046 is formed above interconnect layer 1044 and peripheral circuits 1040. Bonding layer 1046 can include a plurality of bonding contacts 1047 surrounded by dielectrics. In some implementations, a dielectric layer (e.g., ILD layer) is deposited on the top surface of interconnect layer 1044 by one or more thin film deposition processes including, but not limited to, CVD, PVD, ALD, or any combination thereof. Bonding contacts 1047 then can be formed through the dielectric layer and in contact with the interconnects in interconnect layer 1044 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing a barrier layer, an adhesion layer, and/or a seed layer before depositing the conductor.

Method 2300 proceeds to operation 2306, as illustrated in FIG. 23, in which an array of memory cells each including a vertical transistor and a storage unit is formed on a second substrate. The second substrate can include a carrier substrate. The storage unit can include a capacitor or a PCM element. In some implementations, a capacitor is formed to be coupled to the vertical transistor in the respective memory cell.

Figure 24:
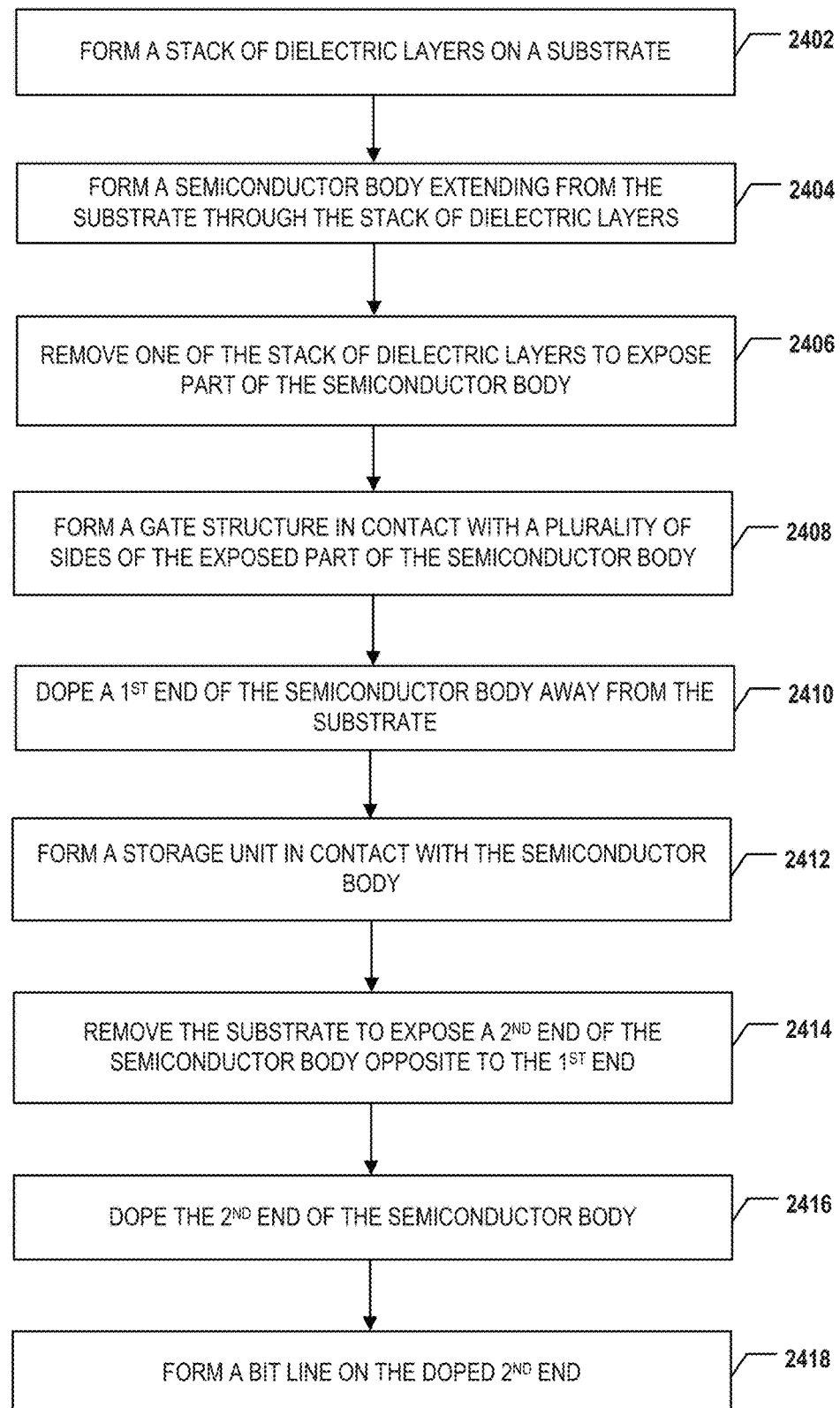
FIG. 24 illustrates a flowchart of a method for forming an array of memory cells each including a vertical transistor, according to some aspects of the present disclosure.

For example, FIG. 24 illustrates a flowchart of a method 2400 for forming an array of memory cells each including a vertical transistor, according to some aspects of the present disclosure. At operation 2402 in FIG. 24, a stack of dielectric layers is formed on a substrate. In some implementations, to form the stack of dielectric layers, three layers having a first dielectric, a second dielectric, and the first dielectric, respectively, are subsequently deposited on the substrate. The first dielectric can include silicon oxide, and the second dielectric can include silicon nitride. The layer having the second dielectric can act as a sacrificial layer sandwiched vertically between two layers having the first dielectric. The sacrificial layer can be removed by selectively etching against the two layers having the first dielectric and replaced with a conductive layer in the later processes.

Figure 10A:
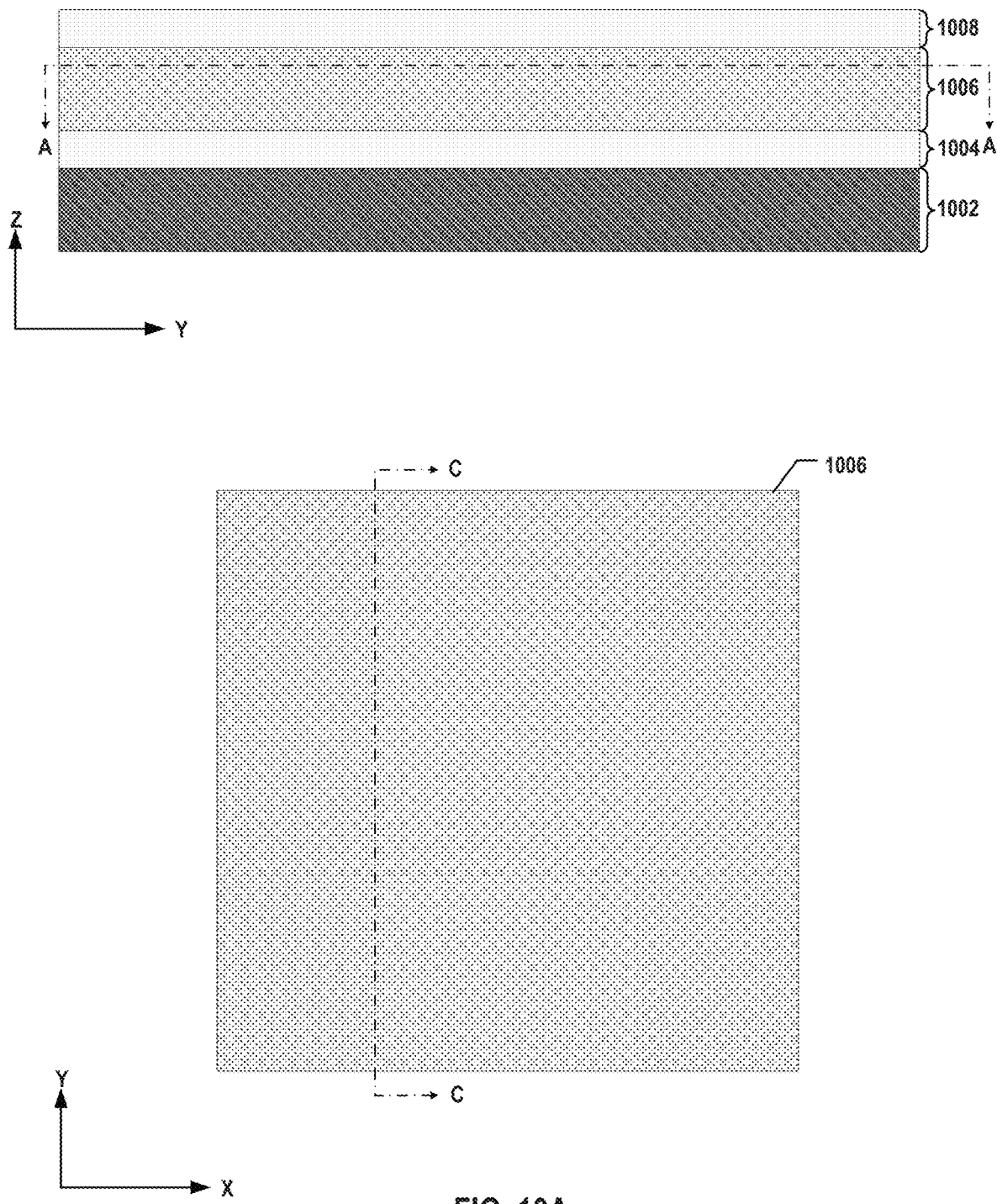
FIGS. 10A-10M illustrate a fabrication process for forming a 3D memory device including vertical transistors, according to some aspects of the present disclosure.

As illustrated in FIG. 10A, a stack of a silicon oxide layer 1004, a silicon nitride layer 1006, and a silicon oxide layer 1008 is formed on a silicon substrate 1002. To form the dielectric stack, silicon oxide, silicon nitride, and silicon oxide are subsequently deposited onto silicon substrate 1002 using one or more thin film deposition processes including, but not limited to, CVD, PVD, ALD, or any combination thereof. In some implementations, silicon oxide layer 1004 is formed by oxidizing the top portion of silicon substrate 1002 using dry oxidation and/or we oxidation, such as in situ steam generation (ISSG) oxidation process. In some implementations, the thickness of silicon oxide layer 1004 (e.g., ISSG silicon oxide) is smaller than the thickness of silicon oxide layer 1008 (e.g., CVD silicon oxide). FIG. 10A illustrates both the side view (in the top portion of FIG. 10A) of a cross-section along the y-direction (the bit line direction, e.g., in the CC plane) and the plan view (in the bottom portion of FIG. 10A) of a cross-section in the x-y plane (e.g., in the AA plane through silicon nitride layer 1006). The same drawing layout is arranged in FIGS. 10B-10G as well.

At operation 2404 in FIG. 24, a semiconductor body extending vertically from the substrate through the stack of dielectric layers is formed. In some implementations, to form the semiconductor body, an opening extending through the stack of dielectric layers is etched to expose part of the substrate, and the semiconductor body is epitaxially grown from the exposed part of the substrate in the opening.

Figure 10B:
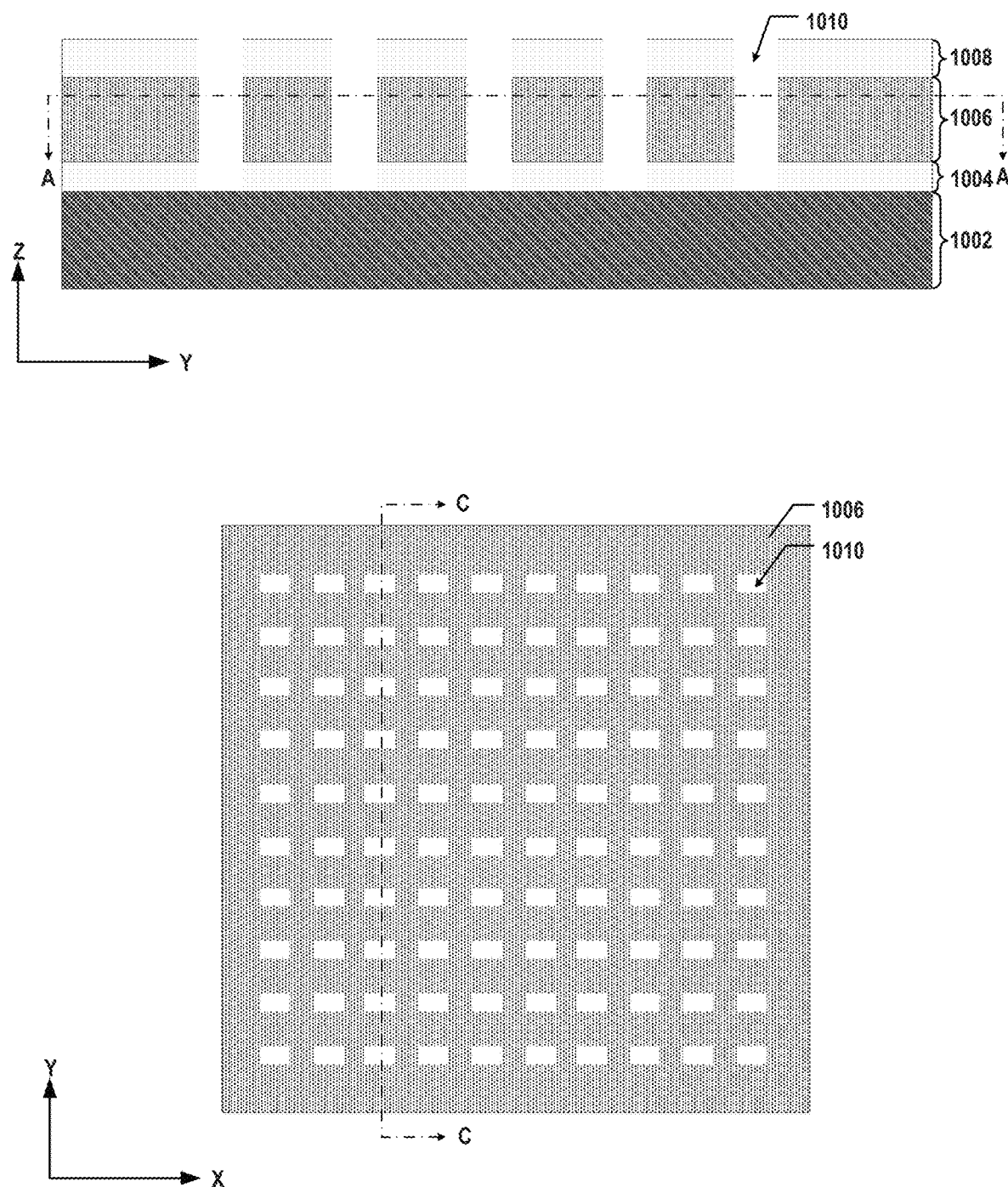

As illustrated in FIG. 10B, an array of openings 1010 is formed, each of which extends vertically (in the z-direction) through the stack of silicon oxide layer 1008, silicon nitride layer 1006, and silicon oxide layer 1004 to silicon substrate 1002. As a result, parts of silicon substrate 1002 can be exposed from openings 1010. In some implementations, a lithography process is performed to pattern the array of openings 1010 using an etch mask (e.g., a photoresist mask), for example, based on the design of word lines and bit lines, and one or more dry etching and/or wet etching processes, such as reactive ion etch (RIE), are performed to etch openings 1010 through silicon oxide layer 1008, silicon nitride layer 1006, and silicon oxide layer 1004 until being stopped by silicon substrate 1002.

Figure 10C:
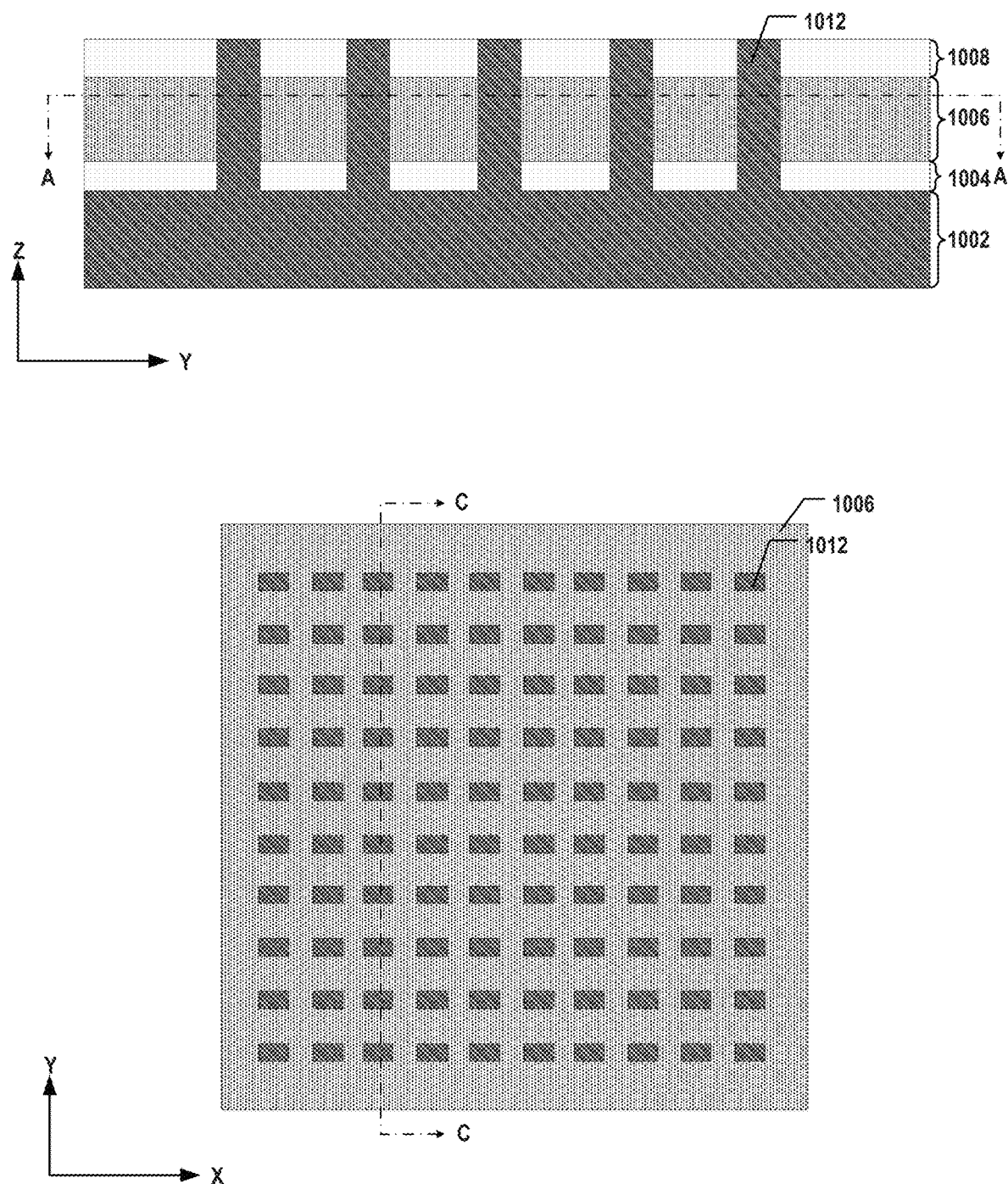

As illustrated in FIG. 10C, an array of semiconductor bodies 1012 are formed in openings 1010. Semiconductor body 1012 can be epitaxially grown from the respective exposed part of silicon substrate 1002 in the respective opening 1010. The fabrication processes for epitaxially growing semiconductor body 1012 can include, but not limited to, vapor-phase epitaxy (VPE), liquid-phase epitaxy (LPE), molecular-beam epitaxy (MPE), or any combinations thereof. The epitaxy can occur upward (toward the positive z-direction) from the exposed parts of silicon substrate 1002 in openings 1010. Semiconductor body 1012 thus can have the same material as silicon substrate 1002, in the form of single crystalline silicon. Depending on the shape of opening 1010, semiconductor body 1012 can have the same shape as opening 1010, such as a cuboid shape or a cylinder shape. In some implementations, a planarization process, such as CMP, is performed to remove excess parts of semiconductor bodies 1012 beyond the top surface of silicon oxide layer 1008. As a result, an array of semiconductor bodies 1012 (e.g., single crystalline silicon bodies) extending vertically (in the z-direction) from silicon substrate 1002 through the stack of silicon oxide layer 1008, silicon nitride layer 1006, and silicon oxide layer 1004 is formed thereby, according to some implementations.

At operation 2406 in FIG. 24, one of the stack of dielectric layers is removed to expose part of the semiconductor body. In some implementations, to remove the one of the stack of dielectric layers, a trench is etched through at least part of the stack of dielectric layers to expose the layer having the second dielectric, and the layer having the second dielectric (e.g., the sacrificial layer) is etched away via the trench. In some implementations, the trench is etched between adjacent rows of semiconductor bodies without touching any sides of the semiconductor bodies.

Figure 10D:
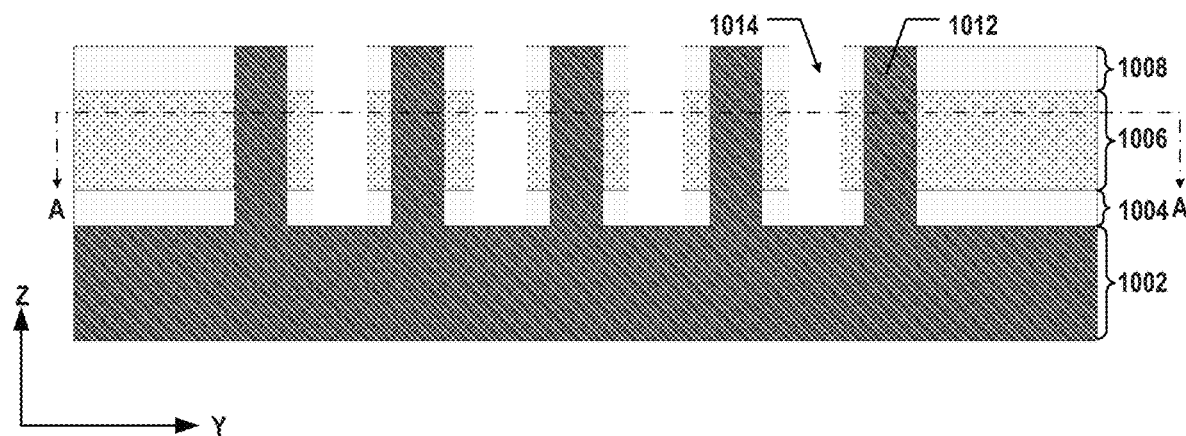
Figure 10D:
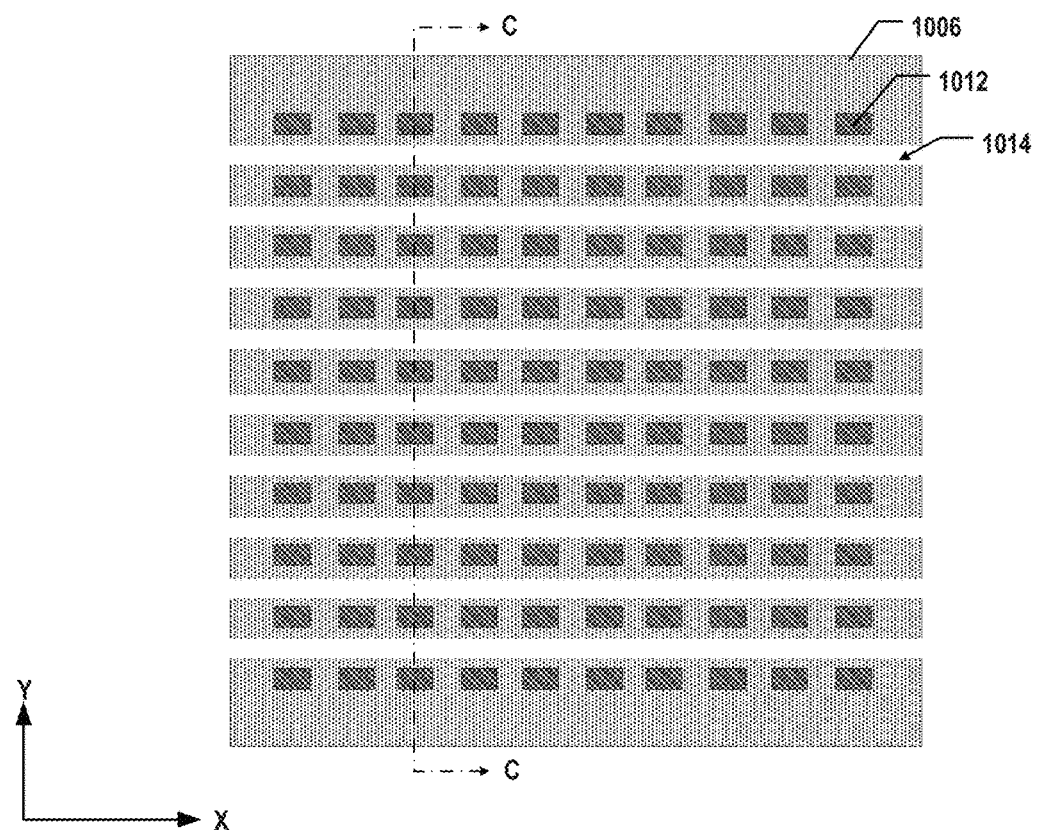

As illustrated in FIG. 10D, a plurality of trenches 1014 (slits openings) each extending laterally along the word line direction (the x-direction) and extending vertically through at least silicon oxide layer 1008 and silicon nitride layer 1006 are formed to expose silicon nitride layer 1006. As a result, parts of silicon nitride layer 1006 can be exposed from trenches 1014. In some implementations, a lithography process is performed to pattern trenches 1014 using an etch mask (e.g., a photoresist mask), for example, based on the design of word lines (word line trenches). As shown in FIG. 10D, trench 1014 is patterned to be formed between adjacent rows of semiconductor bodies 1012 without touching any sides of semiconductor bodies 1012, such that semiconductor bodies 1012 are not exposed from any side thereof. In one example, trench 1014 is patterned to be formed in the middle between adjacent rows of semiconductor bodies 1012, e.g., having the same distance two adjacent rows of semiconductor bodies 1012. In some implementations, one or more dry etching and/or wet etching processes, such as RIE, are performed to etch trenches 1014 through silicon oxide layer 1008, silicon nitride layer 1006, and silicon oxide layer 1004 until being stopped by silicon substrate 1002. It is understood that in some examples, the etching of trenches 1014 may not go all the way to silicon substrate 1002 and may be stopped at silicon oxide layer 1004 so long as silicon nitride layer 1006 is exposed from trenches 1014.

Figure 10E:
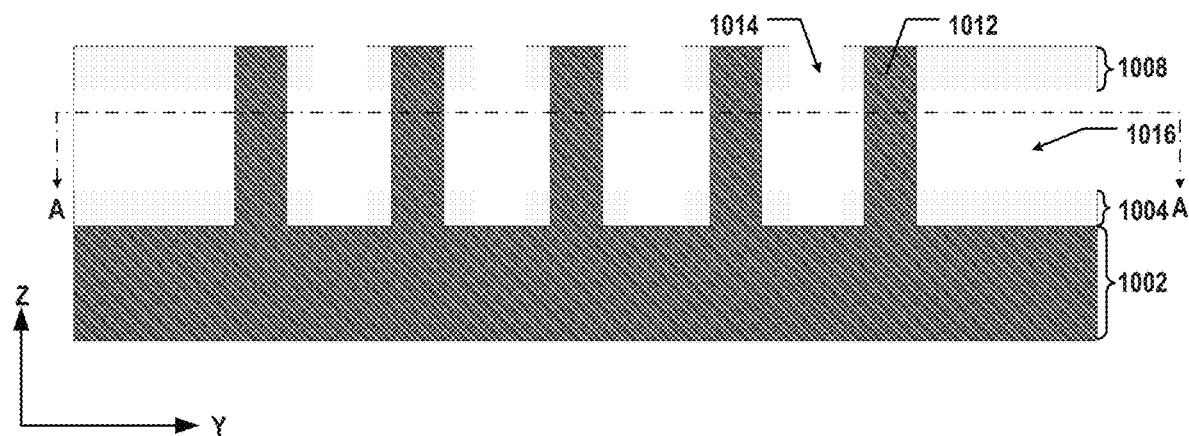
Figure 10E:
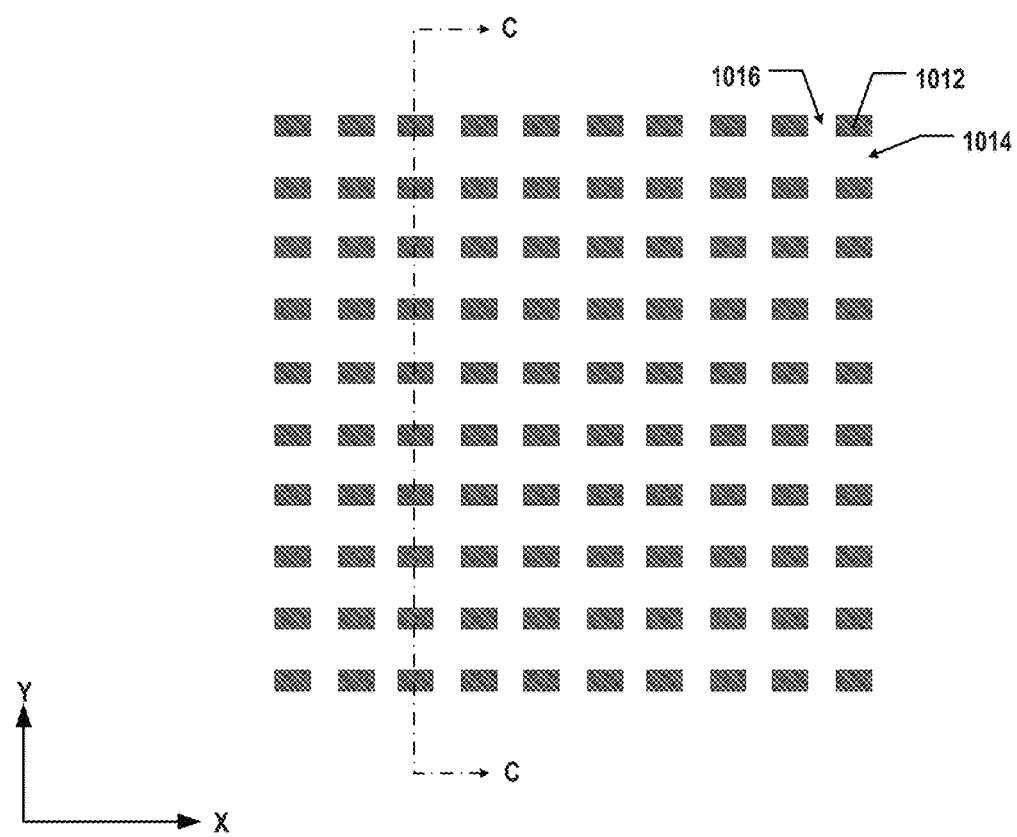

As illustrated in FIG. 10E, silicon nitride layer 1006 (shown in FIG. 10D) is removed to expose parts of semiconductor bodies 1012 abutting silicon nitride layer 1006. In some implementations, silicon nitride layer 1006 is etched away via trenches 1014. For example, a wet etchant including phosphoric acid may be applied through trenches 1014 to selectively wet etch silicon nitride layer 1006 without etching silicon oxide layers 1004 and 1008 as well as semiconductor bodies 1012 and silicon substrate 1002. As a result, lateral recesses 1016 can be formed vertically between silicon oxide layers 1004 and 1008 thereby, which expose parts of semiconductor bodies 1012. As shown in the plan view, all sides of each semiconductor body 1012 can be exposed from lateral recesses 1016.

At operation 2408 in FIG. 24, a gate structure in contact with a plurality of sides of the exposed part of the semiconductor body is formed. In some implementations, to form the gate structure, a gate dielectric is formed over the exposed part of the semiconductor body, a conductive layer is deposited over the gate dielectric, and the conductive layer is patterned to form a gate electrode over the gate dielectric.

Figure 10F:
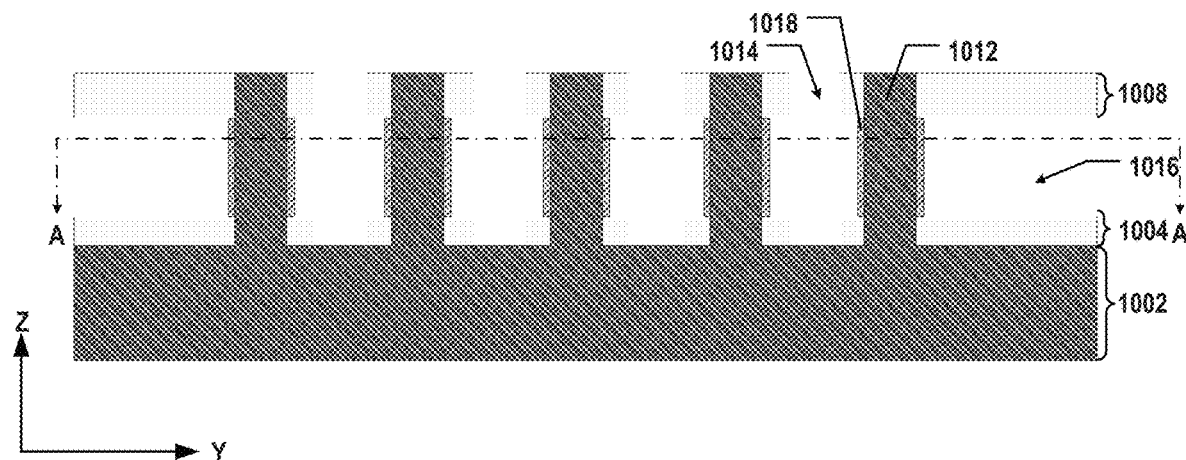
Figure 10F:
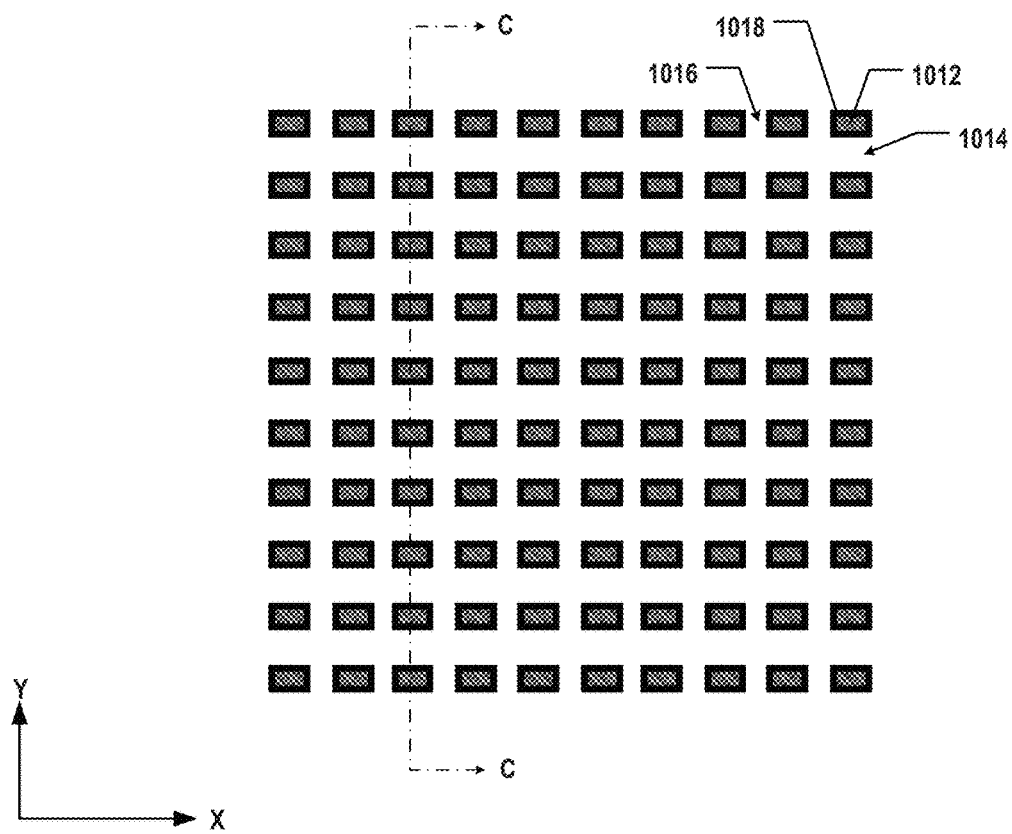

As illustrated in FIG. 10F, a gate dielectric 1018 is formed over the exposed part of each semiconductor body 1012, e.g., surrounding and contacting all the sides of the exposed part of semiconductor body 1012. As shown in the plan view, gate dielectric 1018 can fully circumscribe a respective semiconductor body 1012. In some implementations, a wet oxidation and/or a dry oxidation process, such as ISSG, is performed to form native oxide (e.g., silicon oxide) on semiconductor body 1012 (e.g., single crystalline silicon) as gate dielectric 1018. In some implementations, gate dielectric 1018 is formed by depositing a layer of dielectric, such as silicon oxide, over the exposed part of semiconductor body 1012 through trenches 1014 and lateral recesses 1016 using one or more thin film deposition processes including, but not limited to, CVD, PVD, ALD, or any combination thereof, without filling lateral recesses 1016 and trenches 1014.

Figure 10G:
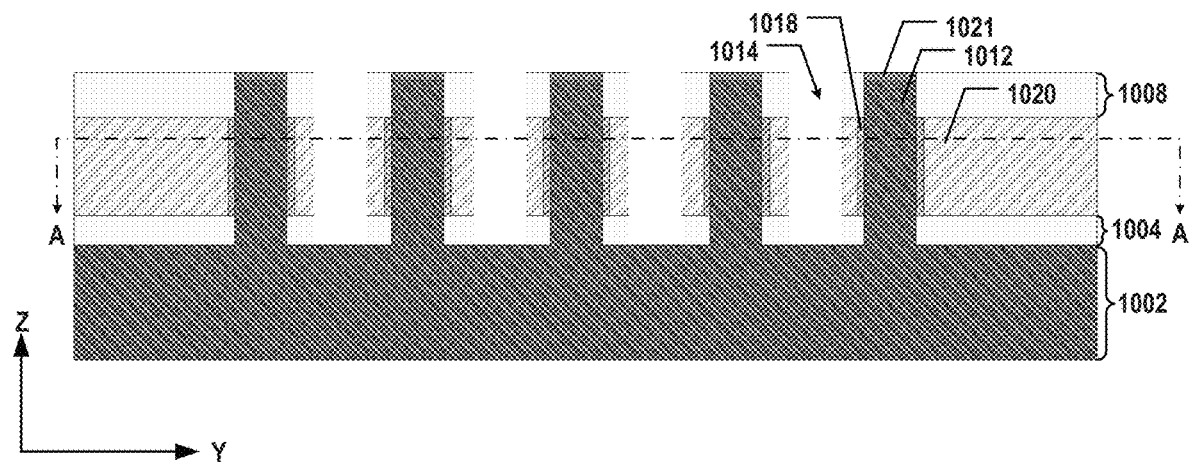
Figure 10G:
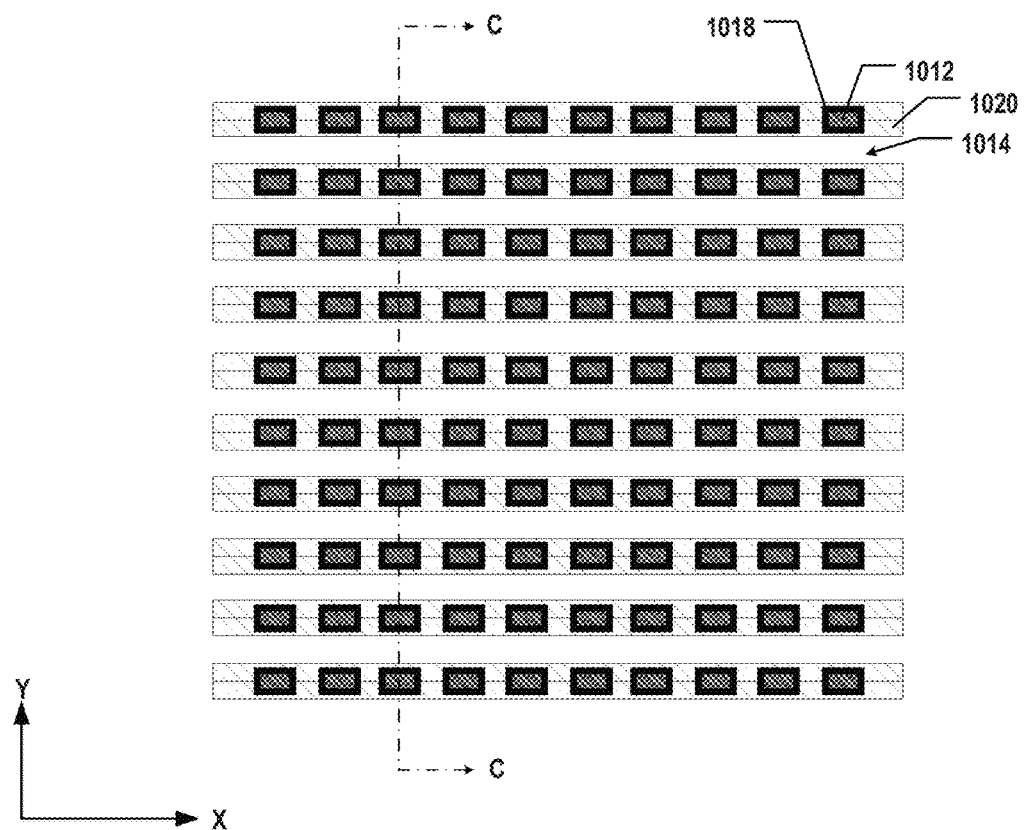

As illustrated in FIG. 10G, a conductive layer 1020 is formed over gate dielectrics 1018 in lateral recesses 1016 (shown in FIG. 10F) through trenches 1014. In some implementations, conductive layer 1020 is formed by depositing conductive materials, such as metal or metal compounds (e.g., TiN), over gate dielectrics 1018 using one or more thin film deposition processes including, but not limited to, CVD, PVD, ALD, or any combination thereof, through trenches 1014 to fill lateral recesses 1016. In one example, the deposition of conductive layer 1020 is controlled not to fill trenches 1014. It is understood that in some examples, the deposition of conductive layer 1020 may fill trenches 1014 as well. Thus, a planarization process, e.g., CMP, may be performed to remove the excess conductive layer 1020 over the top surface of silicon oxide layer 1008, and conductive layer 1020 may be patterned to form a gate electrode over a respective gate dielectric. For example, trenches 1014 filled with conductive layer 1020 may be patterned and etched again to separate conductive layers 1020 between adjacent rows of semiconductor bodies 1012 and gate dielectrics 1018. As described above, a lithography process can be performed to pattern trenches 1014 again using an etch mask (e.g., a photoresist mask), for example, based on the design of word lines (word line trenches).

As a result, patterned conductive layers 1020 can become word lines each extending in the word line direction (the x-direction) and being separated by adjacent trenches 1014, and parts of patterned conductive layers 1020 that are over gate dielectrics 1018 (e.g., fully circumscribes a respective gate dielectric 1018 in the plan view) can become gate electrodes. Gate structures each including a respective gate dielectric 1018 over the exposed part of semiconductor body 1012 and a respective gate electrode (part of conductive layer 1020) over gate dielectric 1018 can be formed thereby.

Since conductive layer 1020 remains on all sides of semiconductor body 1012 (and gate dielectric 1018 thereover) when patterning conductive layer 1020 (etching trenches 1014), the gate structure is in contact with all sides of semiconductor body 1012, according to some implementations, as shown in FIG. 10G. As shown in the plan view, the gate structure (having gate dielectric 1018 and the gate electrode) can fully circumscribe a respective semiconductor body 1012, and all sides of each semiconductor body 1012 can be surrounded and contacted by the respective gate structure. Comparing FIG. 10G with FIG. 10A, silicon nitride layer 1006 (sacrificial layer) in FIG. 10A is eventually replaced with conductive layer 1020 in FIG. 10G, according to some implementations.

At operation 2410 in FIG. 24, a first end of the semiconductor body away from the substrate is doped. As illustrated in FIG. 10G, the exposed upper end of each semiconductor body 1012, e.g., one of the two ends of semiconductor body 1012 in the vertical direction (the z-direction) that is away from silicon substrate 1002, is doped to form a source/drain 1021 (e.g., a source terminal of a vertical transistor). In some implementations, an implantation process and/or thermal diffusion process are performed to dope P-type dopants or N-type dopants to exposed upper ends of semiconductor bodies 1012 to form sources/drains 1021. In some implementations, a silicide layer is formed on source/drain 1021 by performing a silicidation process at the exposed upper ends of semiconductor bodies 1012.

At operation 2412 in FIG. 24, a storage unit in contact with the semiconductor body, e.g., the doped first end thereof, is formed. The storage unit can include a capacitor or a PCM element. In some implementations, to form a storage unit that is a capacitor, a first electrode is formed on the doped first end of the semiconductor body, a capacitor dielectric is formed on the first electrode, and a second electrode is formed on the capacitor dielectric.

Figure 10H:
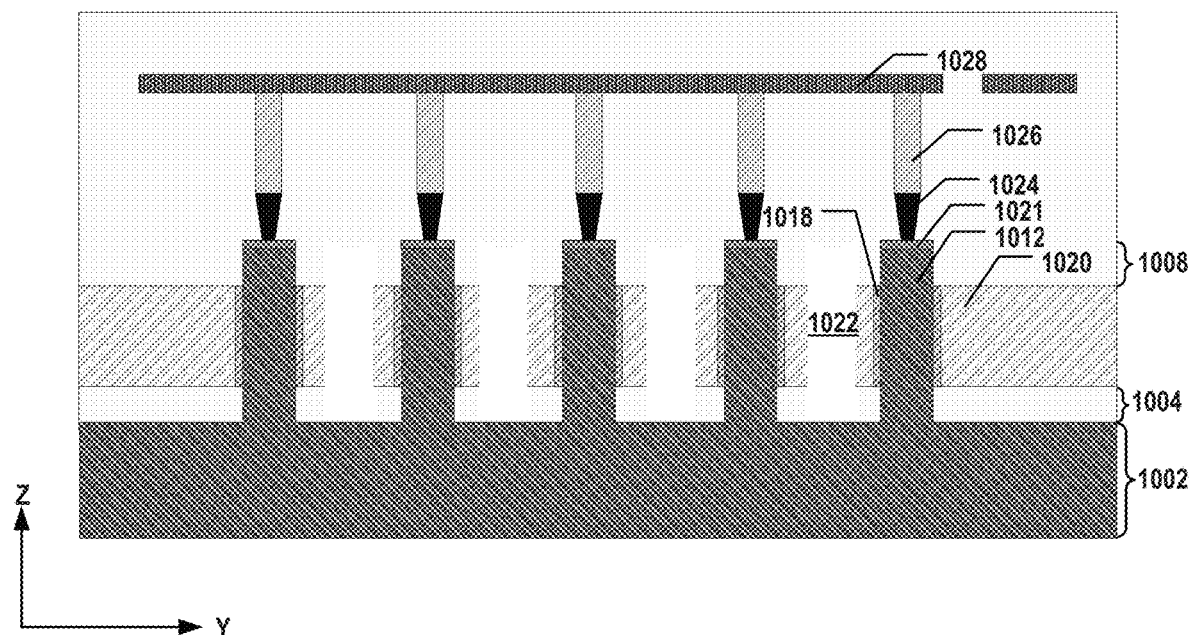

As illustrated in FIG. 10H, one or more ILD layers are formed over the top surface of silicon oxide layer 1008, for example, by depositing dielectrics using one or more thin film deposition processes including, but not limited to, CVD, PVD, ALD, or any combination thereof. It is understood that in some examples in which the ILD layers include silicon oxide, the same material as silicon oxide layer 1008, the boundary and interface between the ILD layer and silicon oxide layer 1008 may become indistinguishable after the deposition. Depending on the lateral dimensions of trenches 1014 (shown in FIG. 10G), trenches 1014 may not be fully filled with dielectrics (e.g., silicon oxide) when forming the ILD layers and thus, become air gaps 1022 between adjacent word lines (patterned conductive layers 1020). It is understood that in some examples, when the lateral dimensions of trenches 1014 are sufficiently large, dielectrics may fully fill trenches 1014 during the formation of the ILD layers, thereby eliminating air gaps 1022.

As illustrated in FIG. 10H, capacitor contacts 1024, first electrodes, capacitor dielectrics, and second electrodes of capacitors 1026, and common plate 1028 are subsequently formed in the ILD layers to be coupled to semiconductor bodies 1012. In some implementations, each capacitor contact 1024 is formed on a respective source/drain 1021, e.g., the doped upper end of a respective semiconductor body 1012 by patterning and etching an electrode hole aligned with respective source/drain 1021 using lithography and etching processes and depositing conductive materials to fill the electrode hole using thin film deposition processes. In some implementations, common plate 1028 is formed on the second electrodes of capacitors 1026 by patterning and etching an electrode trench aligned with capacitors 1026 using lithography and etching processes and depositing conductive materials to fill the electrode trench using thin film deposition processes.

Figure 10I:
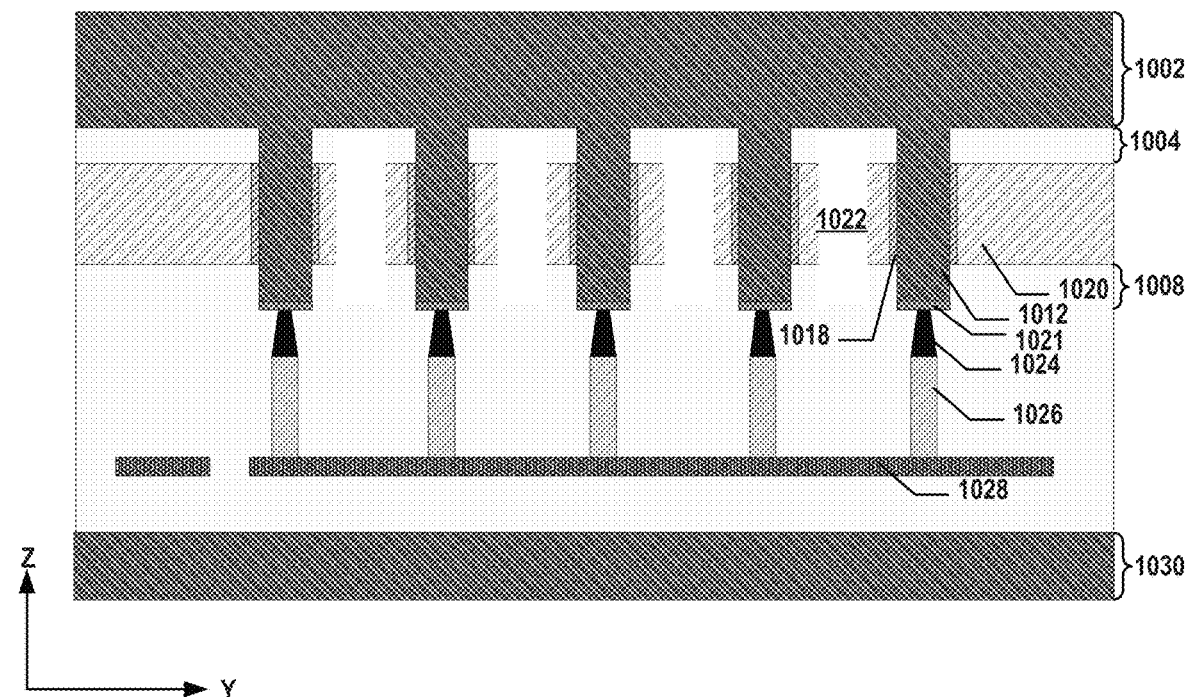

At operation 2414 in FIG. 24, the substrate is removed to expose a second end of the semiconductor body opposite to the first end. As illustrated in FIG. 10I, a carrier substrate 1030 (a.k.a. a handle substrate) is bonded onto the front side of silicon substrate 1002 on which devices are formed using any suitable bonding processes, such as anodic bonding, fusion bonding, transfer bonding, adhesive bonding, and eutectic bonding. The bonded structure can then be flipped upside down, such that silicon substrate 1002 become above carrier substrate 1030.

Figure 10J:
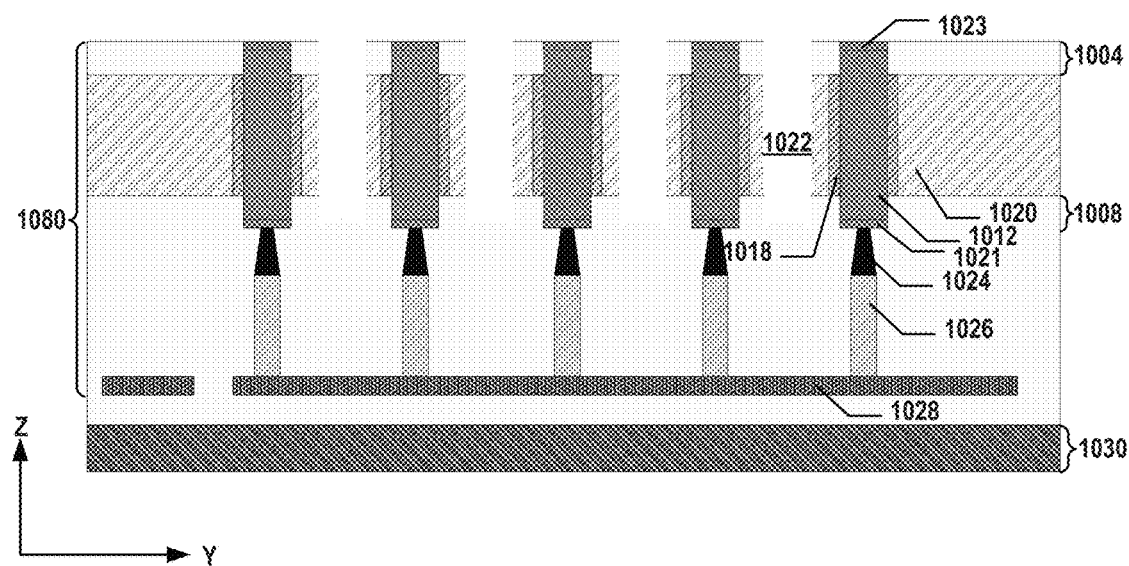

As illustrated in FIG. 10J, silicon substrate 1002 (shown in FIG. 10I) is removed to expose the undoped upper ends of semiconductor bodies 1012 (used to be the lower ends before flipping over). In some implementations, planarization processes (e.g., CMP) and/or etching processes are performed to remove silicon substrate 1002 until being stopped by silicon oxide layer 1004 and the upper ends of semiconductor bodies 1012.

At operation 2416 in FIG. 24, the exposed second end of the semiconductor body is doped. As illustrated in FIG. 10J, the exposed upper end of each semiconductor body 1012, e.g., one of the two ends of semiconductor body 1012 in the vertical direction (the z-direction) that is away from carrier substrate 1030, is doped to form another source/drain 1023 (e.g., a source terminal of the vertical transistor). In some implementations, an implantation process and/or thermal diffusion process are performed to dope P-type dopants or N-type dopants to exposed upper ends of semiconductor bodies 1012 to form sources/drains 1023. In some implementations, a silicide layer is formed on source/drain 1023 by performing a silicidation process at the exposed upper ends of semiconductor bodies 1012. As a result, vertical transistors having semiconductor body 1012, sources/drains 1021 and 1023, gate dielectric 1018, and the gate electrode (part of conductive layer 1020) are formed thereby, as shown in FIG. 10J, according to some implementations. As described above, capacitors 1026 each having the first and second electrodes and the capacitor dielectric are thereby formed as well, and DRAM cells 1080 each having a multi-gate vertical transistor and a capacitor coupled to the multi-gate vertical transistor are thereby formed, as shown in FIG. 10J, according to some implementations.

Figure 10K:
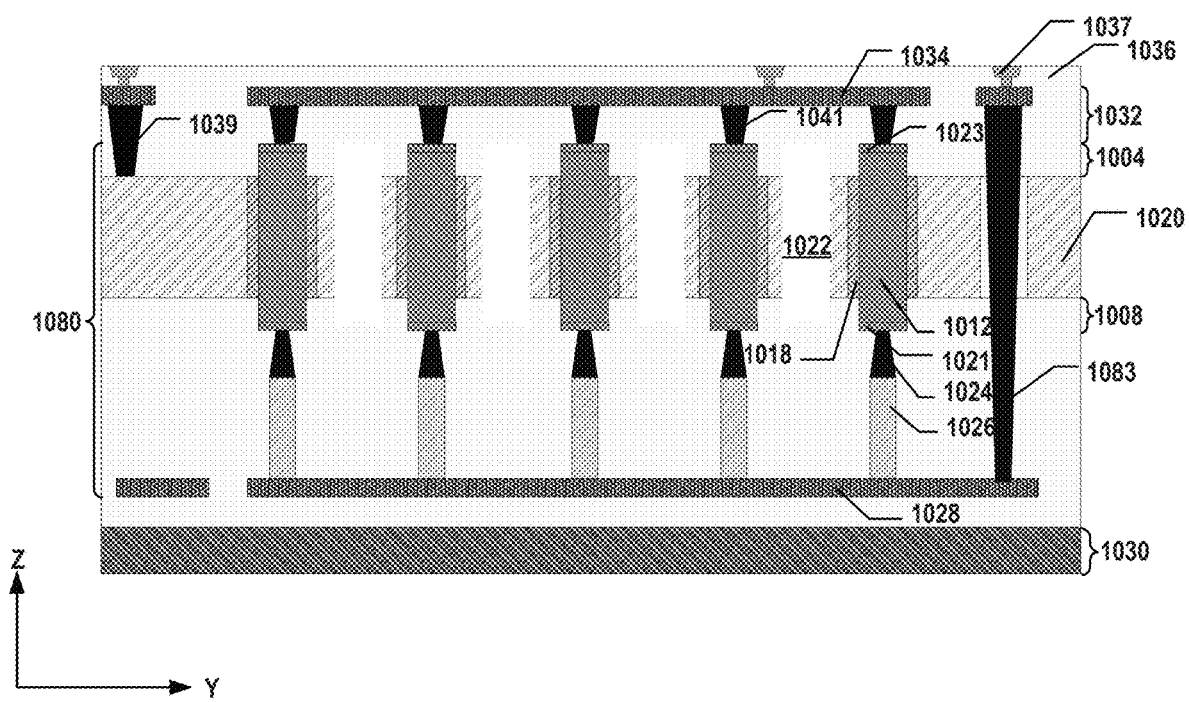
Figure 10L:
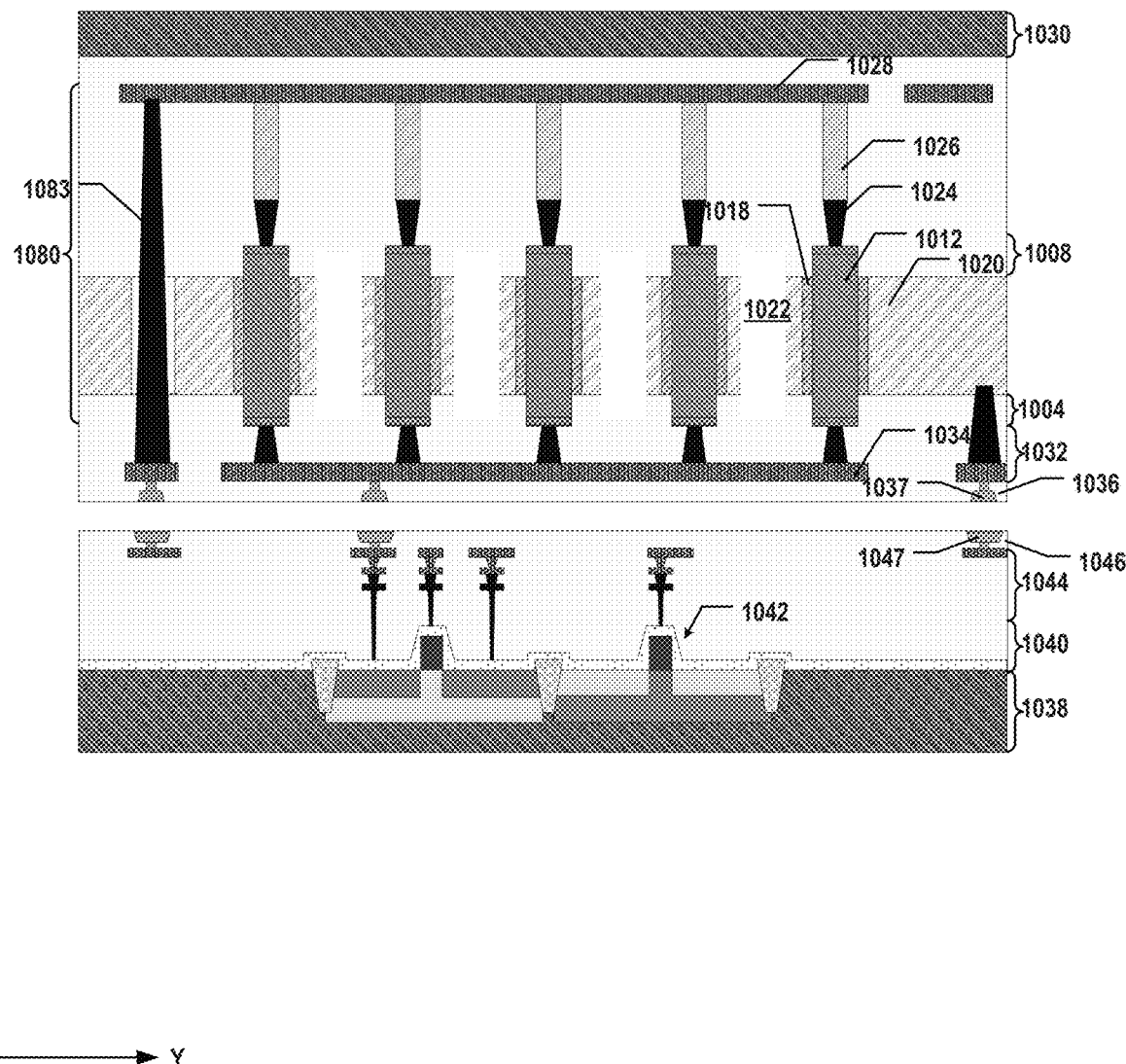

Referring back to FIG. 23, method 2300 proceeds to operation 2308, as illustrated in FIG. 23, in which an interconnect layer including bit lines is formed above the array of memory cells. As illustrated in FIG. 10K, an interconnect layer 1032 can be formed above DRAM cells 1080. Interconnect layer 1032 can include interconnects of MEOL and/or BEOL in a plurality of ILD layers to make electrical connections with DRAM cells 1080. In some implementations, interconnect layer 1032 includes multiple ILD layers and interconnects therein formed in multiple processes. For example, the interconnects in interconnect layers 1032 can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. The ILD layers can include dielectric materials deposited on silicon oxide layer 1004 by one or more thin film deposition processes including, but not limited to, CVD, PVD, ALD, or any combination thereof. The ILD layers and interconnects illustrated in FIG. 10K can be collectively referred to as interconnect layer 1032.

As shown in FIG. 24, at operation 2418, to form the interconnect layer, a bit line is formed on the doped second end. As illustrated in FIG. 10K, bit line 1034 can be formed on sources/drains 1023 by patterning and etching a trench aligned with respective source/drain 1023 using lithography and etching processes and depositing conductive materials to fill the trench using thin film deposition processes. In some implementations, forming bit line 1034 includes depositing a metal layer onto the exposed end of semiconductor body 1012. As a result, bit line 1034 and capacitor 1026 can be formed on opposite sides of semiconductor body 1012 and coupled to opposite ends of semiconductor body 1012. It is understood that additional local interconnects, such as word line contacts 1039, capacitor contacts 1083 (e.g., a conductor), and bit line contacts 1041 (e.g., a metal silicide contact) may be similarly formed as well. In some implementations, bit line contact 1041 (e.g., a metal silicide contact) is formed on the exposed end of semiconductor body 1012, and bit line 1034 is formed on bit line contact 1041.

Method 2300 proceeds to operation 2310, as illustrated in FIG. 23, in which a second bonding layer is formed above the array of memory cells and the interconnect layer. The second bonding layer can include a second bonding contact. As illustrated in FIG. 10K, a bonding layer 1036 is formed above interconnect layer 1032 and DRAM cells 1080. Bonding layer 1036 can include a plurality of bonding contacts 1037 surrounded by dielectrics. In some implementations, a dielectric layer (e.g., ILD layer) is deposited on the top surface of interconnect layer 1032 by one or more thin film deposition processes including, but not limited to, CVD, PVD, ALD, or any combination thereof. Bonding contacts 1037 can then be formed through the dielectric layer and in contact with the interconnects in interconnect layer 1032 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing a barrier layer, an adhesion layer, and/or a seed layer before depositing the conductor.

Method 2300 proceeds to operation 2312, as illustrated in FIG. 23, in which the first semiconductor structure and the second semiconductor structure are bonded in a face-to-face manner, such that the first array of memory cells is coupled to the peripheral circuit across a bonding interface. The bonding can include hybrid bonding. In some implementations, the first bonding contact is in contact with the second bonding contact at the bonding interface after the bonding. In some implementations, the second semiconductor structure is above the first semiconductor structure after the bonding. In some implementations, the first semiconductor structure is above the second semiconductor structure after the bonding.

Figure 10M:
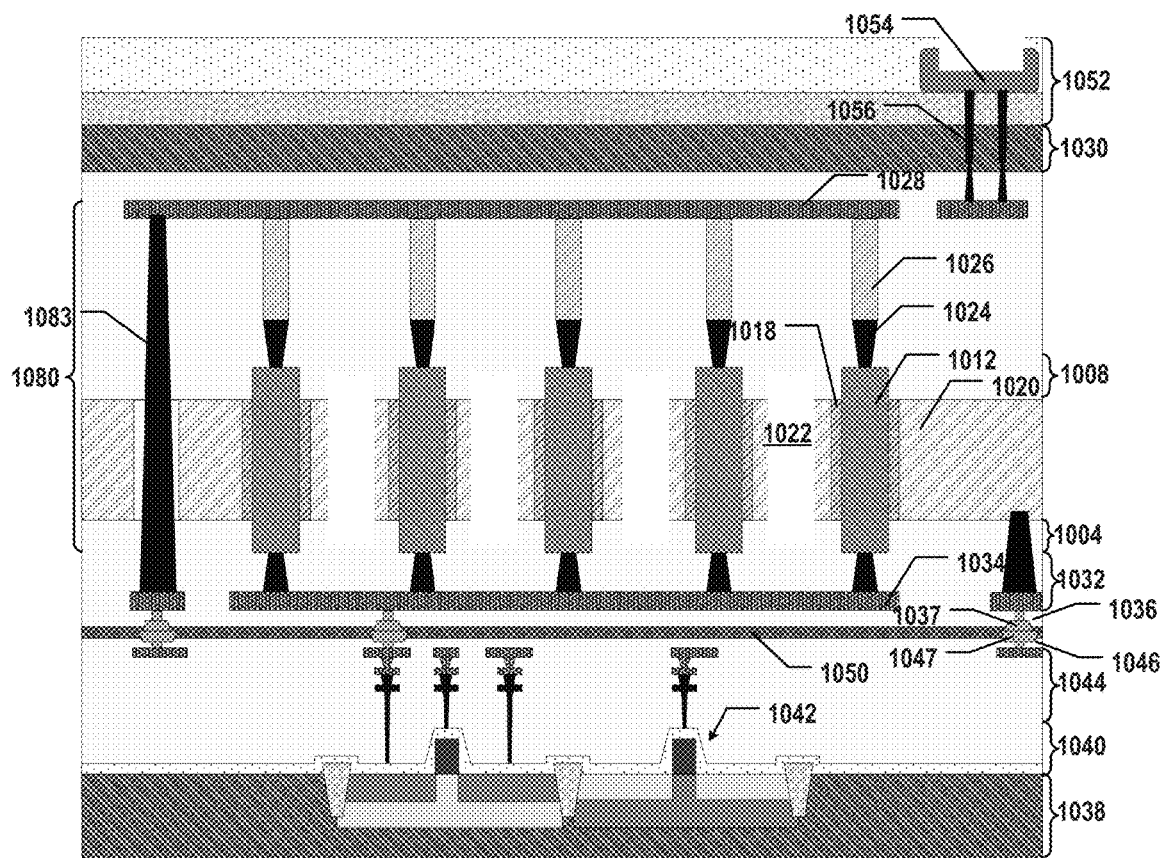

As illustrated in FIG. 10L, carrier substrate 1030 and components formed thereon (e.g., DRAM cells 1080) are flipped upside down. As illustrated in FIG. 10M, bonding layer 1036 facing down is bonded with bonding layer 1046 facing up, e.g., in a face-to-face manner, thereby forming a bonding interface 1050. In some implementations, a treatment process, e.g., a plasma treatment, a wet treatment, and/or a thermal treatment, is applied to the bonding surfaces prior to the bonding. Although not shown in FIGS. 10L and 10M, silicon substrate 1038 and components formed thereon (e.g., peripheral circuits 1040) can be flipped upside down, and bonding layer 1046 facing down can be bonded with bonding layer 1036 facing up, e.g., in a face-to-face manner, thereby forming bonding interface 1050. After the bonding, bonding contacts 1037 in bonding layer 1036 and bonding contacts 1047 in bonding layer 1046 are aligned and in contact with one another, such that DRAM cells 1080 can be electrically connected to peripheral circuits 1040 across bonding interface 1050. It is understood that in the bonded chip, DRAM cells 1080 may be either above or below peripheral circuits 1040. Nevertheless, bonding interface 1050 can be formed vertically between peripheral circuits 1040 and DRAM cells 1080 after the bonding.

Method 2300 proceeds to operation 2314, as illustrated in FIG. 23, in which a pad-out interconnect layer is formed on the backside of the first semiconductor structure or the second semiconductor structure. As illustrated in FIG. 10M, a pad-out interconnect layer 1052 is formed above on the backside of carrier substrate 1030. Pad-out interconnect layer 1052 can include interconnects, such as pad contacts 1054, formed in one or more ILD layers. Pad contacts 1054 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. In some implementations, after the bonding, contacts 1056 are formed extending vertically through carrier substrate 1030, for example, by wet/dry etching processes, followed by depositing conductive materials. Contacts 1056 can be in contact with the interconnects in pad-out interconnect layer 1052. It is understood that in some examples, carrier substrate 1030 may be thinned or removed after bonding and prior to forming pad-out interconnect layer 1052 and contacts 1056, for example, using planarization processes and/or etching processes.

Although not shown, it is understood that in some examples, pad-out interconnect layer 1052 may be formed above on the backside of silicon substrate 1038, and contacts 1056 may be formed extending vertically through silicon substrate 1038. Silicon substrate 1038 may be thinned prior to forming pad-out interconnect layer 1052 and contacts 1056, for example, using planarization processes and/or etching processes.

As described above, FIGS. 10A-10M illustrates a fabrication process of forming a DRAM array having a vertical transistor in which the gate structure is in contact with all sides of the semiconductor body, in the form of a GAA transistor. In some implementations as shown in FIG. 11A-11I, by changing the layout of word line trenches, a DRAM array having a vertical transistor in which the gate structure is in contact with some sides (e.g., three of the four sides) of the semiconductor body are formed with a relatively larger pitch of word lines and reduced fabrication complexity.

Figure 11A:
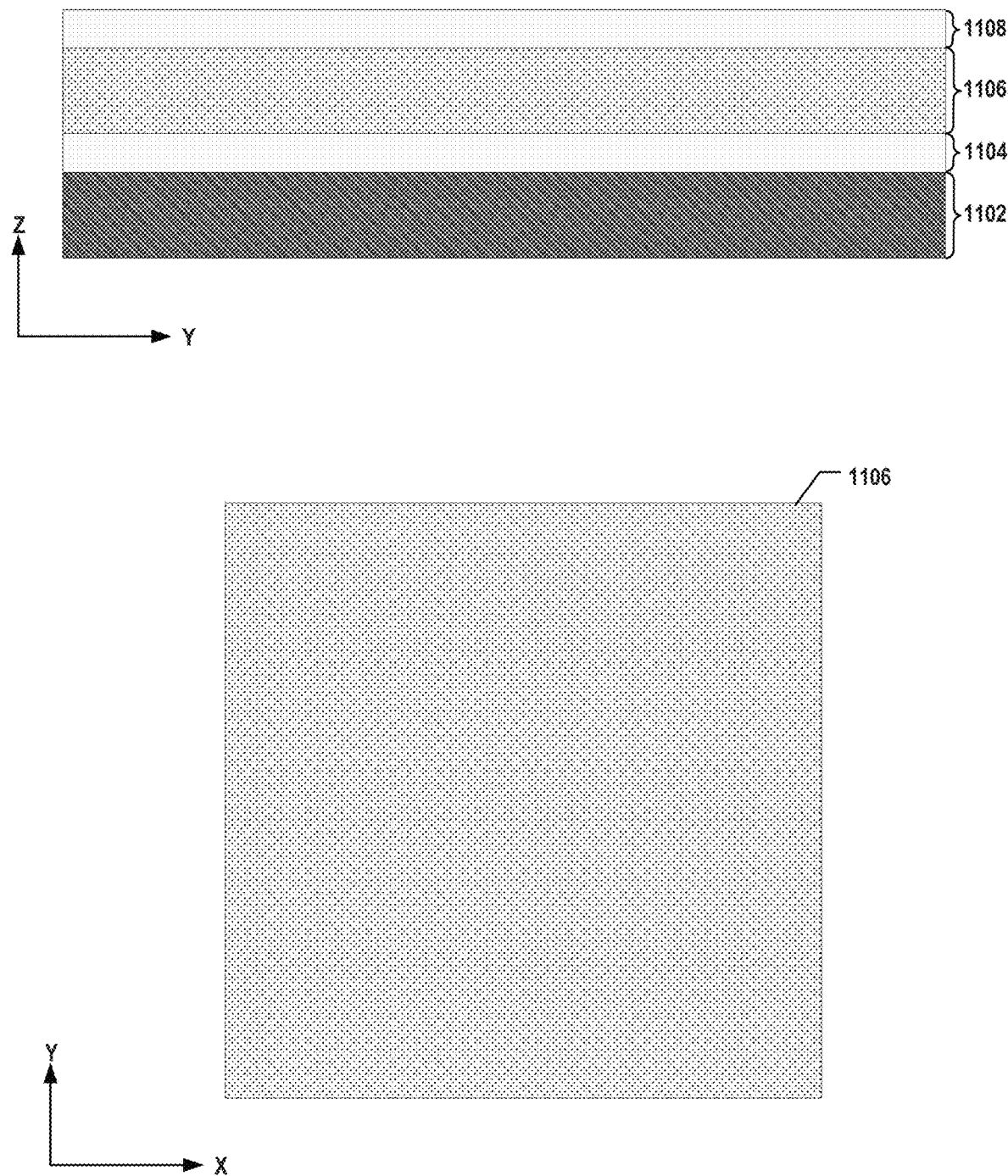
FIGS. 11A-11I illustrate a fabrication process for forming another 3D memory device including vertical transistors, according to some aspects of the present disclosure.

As illustrated in FIG. 11A, a stack of a silicon oxide layer 1104, a silicon nitride layer 1106, and a silicon oxide layer 1108 is formed on a silicon substrate 1102. To form the dielectric stack, silicon oxide, silicon nitride, and silicon oxide are subsequently deposited onto silicon substrate 1102 using one or more thin film deposition processes including, but not limited to, CVD, PVD, ALD, or any combination thereof. In some implementations, silicon oxide layer 1104 is formed by oxidizing the top portion of silicon substrate 1102 using dry oxidation and/or we oxidation, such as ISSG oxidation process. In some implementations, the thickness of silicon oxide layer 1104 (e.g., ISSG silicon oxide) is smaller than the thickness of silicon oxide layer 1108 (e.g., CVD silicon oxide). Besides the side view of the cross-section along the y-direction (e.g., the bit line direction) shown in the top portion of FIG. 11A, the plan view of the cross-section in the x-y plane through silicon nitride layer 1106 is also shown in the bottom portion of FIG. 11A. The same drawing layout is arranged in FIGS. 11B-11E as well.

Figure 11B:
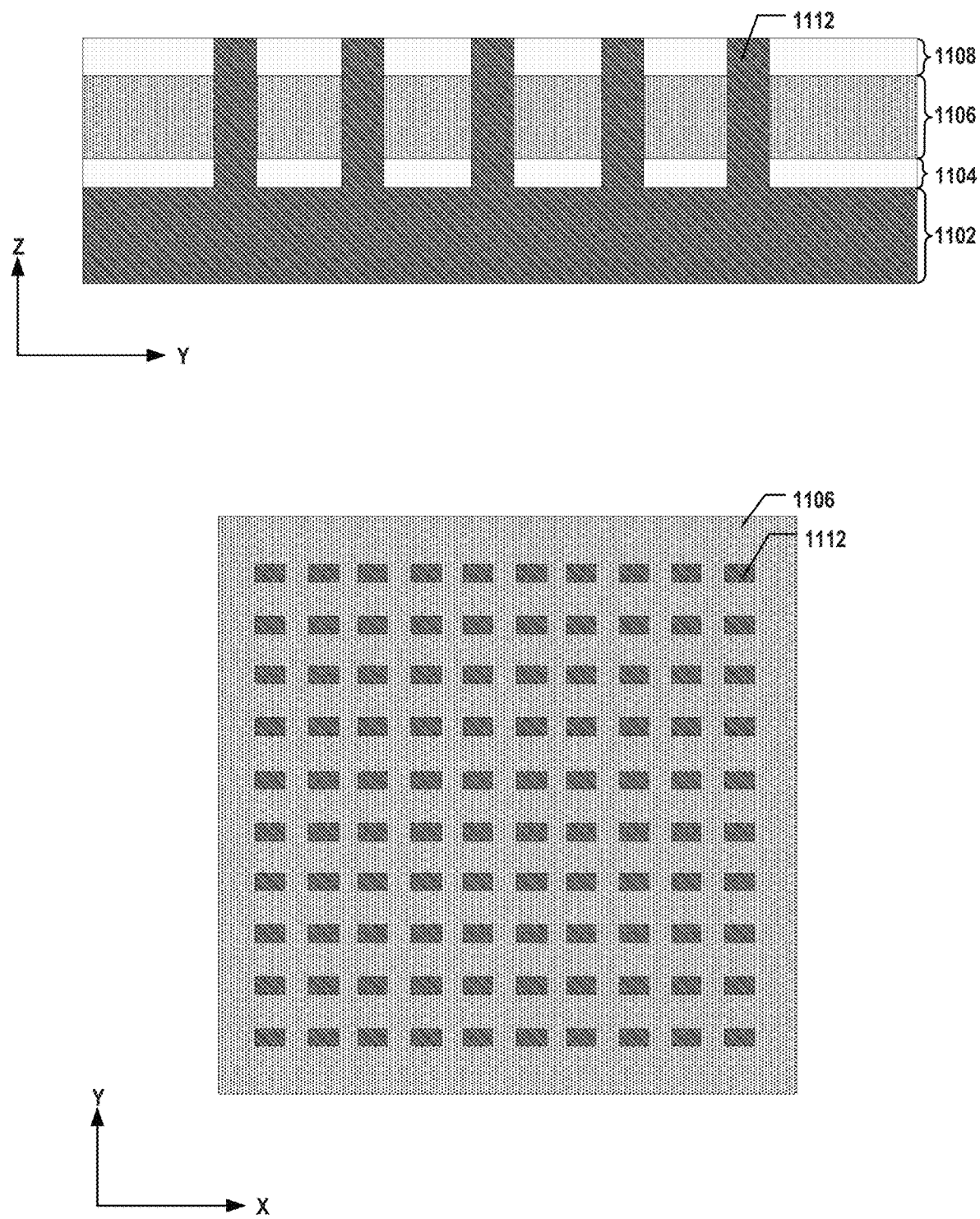

As illustrated in FIG. 11B, an array of semiconductor bodies 1112 each extending vertically through the stack of silicon oxide layer 1108, silicon nitride layer 1106, and silicon oxide layer 1104 are formed. Semiconductor body 1112 can be epitaxially grown from the respective exposed part of silicon substrate 1102 in a respective opening (not shown). The fabrication processes for epitaxially growing semiconductor body 1112 can include, but not limited to, VPE, LPE, MPE, or any combinations thereof. The epitaxy can occur upward (toward the positive z-direction) from the exposed parts of silicon substrate 1102 in the openings. Semiconductor body 1112 thus can have the same material as silicon substrate 1102, in the form of single crystalline silicon. In some implementations, a planarization process, such as CMP, is performed to remove excess parts of semiconductor bodies 1112 beyond the top surface of silicon oxide layer 1108. As a result, an array of semiconductor bodies 1112 (e.g., single crystalline silicon bodies) extending vertically (in the z-direction) from silicon substrate 1102 through the stack of silicon oxide layer 1108, silicon nitride layer 1106, and silicon oxide layer 1104 is formed thereby, according to some implementation.

In some implementations, at operation 2406 in FIG. 24, one of the stack of dielectric layers is removed to expose part of the semiconductor body. In some implementations, to remove the one of the stack of dielectric layers, a trench is etched through at least part of the stack of dielectric layers to expose the layer having the second dielectric, and the layer having the second dielectric (e.g., the sacrificial layer) is etched away via the trench. In some implementations, the trench is etched aligned with one side of the semiconductor body to expose the semiconductor body from the side.

Figure 11C:
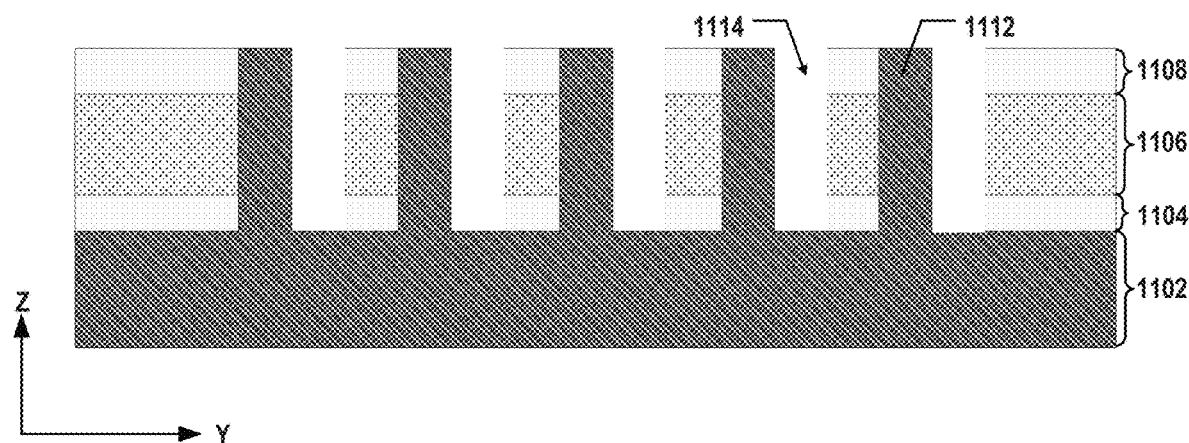
Figure 11C:
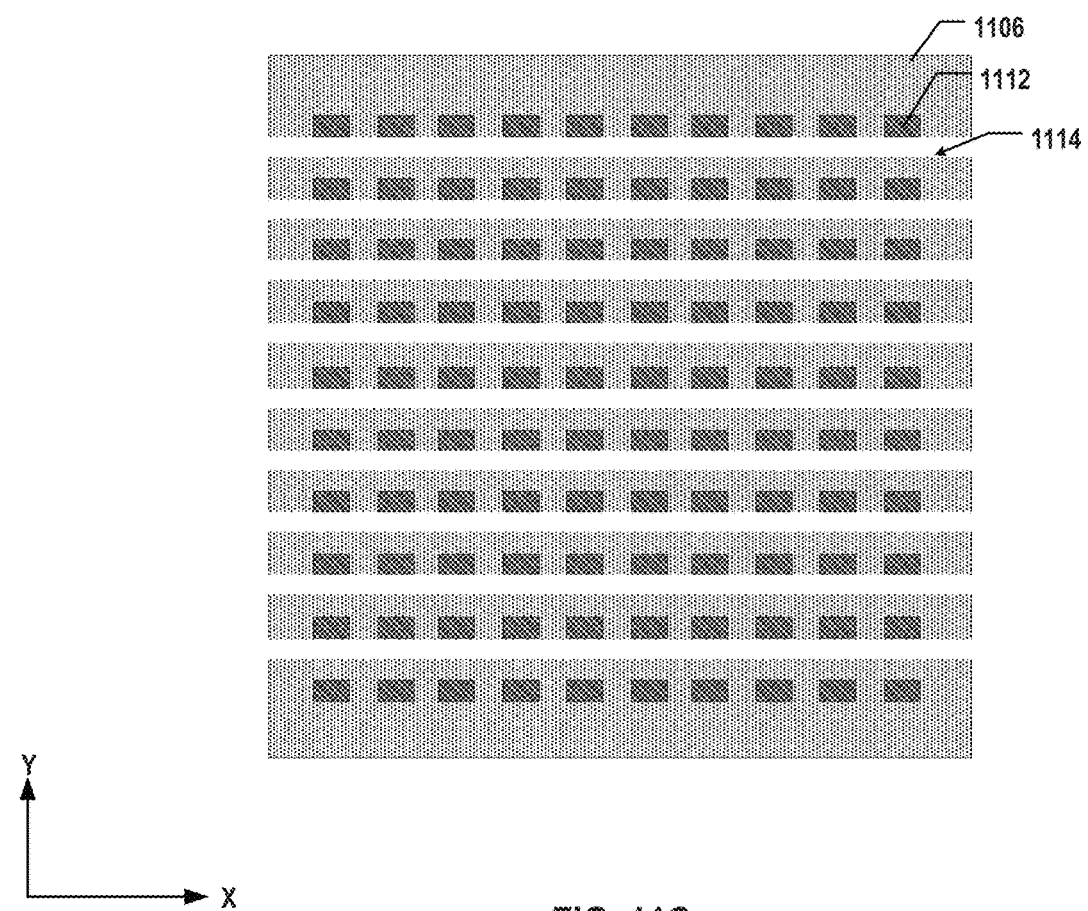

As illustrated in FIG. 11C, a plurality of trenches 1114 (slits openings) each extending laterally along the word line direction (the x-direction) and extending vertically through at least silicon oxide layer 1108 and silicon nitride layer 1106 are formed to expose silicon nitride layer 1106. As a result, parts of silicon nitride layer 1106 can be exposed from trenches 1114. In some implementations, a lithography process is performed to pattern trenches 1114 using an etch mask (e.g., a photoresist mask), for example, based on the design of word lines (word line trenches). As shown in FIG. 11C, trench 1114 is patterned to be formed between adjacent rows of semiconductor bodies 1112 and aligned with one side of semiconductor bodies 1112 to expose the semiconductor bodies 1112 from the side, according to some implementations. That is, trench 1114 can be patterned to touch one side of semiconductor bodies 1112, such that semiconductor bodies 1112 are exposed from the side. In some implementations, one or more dry etching and/or wet etching processes, such as RIE, are performed to etch trenches 1114 through silicon oxide layer 1108, silicon nitride layer 1106, and silicon oxide layer 1104 until being stopped by silicon substrate 1102. It is understood that in some examples, the etching of trenches 1114 may not go all the way to silicon substrate 1102 and may be stopped at silicon oxide layer 1104 so long as silicon nitride layer 1106 is exposed from trenches 1114.

Figure 11D:
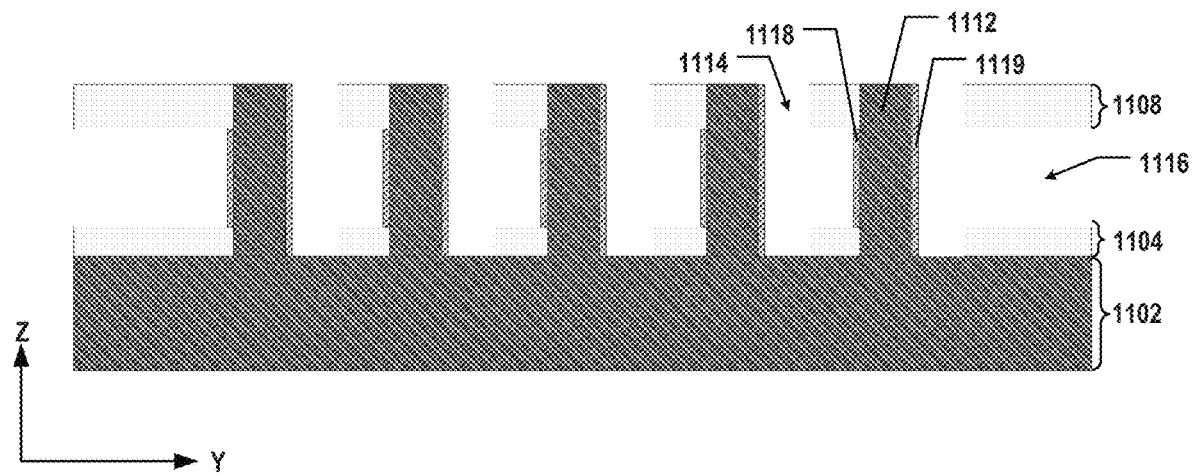
Figure 11D:
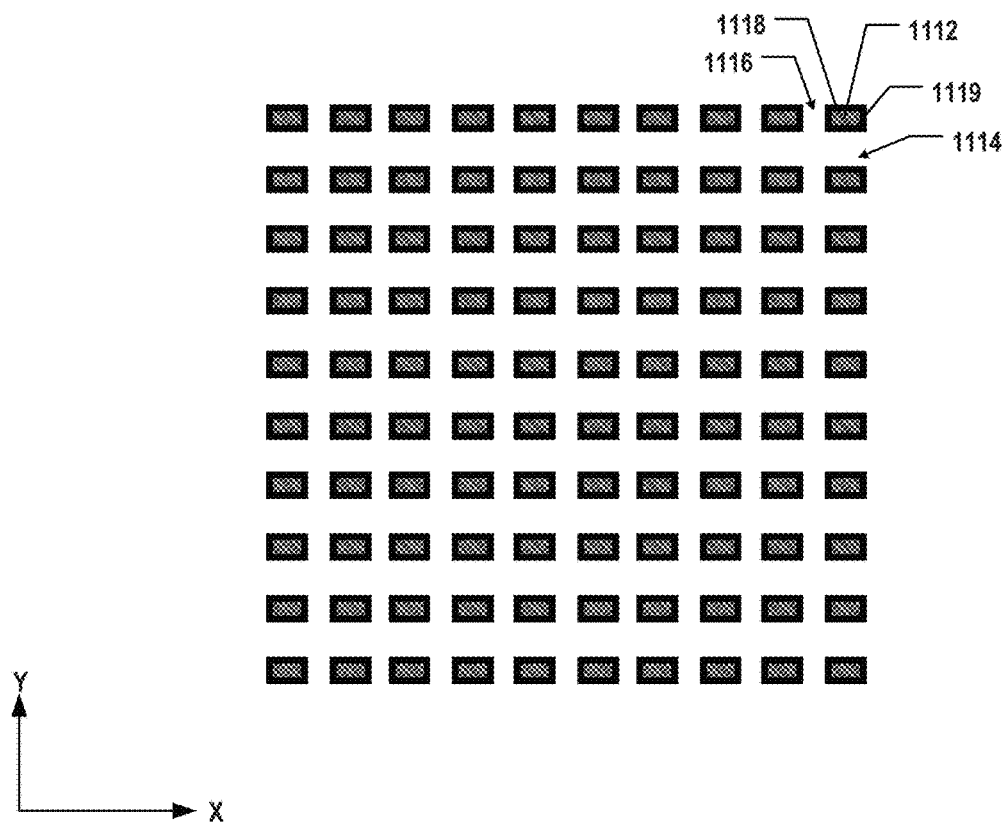

As illustrated in FIG. 11D, silicon nitride layer 1106 (shown in FIG. 11C) is removed to expose parts of semiconductor bodies 1112 abutting silicon nitride layer 1106. In some implementations, silicon nitride layer 1106 is etched away via trenches 1114. For example, a wet etchant including phosphoric acid may be applied through trenches 1114 to selectively wet etch silicon nitride layer 1106 without etching silicon oxide layers 1104 and 1108 as well as semiconductor bodies 1112 and silicon substrate 1102. As a result, lateral recesses 1116 can be formed vertically between silicon oxide layers 1104 and 1008 thereby, which expose parts of semiconductor bodies 1112.

As illustrated in FIG. 11D, a gate dielectric 1118 is formed over the exposed part of each semiconductor body 1112, e.g., surrounding and contacting all the sides of the exposed part of semiconductor body 1112. As shown in the plan view, gate dielectric 1118 can fully circumscribe a respective semiconductor body 1112. In some implementations, a wet oxidation and/or a dry oxidation process, such as ISSG, is performed to form native oxide (e.g., silicon oxide) on semiconductor body 1112 (e.g., single crystalline silicon) as gate dielectric 1118. In some implementations, gate dielectric 1118 is formed by depositing a layer of dielectric, such as silicon oxide, over the exposed part of semiconductor body 1112 through trenches 1114 and lateral recesses 1116 using one or more thin film deposition processes including, but not limited to, CVD, PVD, ALD, or any combination thereof, without filling lateral recesses 1116 and trenches 1114.

Different from FIG. 10F in which gate dielectric 1118 has a uniform vertical dimension (thickness in the z-direction) because all sides of semiconductor body 1112 is surrounded by lateral recess 1016 having the same vertical dimension, in FIG. 11D, because one side of semiconductor body 1112 is aligned with and touches trench 1114 having a greater vertical dimension than that of lateral recess 1116, part of gate dielectric 1118 formed on that side of semiconductor body 1112 (referred to as elongated gate dielectric part 1119) can have a greater vertical dimension than the remainder of gate dielectric 1118 formed on other sides of semiconductor body 1112 touching lateral recess 1116, as shown in the side view of FIG. 11D.

Figure 11E:
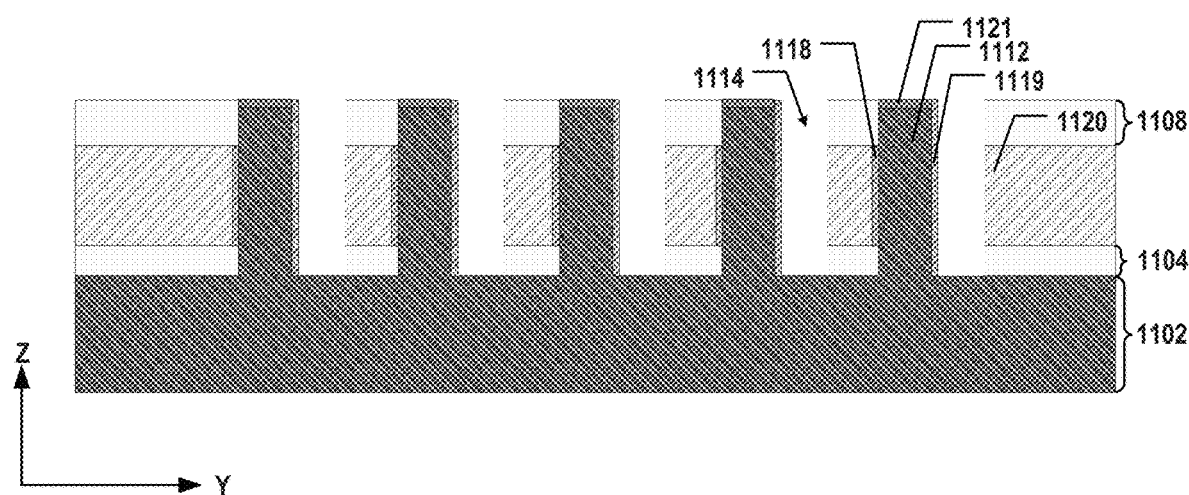
Figure 11E:
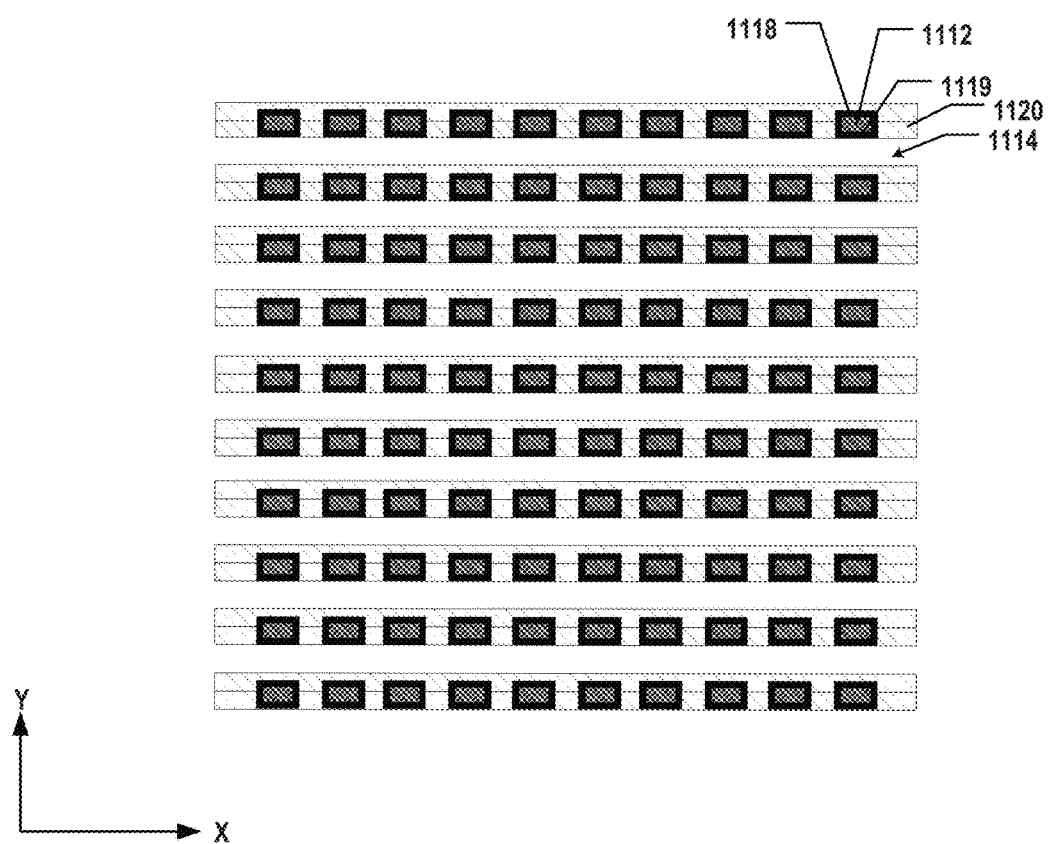

As illustrated in FIG. 11E, a conductive layer 1120 is formed over gate dielectric 1118 in lateral recesses 1116 (shown in FIG. 11D) through trenches 1114, but not over elongated gate dielectric part 1119. In some implementations, conductive layer 1120 is formed by depositing conductive materials, such as metal or metal compounds (e.g., TiN), over gate dielectrics 1118 using one or more thin film deposition processes including, but not limited to, CVD, PVD, ALD, or any combination thereof, through trenches 1114 to fill lateral recesses 1116. In one example, the deposition of conductive layer 1120 is controlled not to fill trenches 1114 (and not over elongated gate dielectric part 1119). It is understood that in some examples, the deposition of conductive layer 1120 may fill trenches 1114 as well. Thus, a planarization process, e.g., CMP, may be performed to remove the excess conductive layer 1120 over the top surface of silicon oxide layer 1108, and conductive layer 1120 may be patterned to form a gate electrode over only gate dielectric 1118, but not elongated gate dielectric part 1119. For example, trenches 1114 filled with conductive layer 1120 may be patterned and etched again to separate conductive layers 1120 between adjacent rows of semiconductor bodies 1112 and gate dielectrics 1118. As described above, a lithography process can be performed to pattern trenches 1114 again using an etch mask (e.g., a photoresist mask), for example, based on the design of word lines (word line trenches).

As a result, patterned conductive layers 1120 can become word lines each extending in the word line direction (the x-direction) and being separated by adjacent trenches 1114, and parts of patterned conductive layers 1120 that are over gate dielectrics 1118, but not elongated gate dielectric part 1119, can become gate electrodes. Gate structures each including a respective gate dielectric 1118 over the exposed part semiconductor body 1112 and a respective gate electrode (part of conductive layer 1120) over gate dielectric 1118 can be formed thereby. Since conductive layer 1120 remains on only some sides of semiconductor body 1012 (and gate dielectric 1018 thereover) when patterning conductive layer 1120 (etching trenches 1114), the gate structure is in contact with some, but not all, sides of semiconductor body 1012, according to some implementations, as shown in FIG. 11E. As shown in the plan view, the gate structure (having gate dielectric 1118 and the gate electrode) can partially circumscribe a respective semiconductor body 1112, and not all sides of each semiconductor body 1112 can be surrounded and contacted by the respective gate structure. Compared with the pitch of word lines 1020 in the example in FIG. 10G, the pitch of word lines 1120 in FIG. 11E may be increased to reduce the fabrication complexity.

As illustrated in FIG. 11E, the exposed upper end of each semiconductor body 1112, e.g., one of the two ends of semiconductor body 1112 in the vertical direction (the z-direction) that is away from silicon substrate 1102, is doped to form a source/drain 1121 (e.g., a source terminal of a vertical transistor). In some implementations, an implantation process and/or thermal diffusion process are performed to dope P-type dopants or N-type dopants to exposed upper ends of semiconductor bodies 1112 to form sources/drains 1021.

Figure 11F:
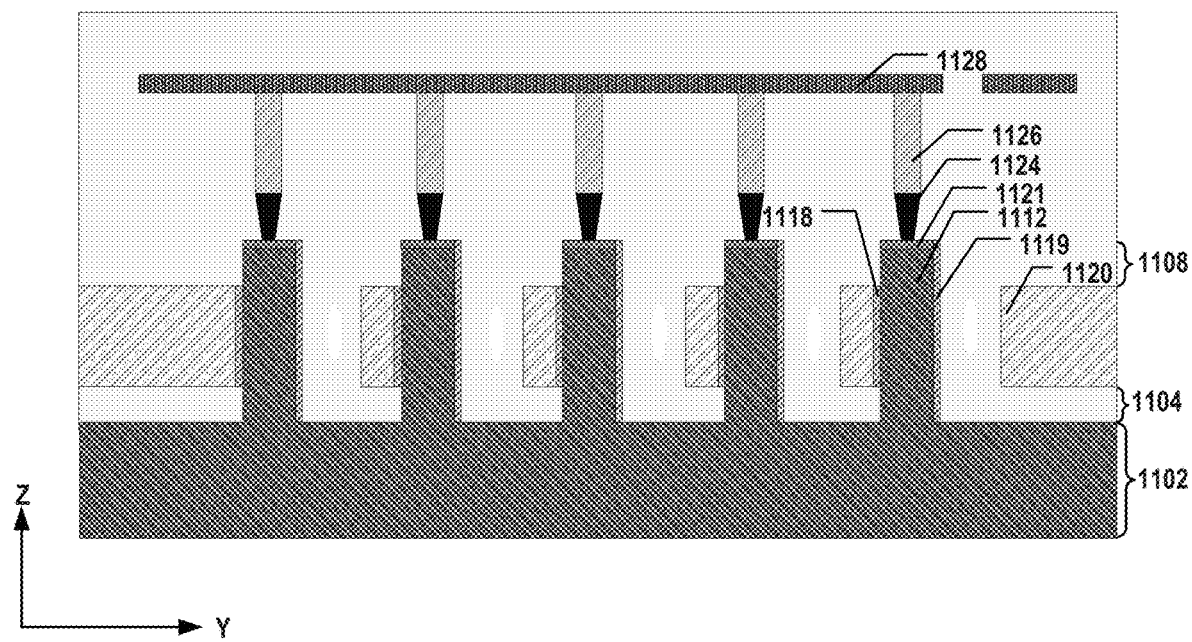

As illustrated in FIG. 11F, one or more ILD layers are formed over the top surface of silicon oxide layer 1108, for example, by depositing dielectrics using one or more thin film deposition processes including, but not limited to, CVD, PVD, ALD, or any combination thereof. It is understood that in some examples in which the ILD layers include silicon oxide, the same material as silicon oxide layer 1108, the boundary and interface between the ILD layer and silicon oxide layer 1108 may become indistinguishable after the deposition. Due to the relatively larger lateral dimensions of trenches 1114 (shown in FIG. 11E) compared with trenches 1014 (as a result of a larger pitch of word lines 1120), trenches 1114 may be fully filled or at least partially with dielectrics (e.g., silicon oxide) when forming the ILD layers and thus, eliminating air gaps 1022 or at least reducing air gaps 1022 between adjacent word lines (patterned conductive layers 1120).

As illustrated in FIG. 11F, capacitor contacts 1124, first electrodes, capacitor dielectrics, and second electrodes of capacitors 1126, and common plate 1128 are subsequently formed in the ILD layers to be coupled to semiconductor bodies 1112. In some implementations, each capacitor contact 1124 is formed on a respective source/drain 1121, e.g., the doped upper end of a respective semiconductor body 1112 by patterning and etching an electrode hole aligned with respective source/drain 1121 using lithography and etching processes and depositing conductive materials to fill the electrode hole using thin film deposition processes. In some implementations, common plate 1128 is formed on the second electrodes of capacitors 1126 by patterning and etching an electrode trench aligned with capacitors 1126 using lithography and etching processes and depositing conductive materials to fill the electrode trench using thin film deposition processes.

Figure 11G:
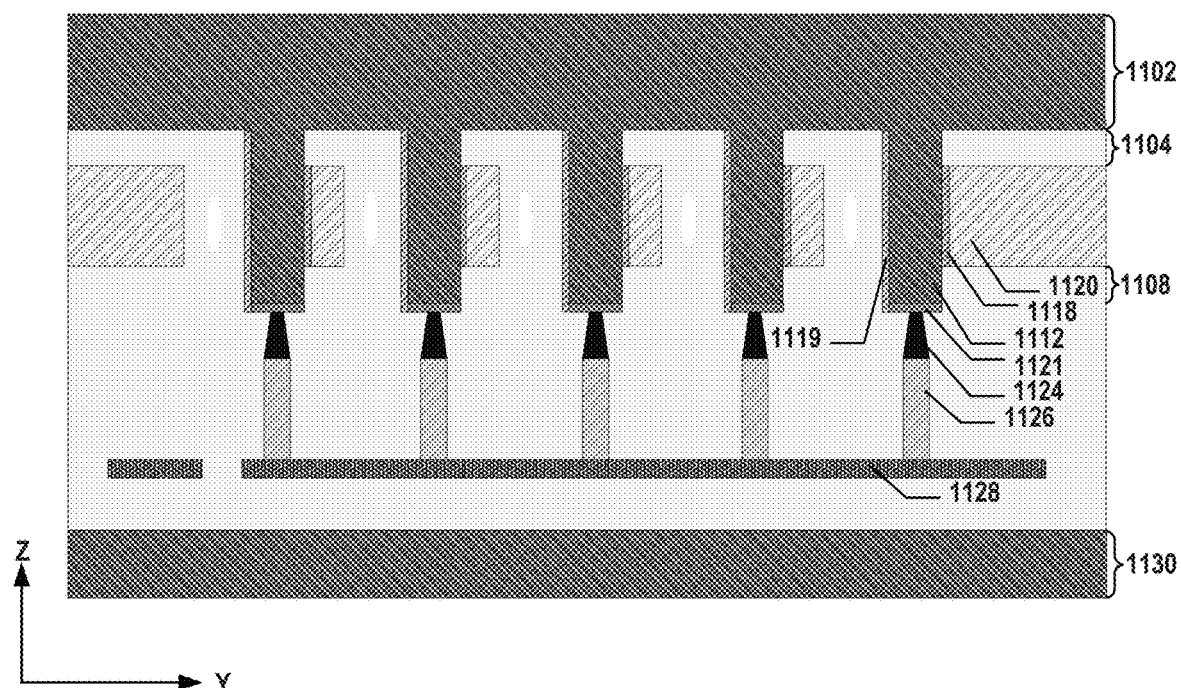

As illustrated in FIG. 11G, a carrier substrate 1130 (a.k.a. a handle substrate) is bonded onto the front side of silicon substrate 1102 on which devices are formed using any suitable bonding processes, such as anodic bonding, fusion bonding, transfer bonding, adhesive bonding, and eutectic bonding. The bonded structure can then be flipped upside down, such that silicon substrate 1102 become above carrier substrate 1130.

Figure 11H:
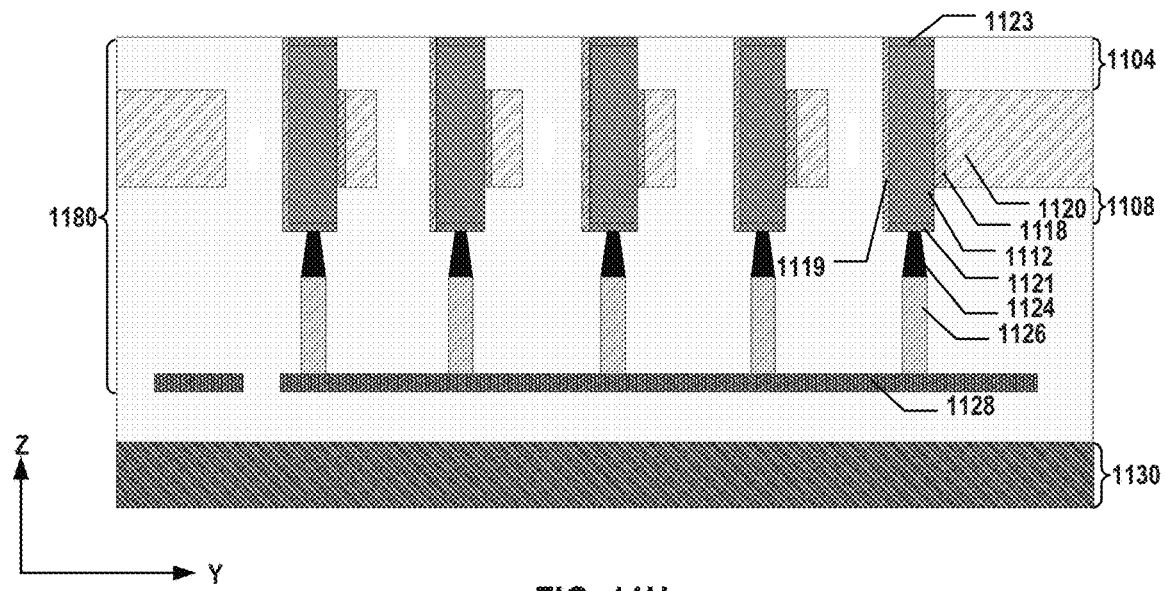

As illustrated in FIG. 11H, silicon substrate 1102 (shown in FIG. 11G) is removed to expose the undoped upper ends of semiconductor bodies 1112 (used to be the lower ends before flipping over). In some implementations, planarization processes (e.g., CMP) and/or etching processes are performed to remove silicon substrate 1102 until being stopped by silicon oxide layer 1104 and the upper ends of semiconductor bodies 1112.

As illustrated in FIG. 11H, the exposed upper end of each semiconductor body 1112, e.g., one of the two ends of semiconductor body 1112 in the vertical direction (the z-direction) that is away from carrier substrate 1130, is doped to form another source/drain 1123 (e.g., a drain terminal of the vertical transistor). In some implementations, an implantation process and/or thermal diffusion process are performed to dope P-type dopants or N-type dopants to exposed upper ends of semiconductor bodies 1112 to form sources/drains 1123. As a result, multi-gate vertical transistors having semiconductor body 1112, sources/drains 1121 and 1123, gate dielectric 1118 (not including elongated gate dielectric part 1119), and the gate electrode (part of conductive layer 1120) are formed thereby, as shown in FIG. 11H, according to some implementations. As described above, capacitors 1126 are thereby formed as well, and DRAM cells 1180 each having a multi-gate vertical transistor and a capacitor coupled to the multi-gate vertical transistor are thereby formed, as shown in FIG. 11H, according to some implementations.

Figure 11I:
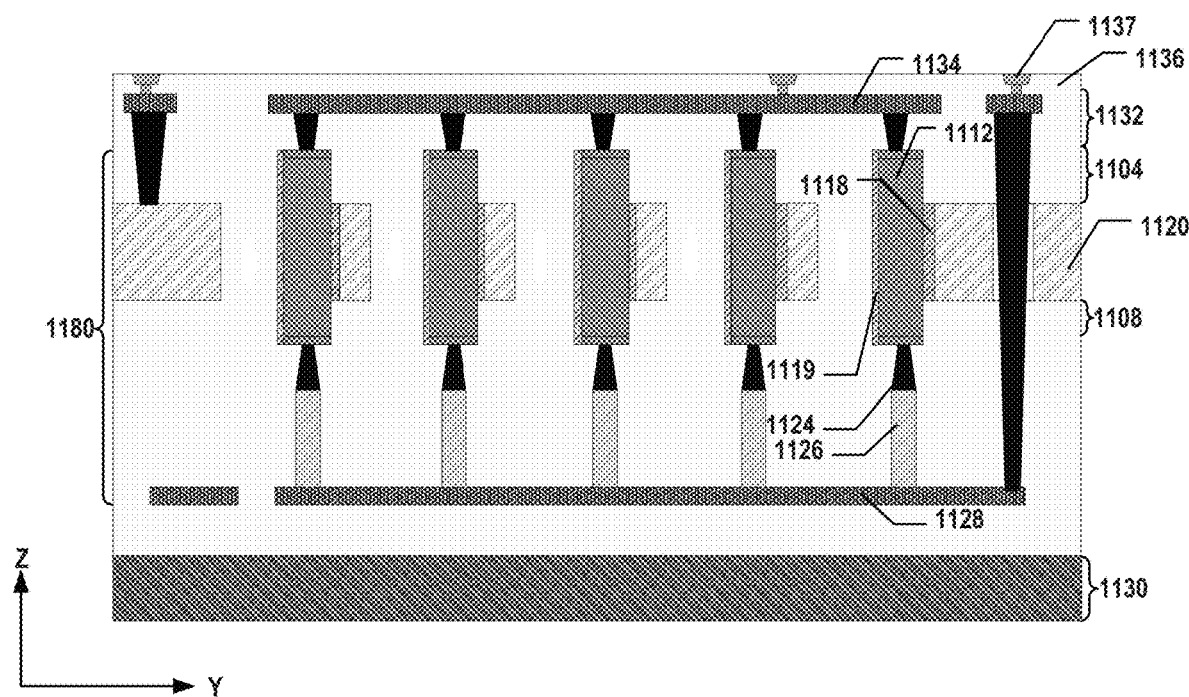

As illustrated in FIG. 11I, an interconnect layer 1132 can be formed above DRAM cells 1180. Interconnect layer 1132 can include interconnects of MEOL and/or BEOL in a plurality of ILD layers to make electrical connections with DRAM cells 1180. In some implementations, interconnect layer 1132 includes multiple ILD layers and interconnects therein formed in multiple processes. For example, the interconnects in interconnect layers 1132 can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. The ILD layers can include dielectric materials deposited on silicon oxide layer 1104 by one or more thin film deposition processes including, but not limited to, CVD, PVD, ALD, or any combination thereof. The ILD layers and interconnects illustrated in FIG. 11I can be collectively referred to as interconnect layer 1132. As illustrated in FIG. 11I, bit line 1134 can be formed on sources/drains 1123 by patterning and etching a trench aligned with respective source/drain 1123 using lithography and etching processes and depositing conductive materials to fill the trench using thin film deposition processes. In some implementations, forming bit line 1134 includes depositing a metal layer onto the exposed end of semiconductor body 1112.

As illustrated in FIG. 11I, a bonding layer 1136 is formed above interconnect layer 1132 and DRAM cells 1180. Bonding layer 1136 can include a plurality of bonding contacts 1137 surrounded by dielectrics. In some implementations, a dielectric layer (e.g., ILD layer) is deposited on the top surface of interconnect layer 1132 by one or more thin film deposition processes including, but not limited to, CVD, PVD, ALD, or any combination thereof. Bonding contacts 1137 can then be formed through the dielectric layer and in contact with the interconnects in interconnect layer 1132 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing a barrier layer, an adhesion layer, and/or a seed layer before depositing the conductor.

As described above, FIGS. 10A-10M illustrates a fabrication process of forming a DRAM cell array from a three-layer dielectric stack having a sacrificial layer (e.g., silicon nitride layer 1006) sandwiched between two dielectric layers (e.g., silicon oxide layers 1004 and 1008). It is understood that the configuration of the dielectric stack from which the DRAM cell array is formed can vary in other examples, resulting DRAM cells with different structures, such as in 3D memory devices 603 and 605 in FIGS. 6C and 6D. In some implementations as shown in FIGS. 12A-12H, a DRAM cell array is formed from a two-layer dielectric stack having a sacrificial layer on a dielectric layer.

At operation 2402 in FIG. 24, a stack of dielectric layers is formed on a substrate. In some implementations, to form the stack of dielectric layers, two layers having a first dielectric and a second dielectric, respectively, are subsequently deposited on the substrate. The first dielectric can include silicon oxide, and the second dielectric can include silicon nitride. The layer having the second dielectric can act as a sacrificial layer on the layer having the first dielectric. The sacrificial layer can be removed by selectively etching against the other layer having the first dielectric and replaced with a conductive layer in the later processes.

Figure 12A:
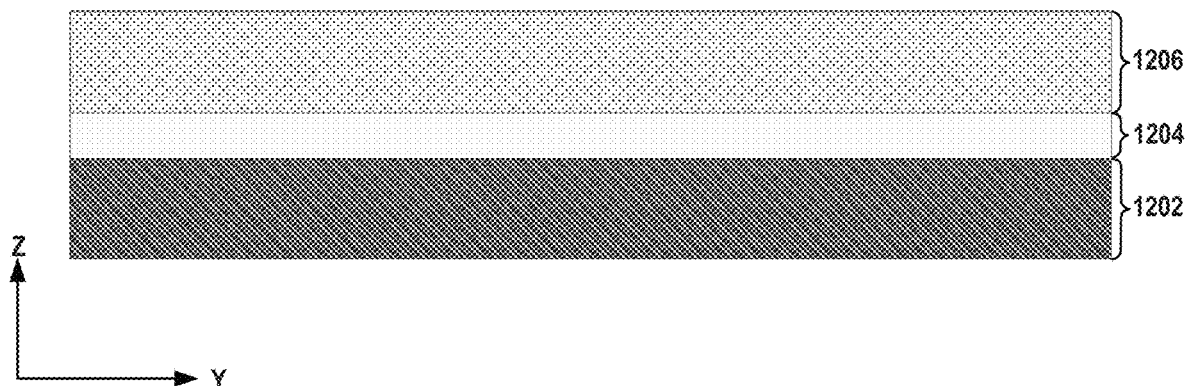
FIGS. 12A-12H illustrate a fabrication process for forming still another 3D memory device including vertical transistors, according to some aspects of the present disclosure.

As illustrated in FIG. 12A, a stack of a silicon oxide layer 1204 and a silicon nitride layer 1206 is formed on a silicon substrate 1202. To form the dielectric stack, silicon oxide and silicon nitride are subsequently deposited onto silicon substrate 1202 using one or more thin film deposition processes including, but not limited to, CVD, PVD, ALD, or any combination thereof. In some implementations, silicon oxide layer 1204 is formed by oxidizing the top portion of silicon substrate 1202 using dry oxidation and/or we oxidation, such as in situ steam generation (ISSG) oxidation process.

Figure 12B:
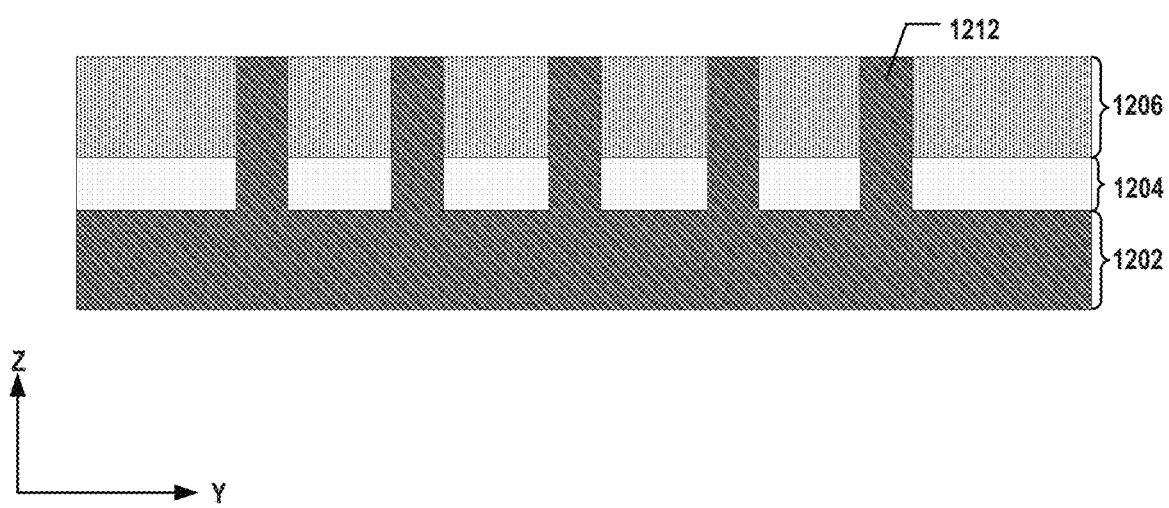

As illustrated in FIG. 12B, an array of semiconductor bodies 1212 each extending vertically through the stack of silicon nitride layer 1206 and silicon oxide layer 1204 are formed. Semiconductor body 1212 can be epitaxially grown from the respective exposed part of silicon substrate 1202 in a respective opening (not shown). The fabrication processes for epitaxially growing semiconductor body 1212 can include, but not limited to, VPE, LPE, MPE, or any combinations thereof. The epitaxy can occur upward (toward the positive z-direction) from the exposed parts of silicon substrate 1202 in the openings. Semiconductor body 1212 thus can have the same material as silicon substrate 1202, in the form of single crystalline silicon. In some implementations, a planarization process, such as CMP, is performed to remove excess parts of semiconductor bodies 1212 beyond the top surface of silicon nitride layer 1206. As a result, an array of semiconductor bodies 1212 (e.g., single crystalline silicon bodies) extending vertically (in the z-direction) from silicon substrate 1202 through the stack of silicon nitride layer 1206 and silicon oxide layer 1204 is formed thereby, according to some implementation.

Figure 12C:
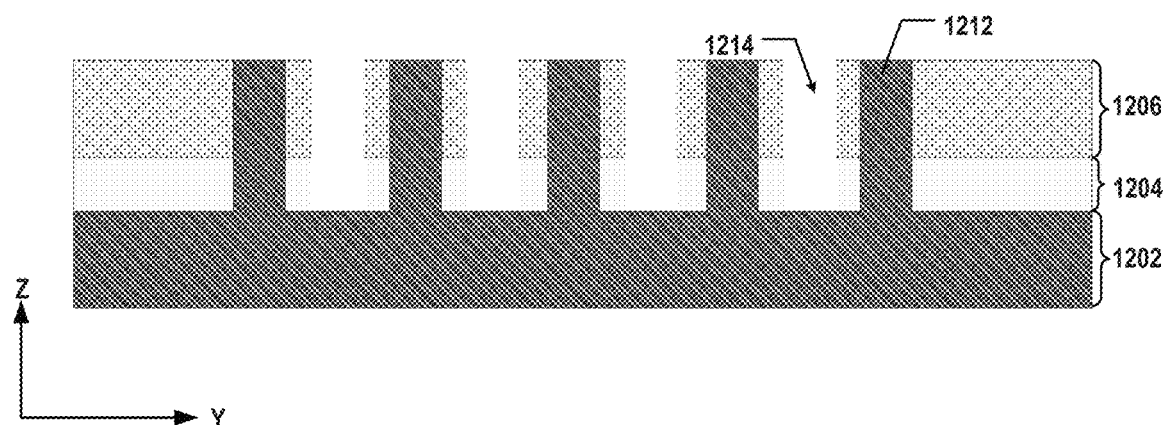

As illustrated in FIG. 12C, a plurality of trenches 1214 (slits openings) each extending laterally along the word line direction (the x-direction) and extending vertically through at least silicon nitride layer 1206 are formed to expose silicon nitride layer 1206. As a result, parts of silicon nitride layer 1206 can be exposed from trenches 1214. In some implementations, a lithography process is performed to pattern trenches 1214 using an etch mask (e.g., a photoresist mask), for example, based on the design of word lines (word line trenches). In some implementations, one or more dry etching and/or wet etching processes, such as RIE, are performed to etch trenches 1214 through silicon nitride layer 1206 and silicon oxide layer 1204 until being stopped by silicon substrate 1202. It is understood that in some examples, the etching of trenches 1214 may not go all the way to silicon substrate 1202 and may be stopped at silicon oxide layer 1204 so long as silicon nitride layer 1206 is exposed from trenches 1214.

Figure 12D:
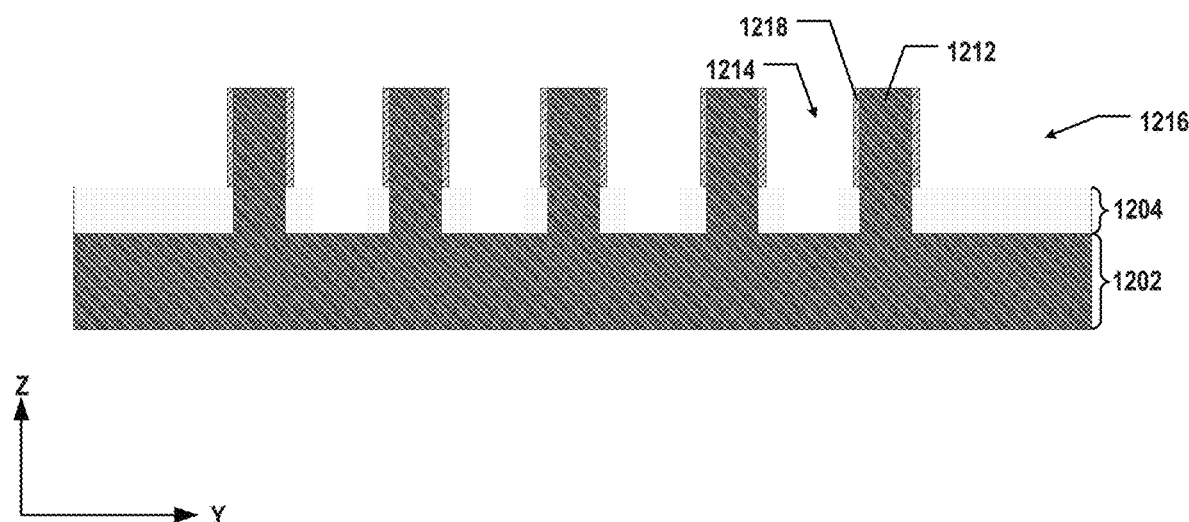

As illustrated in FIG. 12D, silicon nitride layer 1206 (shown in FIG. 12C) is removed to expose parts of semiconductor bodies 1212 abutting silicon nitride layer 1206. In some implementations, silicon nitride layer 1206 is etched away via trenches 1214. For example, a wet etchant including phosphoric acid may be applied through trenches 1214 to selectively wet etch silicon nitride layer 1206 without etching silicon oxide layer 1204 as well as semiconductor bodies 1212 and silicon substrate 1202. As a result, lateral recesses 1216 can be formed thereby, which expose parts of semiconductor bodies 1212. It is understood that in some examples, the top surface of silicon nitride layer 1206 may be exposed, such that trenches 1214 may not be needed to remove silicon nitride layer 1206. Dry etching and/or wet etching processes may be applied directly on silicon nitride layer 1206 to remove silicon nitride layer 1206 (from FIG. 12B to FIG. 12D directly without going through FIG. 12C).

As illustrated in FIG. 12D, a gate dielectric 1218 is formed over the exposed part of each semiconductor body 1212, e.g., surrounding and contacting all the sides of the exposed part of semiconductor body 1212. In some implementations, a wet oxidation and/or a dry oxidation process, such as ISSG, is performed to form native oxide (e.g., silicon oxide) on semiconductor body 1212 (e.g., single crystalline silicon) as gate dielectric 1218. In some implementations, gate dielectric 1218 is formed by depositing a layer of dielectric, such as silicon oxide, over the exposed part of semiconductor body 1212 through trenches 1214 and lateral recesses 1216 using one or more thin film deposition processes including, but not limited to, CVD, PVD, ALD, or any combination thereof, without filling lateral recesses 1216 and trenches 1214. Due to the omission of silicon oxide layer 1008, the upper end of gate dielectric 1218 can be flush with the upper end of semiconductor body 1212 as shown in FIG. 12D, while the upper end of gate dielectric 1018 is below the upper end of semiconductor body 1012 in FIG. 10F.

Figure 12E:
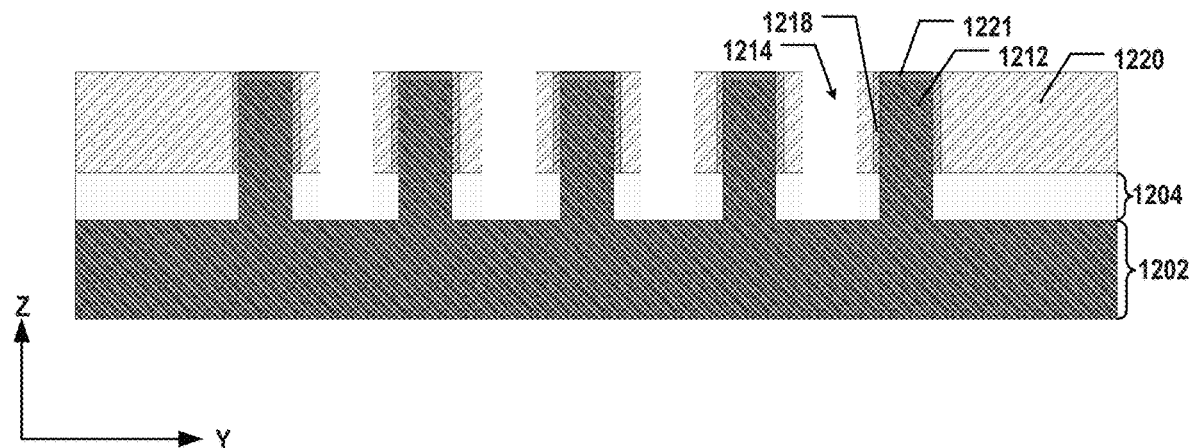

As illustrated in FIG. 12E, a conductive layer 1220 is formed over gate dielectrics 1218 in lateral recesses 1216 (shown in FIG. 12D) through trenches 1214. In some implementations, conductive layer 1220 is formed by depositing conductive materials, such as metal or metal compounds (e.g., TiN), over gate dielectrics 1218 using one or more thin film deposition processes including, but not limited to, CVD, PVD, ALD, or any combination thereof, through trenches 1214 to fill lateral recesses 1216. In one example, the deposition of conductive layer 1220 is controlled not to fill trenches 1214. It is understood that in some examples, the deposition of conductive layer 1220 may fill trenches 1214 as well. Thus, a planarization process, e.g., CMP, may be performed to remove the excess conductive layer 1220 to expose the upper ends of semiconductor bodies 1212, and conductive layer 1220 may be patterned to form a gate electrode over a respective gate dielectric. For example, trenches 1214 filled with conductive layer 1220 may be patterned and etched again to separate conductive layers 1220 between adjacent rows of semiconductor bodies 1212 and gate dielectrics 1218. As described above, a lithography process can be performed to pattern trenches 1214 again using an etch mask (e.g., a photoresist mask), for example, based on the design of word lines (word line trenches). Due to the omission of silicon oxide layer 1008, the top surface of conductive layer 1220 (including gate electrodes and word line) can be flush with the upper end of semiconductor body 1212 as shown in FIG. 12E, while the top surface of word line 1020 is below the upper end of semiconductor body 1012 in FIG. 10G.

As a result, patterned conductive layers 1220 can become word lines each extending in the word line direction (the x-direction) and being separated by adjacent trenches 1214, and parts of patterned conductive layers 1220 that are over gate dielectrics 1218 (e.g., fully circumscribes a respective gate dielectric 1218 in the plan view) can become gate electrodes. Gate structures each including a respective gate dielectric 1218 over the exposed part semiconductor body 1212 and a respective gate electrode (part of conductive layer 1220) over gate dielectric 1218 can be formed thereby. Comparing FIG. 12E with FIG. 12A, silicon nitride layer 1206 (sacrificial layer) in FIG. 12A is eventually replaced with conductive layer 1220 in FIG. 12E, according to some implementations.

As illustrated in FIG. 12E, the exposed upper end of each semiconductor body 1212, e.g., one of the two ends of semiconductor body 1212 in the vertical direction (the z-direction) that is away from silicon substrate 1202, is doped to form a source/drain 1221. In some implementations, an implantation process and/or thermal diffusion process are performed to dope P-type dopants or N-type dopants to exposed upper ends of semiconductor bodies 1212 to form sources/drains 1221.

Figure 12F:
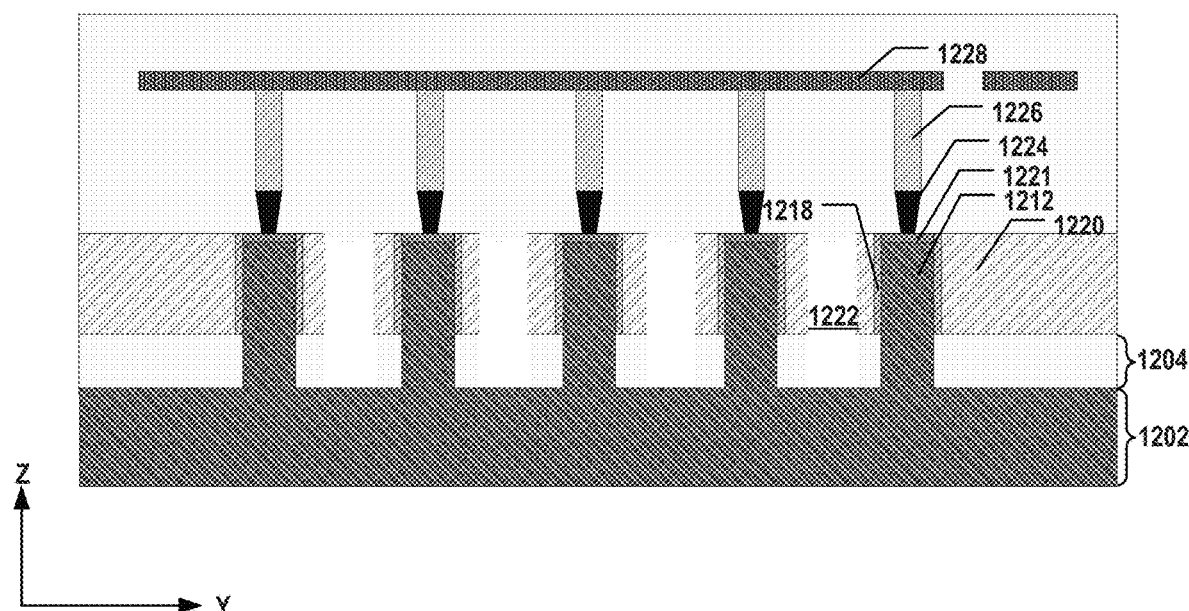

As illustrated in FIG. 12F, one or more ILD layers are formed over the top surface of conductive layer 1220, for example, by depositing dielectrics using one or more thin film deposition processes including, but not limited to, CVD, PVD, ALD, or any combination thereof. Depending on the lateral dimensions of trenches 1214 (shown in FIG. 12E), trenches 1214 may not be fully filled with dielectrics (e.g., silicon oxide) when forming the ILD layers and thus, become air gaps 1222 between adjacent word lines (patterned conductive layers 1220). It is understood that in some examples, when the lateral dimensions of trenches 1214 are sufficiently large, dielectrics may fully fill trenches 1214 during the formation of the ILD layers, thereby eliminating air gaps 1222.

As illustrated in FIG. 12F, capacitor contacts 1224, first electrodes, capacitor dielectrics, and second electrodes of capacitors 1226, and a common plate 1228 are subsequently formed in the ILD layers to be coupled to semiconductor bodies 1212. In some implementations, each capacitor contact 1224 is formed on a respective source/drain 1221, e.g., the doped upper end of a respective semiconductor body 1212 by patterning and etching an electrode hole aligned with respective source/drain 1221 using lithography and etching processes and depositing conductive materials to fill the electrode hole using thin film deposition processes. In some implementations, common plate 1228 is formed on the second electrodes of capacitors 1226 by patterning and etching an electrode trench aligned with capacitors 1226 using lithography and etching processes and depositing conductive materials to fill the electrode trench using thin film deposition processes.

Figure 12G:
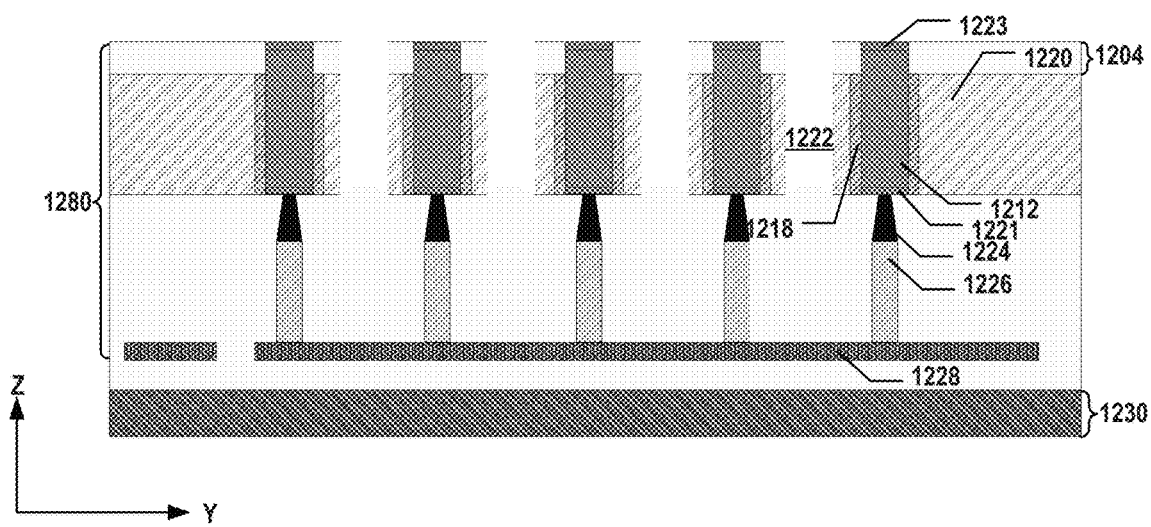

As illustrated in FIG. 12G, a carrier substrate (a.k.a. a handle substrate) 1230 is bonded onto the front side of silicon substrate 1202 on which devices are formed using any suitable bonding processes, such as anodic bonding, fusion bonding, transfer bonding, adhesive bonding, and eutectic bonding. The bonded structure can then be flipped upside down, such that silicon substrate 1202 become above carrier substrate 1230.

As illustrated in FIG. 12G, silicon substrate 1202 (shown in FIG. 12F) is removed to expose the undoped upper ends of semiconductor bodies 1212 (used to be the lower ends before flipping over). In some implementations, planarization processes (e.g., CMP) and/or etching processes are performed to remove silicon substrate 1202 until being stopped by silicon oxide layer 1204 and the upper ends of semiconductor bodies 1212.

As illustrated in FIG. 12G, the exposed upper end of each semiconductor body 1212, e.g., one of the two ends of semiconductor body 1212 in the vertical direction (the z-direction) that is away from carrier substrate 1230, is doped to form another source/drain 1223. In some implementations, an implantation process and/or thermal diffusion process are performed to dope P-type dopants or N-type dopants to exposed upper ends of semiconductor bodies 1212 to form sources/drains 1223. As a result, multi-gate vertical transistors having semiconductor body 1212, sources/drains 1221 and 1223, gate dielectric 1218, and the gate electrode (part of conductive layer 1220) are formed thereby, as shown in FIG. 12G, according to some implementations. As described above, capacitors each having first and second electrodes 1224 and 1228 and capacitor dielectric 1226 are thereby formed as well, and DRAM cells 1280 each having a multi-gate vertical transistor and a capacitor coupled to the multi-gate vertical transistor are thereby formed, as shown in FIG. 12G, according to some implementations.

Figure 12H:
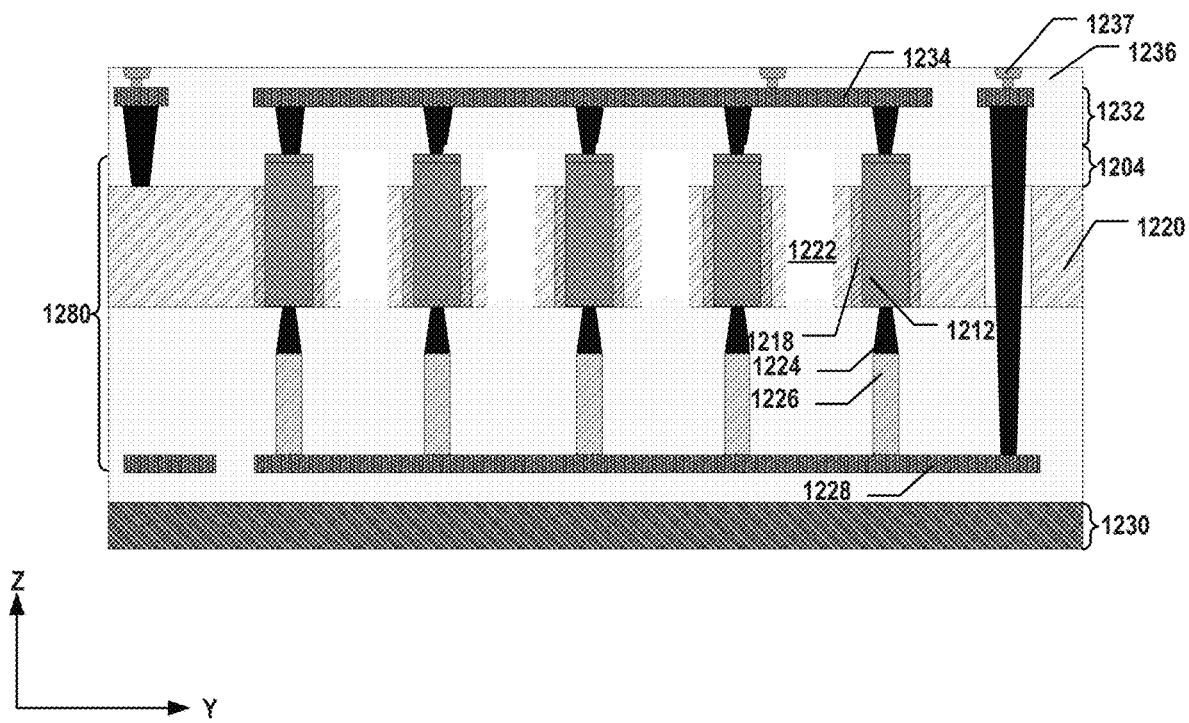

As illustrated in FIG. 12H, an interconnect layer 1232 can be formed above DRAM cells 1280. Interconnect layer 1232 can include interconnects of MEOL and/or BEOL in a plurality of ILD layers to make electrical connections with DRAM cells 1280. In some implementations, interconnect layer 1232 includes multiple ILD layers and interconnects therein formed in multiple processes. For example, the interconnects in interconnect layers 1232 can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. The ILD layers can include dielectric materials deposited on silicon oxide layer 1204 by one or more thin film deposition processes including, but not limited to, CVD, PVD, ALD, or any combination thereof. The ILD layers and interconnects illustrated in FIG. 12H can be collectively referred to as interconnect layer 1232. As illustrated in FIG. 12H, bit line 1234 can be formed on sources/drains 1223 by patterning and etching a trench aligned with respective source/drain 1223 using lithography and etching processes and depositing conductive materials to fill the trench using thin film deposition processes. In some implementations, forming bit line 1234 includes depositing a metal layer onto the exposed end of semiconductor body 1212.

As illustrated in FIG. 12H, a bonding layer 1236 is formed above interconnect layer 1232 and DRAM cells 1280. Bonding layer 1236 can include a plurality of bonding contacts 1237 surrounded by dielectrics. In some implementations, a dielectric layer (e.g., ILD layer) is deposited on the top surface of interconnect layer 1232 by one or more thin film deposition processes including, but not limited to, CVD, PVD, ALD, or any combination thereof. Bonding contacts 1237 can then be formed through the dielectric layer and in contact with the interconnects in interconnect layer 1232 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing a barrier layer, an adhesion layer, and/or a seed layer before depositing the conductor.

In some implementations as shown in FIGS. 13A-13H, a DRAM cell array is formed from a four-layer dielectric stack having a sacrificial layer (e.g., a silicon oxide layer) sandwiched between two dielectric layers (e.g., silicon nitride layers) on a pad layer (e.g., a silicon oxide layer).

At operation 2402 in FIG. 24, a stack of dielectric layers is formed on a substrate. In some implementations, to form the stack of dielectric layers, four layers having a first dielectric, a second dielectric, a third dielectric, and the second dielectric, respectively, are subsequently deposited on the substrate. The second dielectric can include silicon nitride, and the third dielectric can include silicon oxide. The layer having the third dielectric can act as a sacrificial layer vertically sandwiched between the two layers having the second dielectric. The sacrificial layer can be removed by selectively etching against the other layer having the second dielectric and replaced with a conductive layer in the later processes.

Figure 13A:
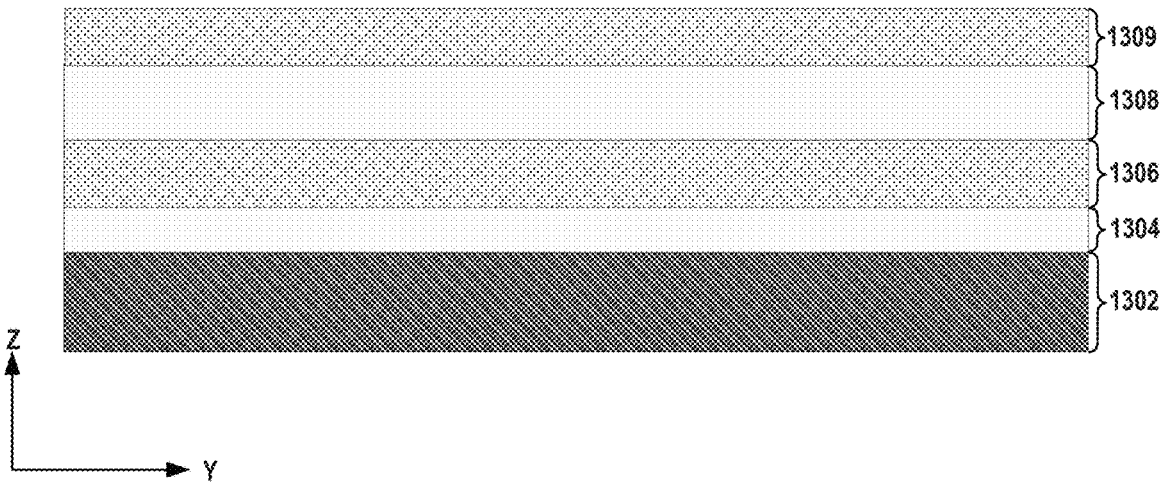
FIGS. 13A-13H illustrate a fabrication process for forming yet another 3D memory device including vertical transistors, according to some aspects of the present disclosure.

As illustrated in FIG. 13A, a stack of a silicon oxide layer 1304, a silicon nitride layer 1306, a silicon oxide layer 1308, and a silicon nitride layer 1309 is formed on a silicon substrate 1302. To form the dielectric stack, silicon oxide and silicon nitride are subsequently and alternatively deposited onto silicon substrate 1202 using one or more thin film deposition processes including, but not limited to, CVD, PVD, ALD, or any combination thereof. In some implementations, silicon oxide layer 1304 (a pad layer) is formed by oxidizing the top portion of silicon substrate 1302 using dry oxidation and/or we oxidation, such as ISSG oxidation process. In some implementations, the thickness of silicon oxide layer 1304 (e.g., ISSG silicon oxide) is smaller than the thickness of silicon oxide layer 1308 (e.g., CVD silicon oxide).

Figure 13B:
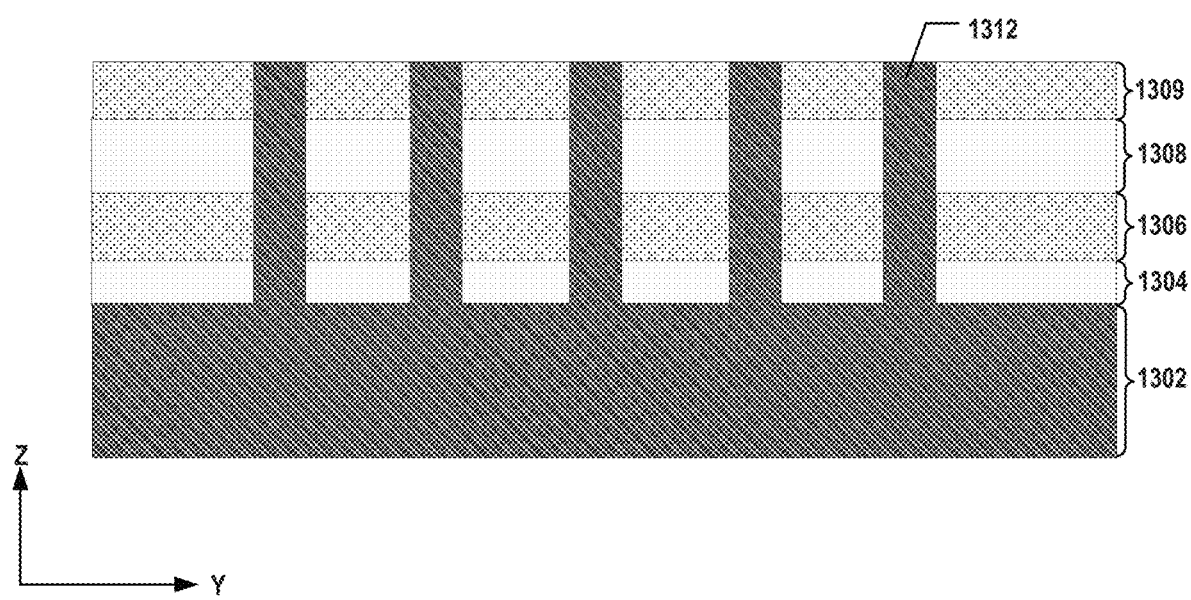

As illustrated in FIG. 13B, an array of semiconductor bodies 1312 each extending vertically through the stack of silicon oxide layer 1304, silicon nitride layer 1306, silicon oxide layer 1308, and silicon nitride layer 1309 are formed. Semiconductor body 1312 can be epitaxially grown from the respective exposed part of silicon substrate 1302 in a respective opening (not shown). The fabrication processes for epitaxially growing semiconductor body 1312 can include, but not limited to, VPE, LPE, MPE, or any combinations thereof. The epitaxy can occur upward (toward the positive z-direction) from the exposed parts of silicon substrate 1302 in the openings. Semiconductor body 1312 thus can have the same material as silicon substrate 1302, in the form of single crystalline silicon. In some implementations, a planarization process, such as CMP, is performed to remove excess parts of semiconductor bodies 1312 beyond the top surface of silicon nitride layer 1309. As a result, an array of semiconductor bodies 1312 (e.g., single crystalline silicon bodies) extending vertically (in the z-direction) from silicon substrate 1302 through the stack of silicon oxide layer 1304, silicon nitride layer 1306, silicon oxide layer 1308, and silicon nitride layer 1309 is formed thereby, according to some implementation.

At operation 2406 in FIG. 24, one of the stack of dielectric layers is removed to expose part of the semiconductor body. In some implementations, to remove the one of the stack of dielectric layers, a trench is etched through at least part of the stack of dielectric layers to expose the layer having the third dielectric, and the layer having the third dielectric (e.g., the sacrificial layer) is etched away via the trench.

Figure 13C:
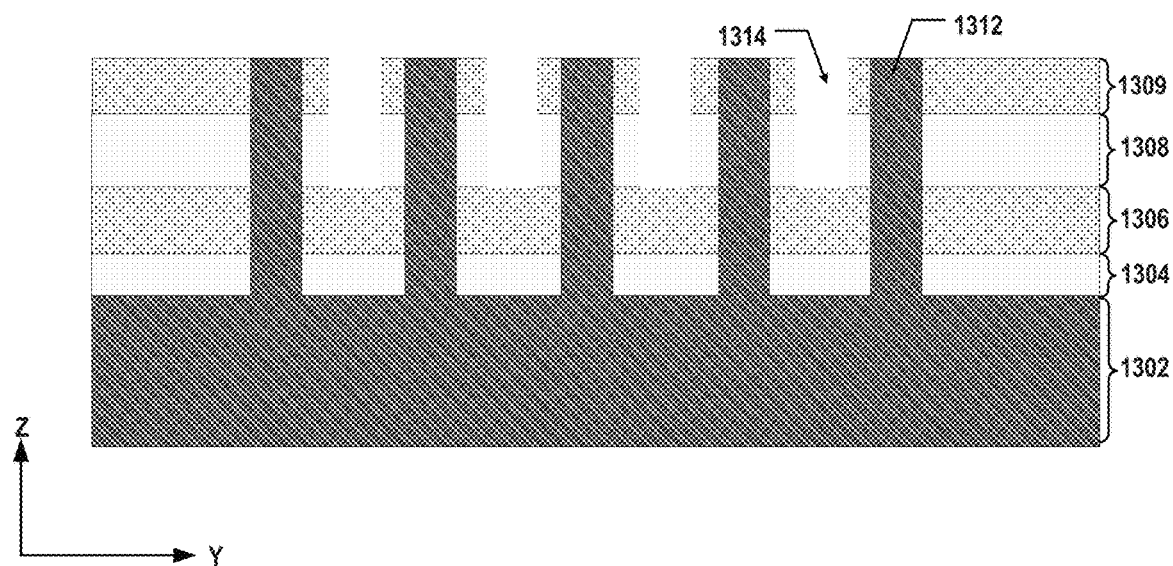

As illustrated in FIG. 13C, a plurality of trenches 1314 (slits openings) each extending laterally along the word line direction (the x-direction) and extending vertically through at least silicon nitride layer 1309 and silicon oxide layer 1308 are formed to expose silicon oxide layer 1308. As a result, parts of silicon oxide layer 1308 can be exposed from trenches 1314. In some implementations, a lithography process is performed to pattern trenches 1314 using an etch mask (e.g., a photoresist mask), for example, based on the design of word lines (word line trenches). In some implementations, one or more dry etching and/or wet etching processes, such as RIE, are performed to etch trenches 1314 through silicon nitride layer 1309 and silicon oxide layer 1308 until being stopped by silicon nitride layer 1306. It is understood that in some examples, the etching of trenches 1314 may go further into silicon nitride layer 1306, but not into silicon oxide layer 1304.

Figure 13D:
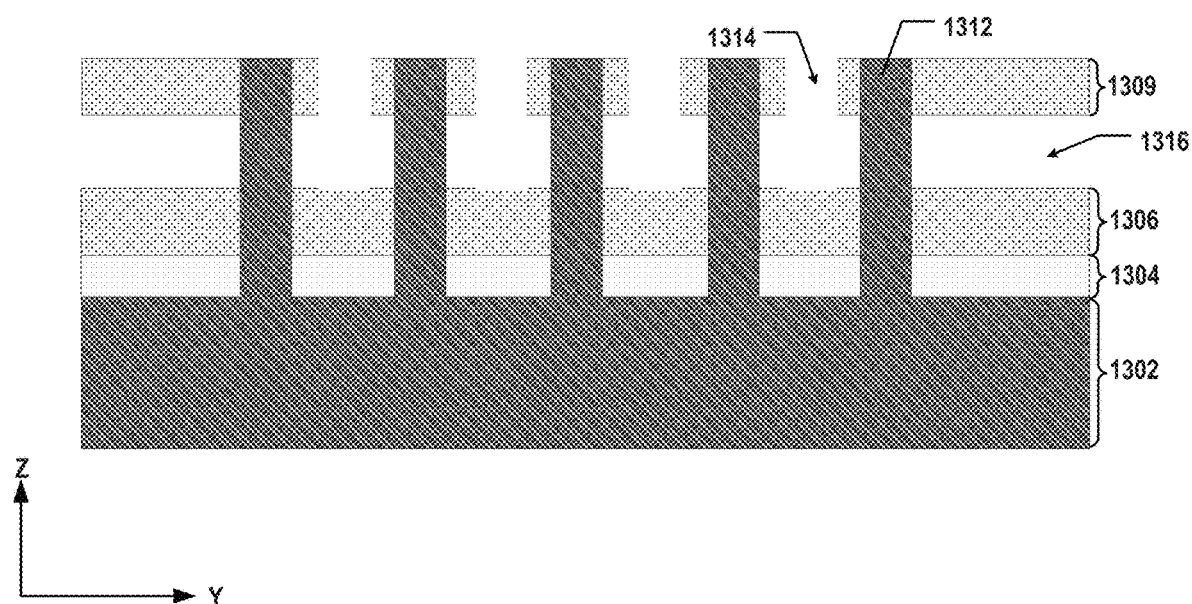

As illustrated in FIG. 13D, silicon oxide layer 1308 (shown in FIG. 13C) is removed to expose parts of semiconductor bodies 1312 abutting silicon oxide layer 1308. In some implementations, silicon oxide layer 1308 is etched away via trenches 1214. For example, a wet etchant including hydrofluoric acid may be applied through trenches 1314 to selectively wet etch silicon oxide layer 1308 without etching silicon nitride layers 1309 and 1306 as well as semiconductor bodies 1312. As a result, lateral recesses 1316 can be formed thereby, which expose parts of semiconductor bodies 1312.

Figure 13E:
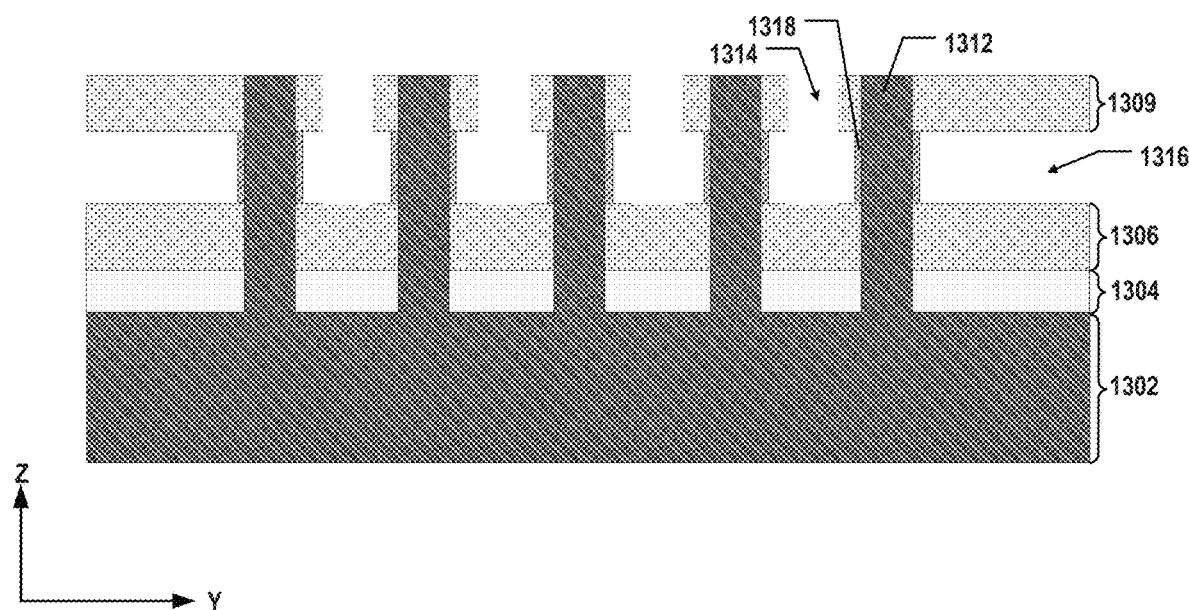

As illustrated in FIG. 13E, a gate dielectric 1318 is formed over the exposed part of each semiconductor body 1312, e.g., surrounding and contacting all the sides of the exposed part of semiconductor body 1312. In some implementations, a wet oxidation and/or a dry oxidation process, such as ISSG, is performed to form native oxide (e.g., silicon oxide) on semiconductor body 1312 (e.g., single crystalline silicon) as gate dielectric 1318. In some implementations, gate dielectric 1318 is formed by depositing a layer of dielectric, such as silicon oxide, over the exposed part of semiconductor body 1312 through trenches 1314 and lateral recesses 1316 using one or more thin film deposition processes including, but not limited to, CVD, PVD, ALD, or any combination thereof, without filling lateral recesses 1316 and trenches 1314. Due to the existence of silicon nitride layer 1309, the upper end of gate dielectric 1318 can be below the upper end of semiconductor body 1312 in FIG. 13E.

Figure 13F:
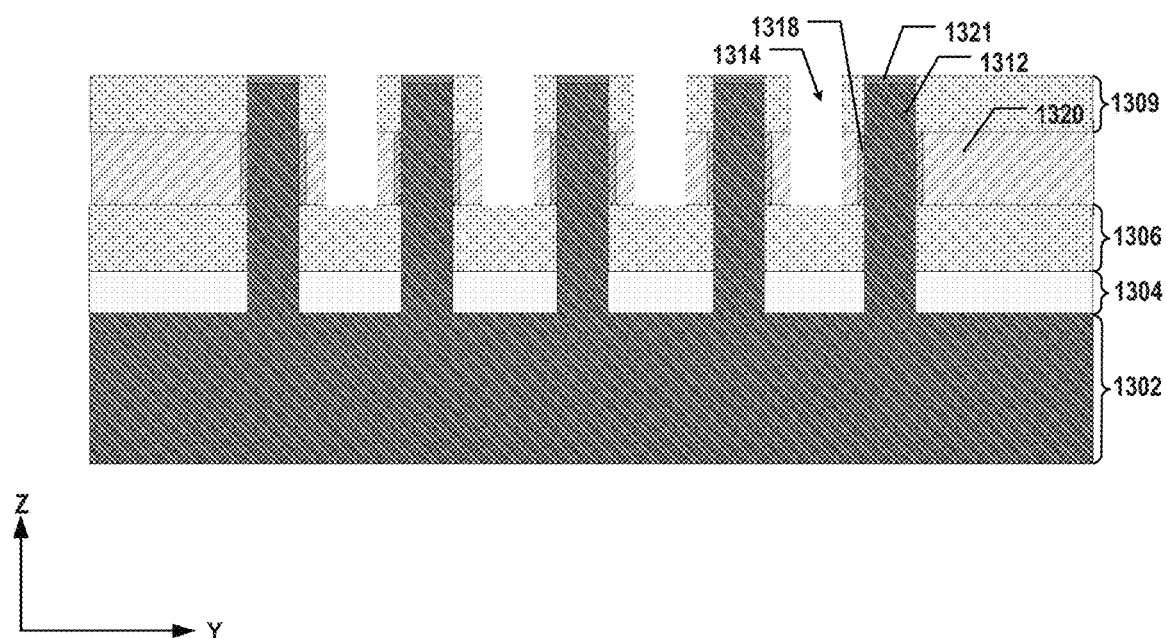

As illustrated in FIG. 13F, a conductive layer 1320 is formed over gate dielectrics 1318 in lateral recesses 1316 (shown in FIG. 13E) through trenches 1314. In some implementations, conductive layer 1320 is formed by depositing conductive materials, such as metal or metal compounds (e.g., TiN), over gate dielectrics 1318 using one or more thin film deposition processes including, but not limited to, CVD, PVD, ALD, or any combination thereof, through trenches 1314 to fill lateral recesses 1316. In one example, the deposition of conductive layer 1320 is controlled not to fill trenches 1314. It is understood that in some examples, the deposition of conductive layer 1320 may fill trenches 1314 as well. Thus, a planarization process, e.g., CMP, may be performed to remove the excess conductive layer 1320 to expose the upper ends of semiconductor bodies 1312, and conductive layer 1320 may be patterned to form a gate electrode over a respective gate dielectric. For example, trenches 1314 filled with conductive layer 1320 may be patterned and etched again to separate conductive layers 1320 between adjacent rows of semiconductor bodies 1312 and gate dielectrics 1318. As described above, a lithography process can be performed to pattern trenches 1314 again using an etch mask (e.g., a photoresist mask), for example, based on the design of word lines (word line trenches). Due to the existence of silicon nitride layer 1309, the top surface of conductive layer 1320 (including gate electrodes and word line) can be below the upper end of semiconductor body 1312 in FIG. 13F.

As a result, patterned conductive layers 1320 can become word lines each extending in the word line direction (the x-direction) and being separated by adjacent trenches 1314, and parts of patterned conductive layers 1320 that are over gate dielectrics 1318 (e.g., fully circumscribes a respective gate dielectric 1318 in the plan view) can become gate electrodes. Gate structures each including a respective gate dielectric 1318 over the exposed part semiconductor body 1312 and a respective gate electrode (part of conductive layer 1320) over gate dielectric 1318 can be formed thereby. Comparing FIG. 13F with FIG. 13A, silicon oxide layer 1308 (sacrificial layer) in FIG. 13A is eventually replaced with conductive layer 1320 in FIG. 13F, according to some implementations.

As illustrated in FIG. 13F, the exposed upper end of each semiconductor body 1312, e.g., one of the two ends of semiconductor body 1312 in the vertical direction (the z-direction) that is away from silicon substrate 1302, is doped to form a source/drain 1321 (e.g., a source terminal of a vertical transistor). In some implementations, an implantation process and/or thermal diffusion process are performed to dope P-type dopants or N-type dopants to exposed upper ends of semiconductor bodies 1312 to form sources/drains 1321.

Figure 13G:
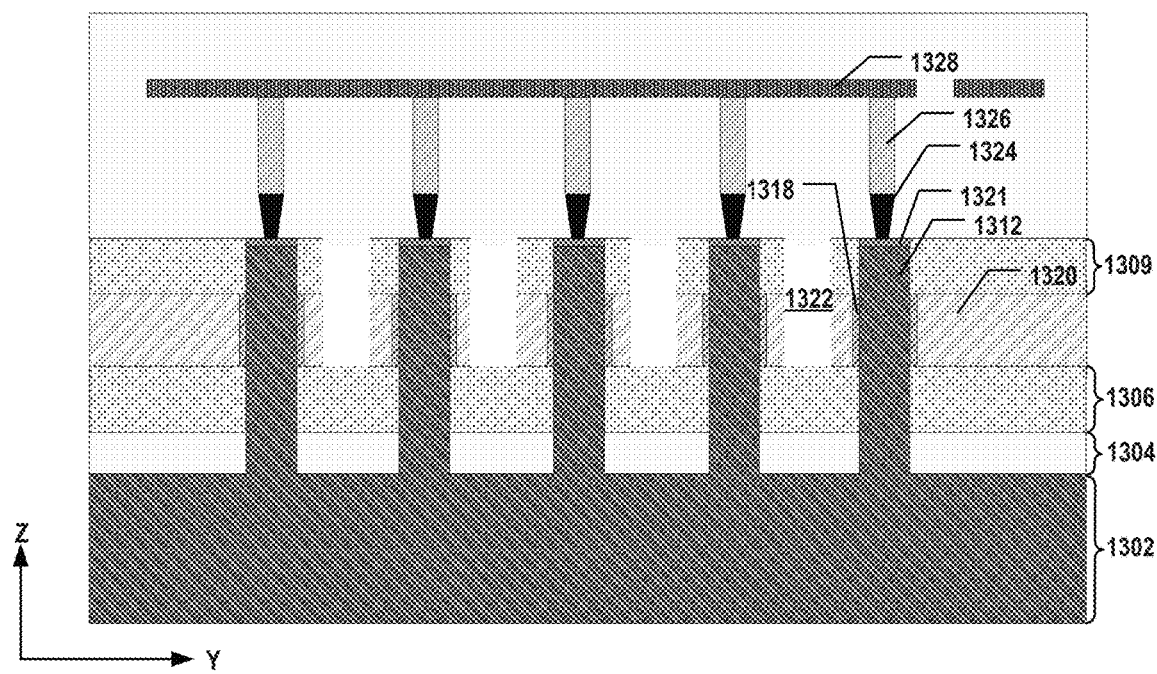

As illustrated in FIG. 13G, one or more ILD layers are formed over the top surface of silicon nitride layer 1309, for example, by depositing dielectrics using one or more thin film deposition processes including, but not limited to, CVD, PVD, ALD, or any combination thereof. Depending on the lateral dimensions of trenches 1314 (shown in FIG. 13F), trenches 1314 may not be fully filled with dielectrics (e.g., silicon oxide) when forming the ILD layers and thus, become air gaps 1322 between adjacent word lines (patterned conductive layers 1320). It is understood that in some examples, when the lateral dimensions of trenches 1314 are sufficiently large, dielectrics may fully fill trenches 1314 during the formation of the ILD layers, thereby eliminating air gaps 1322.

As illustrated in FIG. 13G, capacitor contacts 1324, first electrodes, capacitor dielectrics, and second electrodes of capacitors 1326, and a common plate 1328 are subsequently formed in the ILD layers to be coupled to semiconductor bodies 1312. In some implementations, each capacitor contact 1324 is formed on a respective source/drain 1321, e.g., the doped upper end of a respective semiconductor body 1312 by patterning and etching an electrode hole aligned with respective source/drain 1321 using lithography and etching processes and depositing conductive materials to fill the electrode hole using thin film deposition processes. In some implementations, common plate 1328 is formed on capacitors 1326 by patterning and etching an electrode trench aligned with capacitors 1326 using lithography and etching processes and depositing conductive materials to fill the electrode trench using thin film deposition processes.

Figure 13H:
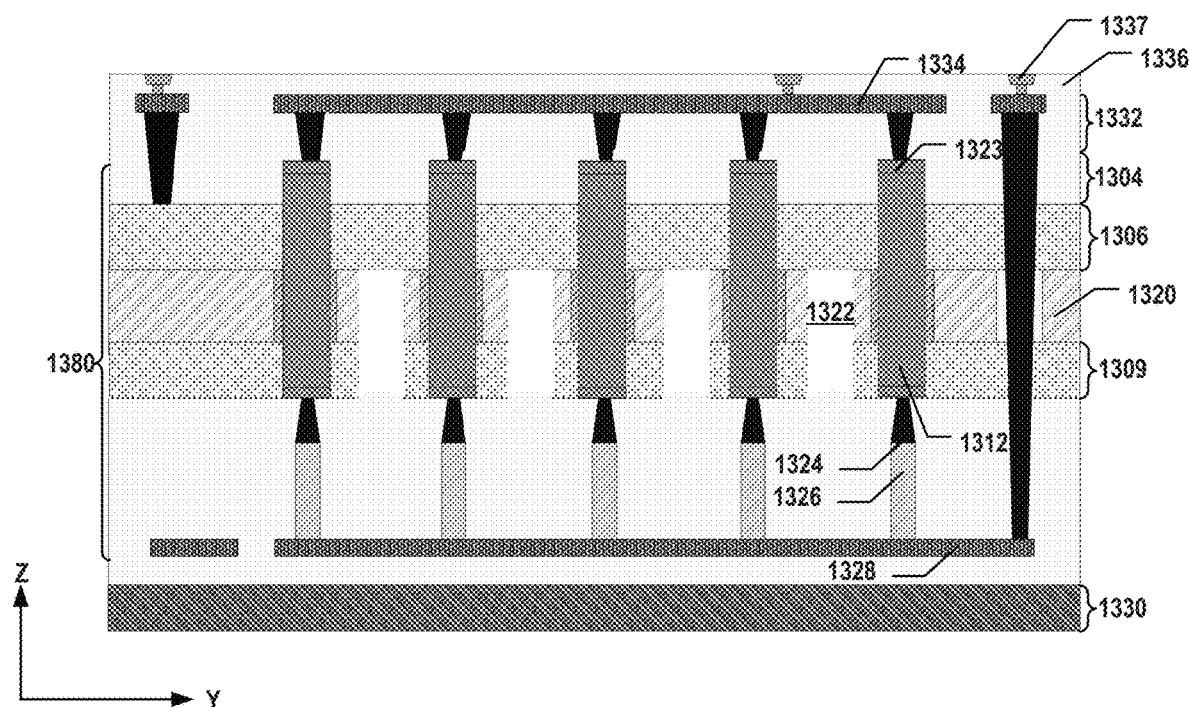

As illustrated in FIG. 13H, a carrier substrate 1330 (a.k.a. a handle substrate) is bonded onto the front side of silicon substrate 1302 on which devices are formed using any suitable bonding processes, such as anodic bonding, fusion bonding, transfer bonding, adhesive bonding, and eutectic bonding. The bonded structure can then be flipped upside down, such that silicon substrate 1302 become above carrier substrate 1330.

As illustrated in FIG. 13H, silicon substrate 1302 (shown in FIG. 13G) is removed to expose the undoped upper ends of semiconductor bodies 1312 (used to be the lower ends before flipping over). In some implementations, planarization processes (e.g., CMP) and/or etching processes are performed to remove silicon substrate 1302 until being stopped by silicon oxide layer 1304 and the upper ends of semiconductor bodies 1312.

As illustrated in FIG. 13H, the exposed upper end of each semiconductor body 1312, e.g., one of the two ends of semiconductor body 1312 in the vertical direction (the z-direction) that is away from carrier substrate 1330, is doped to form another source/drain 1323 (e.g., a drain terminal of the vertical transistor). In some implementations, an implantation process and/or thermal diffusion process are performed to dope P-type dopants or N-type dopants to exposed upper ends of semiconductor bodies 1312 to form sources/drains 1323. As a result, vertical transistors having semiconductor body 1312, sources/drains 1321 and 1323, gate dielectric 1318, and the gate electrode (part of conductive layer 1320) are formed thereby, as shown in FIG. 13H, according to some implementations. As described above, capacitors each having first and second electrodes 1324 and 1328 and capacitor dielectric 1326 are thereby formed as well, and DRAM cells 1380 each having a multi-gate vertical transistor and a capacitor coupled to the multi-gate vertical transistor are thereby formed, as shown in FIG. 13H, according to some implementations.

As illustrated in FIG. 13H, an interconnect layer 1332 can be formed above DRAM cells 1380. Interconnect layer 1332 can include interconnects of MEOL and/or BEOL in a plurality of ILD layers to make electrical connections with DRAM cells 1380. In some implementations, interconnect layer 1332 includes multiple ILD layers and interconnects therein formed in multiple processes. For example, the interconnects in interconnect layers 1332 can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. The ILD layers can include dielectric materials deposited on silicon oxide layer 1304 by one or more thin film deposition processes including, but not limited to, CVD, PVD, ALD, or any combination thereof. The ILD layers and interconnects illustrated in FIG. 13H can be collectively referred to as interconnect layer 1332. As illustrated in FIG. 13H, bit line 1334 can be formed on sources/drains 1323 by patterning and etching a trench aligned with respective source/drain 1323 using lithography and etching processes and depositing conductive materials to fill the trench using thin film deposition processes. In some implementations, forming bit line 1334 includes depositing a metal layer onto the exposed end of semiconductor body 1312.

As illustrated in FIG. 13H, a bonding layer 1336 is formed above interconnect layer 1332 and DRAM cells 1380. Bonding layer 1336 can include a plurality of bonding contacts 1337 surrounded by dielectrics. In some implementations, a dielectric layer (e.g., ILD layer) is deposited on the top surface of interconnect layer 1332 by one or more thin film deposition processes including, but not limited to, CVD, PVD, ALD, or any combination thereof. Bonding contacts 1337 can then be formed through the dielectric layer and in contact with the interconnects in interconnect layer 1332 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing a barrier layer, an adhesion layer, and/or a seed layer before depositing the conductor.

A third semiconductor structure including a second array of memory cells can be formed. Each of the memory cells can also include a vertical transistor, and a storage unit coupled to the vertical transistor. The second semiconductor structure and the third semiconductor structure can be bonded in a face-to-face manner. In some implementations, the second and third semiconductor structures are bonded prior to bonding the first and second semiconductor structures. For example, as shown in FIG. 23, the second and third semiconductor structures may be bonded prior to operation 2312, e.g., between operation 2306 and operation 2308.

Figure 14A:
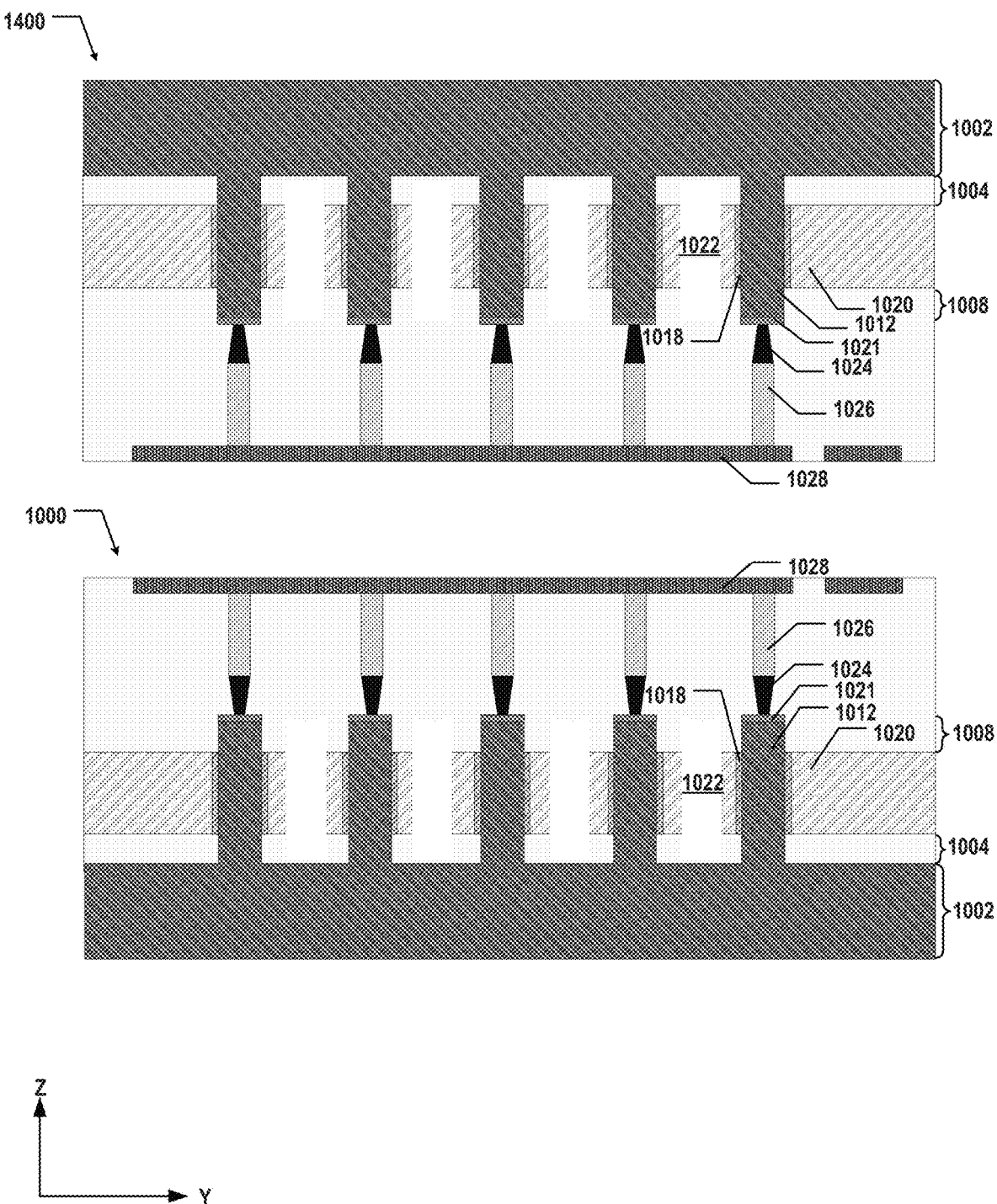
FIGS. 14A-14E illustrate a fabrication process for forming yet another 3D memory device including vertical transistors, according to some aspects of the present disclosure.

As illustrated in FIG. 14A, two semiconductor structures 1000 and 1400 are formed separately (e.g., in parallel) using any suitable fabrication processes disclosed herein (e.g., in FIGS. 10A-10H). For ease of description, the fabrication process of forming semiconductor structure 1400 is not repeated and is the same as that of forming semiconductor structure 1000. Thus, two semiconductor structures 1000 and 1400 may have the same devices therein.

Figure 14B:
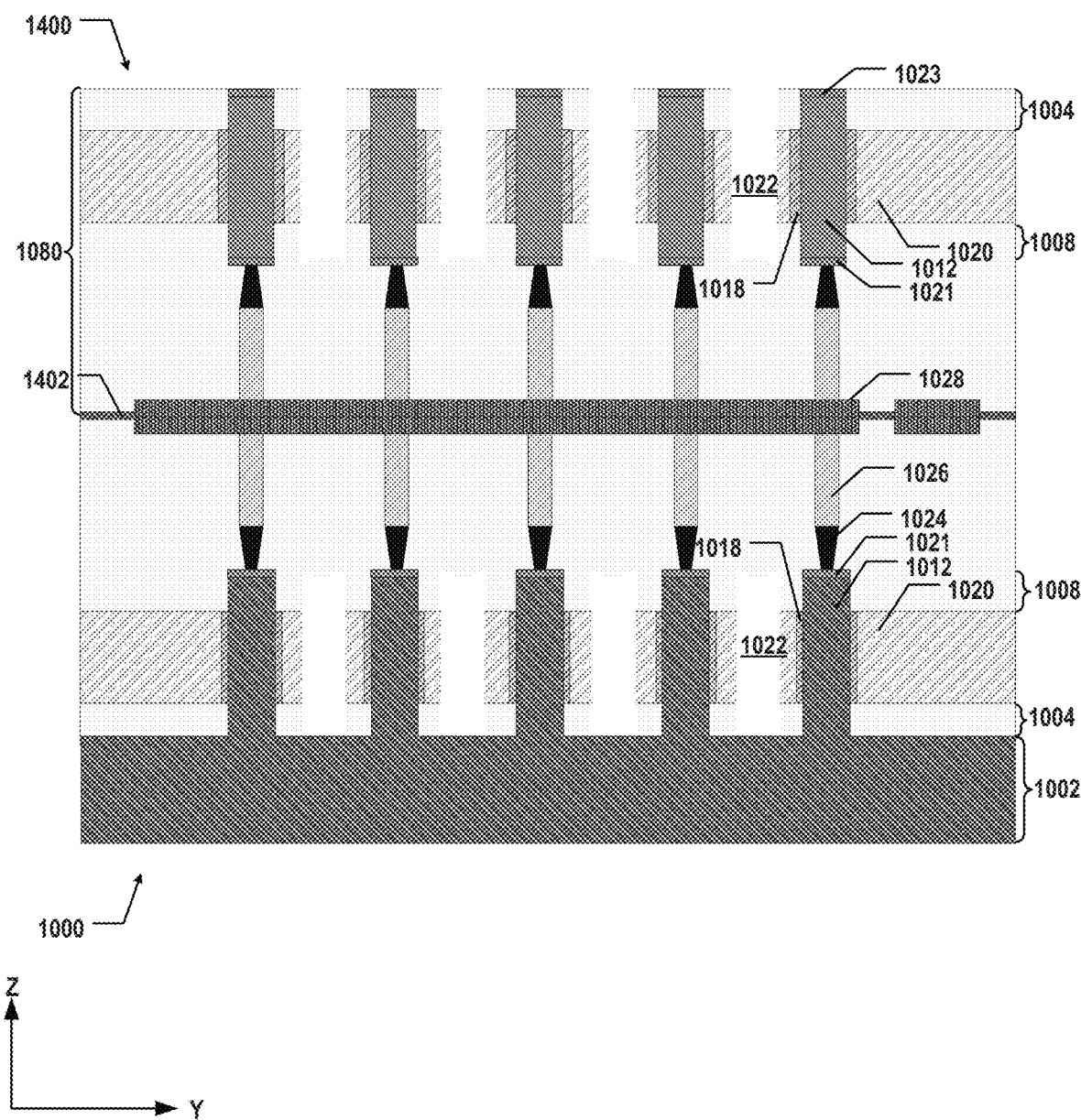

As illustrated in FIG. 14A, semiconductor structure 1400 is flipped upside down. As illustrated in FIG. 14B, semiconductor structure 1400 facing down is bonded with semiconductor structure 1000 facing up, e.g., in a face-to-face manner, thereby forming a bonding interface 1402, using any suitable substrate/wafer bonding processes including, for example, hybrid bonding (as described above in detail), anodic bonding, and fusion (direct) bonding. In one example, fusion bonding may be performed between layers of silicon and silicon, silicon and silicon oxide, or silicon oxide and silicon oxide with pressure and heat. In another example, anodic bonding may be performed between layers of silicon oxide (in an ionic glass) and silicon with voltage, pressure, and heat. It is understood that depending on the bonding process, dielectric layers (e.g., silicon oxide layers) may be formed on one or both sides of bonding interface 1402. For example, silicon oxide layers may be formed on the top surfaces of semiconductor structures 1000 and 1400 to allow $SiO_2$—$SiO_2$ bonding using fusion bonding. In some implementations, common plate 1028 of semiconductor structure 1400 are in contact with common plate of semiconductor structure 1000 at bonding interface 1402 and thus, may be viewed as a common electrode (e.g., common ground plate) of both semiconductor structures 1000 and 1400.

As illustrated in FIG. 14B, silicon substrate 1002 (shown in FIG. 14A) of semiconductor structure 1400 (on top of semiconductor structure 1000 after bonding) is removed to expose the undoped upper ends of semiconductor bodies 1012 (used to be the lower ends before flipping over). In some implementations, planarization processes (e.g., CMP) and/or etching processes are performed to remove silicon substrate 1002 of semiconductor structure 1400 until being stopped by silicon oxide layer 1004 and the upper ends of semiconductor bodies 1012 of semiconductor structure 1400.

As illustrated in FIG. 14B, the exposed upper end of each semiconductor body 1012 of semiconductor structure 1400, e.g., one of the two ends of semiconductor body 1012 in the vertical direction (the z-direction) that is away from semiconductor structure 1000, is doped to form another source/drain 1023. In some implementations, an implantation process and/or thermal diffusion process are performed to dope P-type dopants or N-type dopants to exposed upper ends of semiconductor bodies 1012 of semiconductor structure 1400 to form sources/drains 1023. As a result, multi-gate vertical transistors having semiconductor body 1012, sources/drains 1021 and 1023, gate dielectric 1018, and the gate electrode (part of conductive layer 1020) are formed thereby in semiconductor structure 1400, as shown in FIG. 14B, according to some implementations. As described above, capacitors 1026 are thereby formed as well, and DRAM cells 1080 each having a multi-gate vertical transistor and a capacitor coupled to the multi-gate vertical transistor are thereby formed of semiconductor structure 1400, as shown in FIG. 14B, according to some implementations.

Figure 14C:
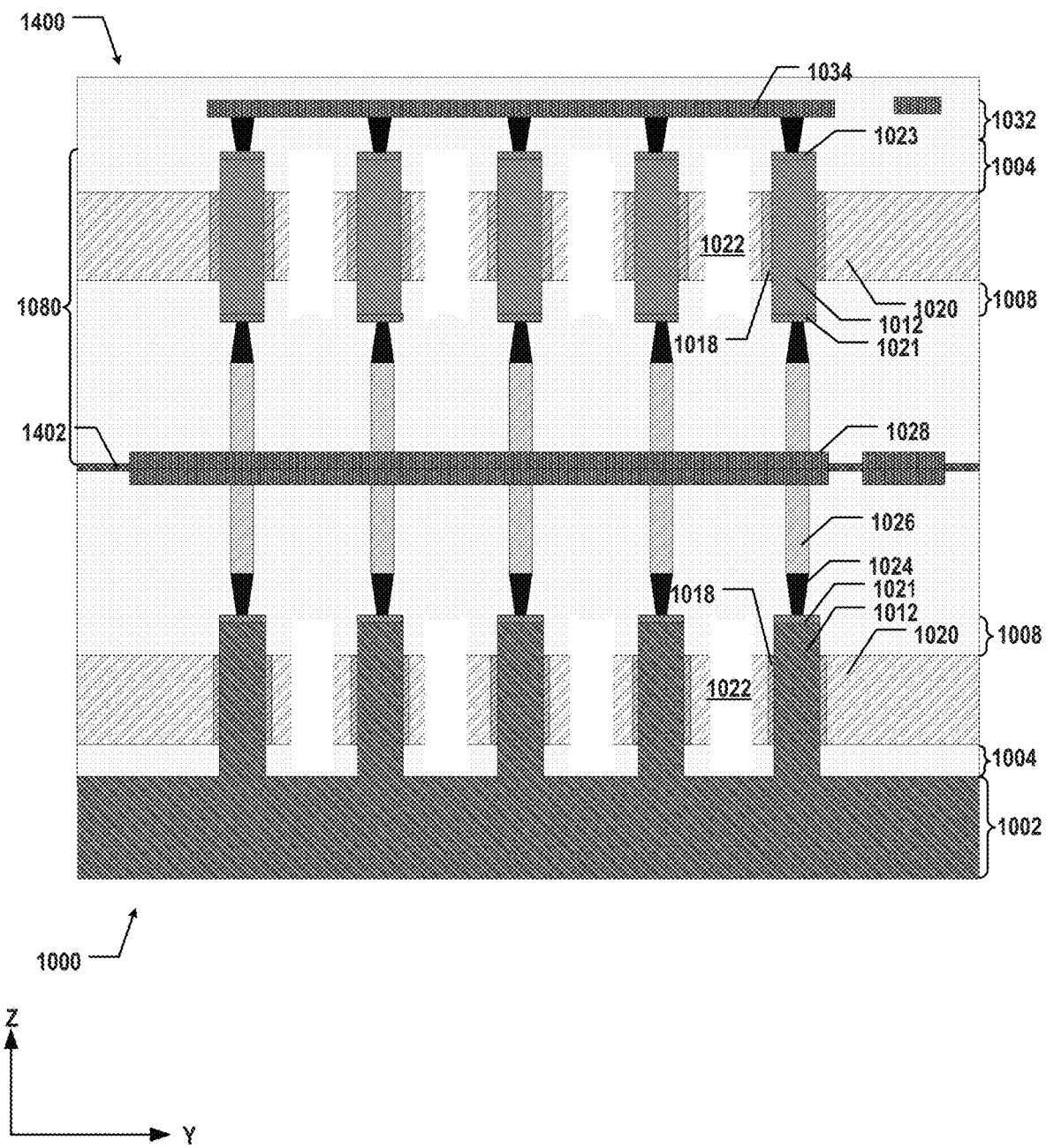

As illustrated in FIG. 14C, an interconnect layer 1032 can be formed above DRAM cells 1080. Interconnect layer 1032 can include interconnects of MEOL and/or BEOL in a plurality of ILD layers to make electrical connections with DRAM cells 1080. In some implementations, interconnect layer 1032 includes multiple ILD layers and interconnects therein formed in multiple processes. For example, the interconnects in interconnect layers 1032 can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. The ILD layers can include dielectric materials deposited on silicon oxide layer 1004 by one or more thin film deposition processes including, but not limited to, CVD, PVD, ALD, or any combination thereof. The ILD layers and interconnects illustrated in FIG. 14C can be collectively referred to as interconnect layer 1032.

Figure 14D:
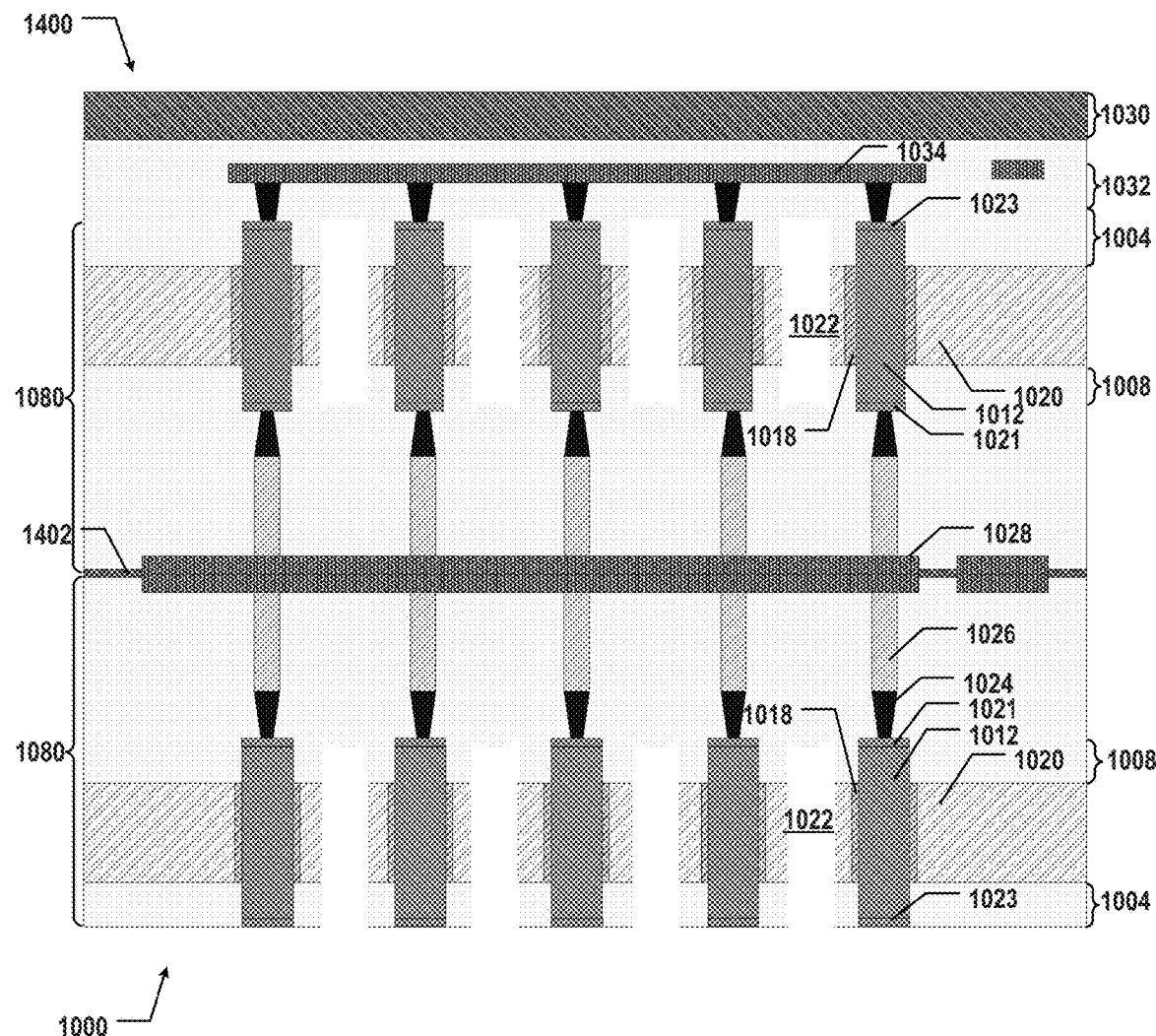

As illustrated in FIG. 14D, a carrier substrate 1030 (a.k.a. a handle substrate) is bonded onto the front side of semiconductor structure 1400 on which devices are formed using any suitable bonding processes, such as anodic bonding, fusion bonding, transfer bonding, adhesive bonding, and eutectic bonding. The bonded structure can then be flipped upside down, such that semiconductor structure 1000 become above carrier substrate 1030 (not shown in FIG. 14D).

As illustrated in FIG. 14D, silicon substrate 1002 of semiconductor structure 1000 (shown in FIG. 14C) is removed to expose the undoped upper ends of semiconductor bodies 1012 of semiconductor structure 1000 (used to be the lower ends before flipping over). In some implementations, planarization processes (e.g., CMP) and/or etching processes are performed to remove silicon substrate 1002 of semiconductor structure 1000 until being stopped by silicon oxide layer 1004 and the upper ends of semiconductor bodies 1012 of semiconductor structure 1000.

As illustrated in FIG. 14D, the exposed upper end of each semiconductor body 1012 of semiconductor structure 1000, e.g., one of the two ends of semiconductor body 1012 in the vertical direction (the z-direction) that is away from semiconductor structure 1400, is doped to form another source/drain 1023. In some implementations, an implantation process and/or thermal diffusion process are performed to dope P-type dopants or N-type dopants to exposed upper ends of semiconductor bodies 1012 of semiconductor structure 1000 to form sources/drains 1023. As a result, vertical transistors having semiconductor body 1012, sources/drains 1021 and 1023, gate dielectric 1018, and the gate electrode (part of conductive layer 1020) are formed thereby in semiconductor structure 1000, as shown in FIG. 14D, according to some implementations. As described above, capacitors 1026 are thereby formed as well, and DRAM cells 1080 each having a multi-gate vertical transistor and a capacitor coupled to the multi-gate vertical transistor are thereby formed of semiconductor structure 1000, as shown in FIG. 14D, according to some implementations.

Figure 14E:
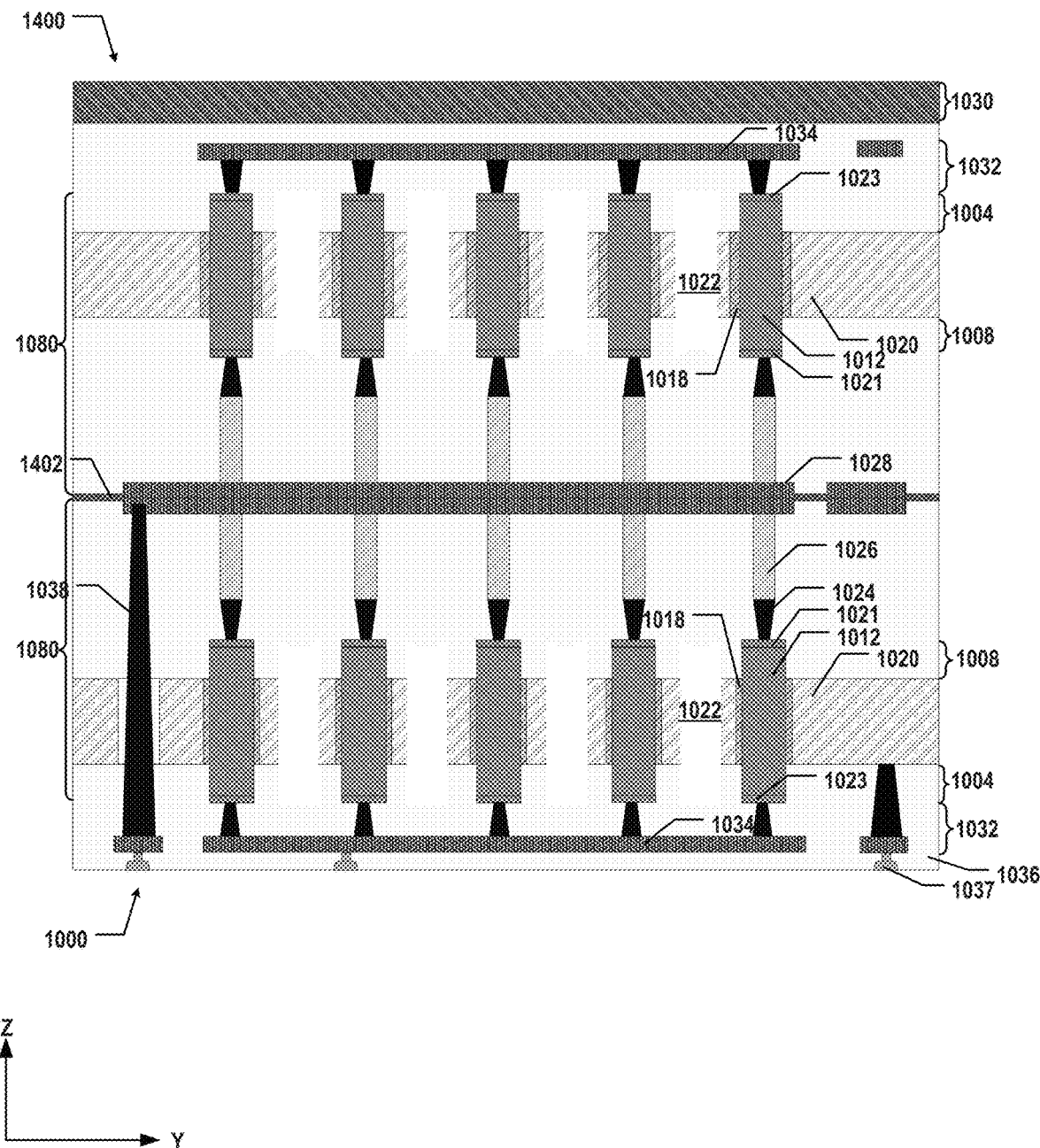

As illustrated in FIG. 14E, an interconnect layer 1032 can be formed above DRAM cells 1080 in semiconductor structure 1000. Interconnect layer 1032 can include interconnects of MEOL and/or BEOL in a plurality of ILD layers to make electrical connections with DRAM cells 1080 in semiconductor structure 1000. In some implementations, interconnect layer 1032 includes multiple ILD layers and interconnects therein formed in multiple processes. For example, the interconnects in interconnect layers 1032 can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. The ILD layers can include dielectric materials deposited on silicon oxide layer 1004 by one or more thin film deposition processes including, but not limited to, CVD, PVD, ALD, or any combination thereof. The ILD layers and interconnects illustrated in FIG. 14E can be collectively referred to as interconnect layer 1032.

As illustrated in FIG. 14E, a bonding layer 1036 is formed above interconnect layer 1032 and DRAM cells 1080 in semiconductor structure 1000. Bonding layer 1036 can include a plurality of bonding contacts 1037 surrounded by dielectrics. In some implementations, a dielectric layer (e.g., ILD layer) is deposited on the top surface of interconnect layer 1032 by one or more thin film deposition processes including, but not limited to, CVD, PVD, ALD, or any combination thereof. Bonding contacts 1037 can then be formed through the dielectric layer and in contact with the interconnects in interconnect layer 1032 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing a barrier layer, an adhesion layer, and/or a seed layer before depositing the conductor.

The bonded structure shown in FIG. 14E then can be bonded with a semiconductor structure including peripheral circuits in a face-to-face manner, as described above in detail with respect to operation 2312 in FIG. 23 and FIGS. 10L and 10M.

In some implementations, the second and third semiconductor structures are bonded after bonding the first and second semiconductor structures. For example, as shown in FIG. 23, the second and third semiconductor structures may be bonded after operation 2312, e.g., between operation 2312 and operation 2314.

Figure 15A:
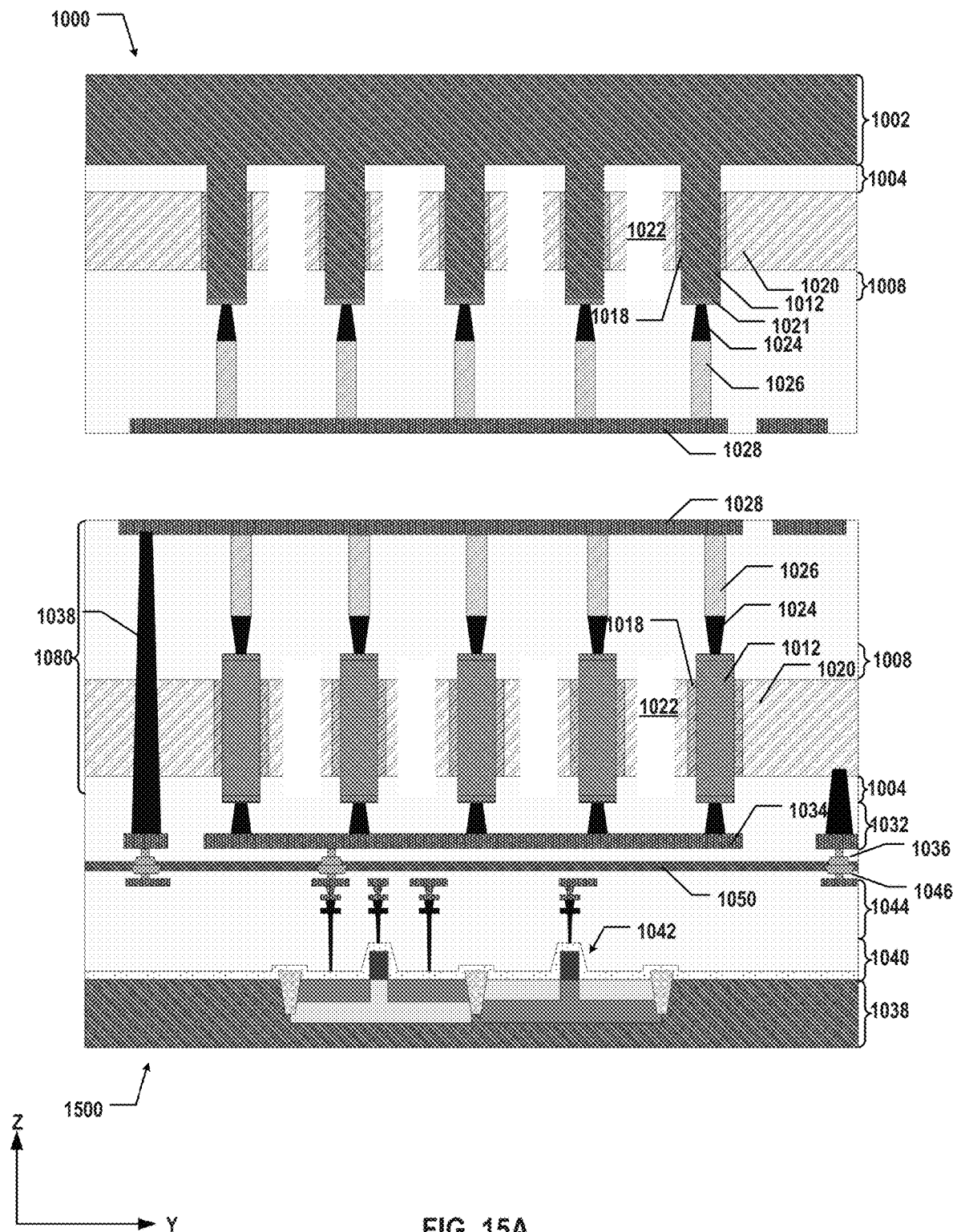
FIGS. 15A-15D illustrate a fabrication process for forming yet another 3D memory device including vertical transistors, according to some aspects of the present disclosure.

As illustrated in FIG. 15A, a bonded semiconductor structure 1500 is formed after the fabrication process shown in FIG. 10L by removing carrier substrate 1030. A semiconductor structure 1000 is formed separately (e.g., in parallel) using any suitable fabrication processes disclosed herein (e.g., in FIGS. 10A-10H). For ease of description, the fabrication processes of forming semiconductor structures 1000 and 1500 are not repeated.

Figure 15B:
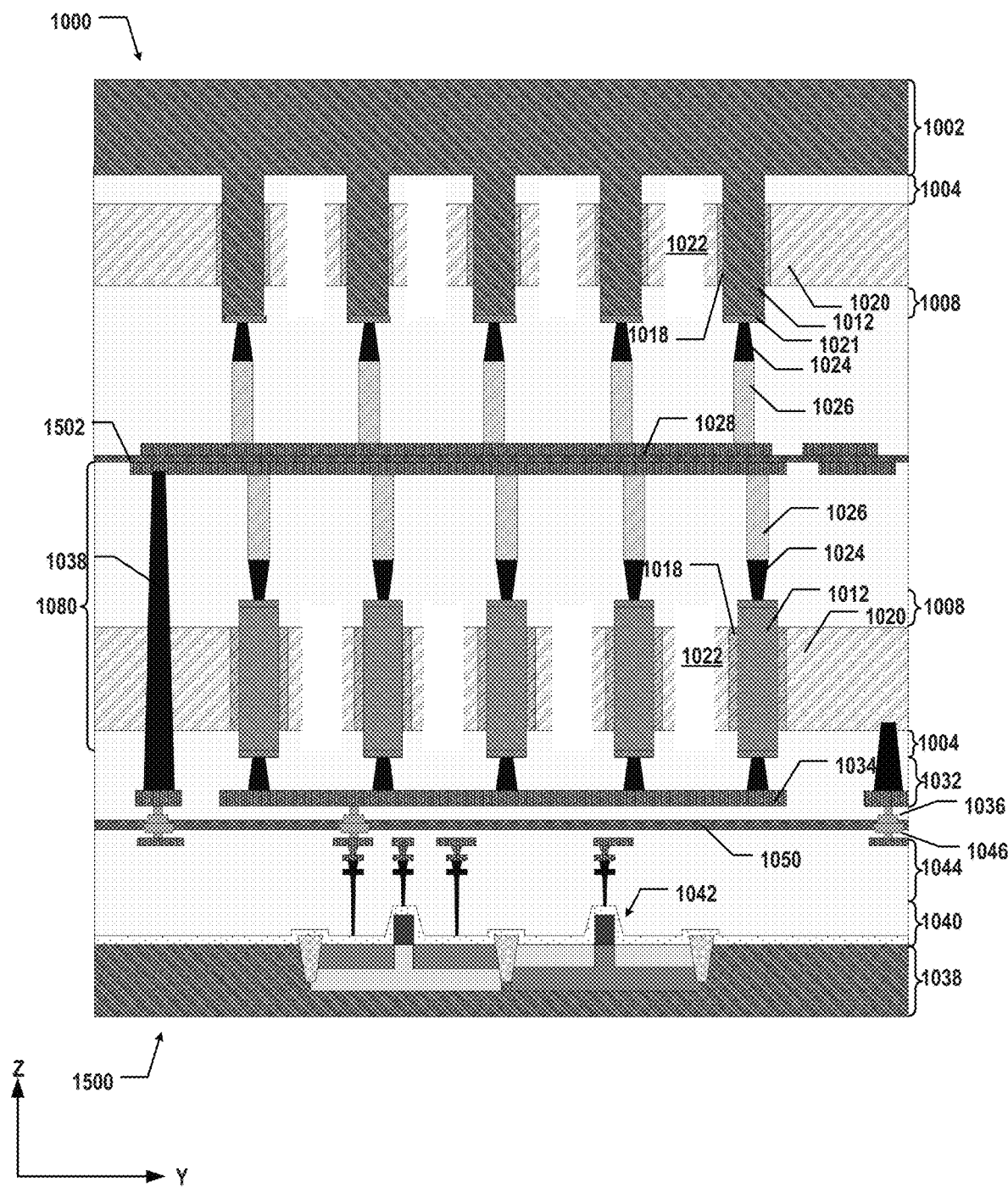

As illustrated in FIG. 15A, semiconductor structure 1000 is flipped upside down. As illustrated in FIG. 15B, semiconductor structure 1000 facing down is bonded with semiconductor structure 1500 facing up, e.g., in a face-to-face manner, thereby forming a bonding interface 1502, using any suitable substrate/wafer bonding processes including, for example, hybrid bonding (as described above in detail), anodic bonding, and fusion (direct) bonding. In one example, fusion bonding may be performed between layers of silicon and silicon, silicon and silicon oxide, or silicon oxide and silicon oxide with pressure and heat. In another example, anodic bonding may be performed between layers of silicon oxide (in an ionic glass) and silicon with voltage, pressure, and heat. It is understood that depending on the bonding process, dielectric layers (e.g., silicon oxide layers) may be formed on one or both sides of bonding interface 1502. For example, silicon oxide layers may be formed on the top surfaces of semiconductor structures 1000 and 1500 to allow SiO$_2$—SiO$_2$ bonding using fusion bonding. In some implementations, common plate 1028 of semiconductor structure 1000 are in contact with common plate 1028 of semiconductor structure 1500 at bonding interface 1502 and thus, may be viewed as a common electrode (e.g., common ground plate) of both semiconductor structures 1000 and 1500.

Figure 15C:
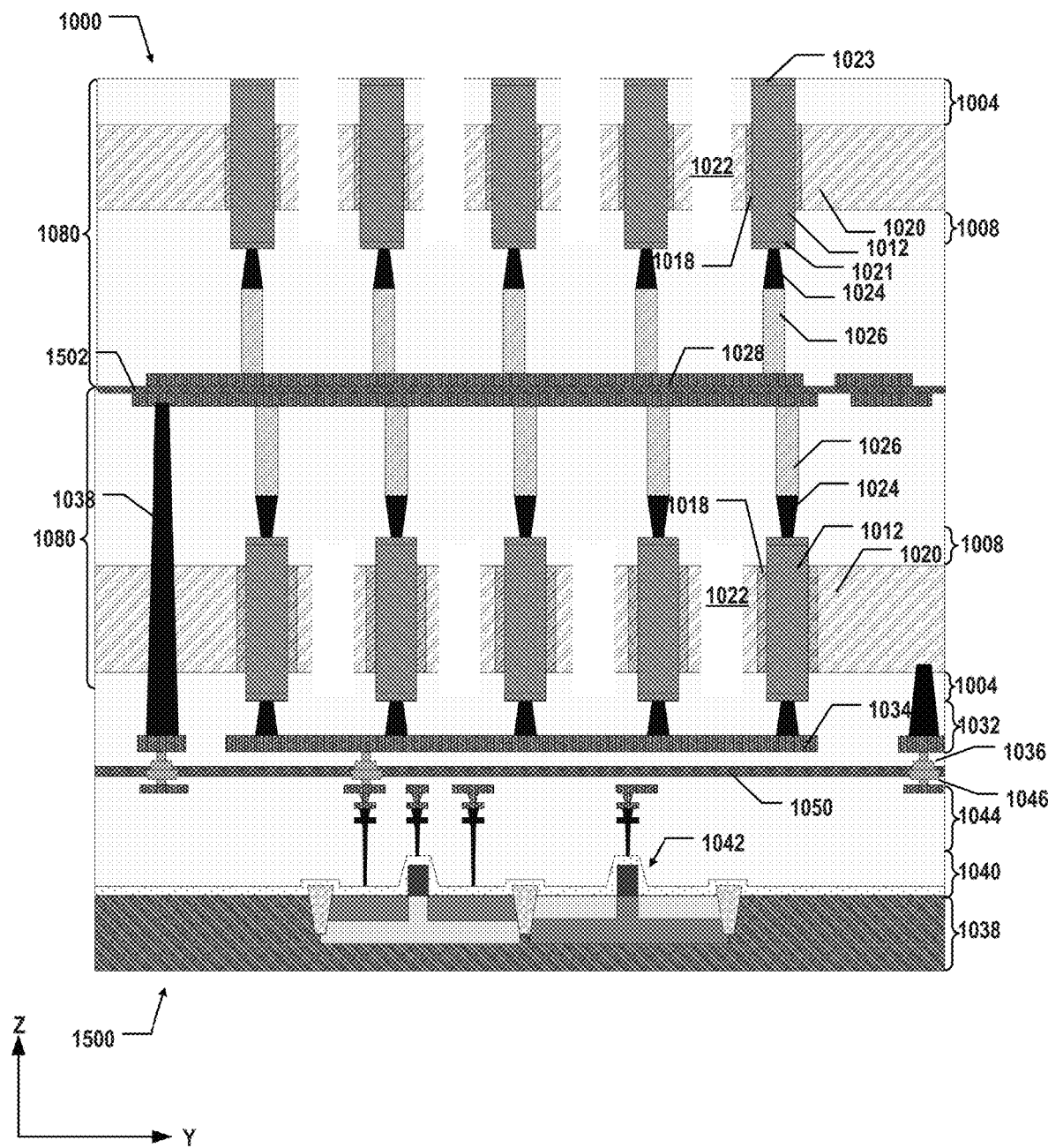

As illustrated in FIG. 15C, silicon substrate 1002 (shown in FIG. 15B) of semiconductor structure 1000 (on top of semiconductor structure 1500 after bonding) is removed to expose the undoped upper ends of semiconductor bodies 1012 (used to be the lower ends before flipping over). In some implementations, planarization processes (e.g., CMP) and/or etching processes are performed to remove silicon substrate 1002 of semiconductor structure 1000 until being stopped by silicon oxide layer 1004 and the upper ends of semiconductor bodies 1012 of semiconductor structure 1000.

As illustrated in FIG. 15C, the exposed upper end of each semiconductor body 1012 of semiconductor structure 1000, e.g., one of the two ends of semiconductor body 1012 in the vertical direction (the z-direction) that is away from semiconductor structure 1500, is doped to form another source/drain 1023. In some implementations, an implantation process and/or thermal diffusion process are performed to dope P-type dopants or N-type dopants to exposed upper ends of semiconductor bodies 1012 of semiconductor structure 1000 to form sources/drains 1023. As a result, multi-gate vertical transistors having semiconductor body 1012, sources/drains 1021 and 1023, gate dielectric 1018, and the gate electrode (part of conductive layer 1020) are formed thereby in semiconductor structure 1000, as shown in FIG. 15C, according to some implementations. As described above, capacitors 1026 are thereby formed as well, and DRAM cells 1080 each having a multi-gate vertical transistor and a capacitor coupled to the multi-gate vertical transistor are thereby formed of semiconductor structure 1400, as shown in FIG. 15C, according to some implementations.

Figure 15D:
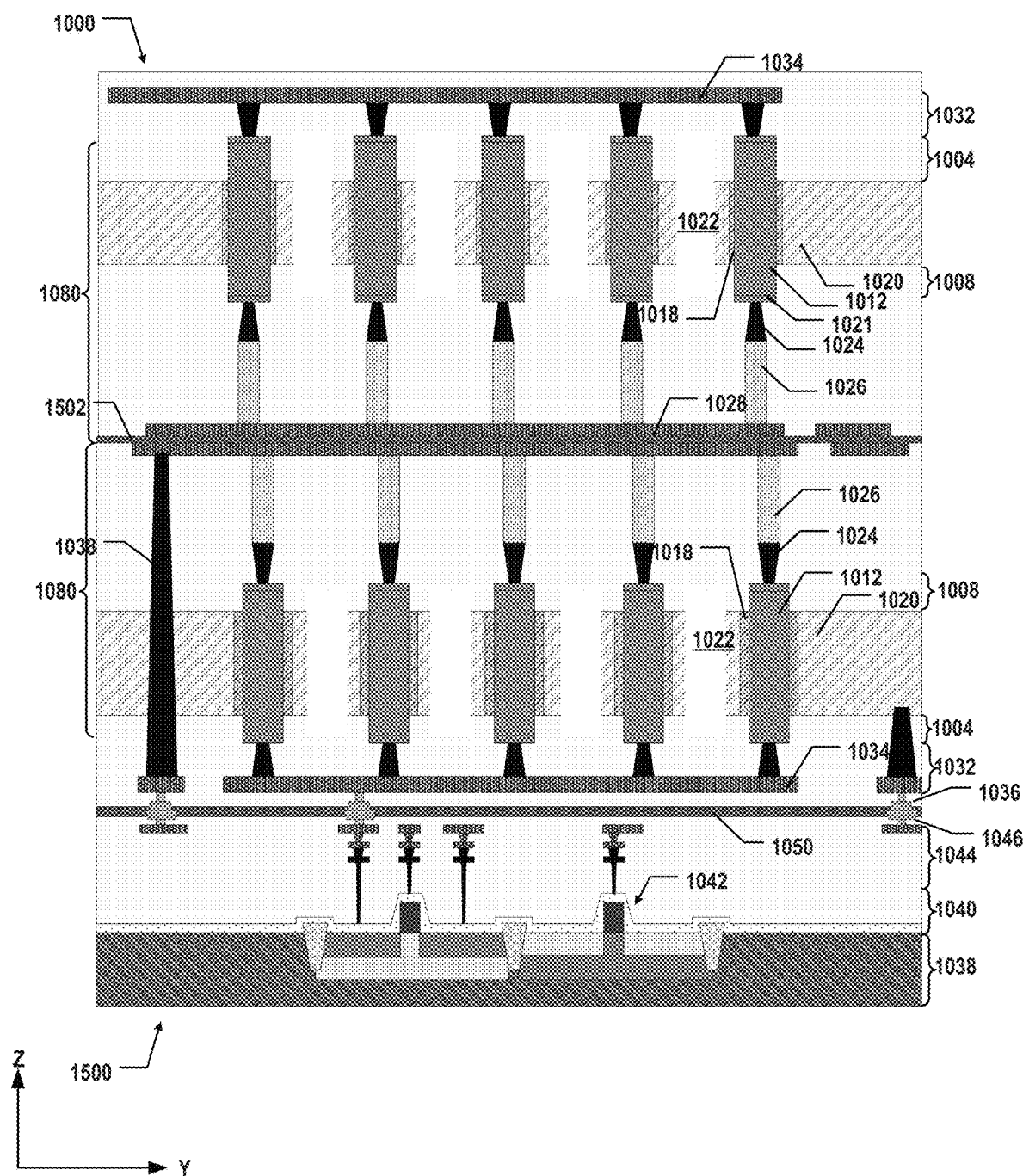

As illustrated in FIG. 15D, an interconnect layer 1032 can be formed above DRAM cells 1080 in semiconductor structure 1000. Interconnect layer 1032 can include interconnects of MEOL and/or BEOL in a plurality of ILD layers to make electrical connections with DRAM cells 1080. In some implementations, interconnect layer 1032 includes multiple ILD layers and interconnects therein formed in multiple processes. For example, the interconnects in interconnect layers 1032 can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. The ILD layers can include dielectric materials deposited on silicon oxide layer 1004 by one or more thin film deposition processes including, but not limited to, CVD, PVD, ALD, or any combination thereof. The ILD layers and interconnects illustrated in FIG. 15D can be collectively referred to as interconnect layer 1032.

A pad-out interconnect layer then can be formed on the bonded structure shown in FIG. 15D as described above in detail with respect to operation 2314 in FIG. 23 and FIG. 10M.

Method 2300 may also be implemented by the fabrication process described in FIGS. 19A-19M and 22 to form 3D memory device 1700 depicted in FIG. 17 having single-gate vertical transistors, as opposed to multiple-gate vertical transistors. Referring to FIG. 23, method 2300 starts at operation 2302, in which a peripheral circuit is formed on a first substrate. The first substrate can include a silicon substrate. In some implementations, an interconnect layer is formed above the peripheral circuit. The interconnect layer can include a plurality of interconnects in one or more ILD layers.

As illustrated in FIG. 19L, a plurality of transistors 1948 are formed on a silicon substrate 1944. Transistors 1948 can be formed by a plurality of processes including, but not limited to, photolithography, dry/wet etch, thin film deposition, thermal growth, implantation, CMP, and any other suitable processes. In some implementations, doped regions are formed in silicon substrate 1944 by ion implantation and/or thermal diffusion, which function, for example, as the source and drain of transistors 1948. In some implementations, isolation regions (e.g., STIs) are also formed in silicon substrate 1944 by wet/dry etch and thin film deposition. Transistors 1948 can form peripheral circuits 1946 on silicon substrate 1944.

As illustrated in FIG. 19L, an interconnect layer 1950 can be formed above peripheral circuits 1946 having transistors 1948. Interconnect layer 1950 can include interconnects of MEOL and/or BEOL in a plurality of ILD layers to make electrical connections with peripheral circuits 1946. In some implementations, interconnect layer 1950 includes multiple ILD layers and interconnects therein formed in multiple processes. For example, the interconnects in interconnect layers 1950 can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 19L can be collectively referred to as interconnect layer 1950.

Method 2300 proceeds to operation 2304, as illustrated in FIG. 23, in which a first bonding layer is formed above the peripheral circuit (and the interconnect layer). The first bonding layer can include a first bonding contact. As illustrated in FIG. 19L, a bonding layer 1952 is formed above interconnect layer 1950 and peripheral circuits 1946. Bonding layer 1952 can include a plurality of bonding contacts surrounded by dielectrics. In some implementations, a dielectric layer (e.g., ILD layer) is deposited on the top surface of interconnect layer 1950 by one or more thin film deposition processes including, but not limited to, CVD, PVD, ALD, or any combination thereof. The bonding contacts then can be formed through the dielectric layer and in contact with the interconnects in interconnect layer 1950 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing a barrier layer, an adhesion layer, and/or a seed layer before depositing the conductor.

Method 2300 proceeds to operation 2306, as illustrated in FIG. 23, in which an array of memory cells each including a vertical transistor and a storage unit is formed on a second substrate. The second substrate can include a carrier substrate. The storage unit can include a capacitor or a PCM element. In some implementations, a capacitor is formed to be coupled to the vertical transistor in the respective memory cell.

Figure 25:
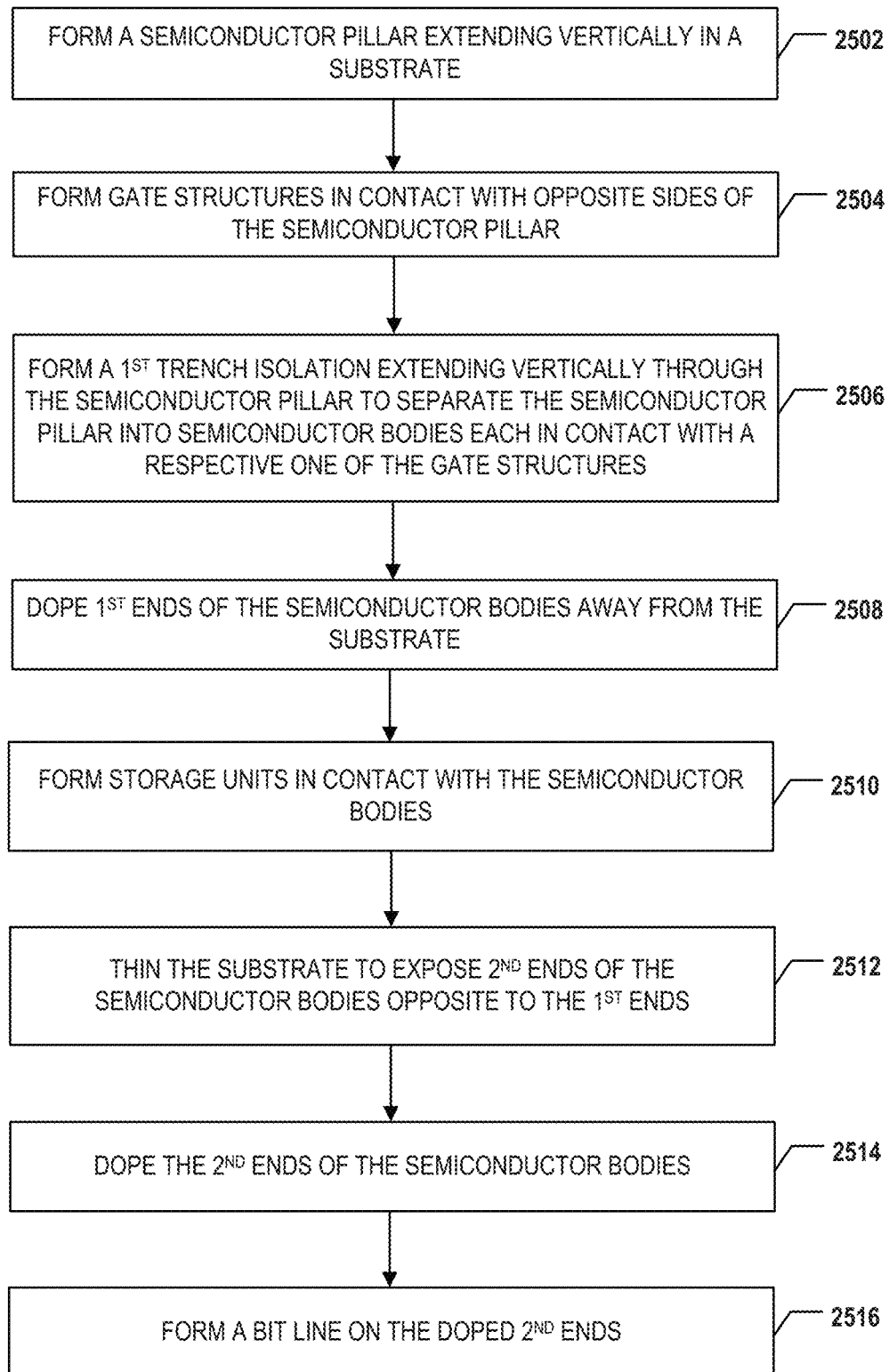
FIG. 25 illustrates a flowchart of a method for forming another array of memory cells each including a vertical transistor, according to some aspects of the present disclosure.

For example, FIG. 25 illustrates a flowchart of a method 2500 for forming another array of memory cells each including a vertical transistor, according to some aspects of the present disclosure. At operation 2502 in FIG. 25, a semiconductor pillar extending vertically in a substrate is formed. The substrate can be a silicon substrate. In some implementations, to form the semiconductor pillar, the substrate is etched in a first lateral direction to form a plurality of first trenches, a dielectric is deposited to fill the first trenches to form second trench isolations, and the substrate and the second trench isolations are etched in a second lateral direction to form a plurality of second trenches and the semiconductor pillar surrounded by the second trenches and the second trench isolations. In some implementations, a dielectric is deposited to partially fill the second trenches.

Figure 19A:
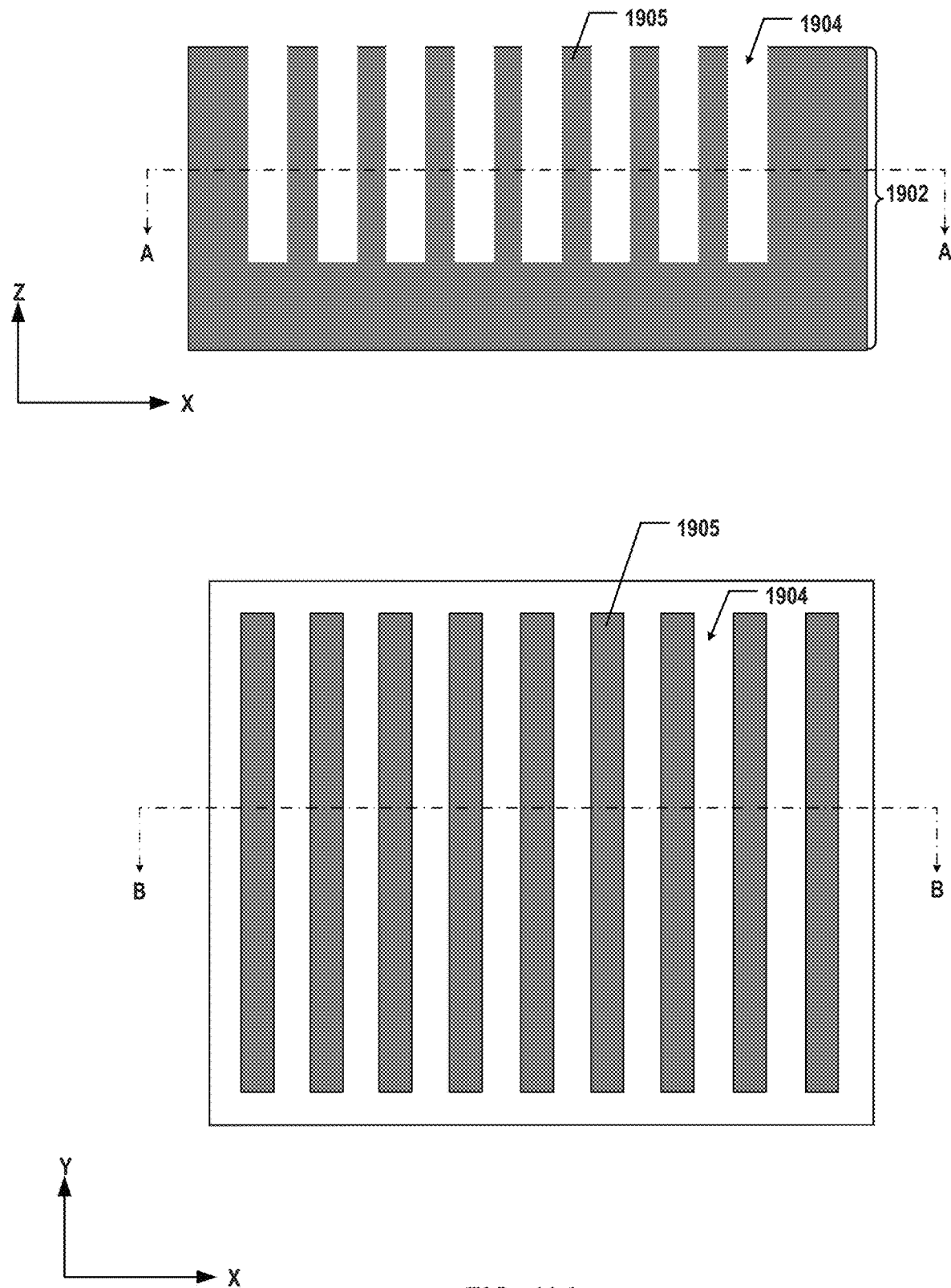
FIGS. 19A-19M illustrate a fabrication process for forming yet another 3D memory device including vertical transistors, according to some aspects of the present disclosure.

As illustrated in FIG. 19A, a plurality of parallel trenches 1904 are formed in the y-direction (e.g., the bit line direction) to form a plurality of parallel semiconductor walls 1905 in the y-direction. In some implementations, a lithography process is performed to pattern trenches 1904 and semiconductor walls 1905 using an etch mask (e.g., a photoresist mask and/or a hard mask), for example, based on the design of bit lines, and one or more dry etching and/or wet etching processes, such as RIE, are performed to etch trenches 1904 in a silicon substrate 1902. Thus, semiconductor wall 1905 extending vertically in silicon substrate 1902 can be formed. The bottom of semiconductor wall 1905 can be below the top surface of silicon substrate 1902. Since semiconductor walls 1905 are formed by etching silicon substrate 1902, semiconductor walls 1905 can have the same material as silicon substrate 1902, such as single crystalline silicon. FIG. 19A illustrates both the side view (in the top portion of FIG. 19A) of a cross-section along the x-direction (the word line direction, e.g., in the BB plane) and the plan view (in the bottom portion of FIG. 19A) of a cross-section in the x-y plane (e.g., in the AA plane through semiconductor walls 1905). The same drawing layout is arranged in FIG. 19B as well.

Figure 19B:
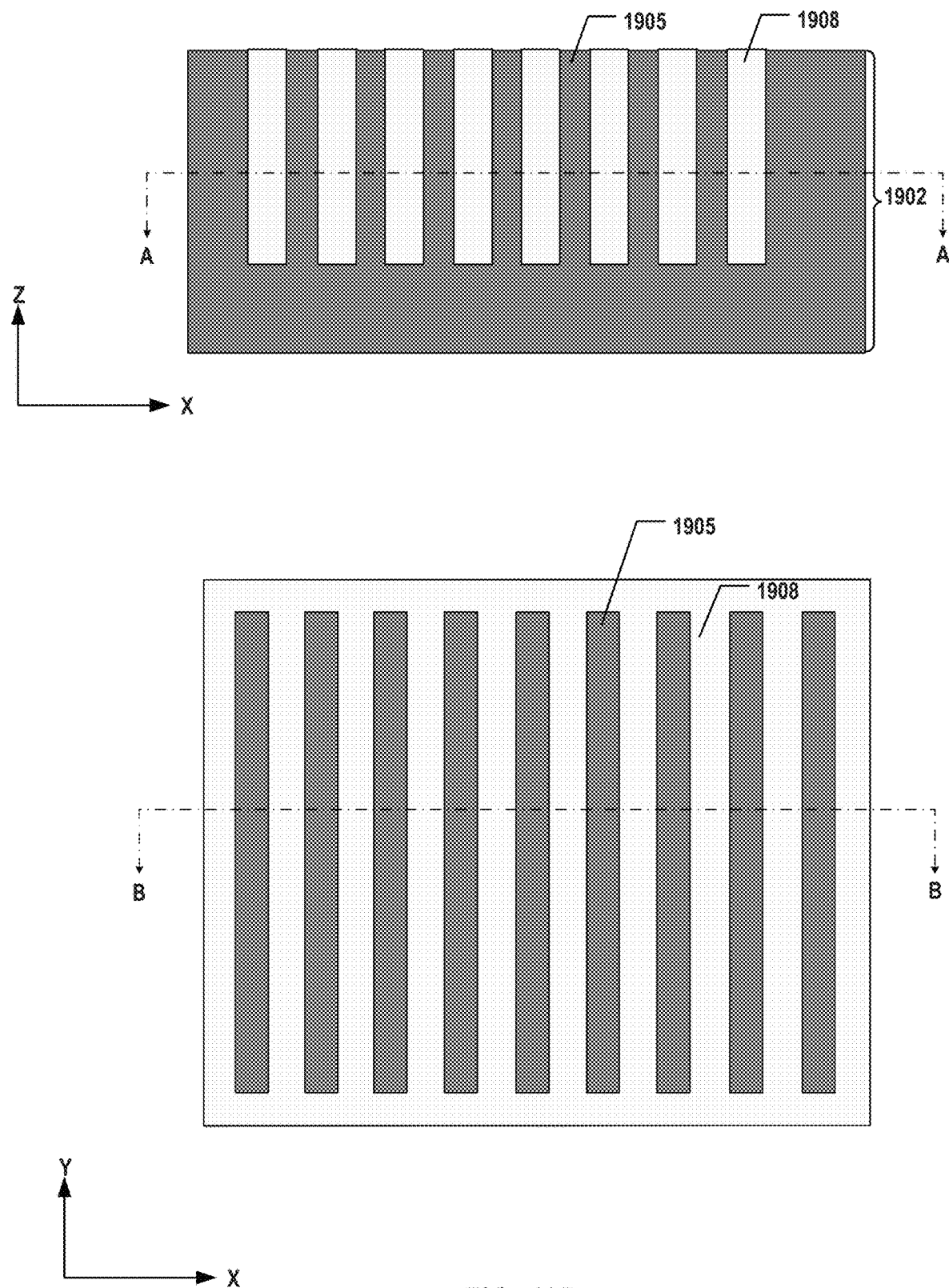

As illustrated in FIG. 19B, trench isolations 1908 (e.g., STIs) are formed in trenches 1904. In some implementations, a dielectric, such as silicon oxide, is deposited to fully fill trenches 1904 using one or more thin film deposition processes including, but not limited to, CVD, PVD, ALD, or any combination thereof. In some implementations, a planarization process, such as CMP, is performed to remove excess dielectric deposited beyond the top surface of silicon substrate 1902. As a result, parallel semiconductor walls 1905 can be separated by trench isolations 1908.

Figure 19C:
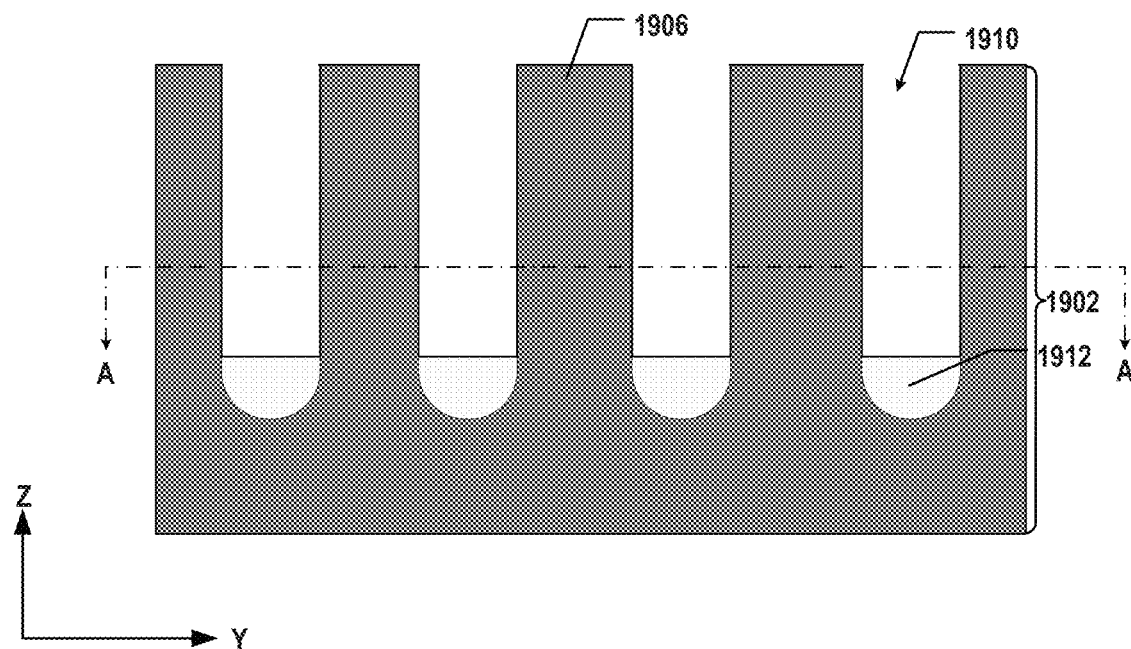
Figure 19C:
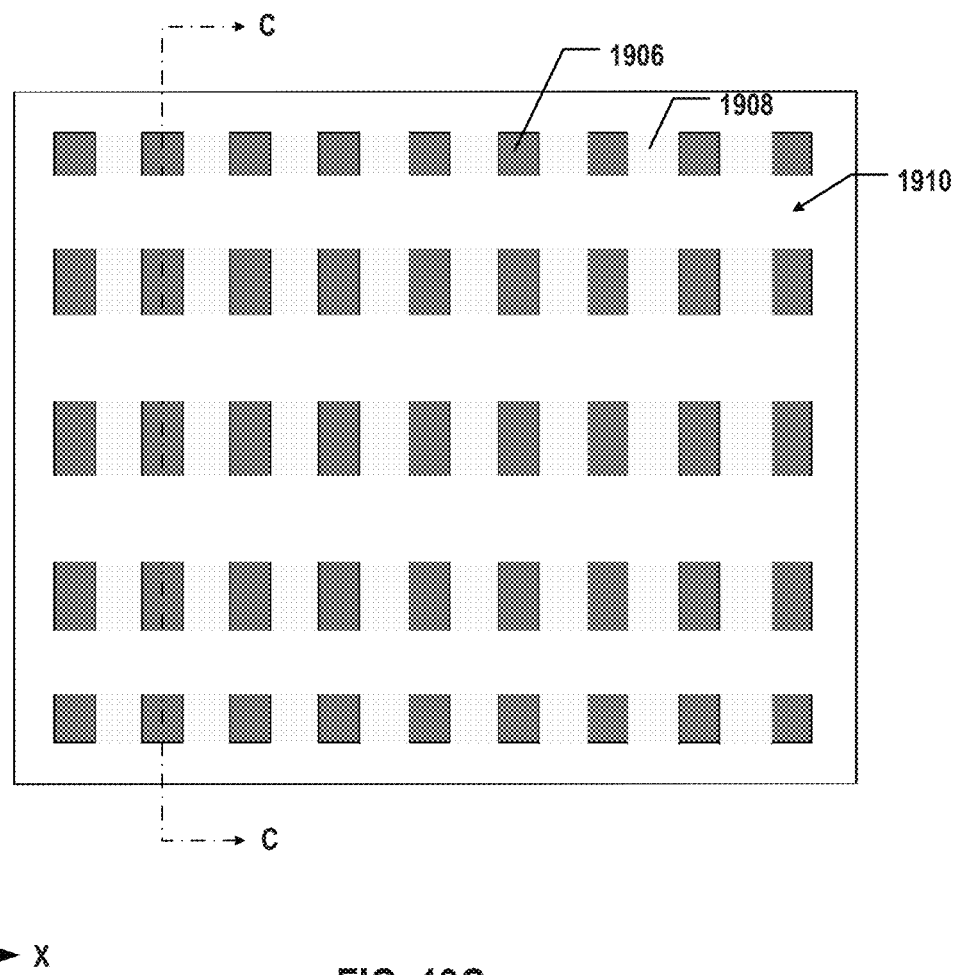

As illustrated in FIG. 19C, a plurality of parallel trenches 1910 are formed in the x-direction (e.g., the word line direction) to form an array of semiconductor pillars 1906 each extending vertically in silicon substrate 1902. In some implementations, a lithography process is performed to pattern trenches 1910 to be perpendicular to trench isolations 1908 using an etch mask (e.g., a photoresist mask and/or a hard mask), for example, based on the design of word lines, and one or more dry etching and/or wet etching processes, such as RIE, are performed on silicon substrate 1902 and trench isolation 1908 to etch trenches 1910 in silicon substrate 1902. As a result, semiconductor walls 1905 (shown in FIG. 19B) can be cut by trenches 1910 to form an array of semiconductor pillars 1906 each extending vertically in silicon substrate 1902. The bottom of semiconductor pillar 1906 can be below the top surface of silicon substrate 1902. Since semiconductor pillars 1906 are formed by etching silicon substrate 1902, semiconductor pillars 1906 can have the same material as silicon substrate 1902, such as single crystalline silicon. FIG. 19C illustrates both the side view (in the top portion of FIG. 19C) of a cross-section along the y-direction (the bit line direction, e.g., in the CC plane) and the plan view (in the bottom portion of FIG. 19C) of a cross-section in the x-y plane (e.g., in the AA plane through semiconductor pillars 1906). The same drawing layout is arranged in FIGS. 19C-19G as well.

As illustrated in FIG. 19C, a dielectric layer 1912 is formed at the bottom of trench 1910, for example, by depositing a dielectric, such as silicon oxide, to partially fill trench 1910, using one or more thin film deposition processes including, but not limited to, CVD, PVD, ALD, or any combination thereof. The deposition conditions, such as deposition rate and/or time, can be controlled to control the thickness of dielectric layer 1912 and avoid fully filling trench 1910. As a result, the bottom surface of trenches 1910 can be elevated to be above the bottom surface of semiconductor pillars 1906. As shown in the plan view, the two opposite sides of semiconductor pillar 1906 in the y-direction are exposed by trenches 1910, and the other two opposite sides of semiconductor pillar 1906 in the x-direction are in contact with trench isolation 1908. In other words, semiconductor pillar 1906 is surrounded by trenches 1910 and trenches isolations 1908.

At operation 2504 in FIG. 25, gate structures in contact with opposite sides of the semiconductor pillar are formed. In some implementations, to form the gate structures, gate dielectrics are formed over the opposite sides of the semiconductor pillar, and gate electrodes are formed over the gate dielectrics. In some implementations, to form the gate electrodes, conductive layers are deposited over the gate dielectrics, and the conductive layers are etched back.

Figure 19D:
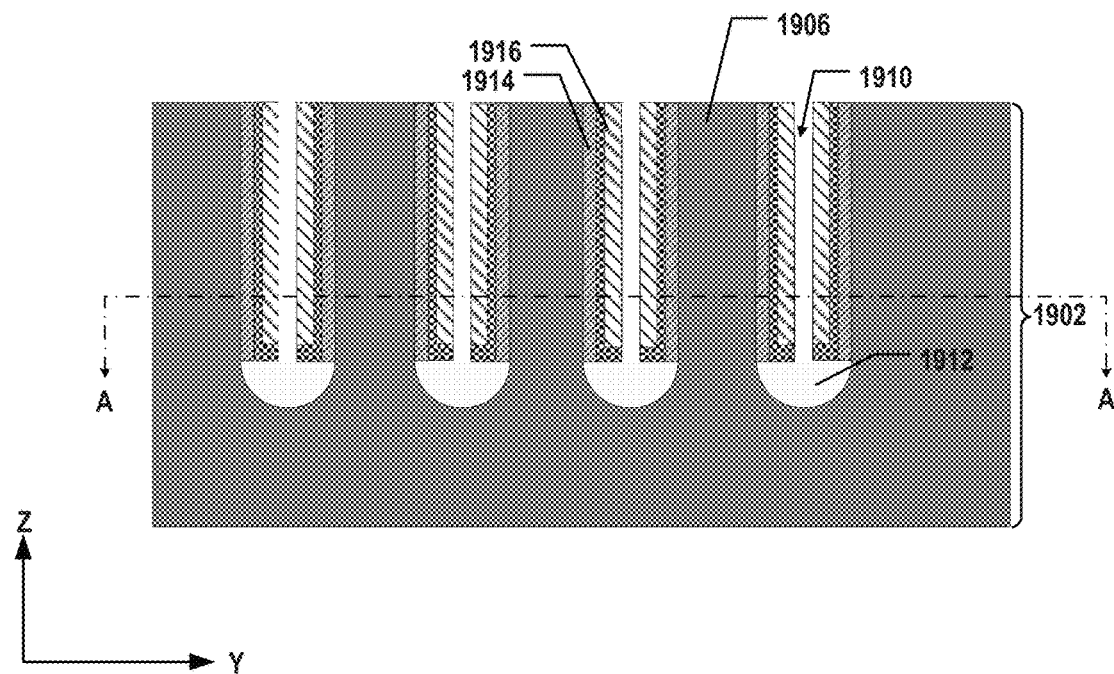
Figure 19D:
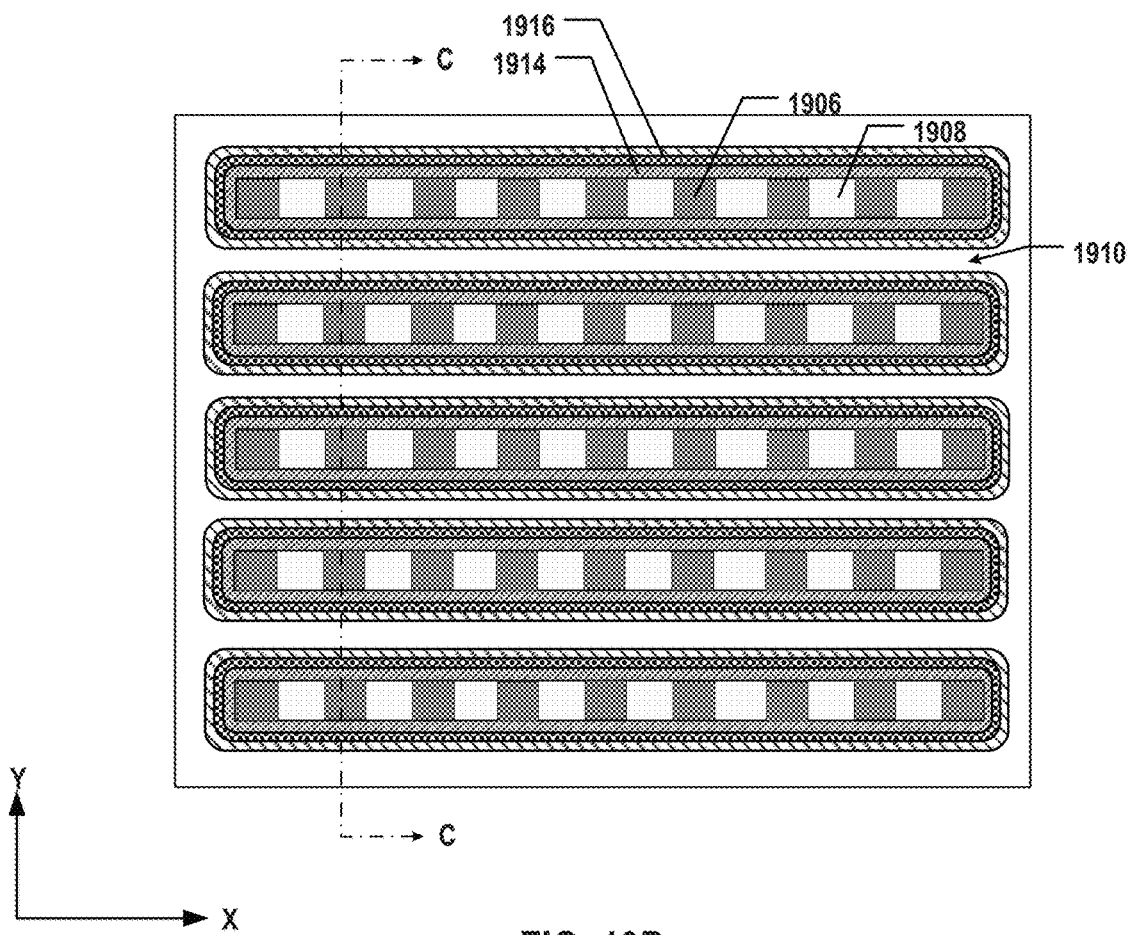

As illustrated in FIG. 19D, gate dielectrics 1914 are formed over the two opposite sides of semiconductor pillars 1906 in the bit line direction (they-direction) exposed from trenches 1910. As shown in the plan view, gate dielectrics 1914 can be parts of a continuous dielectric layer formed over sidewalls of each row of semiconductor pillars 1906 and trench isolations 1908. In some implementations, gate dielectric 1914 is formed by depositing a layer of dielectric, such as silicon oxide, over the sidewalls of trenches 1910 using one or more thin film deposition processes including, but not limited to, CVD, PVD, ALD, or any combination thereof, without fully filling trenches 1910. It is understood that in some examples, gate dielectrics 1914 may not be parts of a continuous dielectric layer. For example, a wet oxidation and/or a dry oxidation process, such as in situ steam generation (ISSG) oxidation, is performed to form native oxide (e.g., silicon oxide) on semiconductor pillar 1906 (e.g., single crystalline silicon) as gate dielectric 1914.

As illustrated in FIG. 19D, conductive layers 1916 are formed over gate dielectrics 1914 in trenches 1910. In some implementations, conductive layers 1916 are formed by depositing one or more conductive materials, such as metal and/or metal compounds (e.g., W and TiN), over gate dielectrics 1914 using one or more thin film deposition processes including, but not limited to, CVD, PVD, ALD, or any combination thereof, to partially fill trenches 1910. For example, layers of TiN and W may be sequentially deposited to form conductive layer 1916. A planarization process, e.g., CMP, can be performed to remove the excess conductive materials over the top surface of silicon substrate 1902.

Figure 19E:
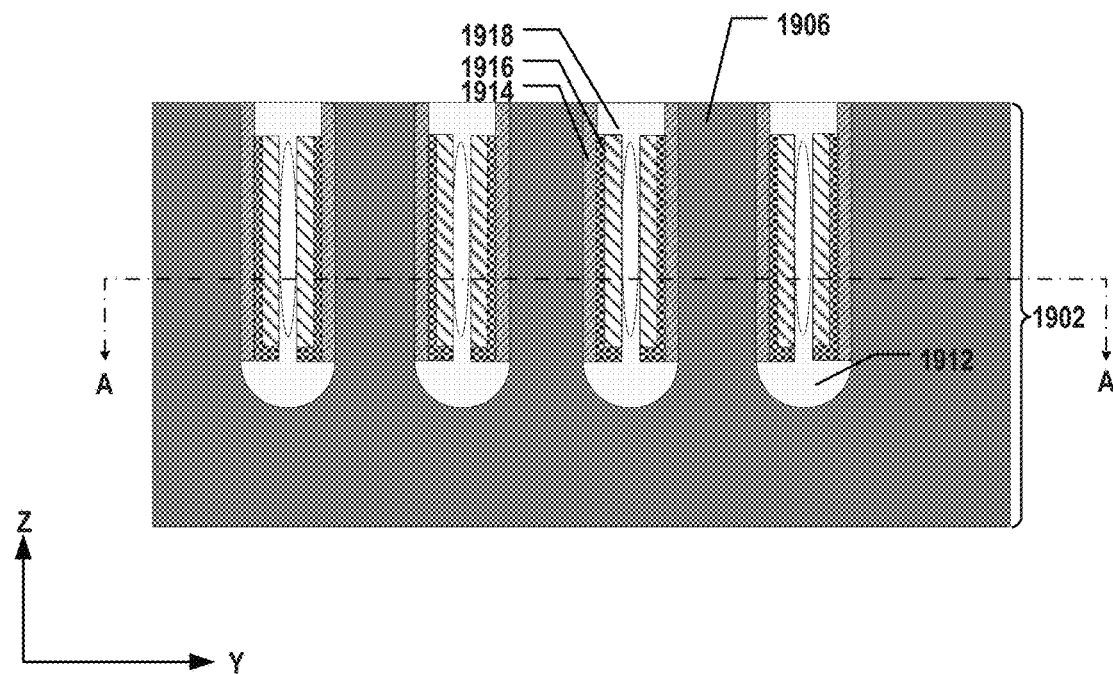
Figure 19E:
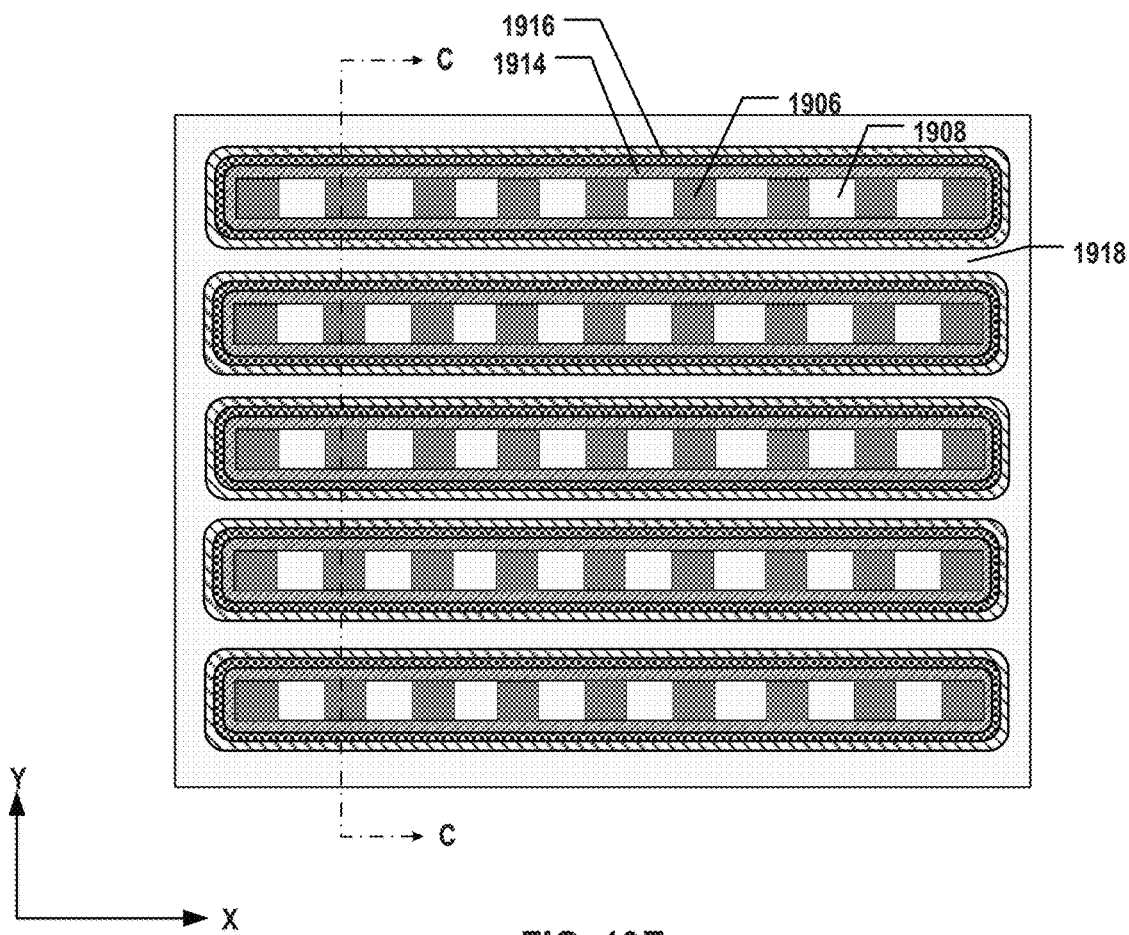

As illustrated in FIG. 19E, in some implementations, conductive layers 1916 are etched back, for example, using dry etch and/or wet etch (e.g., RIE), to form dents, such that the upper ends of conductive layers 1916 are below the top surface of semiconductor pillars 1906. In some implementations, as gate dielectrics 1914 are not etched back, the upper ends of conductive layers 1916 are below the upper ends of gate dielectrics 1914 as well, which are flush with the top surface of semiconductor pillars 1906. As a result, etched-back conductive layers 1916 can become word lines each extending in the word line direction (the x-direction), and parts of etched-back conductive layers 1916 that are facing semiconductor pillars 1906 can become gate electrodes. Gate structures each including a respective gate dielectric 1914 over the exposed side of semiconductor pillar 1906 and a respective gate electrode (part of conductive layer 1916) over gate dielectric 1914 can be formed thereby. In some implementations, as shown in FIG. 19E, a dielectric layer 1918 is formed in the remaining space of trenches 1910 as well as the dents (not shown) resulting from etching back of conductive layers 1916, for example, by depositing a dielectric, such as silicon oxide, using one or more thin film deposition processes including, but not limited to, CVD, PVD, ALD, or any combination thereof. It is understood that depending on the pitches of the word lines (the dimension of trenches 1910), air gaps may be formed in dielectric layer 1918.

At operation 2506 in FIG. 25, a first trench isolation extending vertically through the semiconductor pillar is formed to separate the semiconductor pillar into semiconductor bodies each in contact with a respective one of the gate structures. In some implementations, to form the first trench, the semiconductor pillar is etched in the second lateral direction to form a third trench, and a dielectric is deposited to fill the third trench.

Figure 19F:
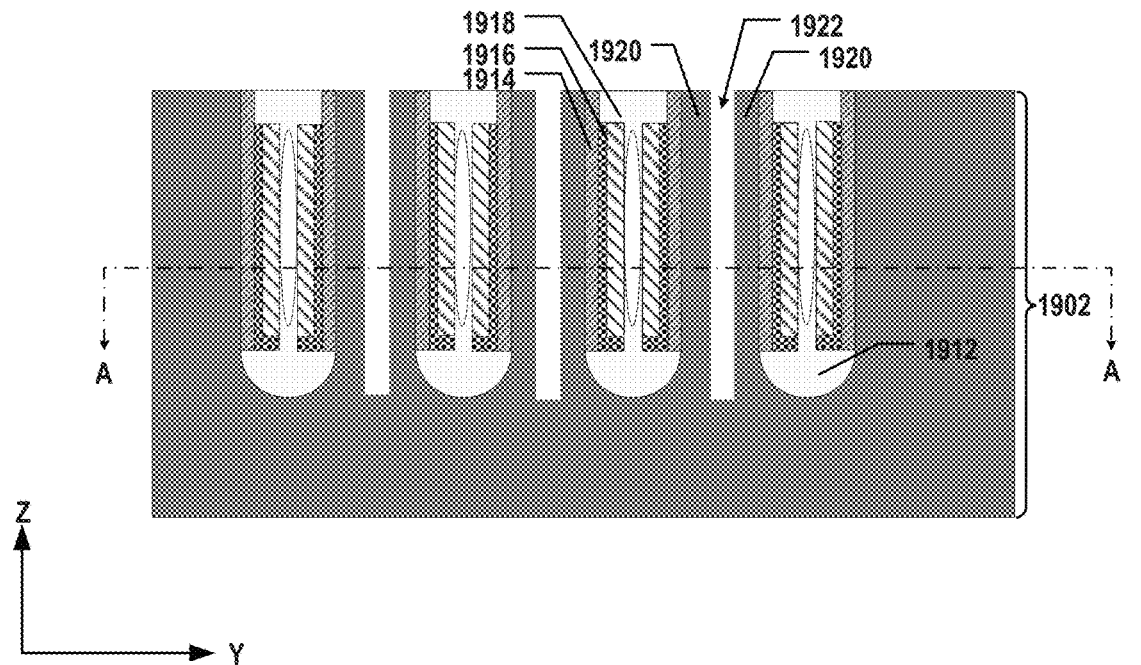
Figure 19F:
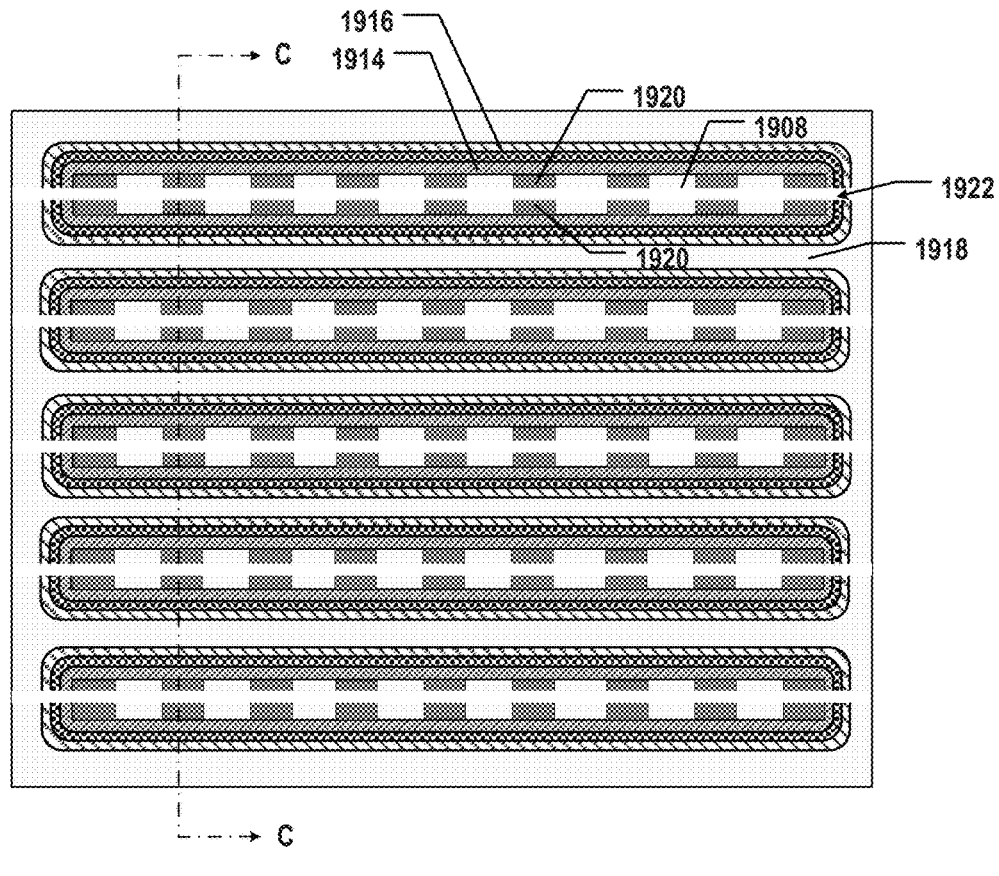

As illustrated in FIG. 19F, a plurality of parallel trenches 1922 in the x-direction (e.g., the word line direction) are formed to form an array of semiconductor bodies 1920 each extending vertically in silicon substrate 1902. In some implementations, a lithography process is performed to pattern trenches 1922 on semiconductor pillars 1906 (shown in FIG. 19E) using an etch mask (e.g., a photoresist mask and/or a hard mask), and one or more dry etching and/or wet etching processes, such as RIE, are performed on semiconductor pillars 1906 and trench isolation 1908 to etch trenches 1922. The etching can be controlled such that bottom of trenches 1922 is flush with or below the bottom surface of semiconductor pillars 1906. As a result, each semiconductor pillar 1906 can be separated by a respective trench 1922 into two semiconductor bodies 1920 in the y-direction. Since semiconductor bodies 1920 are formed by etching silicon substrate 1902, semiconductor bodies 1920 can have the same material as silicon substrate 1902, such as single crystalline silicon. As shown in the plan view, each semiconductor body 1920 can be in contact with a gate structure having gate dielectric 1914 and gate electrode 1916 on one side of semiconductor body 1920 in the y-direction. The opposite side of semiconductor body 1920 can be exposed by trench 1922. In some implementations, a mirror-symmetric arrangement of two semiconductor bodies 1920 and two gate structures thereof is achieved by forming trench 1922 across the middle of a respective semiconductor pillar 1906.

Figure 19G:
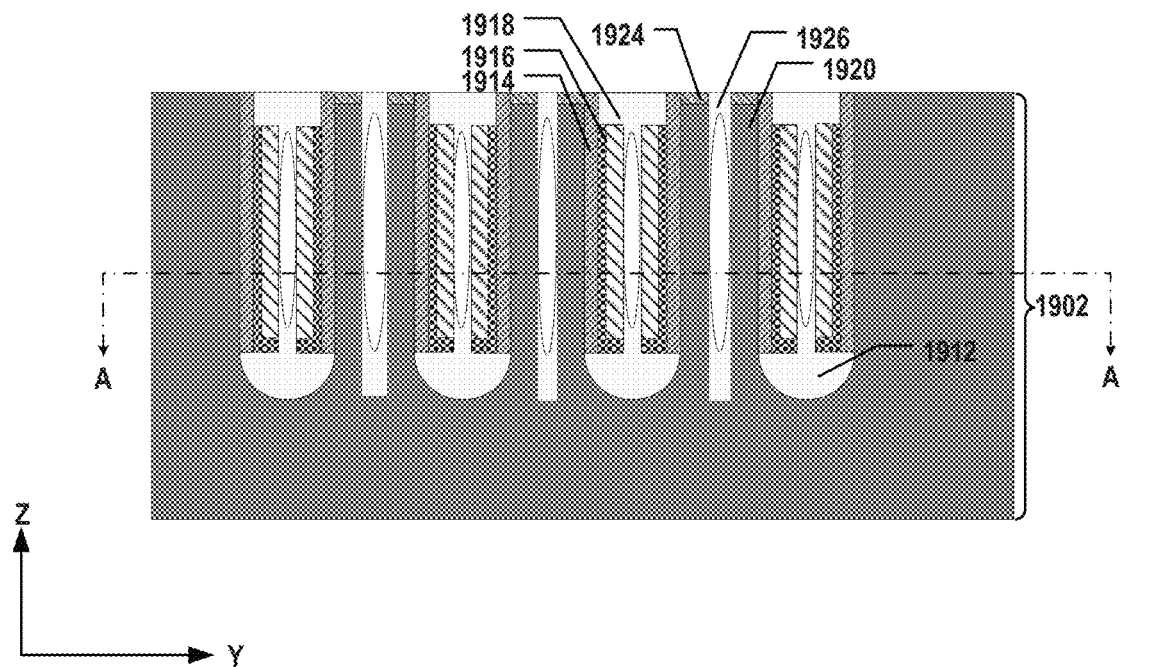
Figure 19G:
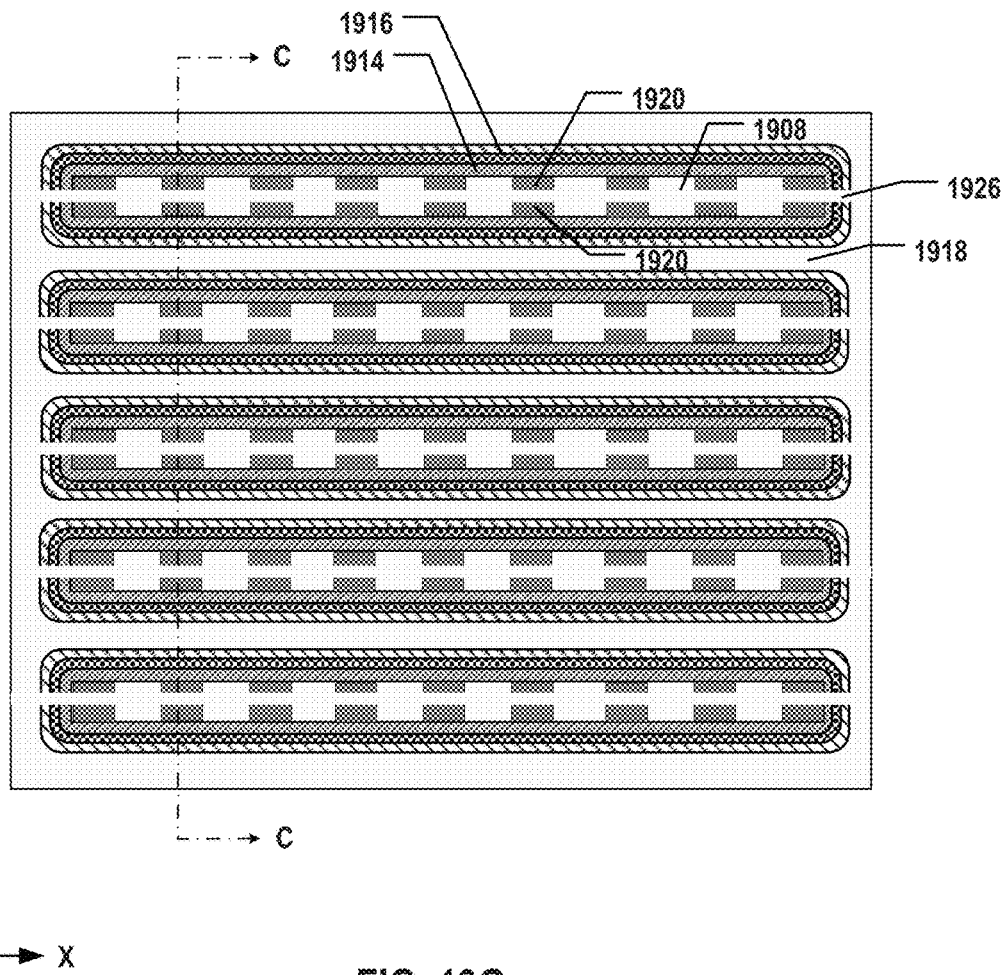

As illustrated in FIG. 19G, a trench isolation 1926 is formed in trench 1922 (shown in FIG. 19F), for example, by depositing a dielectric, such as silicon oxide, to fill trench 1922, using one or more thin film deposition processes including, but not limited to, CVD, PVD, ALD, or any combination thereof. A planarization process can be performed to remove excess dielectric over the top surface of silicon substrate 1902. It is understood that depending on the pitches of the semiconductor bodies 1920 (the dimension of trenches 1922), air gaps may be formed in trench isolation 1926. As shown in the plan view, parallel trench isolations 1926 each extending in the x-direction can form an array of semiconductor bodies 1920 in which a single side is in contact with a gate structure having gate dielectric 1914 and gate electrode 1916.

At operation 2508 in FIG. 25, first ends of the semiconductor bodies away from the substrate are doped. As illustrated in FIG. 19G, the exposed upper end of each semiconductor body 1920, e.g., one of the two ends of semiconductor body 1920 in the vertical direction (the z-direction) that is away from silicon substrate 1902, is doped to form a source/drain 1924 (e.g., a source terminal of a vertical transistor). In some implementations, an implantation process and/or thermal diffusion process are performed to dope P-type dopants or N-type dopants to exposed upper ends of semiconductor bodies 1920 to form sources/drains 1924. In some implementations, a silicide layer is formed on source/drain 1924 by performing a silicidation process at the exposed upper ends of semiconductor bodies 1920.

At operation 2510 in FIG. 25, storage units in contact with the semiconductor bodies, e.g., the doped first ends thereof, are formed. The storage unit can include a capacitor or a PCM element. In some implementations, to form a storage unit that is a capacitor, a first electrode is formed on the doped first end of the semiconductor body, a capacitor dielectric is formed on the first electrode, and a second electrode is formed on the capacitor dielectric.

Figure 19H:
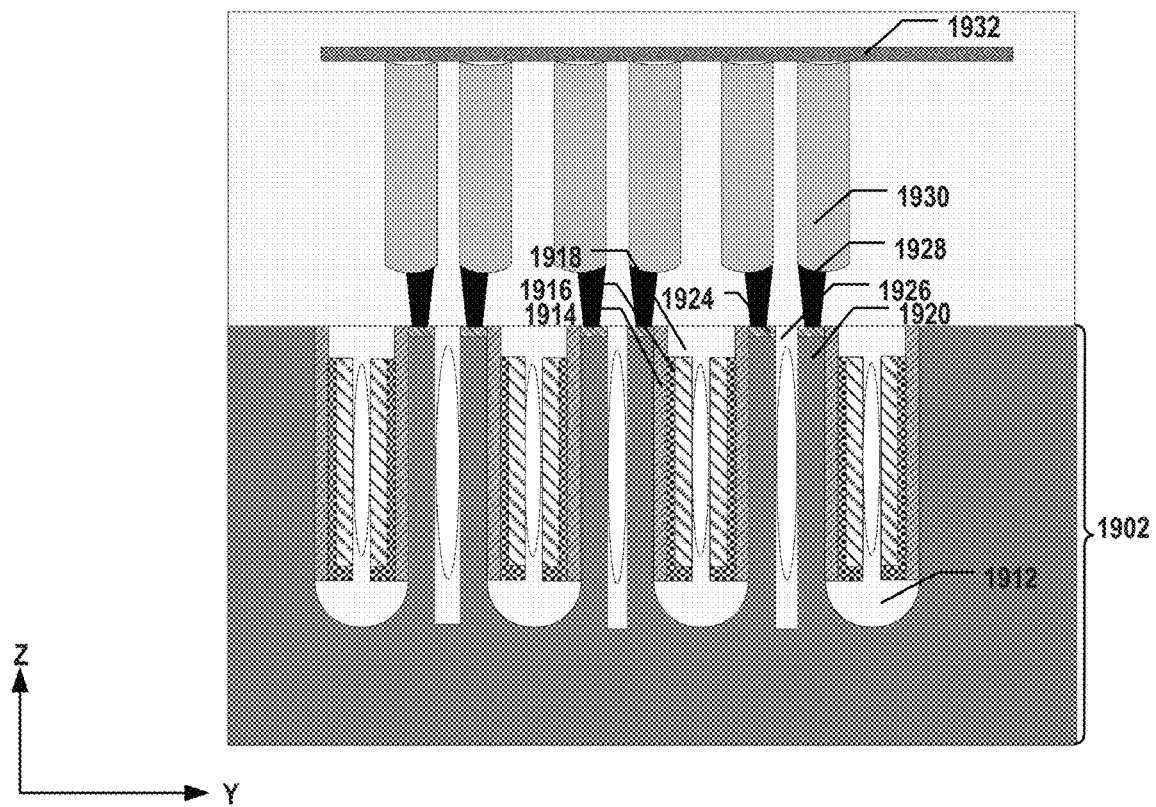

As illustrated in FIG. 19H, one or more ILD layers are formed over the top surface of silicon substrate 1902, for example, by depositing dielectrics using one or more thin film deposition processes including, but not limited to, CVD, PVD, ALD, or any combination thereof. Capacitor contacts 1928, first electrodes, capacitor dielectrics, and second electrodes of capacitors 1930, and a common plate 1932 are subsequently formed in the ILD layers to be coupled to semiconductor bodies 1920. In some implementations, capacitor contact 1928 is formed on a respective source/drain 1924, e.g., the doped upper end of a respective semiconductor body 1920 by patterning and etching an electrode hole aligned with respective source/drain 1924 using lithography and etching processes and depositing conductive materials to fill the electrode hole using thin film deposition processes. In some implementations, common plate 1932 is formed on the second electrodes of capacitors 1930 by patterning and etching an electrode trench aligned with capacitors 1930 using lithography and etching processes and depositing conductive materials to fill the electrode trench using thin film deposition processes.

Figure 19I:
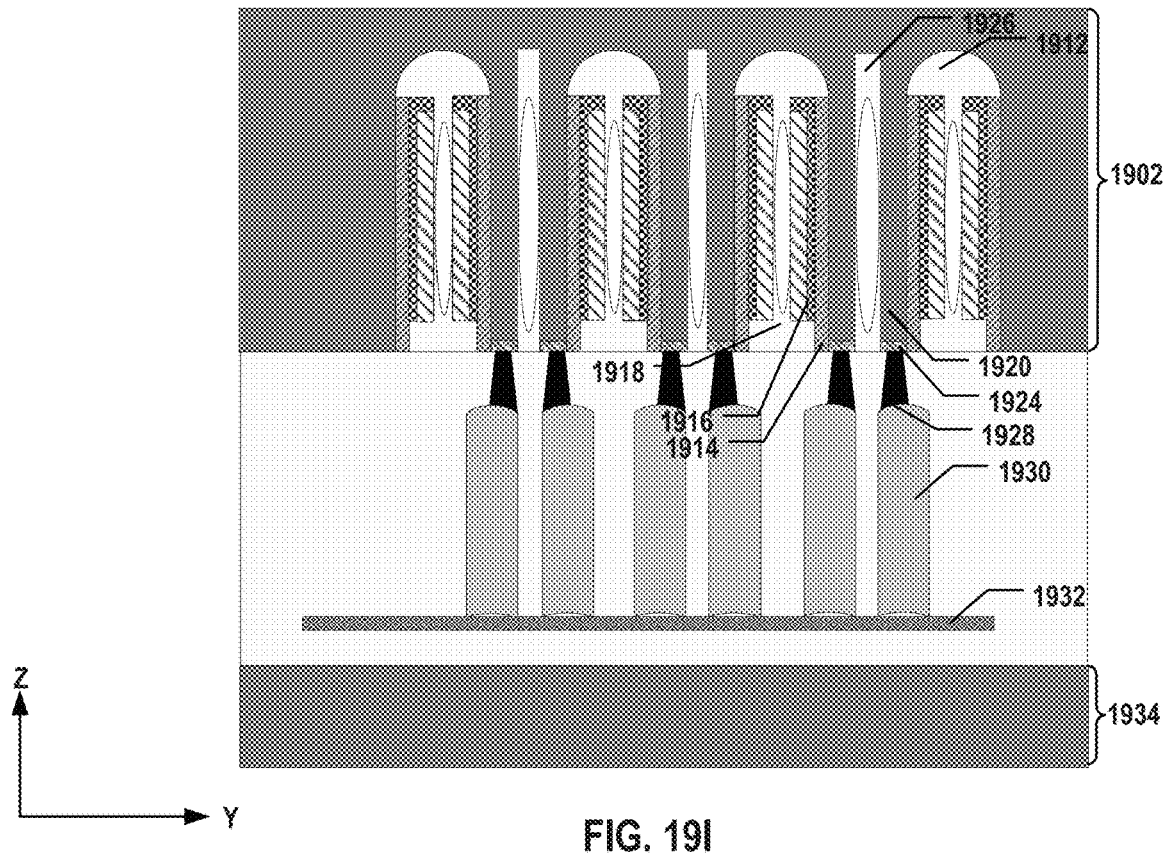

At operation 2512 in FIG. 25, the substrate is thinned to expose second ends of the semiconductor bodies opposite to the first end. As illustrated in FIG. 19I, a carrier substrate 1934 (a.k.a. a handle substrate) is bonded onto the front side of silicon substrate 1902 on which devices are formed using any suitable bonding processes, such as anodic bonding, fusion bonding, transfer bonding, adhesive bonding, and eutectic bonding. The bonded structure can then be flipped upside down, such that silicon substrate 1902 become above carrier substrate 1934.

Figure 19J:
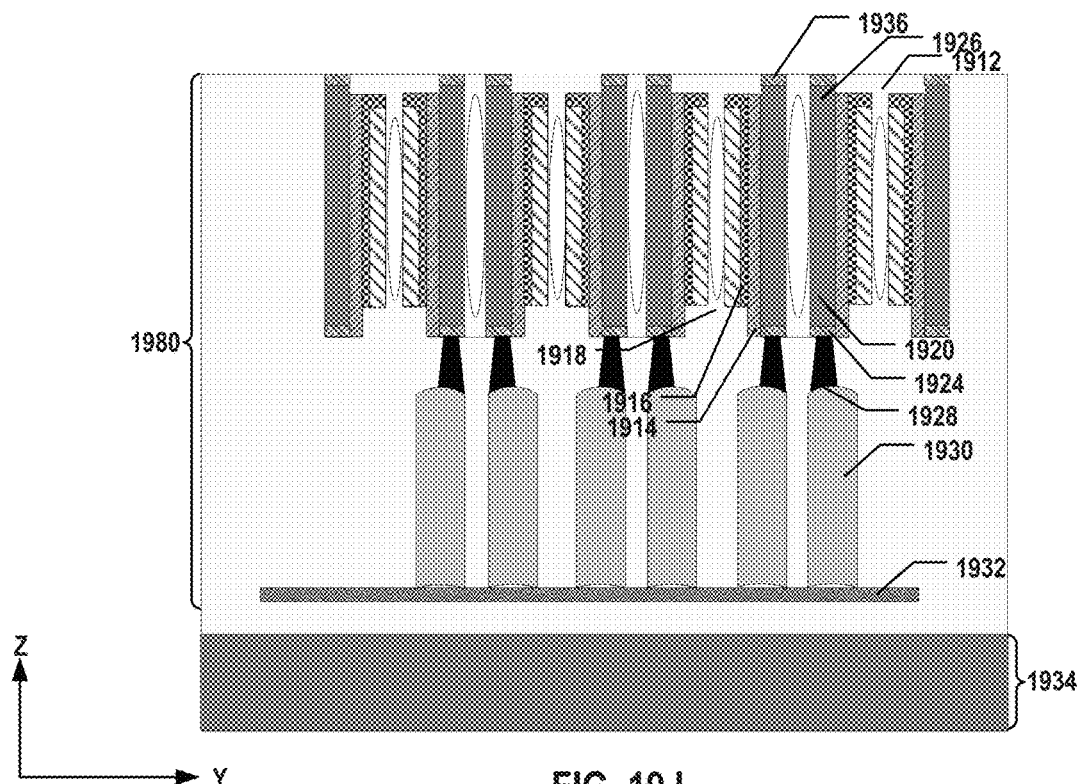

As illustrated in FIG. 19J, silicon substrate 1902 (shown in FIG. 19I) is thinned to expose the undoped upper ends of semiconductor bodies 1920 (used to be the lower ends before flipping over). In some implementations, planarization processes (e.g., CMP) and/or etching processes are performed to thin silicon substrate 1902 until being stopped by dielectric layer 1918 and the upper ends of semiconductor bodies 1920.

At operation 2514 in FIG. 25, the exposed second ends of the semiconductor bodies are doped. As illustrated in FIG. 19J, the exposed upper end of each semiconductor body 1920, e.g., one of the two ends of semiconductor body 1920 in the vertical direction (the z-direction) that is away from carrier substrate 1934, is doped to form another source/drain 1936 (e.g., a drain terminal of the vertical transistor). In some implementations, an implantation process and/or thermal diffusion process are performed to dope P-type dopants or N-type dopants to exposed upper ends of semiconductor bodies 1920 to form sources/drains 1936. In some implementations, a silicide layer is formed on source/drain 1936 by performing a silicidation process at the exposed upper ends of semiconductor bodies 1920. As a result, vertical transistors having semiconductor body 1920, sources/drains 1924 and 1936, gate dielectric 1914, and the gate electrode (part of conductive layer 1916) are formed thereby, as shown in FIG. 19J, according to some implementations. As described above, capacitors 1930 each having the first and second electrodes and the capacitor dielectric are thereby formed as well, and DRAM cells 1980 each having a single-gate vertical transistor and a capacitor coupled to the single-gate vertical transistor are thereby formed, as shown in FIG. 19J, according to some implementations.

Figure 19K:
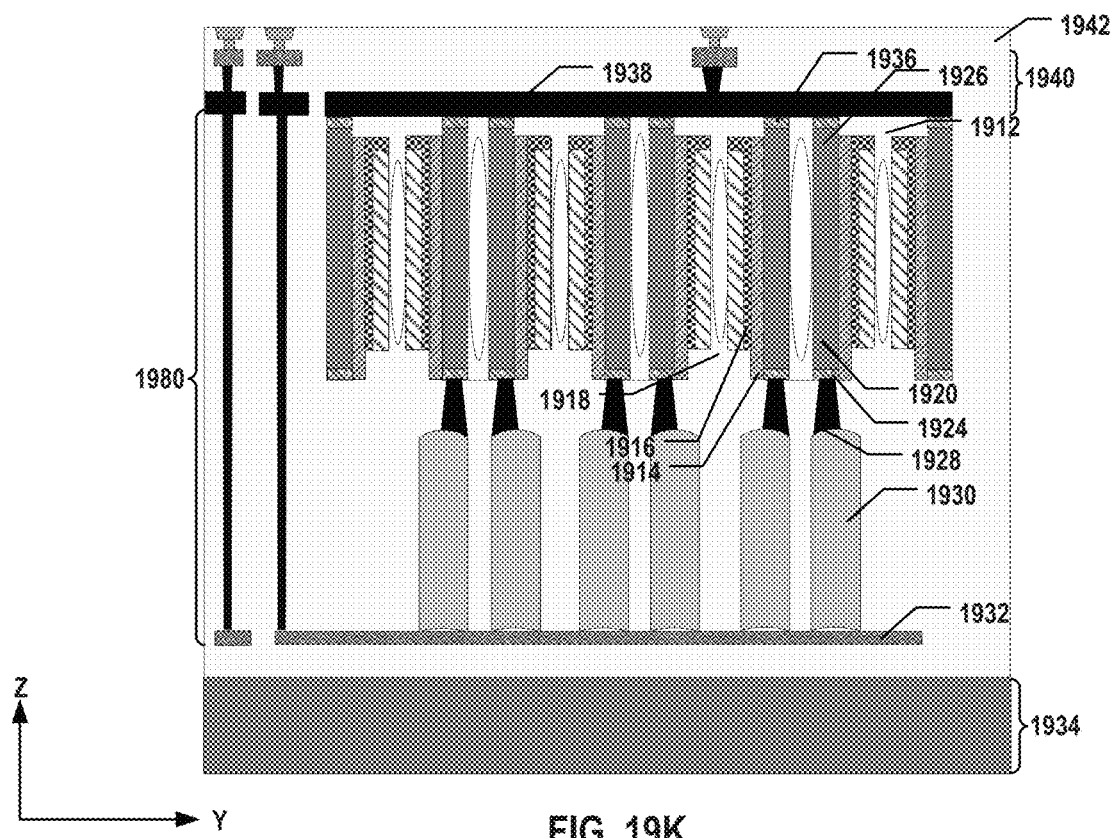
Figure 19L:
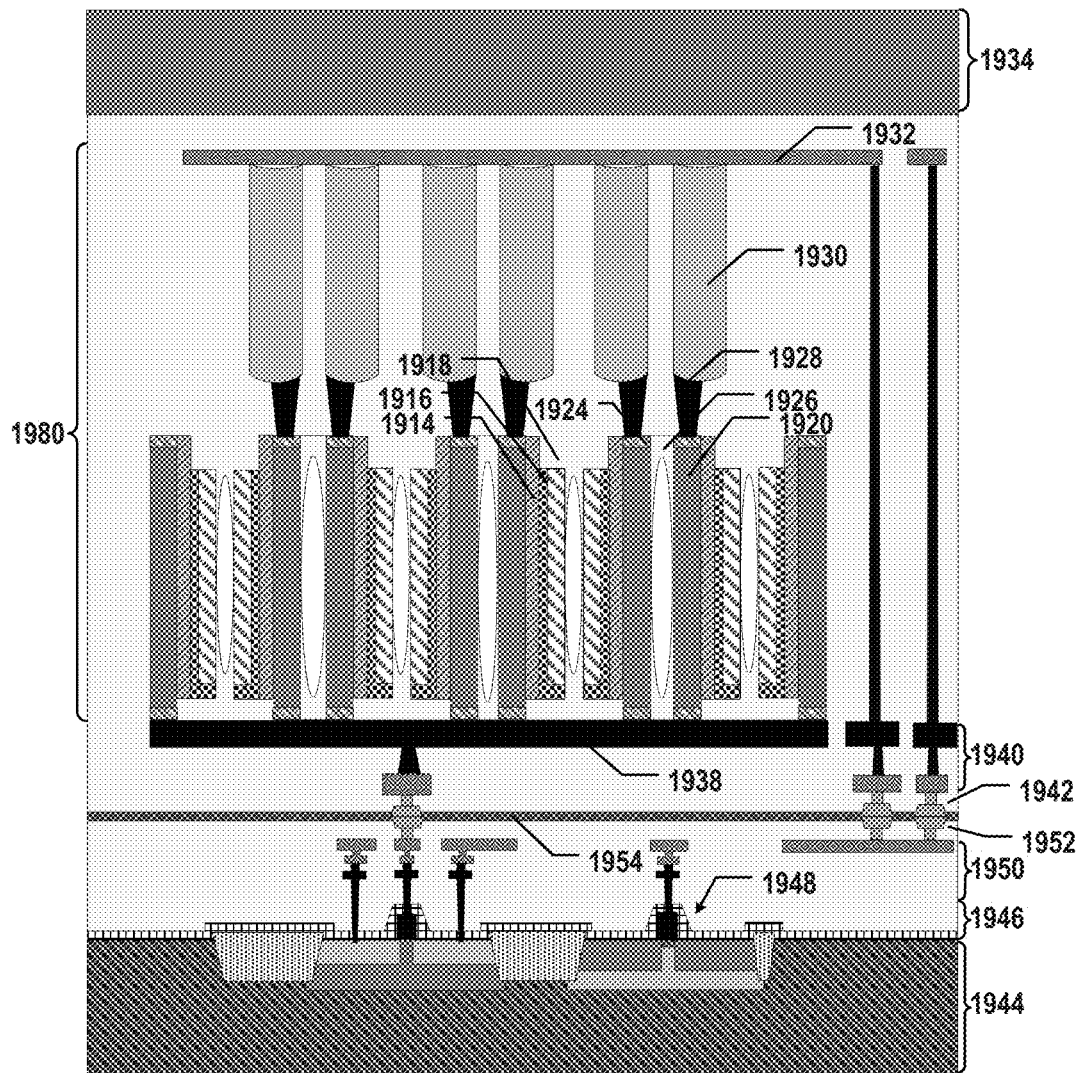

Referring back to FIG. 23, method 2300 proceeds to operation 2308, as illustrated in FIG. 23, in which an interconnect layer including bit lines is formed above the array of memory cells. As illustrated in FIG. 19K, an interconnect layer 1940 can be formed above DRAM cells 1980. Interconnect layer 1940 can include interconnects of MEOL and/or BEOL in a plurality of ILD layers to make electrical connections with DRAM cells 1980. In some implementations, interconnect layer 1940 includes multiple ILD layers and interconnects therein formed in multiple processes. For example, the interconnects in interconnect layers 1940 can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. The ILD layers can include dielectric materials deposited using one or more thin film deposition processes including, but not limited to, CVD, PVD, ALD, or any combination thereof. The ILD layers and interconnects illustrated in FIG. 19K can be collectively referred to as interconnect layer 1940.

As shown in FIG. 25, at operation 2516, to form the interconnect layer, a bit line is formed on the doped second end. As illustrated in FIG. 19K, bit line 1938 can be formed on sources/drains 1936 by patterning and etching a trench aligned with respective source/drain 1936 using lithography and etching processes and depositing conductive materials to fill the trench using thin film deposition processes. In some implementations, forming bit line 1938 includes depositing a metal layer onto the exposed end of semiconductor body 1920. As a result, bit line 1938 and capacitor 1930 can be formed on opposite sides of semiconductor body 1920 and coupled to opposite ends of semiconductor body 1920. It is understood that additional local interconnects, such as word line contacts, capacitor contacts (e.g., a conductor), and bit line contacts (not shown in FIG. 19K, e.g., a metal silicide contact) may be similarly formed as well. In some implementations, the bit line contact (e.g., a metal silicide contact) is formed on the exposed end of semiconductor body 1820, and bit line 1938 is formed on the bit line contact.

Method 2300 proceeds to operation 2310, as illustrated in FIG. 23, in which a second bonding layer is formed above the array of memory cells and the interconnect layer. The second bonding layer can include a second bonding contact. As illustrated in FIG. 19K, a bonding layer 1942 is formed above interconnect layer 1940 and DRAM cells 1980. Bonding layer 1942 can include a plurality of bonding contacts surrounded by dielectrics. In some implementations, a dielectric layer (e.g., ILD layer) is deposited on the top surface of interconnect layer 1940 by one or more thin film deposition processes including, but not limited to, CVD, PVD, ALD, or any combination thereof. The bonding contacts can then be formed through the dielectric layer and in contact with the interconnects in interconnect layer 1940 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing a barrier layer, an adhesion layer, and/or a seed layer before depositing the conductor.

Method 2300 proceeds to operation 2312, as illustrated in FIG. 23, in which the first semiconductor structure and the second semiconductor structure are bonded in a face-to-face manner, such that the first array of memory cells is coupled to the peripheral circuit across a bonding interface. The bonding can include hybrid bonding. In some implementations, the first bonding contact is in contact with the second bonding contact at the bonding interface after the bonding. In some implementations, the second semiconductor structure is above the first semiconductor structure after the bonding. In some implementations, the first semiconductor structure is above the second semiconductor structure after the bonding.

As illustrated in FIG. 19L, carrier substrate 1934 and components formed thereon (e.g., DRAM cells 1980) are flipped upside down. As illustrated in FIG. 19L, bonding layer 1942 facing down is bonded with bonding layer 1952 facing up, e.g., in a face-to-face manner, thereby forming a bonding interface 1954. In some implementations, a treatment process, e.g., a plasma treatment, a wet treatment, and/or a thermal treatment, is applied to the bonding surfaces prior to the bonding. Although not shown in FIG. 19L, silicon substrate 1944 and components formed thereon (e.g., peripheral circuits 1946) can be flipped upside down, and bonding layer 1952 facing down can be bonded with bonding layer 1942 facing up, e.g., in a face-to-face manner, thereby forming bonding interface 1954. After the bonding, the bonding contacts in bonding layer 1942 and the bonding contacts in bonding layer 1952 are aligned and in contact with one another, such that DRAM cells 1980 can be electrically connected to peripheral circuits 1946 across bonding interface 1954. It is understood that in the bonded chip, DRAM cells 1980 may be either above or below peripheral circuits 1946. Nevertheless, bonding interface 1954 can be formed vertically between peripheral circuits 1946 and DRAM cells 1980 after the bonding.

Figure 19M:
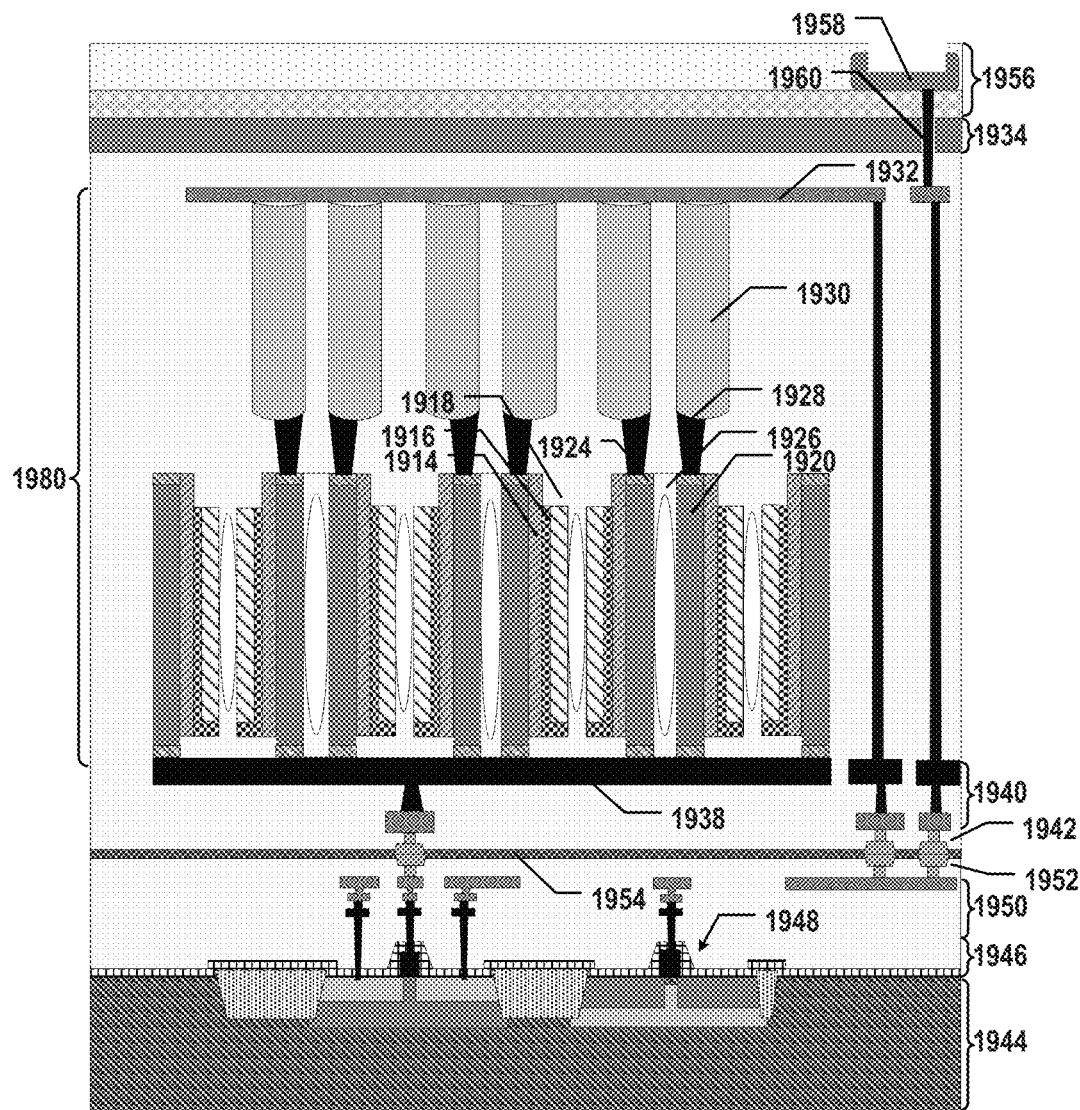

Method 2300 proceeds to operation 2314, as illustrated in FIG. 23, in which a pad-out interconnect layer is formed on the backside of the first semiconductor structure or the second semiconductor structure. As illustrated in FIG. 19M, a pad-out interconnect layer 1956 is formed above on the backside of carrier substrate 1934. Pad-out interconnect layer 1956 can include interconnects, such as pad contacts 1958, formed in one or more ILD layers. Pad contacts 1958 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. In some implementations, after the bonding, contacts 1960 are formed extending vertically through carrier substrate 1934, for example, by wet/dry etching processes, followed by depositing conductive materials. Contacts 1960 can be in contact with the interconnects in pad-out interconnect layer 1956. It is understood that in some examples, carrier substrate 1934 may be thinned or removed after bonding and prior to forming pad-out interconnect layer 1956 and contacts 1960, for example, using planarization processes and/or etching processes.

Although not shown, it is understood that in some examples, pad-out interconnect layer 1956 may be formed above on the backside of silicon substrate 1944, and contacts 1960 may be formed extending vertically through silicon substrate 1944. Silicon substrate 1944 may be thinned prior to forming pad-out interconnect layer 1956 and contacts 1960, for example, using planarization processes and/or etching processes. Although not shown, it is further understood that in some examples, the fabrication processes described with respect to FIGS. 14A-14E and 15A-15D may be applied to form another array of DRAM cells 1980 in another semiconductor structure bonded to the semiconductor structure including DRAM cells 1980 described above with respect to FIGS. 19A-19M.

Method 2300 may further be implemented by the fabrication process described in FIGS. 22A-22M and 26 to form 3D memory device 2100 depicted in FIG. 21 having double-gate vertical transistors, as opposed to single-gate vertical transistors. Referring to FIG. 23, method 2300 starts at operation 2302, in which a peripheral circuit is formed on a first substrate. The first substrate can include a silicon substrate. In some implementations, an interconnect layer is formed above the peripheral circuit. The interconnect layer can include a plurality of interconnects in one or more ILD layers.

Figure 22L:
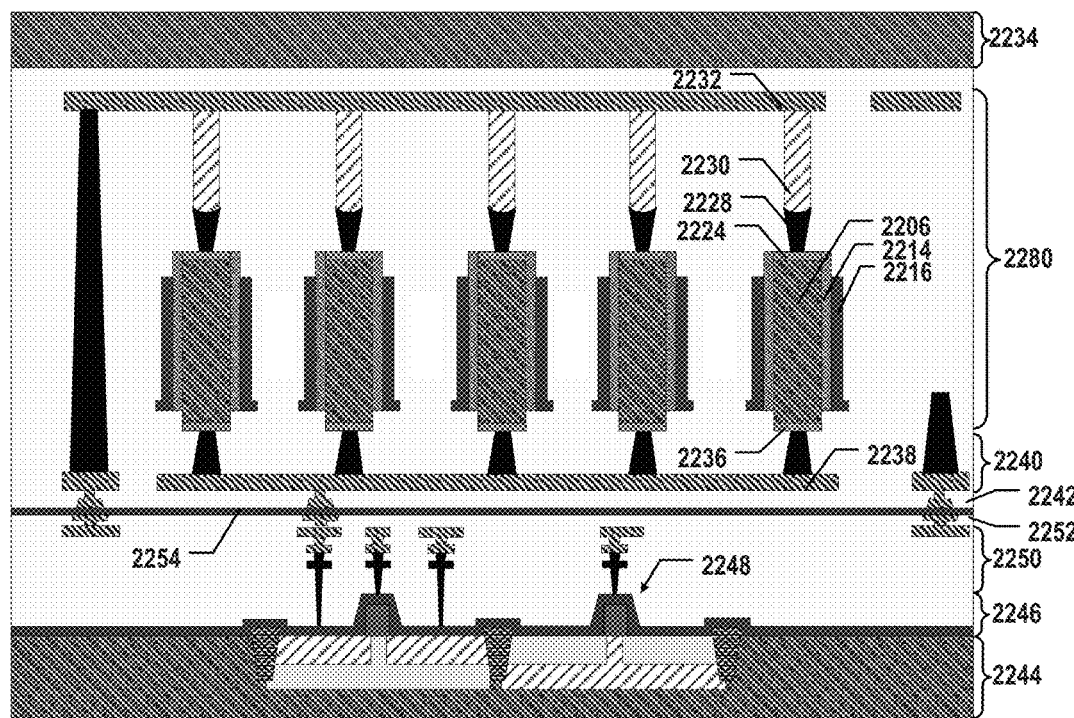
Figure 23:
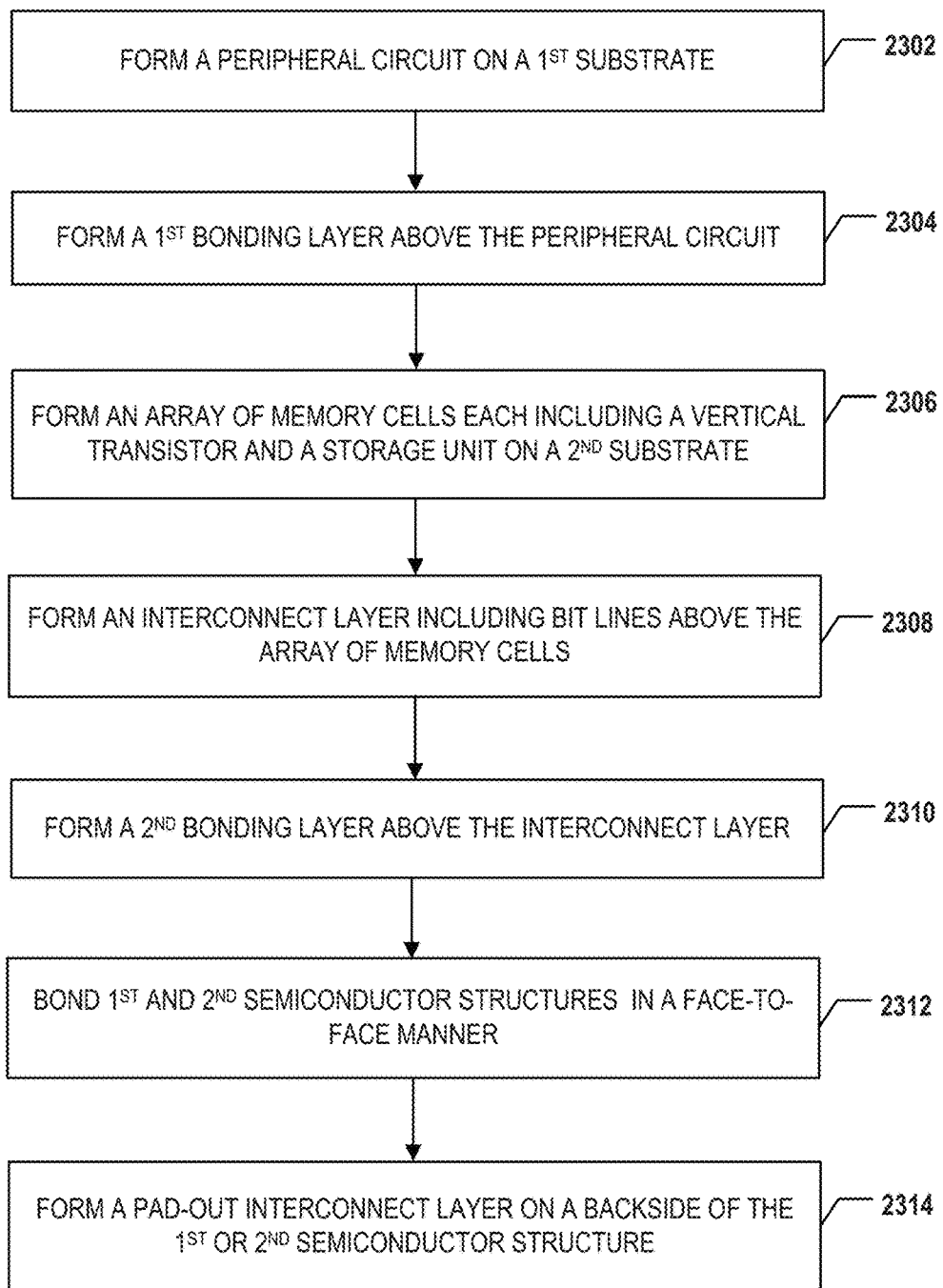
FIG. 23 illustrates a flowchart of a method for forming a 3D memory device including vertical transistors, according to some aspects of the present disclosure.

As illustrated in FIG. 22L, a plurality of transistors 2248 are formed on a silicon substrate 2244. Transistors 2248 can be formed by a plurality of processes including, but not limited to, photolithography, dry/wet etch, thin film deposition, thermal growth, implantation, CMP, and any other suitable processes. In some implementations, doped regions are formed in silicon substrate 2244 by ion implantation and/or thermal diffusion, which function, for example, as the source and drain of transistors 2248. In some implementations, isolation regions (e.g., STIs) are also formed in silicon substrate 2244 by wet/dry etch and thin film deposition. Transistors 2248 can form peripheral circuits 2246 on silicon substrate 2244.

As illustrated in FIG. 22L, an interconnect layer 2250 can be formed above peripheral circuits 2246 having transistors 2248. Interconnect layer 2250 can include interconnects of MEOL and/or BEOL in a plurality of ILD layers to make electrical connections with peripheral circuits 2246. In some implementations, interconnect layer 2250 includes multiple ILD layers and interconnects therein formed in multiple processes. For example, the interconnects in interconnect layers 2250 can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 22L can be collectively referred to as interconnect layer 2250.

Method 2300 proceeds to operation 2304, as illustrated in FIG. 23, in which a first bonding layer is formed above the peripheral circuit (and the interconnect layer). The first bonding layer can include a first bonding contact. As illustrated in FIG. 22L, a bonding layer 2252 is formed above interconnect layer 2250 and peripheral circuits 2246. Bonding layer 2252 can include a plurality of bonding contacts surrounded by dielectrics. In some implementations, a dielectric layer (e.g., ILD layer) is deposited on the top surface of interconnect layer 2250 by one or more thin film deposition processes including, but not limited to, CVD, PVD, ALD, or any combination thereof. The bonding contacts can then be formed through the dielectric layer and in contact with the interconnects in interconnect layer 2250 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing a barrier layer, an adhesion layer, and/or a seed layer before depositing the conductor.

Method 2300 proceeds to operation 2306, as illustrated in FIG. 23, in which an array of memory cells each including a vertical transistor and a storage unit is formed on a second substrate. The second substrate can include a carrier substrate. The storage unit can include a capacitor or a PCM element. In some implementations, a capacitor is formed to be coupled to the vertical transistor in the respective memory cell.

Figure 26:
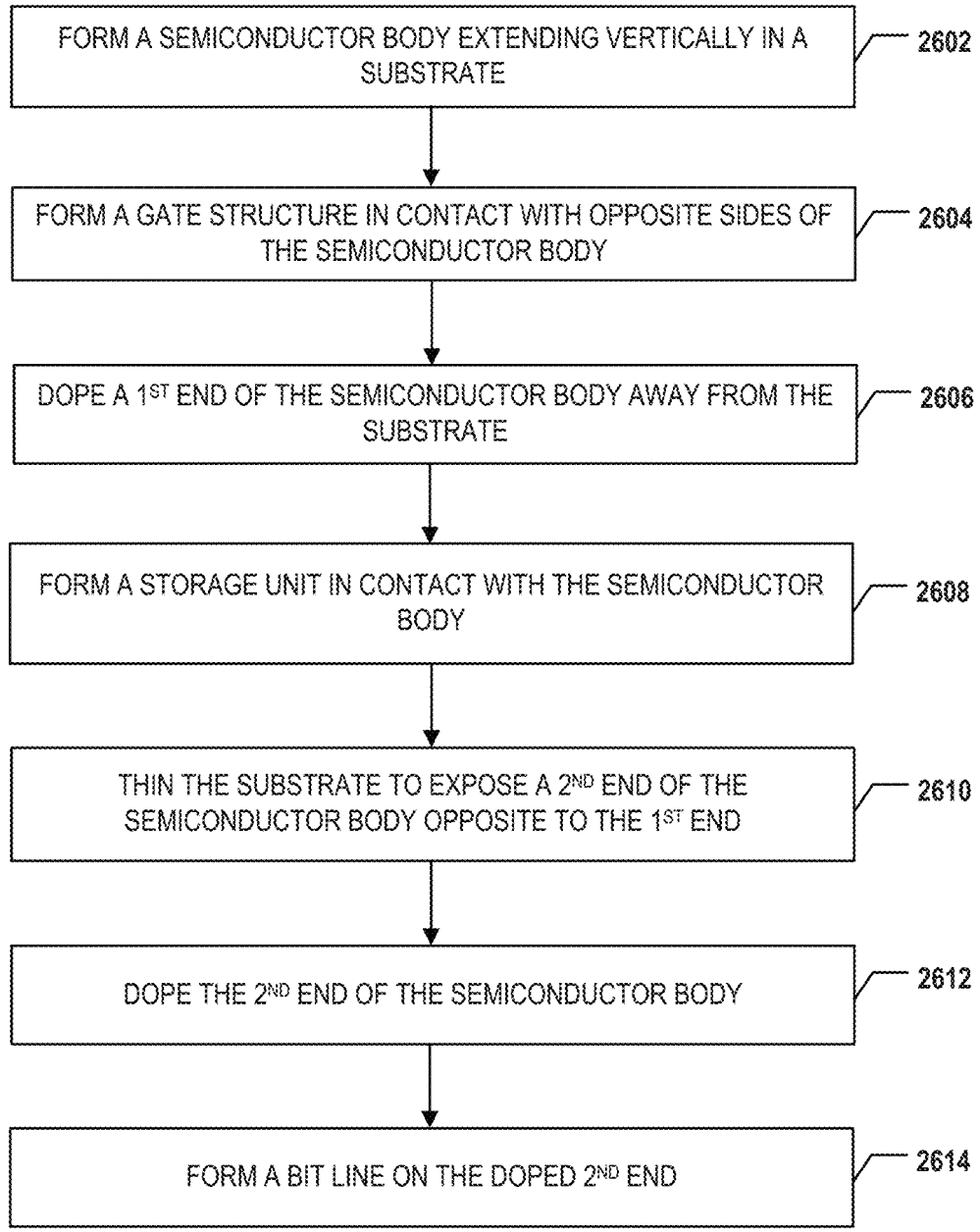
FIG. 26 illustrates a flowchart of a method for forming still another array of memory cells each including a vertical transistor, according to some aspects of the present disclosure.

For example, FIG. 26 illustrates a flowchart of a method 2600 for forming still another array of memory cells each including a vertical transistor, according to some aspects of the present disclosure. At operation 2602 in FIG. 26, a semiconductor body extending vertically in a substrate is formed. The substrate can be an SOI substrate including a handle layer, a buried oxide layer, and a device layer. In some implementations, to form the semiconductor body, the handle layer is etched in a first lateral direction to form first trenches, and the handle layer is etched in a second lateral direction to form second trenches, such that the two opposite sides of the semiconductor body is exposed by the second trenches. In some implementations, a dielectric is deposited to partially fill the second trenches.

As illustrated in FIG. 22A, a plurality of parallel trenches 2204 are formed in the y-direction (e.g., the bit line direction) to form a plurality of parallel semiconductor walls 2205 in the y-direction. In some implementations, a lithography process is performed to pattern trenches 2204 and semiconductor walls 2205 using an etch mask (e.g., a photoresist mask and/or a hard mask), for example, based on the design of bit lines, and one or more dry etching and/or wet etching processes, such as RIE, are performed to etch trenches 1904 in an SOI substrate 2201. Thus, semiconductor wall 1905 extending vertically in SOI substrate 2201 can be formed. As shown in FIG. 22A, SOI substrate 2201 can include a handle layer 2202, a buried oxide layer 2203 on handle layer 2202, and a device layer 2209 on buried oxide layer 2203. In some implementations, buried oxide layer 2203 includes silicon oxide, and device layer 2209 includes single crystalline silicon. In some implementations, to form trenches 2204, device layer 2209 is etched using RIE, stopped at buried oxide layer 2203. That is, buried oxide layer 2203 can serve as the etch stop layer. It is understood that in some examples, device layer 2209 may not be part of an SOI substrate, but transferred and bonded onto buried oxide layer 2203 from another silicon substrate (not shown, e.g., an SOI substrate). It is also understood that in some examples, SOI substrate 2201 may be replaced with a silicon substrate, such as silicon substrate 1902 in FIG. 19A; the etching of trenches 2204 may not be stopped by buried oxide layer 2203, but by controlling the etching rate and/or duration, for example, as shown in FIG. 19A Nevertheless, the bottom of semiconductor wall 2205 can be below the top surface of SOI substrate 2201. Since semiconductor walls 2205 are formed by etching device layer 2209 of SOI substrate 2201, semiconductor walls 2205 can have the same material as device layer 2209 of SOI substrate 2201, such as single crystalline silicon. FIG. 22A illustrates both the side view (in the top portion of FIG. 22A) of a cross-section along the x-direction (the word line direction, e.g., in the BB plane) and the plan view (in the bottom portion of FIG. 22A) of a cross-section in the x-y plane (e.g., in the AA plane through semiconductor walls 2205).

As illustrated in FIG. 22B, a plurality of parallel trenches 2210 are formed in the x-direction (e.g., the word line direction) to form an array of semiconductor bodies 2206 each extending vertically in SOI substrate 2201. In some implementations, a lithography process is performed to pattern trenches 2210 to be perpendicular to trenches 2204 using an etch mask (e.g., a photoresist mask and/or a hard mask), for example, based on the design of word lines, and one or more dry etching and/or wet etching processes, such as RIE, are performed to etch trenches 2210 in device layer 2209 of SOI substrate 2201. As a result, semiconductor walls 2205 (shown in FIG. 22A) can be cut by trenches 2210 to form an array of semiconductor bodies 2206 each extending vertically in SOI substrate 2201. The bottom of semiconductor body 2206 can be below the top surface of SOI substrate 2201. Since semiconductor bodies 2206 are formed by etching device layer 2209 of SOI substrate 2201, semiconductor bodies 2206 can have the same material as device layer 2209 of SOI substrate 2201, such as single crystalline silicon. FIG. 22B illustrates both the side view (in the top portion of FIG. 22B) of a cross-section along the y-direction (the bit line direction, e.g., in the CC plane) and the plan view (in the bottom portion of FIG. 22B) of a cross-section in the x-y plane (e.g., in the AA plane through semiconductor bodies 2206). The same drawing layout is arranged in FIGS. 22C-22G as well.

It is understood that in some examples, trenches 2204 and 2210 may be formed in the same process, as opposed to two consecutive processes. For example, the same lithography process may be used to pattern and trenches 2204 and 2210, followed by the same etching process. It is also understood that in some examples, trenches 2210 in the word line direction may be formed prior to the formation of trenches 2204 in the bit line direction. Nevertheless, after the formation of trenches 2204 and 2210, semiconductor body 2206 can be formed, and all four sides of semiconductor body 2206 can be exposed by trenches 2204 and 2210. In some implementations, two opposite sides of semiconductor body 2206 in the word line direction are exposed by trenches 2204, and two opposite sides of semiconductor body 2206 in the bit line direction are exposed by trenches 2210, As shown in the plan view. In other words, semiconductor body 2206 can be surrounded by trenches 2204 and 2210.

As illustrated in FIG. 22C, a dielectric layer 2212 is formed at the bottom of trench 2210 (and trench 2204 in some examples), for example, by depositing a dielectric, such as silicon oxide, to partially fill trench 2210, using one or more thin film deposition processes including, but not limited to, CVD, PVD, ALD, or any combination thereof. The deposition conditions, such as deposition rate and/or time, can be controlled to control the thickness of dielectric layer 2212 and avoid fully filling trench 2210. As a result, the bottom surface of trenches 2210 can be elevated to be above the bottom surface of semiconductor bodies 2206.

At operation 2604 in FIG. 26, a gate structure in contact with opposite sides of the semiconductor body is formed. In some implementations, to form the gate structure, a gate dielectric is formed over the opposite sides of the semiconductor body, and a gate electrode is formed over the gate dielectric. In some implementations, to form the gate electrode, a conductive layer is deposited over the gate dielectric, and the conductive layer is etched back.

As illustrated in FIG. 22D, a gate dielectric 2214 is formed over the two opposite sides of semiconductor body 2206 in the bit line direction (the y-direction) exposed from trenches 2210. As shown in the plan view, gate dielectrics 2214 can be parts of a continuous dielectric layer formed over sidewalls of each row of semiconductor bodies 2206. In some implementations, gate dielectric 2214 is formed by depositing a layer of dielectric, such as silicon oxide, over the sidewalls and top surfaces of semiconductor bodies 2206 using one or more thin film deposition processes including, but not limited to, CVD, PVD, ALD, or any combination thereof, without fully filling trenches 2210. It is understood that in some examples, gate dielectrics 2214 may not be parts of a continuous dielectric layer. For example, a wet oxidation and/or a dry oxidation process, such as ISSG oxidation, is performed to form native oxide (e.g., silicon oxide) on semiconductor bodies 2206 (e.g., single crystalline silicon) as gate dielectric 2214.

As illustrated in FIG. 22D, a conductive layer 2216 is formed over gate dielectrics 2214. In some implementations, conductive layers 2216 are formed by depositing one or more conductive materials, such as metal and/or metal compounds (e.g., W and TiN), over gate dielectrics 2214 using one or more thin film deposition processes including, but not limited to, CVD, PVD, ALD, or any combination thereof, to partially fill trenches 2210. For example, layers of TiN and W may be sequentially deposited to form conductive layer 2216. As shown in the side view, conductive layers 2216 can be a continuous layer in the bit line direction as the conductive materials can be deposited over the top surfaces of semiconductor bodies 2206 and the bottom surfaces of trenches 2210.

As illustrated in FIG. 22E, in some implementations, parts of conductive layers 2216 at the bottom surfaces of trenches 2210 are removed to separate the continuous conductive layers 2216 into discrete pieces in the bit line direction, for example, using dry etch and/or we etch (e.g., RIE) to form cuts 2211 on the bottom surfaces of trenches 2210. In some implementations, parts of conductive layers 2216 at the top surfaces of semiconductor bodies 2206 are removed as well by the same etching process to expose gate dielectrics 2214 at the top surfaces of semiconductor bodies 2206.

As illustrated in FIG. 22F, in some implementations, trench isolations 2218 are formed in trench 2210 (shown in FIG. 22E), for example, by depositing a dielectric, such as silicon oxide, to fill trench 2210, using one or more thin film deposition processes including, but not limited to, CVD, PVD, ALD, or any combination thereof. A planarization process (e.g., CMP and/or etching process) can be performed to remove excess dielectric over the top surface of semiconductor bodies 2206. In some implementations, the planarization process removes parts of gate dielectrics 2214 over the top surfaces of semiconductor bodies 2206 as well to expose the top surfaces of semiconductor bodies 2206. It is understood that depending on the pitches of the semiconductor bodies 2206 (the dimension of trenches 2210), air gaps may be formed in trench isolation 2218. As shown in the plan view, the deposition of the dielectric may fill the remaining spaces of trenches 2204 (shown in FIG. 22E) as well to form isolations 2219 between adjacent semiconductor bodies 2206 in the word line direction (e.g., in the same row).

As illustrated in FIG. 22G, in some implementations, conductive layers 2216 are etched back, for example, using dry etch and/or wet etch (e.g., RIE), to form dents, such that the upper ends of conductive layers 2216 are below the top surface of semiconductor bodies 1906. In some implementations, as gate dielectrics 2214 are not etched back, the upper ends of conductive layers 2216 are below the upper ends of gate dielectrics 2214 as well, which are flush with the top surface of semiconductor bodies 2206. As a result, etched-back conductive layers 2216 can become word lines each extending in the word line direction (the x-direction), and parts of etched-back conductive layers 2216 that are facing semiconductor bodies 2206 can become gate electrodes. Gate structures each including a respective gate dielectric 2214 over the exposed two opposite sides (in the bit line direction) of semiconductor body 2206 and a respective gate electrode (part of conductive layer 2216) over gate dielectric 2214 can be formed thereby.

At operation 2608 in FIG. 26, a first end of the semiconductor body away from the substrate is doped. As illustrated in FIG. 22G, the exposed upper end (top surface) of each semiconductor body 2206, e.g., one of the two ends of semiconductor body 2206 in the vertical direction (the z-direction) that is away from handle layer 2202 of SOI substrate 2201, is doped to form a source/drain 2224 (e.g., a source terminal of a vertical transistor). In some implementations, an implantation process and/or thermal diffusion process are performed to dope P-type dopants or N-type dopants to exposed upper ends of semiconductor bodies 2206 to form sources/drains 2224. In some implementations, a silicide layer is formed on source/drain 2224 by performing a silicidation process at the exposed upper ends of semiconductor bodies 2206.

At operation 2608 in FIG. 26, a storage unit in contact with the semiconductor body, e.g., the doped first end thereof, is formed. The storage unit can include a capacitor or a PCM element. In some implementations, to form a storage unit that is a capacitor, a first electrode is formed on the doped first end of the semiconductor body, a capacitor dielectric is formed on the first electrode, and a second electrode is formed on the capacitor dielectric.

As illustrated in FIG. 22H, one or more ILD layers are formed over the top surface of semiconductor bodies 2206, for example, by depositing dielectrics using one or more thin film deposition processes including, but not limited to, CVD, PVD, ALD, or any combination thereof. Capacitor contacts 2228, first electrodes, capacitor dielectrics, and second electrodes of capacitors 2230, and a common plate 2232 are subsequently formed in the ILD layers to be coupled to semiconductor bodies 2206. In some implementations, each capacitor contact 2228 is formed on a respective source/drain 2224, e.g., the doped upper end of a respective semiconductor body 2206 by patterning and etching an electrode hole aligned with respective source/drain 2224 using lithography and etching processes and depositing conductive materials to fill the electrode hole using thin film deposition processes. In some implementations, common plate 2232 is formed on capacitors 2230 by patterning and etching an electrode trench aligned with capacitors dielectrics 2230 using lithography and etching processes and depositing conductive materials to fill the electrode trench using thin film deposition processes.

At operation 2610 in FIG. 26, the substrate is thinned to expose a second end of the semiconductor body opposite to the first end. As illustrated in FIG. 22, a carrier substrate 2234 (a.k.a. a handle substrate) is bonded onto the front side of SOI substrate 2201 on which devices are formed using any suitable bonding processes, such as anodic bonding, fusion bonding, transfer bonding, adhesive bonding, and eutectic bonding. The bonded structure can then be flipped upside down, such that handle layer 2202 of SOI substrate 2201 become above carrier substrate 2234.

As illustrated in FIG. 22J, SOI substrate 2201 is thinned to expose the undoped upper ends of semiconductor bodies 2206 (used to be the lower ends before flipping over). In some implementations, planarization processes (e.g., CMP) and/or etching processes are performed to remove handle layer 2202 and buried oxide layer 2203 (shown in FIG. 22G) of SOI substrate 2201 until being stopped by the upper ends of semiconductor bodies 2206.

At operation 2612 in FIG. 26, the exposed second end of the semiconductor body is doped. As illustrated in FIG. 22J, the exposed upper end of each semiconductor body 2206, e.g., one of the two ends of semiconductor body 2206 in the vertical direction (the z-direction) that is away from carrier substrate 2234, is doped to form another source/drain 2236 (e.g., a drain terminal of the vertical transistor). In some implementations, an implantation process and/or thermal diffusion process are performed to dope P-type dopants or N-type dopants to exposed upper ends of semiconductor bodies 2206 to form sources/drains 2236. In some implementations, a silicide layer is formed on source/drain 2236 by performing a silicidation process at the exposed upper ends of semiconductor bodies 2206. As a result, vertical transistors having semiconductor body 2206, sources/drains 2224 and 2236, gate dielectric 2214, and the gate electrode (part of conductive layer 2216) are formed thereby, as shown in FIG. 22J, according to some implementations. As described above, capacitors 2230 are thereby formed as well, and DRAM cells 2280 each having a double-gate vertical transistor and a capacitor coupled to the double-gate vertical transistor are thereby formed, as shown in FIG. 22J, according to some implementations.

Referring back to FIG. 23, method 2300 proceeds to operation 2308, as illustrated in FIG. 23, in which an interconnect layer including bit lines is formed above the array of memory cells. As illustrated in FIG. 22K, an interconnect layer 2240 can be formed above DRAM cells 2280. Interconnect layer 2240 can include interconnects of MEOL and/or BEOL in a plurality of ILD layers to make electrical connections with DRAM cells 2280. In some implementations, interconnect layer 2240 includes multiple ILD layers and interconnects therein formed in multiple processes. For example, the interconnects in interconnect layers 2240 can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. The ILD layers can include dielectric materials deposited using one or more thin film deposition processes including, but not limited to, CVD, PVD, ALD, or any combination thereof. The ILD layers and interconnects illustrated in FIG. 22K can be collectively referred to as interconnect layer 2240.

As shown in FIG. 26, at operation 2614, to form the interconnect layer, a bit line is formed on the doped second end. As illustrated in FIG. 22K, bit line 2238 can be formed on sources/drains 2236 by patterning and etching a trench aligned with respective source/drain 2236 using lithography and etching processes and depositing conductive materials to fill the trench using thin film deposition processes. In some implementations, forming bit line 2238 includes depositing a metal layer onto the exposed end of semiconductor body 2220. As a result, bit line 2238 and capacitor 2230 can be formed on opposite sides of semiconductor body 2206 and coupled to opposite ends of semiconductor body 2206. It is understood that additional local interconnects, such as word line contacts, capacitor contacts (e.g., a conductor), and bit line contacts (e.g., a metal silicide contact) may be similarly formed as well. In some implementations, the bit line contact (e.g., a metal silicide contact) is formed on the exposed end of semiconductor body 2220, and bit line 2238 is formed on the bit line contact.

Method 2300 proceeds to operation 2310, as illustrated in FIG. 23, in which a second bonding layer is formed above the array of memory cells and the interconnect layer. The second bonding layer can include a second bonding contact. As illustrated in FIG. 22K, a bonding layer 2242 is formed above interconnect layer 2240 and DRAM cells 2280. Bonding layer 2242 can include a plurality of bonding contacts surrounded by dielectrics. In some implementations, a dielectric layer (e.g., ILD layer) is deposited on the top surface of interconnect layer 2240 by one or more thin film deposition processes including, but not limited to, CVD, PVD, ALD, or any combination thereof. The bonding contacts can then be formed through the dielectric layer and in contact with the interconnects in interconnect layer 2240 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing a barrier layer, an adhesion layer, and/or a seed layer before depositing the conductor.

Method 2300 proceeds to operation 2312, as illustrated in FIG. 23, in which the first semiconductor structure and the second semiconductor structure are bonded in a face-to-face manner, such that the first array of memory cells is coupled to the peripheral circuit across a bonding interface. The bonding can include hybrid bonding. In some implementations, the first bonding contact is in contact with the second bonding contact at the bonding interface after the bonding. In some implementations, the second semiconductor structure is above the first semiconductor structure after the bonding. In some implementations, the first semiconductor structure is above the second semiconductor structure after the bonding.

As illustrated in FIG. 22L, carrier substrate 2234 and components formed thereon (e.g., DRAM cells 2280) are flipped upside down. As illustrated in FIG. 22L, bonding layer 2242 facing down is bonded with bonding layer 2252 facing up, e.g., in a face-to-face manner, thereby forming a bonding interface 2254. In some implementations, a treatment process, e.g., a plasma treatment, a wet treatment, and/or a thermal treatment, is applied to the bonding surfaces prior to the bonding. Although not shown in FIG. 22L, silicon substrate 2244 and components formed thereon (e.g., peripheral circuits 2246) can be flipped upside down, and bonding layer 2252 facing down can be bonded with bonding layer 2242 facing up, e.g., in a face-to-face manner, thereby forming bonding interface 2254. After the bonding, the bonding contacts in bonding layer 2242 and the bonding contacts in bonding layer 2252 are aligned and in contact with one another, such that DRAM cells 2280 can be electrically connected to peripheral circuits 2246 across bonding interface 2254. It is understood that in the bonded chip, DRAM cells 2280 may be either above or below peripheral circuits 2246. Nevertheless, bonding interface 2254 can be formed vertically between peripheral circuits 2246 and DRAM cells 2280 after the bonding.

Figure 22M:
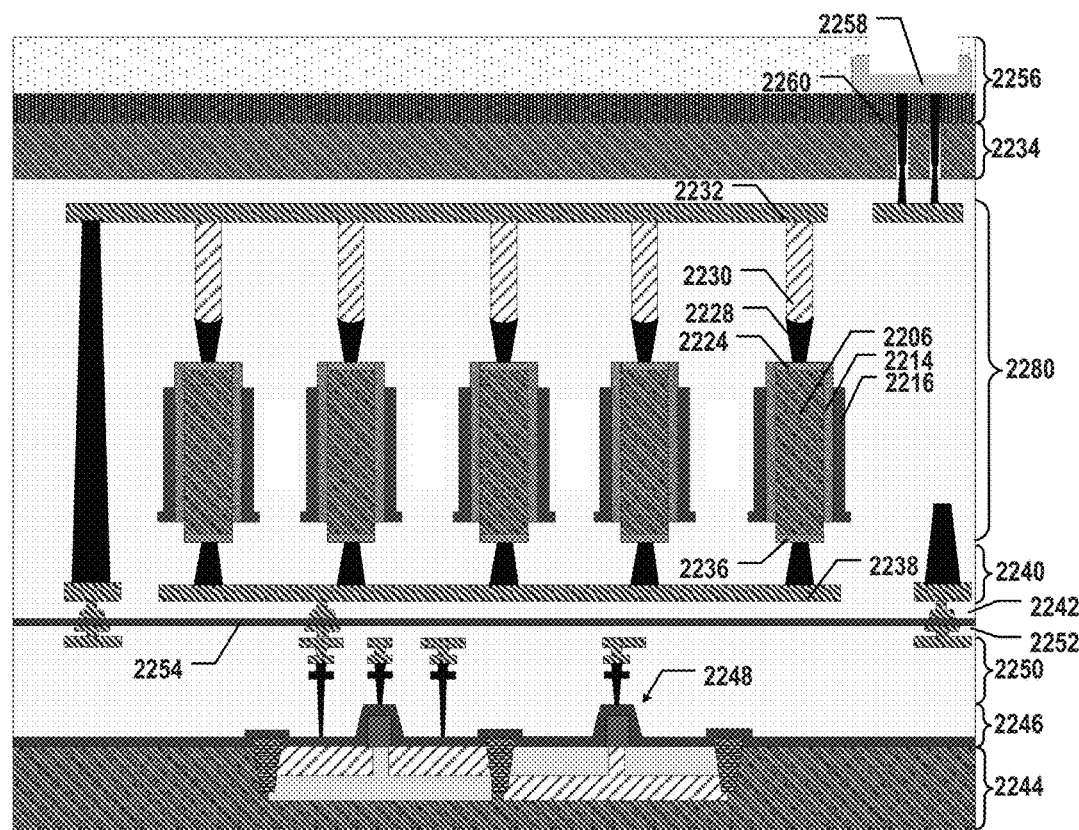

Method 2300 proceeds to operation 2314, as illustrated in FIG. 23, in which a pad-out interconnect layer is formed on the backside of the first semiconductor structure or the second semiconductor structure. As illustrated in FIG. 22M, a pad-out interconnect layer 2256 is formed above on the backside of carrier substrate 2234. Pad-out interconnect layer 2256 can include interconnects, such as pad contacts 2258, formed in one or more ILD layers. Pad contacts 2258 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. In some implementations, after the bonding, contacts 2260 are formed extending vertically through carrier substrate 2234, for example, by wet/dry etching processes, followed by depositing conductive materials. Contacts 2260 can be in contact with the interconnects in pad-out interconnect layer 2256. It is understood that in some examples, carrier substrate 2234 may be thinned or removed after bonding and prior to forming pad-out interconnect layer 2256 and contacts 2260, for example, using planarization processes and/or etching processes.

Although not shown, it is understood that in some examples, pad-out interconnect layer 2256 may be formed above on the backside of silicon substrate 2244, and contacts 2260 may be formed extending vertically through silicon substrate 2244. Silicon substrate 2244 may be thinned prior to forming pad-out interconnect layer 2256 and contacts 2260, for example, using planarization processes and/or etching processes. Although not shown, it is further understood that in some examples, the fabrication processes described with respect to FIGS. 14A-14E and 15A-15D may be applied to form another array of DRAM cells 2280 in another semiconductor structure bonded to the semiconductor structure including DRAM cells 2280 described above with respect to FIGS. 22A-22M.

According to one aspect of the present disclosure, a 3D memory device includes a first semiconductor structure, a second semiconductor structure, and a first bonding interface between the first semiconductor structure and the second semiconductor structure. The first semiconductor structure includes a peripheral circuit. The second semiconductor structure includes an array of memory cells and a plurality of bit lines coupled to the memory cells and each extending in a second direction perpendicular to the first direction. Each of the memory cells includes a vertical transistor extending in a first direction, and a storage unit coupled to the vertical transistor. A respective one of the bit lines and a respective storage unit are coupled to opposite ends of each one of the memory cells in the first direction. The array of memory cells is coupled to the peripheral circuit across the first bonding interface.

In some implementations, the first semiconductor structure further includes a first bonding layer including a first bonding contact, the second semiconductor structure further includes a second bonding layer including a second bonding contact, and the first bonding contact is in contact with the second bonding contact at the first bonding interface.

In some implementations, the second semiconductor structure further includes a pad-out interconnect layer, and the storage units are disposed between the vertical transistors and the pad-out interconnect layer.

In some implementations, the first semiconductor structure further includes a pad-out interconnect layer, and the peripheral circuit is disposed between the first bonding interface and the pad-out interconnect layer.

In some implementations, the 3D memory device further includes a third semiconductor structure including a second array of memory cells, and a second bonding interface between the second semiconductor structure and the third semiconductor structure in the first direction. In some implementations, each of the memory cells includes a vertical transistor extending in the first direction, and a storage unit coupled to the vertical transistor. In some implementations, the second array of memory cells is coupled to the peripheral circuit across the first and second bonding interfaces.

In some implementations, the storage units in the first array of memory cells are disposed between the second bonding interface and the vertical transistors in the first array of memory cells, and the storage units in the second array of memory cells are disposed between the second bonding interface and the vertical transistors in the second array of memory cells.

In some implementations, the third semiconductor structure further includes a pad-out interconnect layer, and the vertical transistors in the second array of memory cells are disposed between the storage units in the second array of memory cells and the pad-out interconnect layer.

In some implementations, the bit lines are disposed between the vertical transistors and the first bonding interface.

In some implementations, the vertical transistors are disposed between the storage units and the first bonding interface.

In some implementations, the second semiconductor structure further includes an interconnect layer including the bit lines between the second bonding layer and the first array of memory cells.

In some implementations, the bit lines are coupled to the peripheral circuit through the interconnect layer, the first bonding layer, and the second bonding layer.

In some implementations, the second semiconductor structure further includes a plurality of word lines each extending in a third direction perpendicular to the first direction and the second direction. In some implementations, the vertical transistor includes a semiconductor body extending in the first direction and a gate structure in contact with one or more sides of the semiconductor body.

In some implementations, the gate structure includes a gate electrode, and a gate dielectric between the gate electrode and the semiconductor body in the second direction, and the gate dielectrics of two adjacent vertical transistors of the vertical transistors in the third direction are continuous.

In some implementations, two adjacent vertical transistors of the vertical transistors in the second direction are mirror-symmetric to one another.

In some implementations, the second semiconductor structure further includes a trench isolation extending in the third direction and disposed between the two adjacent vertical transistors in the second direction.

In some implementations, the gate structure is in contact with one side of the semiconductor body in the second direction.

In some implementations, the gate structure is in contact with two opposite sides of the semiconductor body in the second direction.

In some implementations, the gate structure includes a gate electrode, and a gate dielectric between the gate electrode and the semiconductor body in the second and third directions, and the gate dielectrics of two adjacent vertical transistors of the vertical transistors in the third direction are separate.

In some implementations, the vertical transistor is a GAA transistor in which the gate structure fully circumscribes the semiconductor body in a plan view.

In some implementations, the gate structure partially circumscribes the semiconductor body in a plan view.

In some implementations, the second semiconductor structure further includes a plurality of air gaps each disposed between adjacent word lines of the word lines in the second direction.

In some implementations, the vertical transistor further includes a source and a drain disposed at two ends of the semiconductor body, respectively, in the first direction.

In some implementations, one of the source and the drain of the vertical transistor is coupled to the storage unit in a respective memory cell.

In some implementations, another one of the source and the drain of the vertical transistor is coupled to the respective bit line.

In some implementations, two ends of the semiconductor body in the first direction extend beyond the gate structure, respectively.

In some implementations, the second semiconductor structure further includes a first dielectric layer, a second dielectric layer, and a third dielectric layer having a material different from the first and second dielectric layers. In some implementations, the storage unit is formed in the third dielectric layer. In some implementations, the word lines are sandwiched between the first and second dielectric layers in the first direction.

In some implementations, one end of the semiconductor body in the first direction is flush with the gate structure.

In some implementations, the memory cells comprise at least a DRAM cell, a PCM cell, or a FRAM cell.

According to another aspect of the present disclosure, a memory system includes a first semiconductor structure, a second semiconductor structure, and a first bonding interface between the first semiconductor structure and the second semiconductor structure. The first semiconductor structure includes a peripheral circuit. The second semiconductor structure includes an array of memory cells and a plurality of bit lines coupled to the memory cells and each extending in a second direction perpendicular to the first direction. Each of the memory cells includes a vertical transistor extending in a first direction, and a storage unit coupled to the vertical transistor. A respective one of the bit lines and a respective storage unit are coupled to opposite ends of each one of the memory cells in the first direction. The array of memory cells is coupled to the peripheral circuit across the first bonding interface. The memory controller is configured to control the array of memory cells through the peripheral circuit and the bit lines.

In some implementations, the memory system further includes a host coupled to the memory controller and configured to send or receive the data to or from the memory device.

In some implementations, the memory cells comprise at least a DRAM cell, a PCM cell, or a FRAM cell.

According to still another aspect of the present disclosure, a method for forming a 3D memory device is disclosed. A first semiconductor structure including a peripheral circuit is formed. A second semiconductor structure is formed. To form the second semiconductor structure, an array of memory cells is formed, and a plurality of bit lines coupled to the memory cells are formed. Each of the memory cells includes a vertical transistor extending in a first direction, and a storage unit coupled to the vertical transistor. A respective one of the bit lines and a respective storage unit are coupled to opposite ends of each one of the memory cells vertically. The first semiconductor structure and the second semiconductor structure are bonded in a face-to-face manner, such that the array of memory cells is coupled to the peripheral circuit across a bonding interface.

In some implementations, to form the first semiconductor structure, a first bonding layer including a first bonding contact is formed. In some implementations, to form the second semiconductor structure, a second bonding layer including a second bonding contact is formed. In some implementations, the first bonding contact is in contact with the second bonding contact at the bonding interface after the bonding.

In some implementations, to form the second semiconductor structure, an interconnect layer including the bit lines is formed above the first array of memory cells prior to forming the second bonding layer.

In some implementations, to form the first array of memory cells, a semiconductor body extending vertically is formed, a gate structure in contact with one or more sides of the semiconductor body is formed, and the storage unit in contact with one end of the semiconductor body vertically is formed.

In some implementations, a pad-out interconnect layer is formed on a backside of the first semiconductor structure or the second semiconductor structure after the bonding.

In some implementations, the bonding includes hybrid bonding.

In some implementations, a third semiconductor structure including a second array of memory cells is formed, and the second semiconductor structure and the third semiconductor structure are bonded in a face-to-face manner. In some implementations, each of the memory cells includes a vertical transistor, and a storage unit coupled to the vertical transistor.

In some implementations, the second and third semiconductor structures are bonded prior to bonding the first and second semiconductor structures.

In some implementations, the second and third semiconductor structures are bonded after bonding the first and second semiconductor structures.

In some implementations, a pad-out interconnect layer is formed on a backside of the third semiconductor structure after bonding the second and third semiconductor structures.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A three-dimensional (3D) memory device, comprising:
a first semiconductor structure comprising a peripheral circuit;
a second semiconductor structure comprising:
a first array of memory cells, wherein each of the memory cells comprises a vertical transistor extending in a first direction, and a storage unit coupled to the vertical transistor; and
a plurality of bit lines coupled to the memory cells and each extending in a second direction perpendicular to the first direction, wherein a respective one of the bit lines and a respective storage unit are coupled to opposite ends of each one of the memory cells in the first direction; and
a first bonding interface between the first semiconductor structure and the second semiconductor structure in the first direction, wherein the first array of memory cells is coupled to the peripheral circuit across the first bonding interface.

2. The 3D memory device of claim 1, wherein
the first semiconductor structure further comprises a first bonding layer comprising a first bonding contact, and the second semiconductor structure further comprises a second bonding layer comprising a second bonding contact; and
the first bonding contact is in contact with the second bonding contact at the first bonding interface.

3. The 3D memory device of claim 2, wherein the second semiconductor structure further comprises an interconnect layer comprising the bit lines between the second bonding layer and the first array of memory cells.

4. The 3D memory device of claim 3, wherein the bit lines are coupled to the peripheral circuit through the interconnect layer, the first bonding layer, and the second bonding layer.

5. The 3D memory device of claim 1, wherein
the second semiconductor structure further comprises a pad-out interconnect layer; and
the storage units are disposed between the vertical transistors and the pad-out interconnect layer.

6. The 3D memory device of claim 1, wherein
the first semiconductor structure further comprises a pad-out interconnect layer; and
the peripheral circuit is disposed between the first bonding interface and the pad-out interconnect layer.

7. The 3D memory device of claim 1, further comprising:
a third semiconductor structure comprising a second array of memory cells, wherein each of the memory cells comprises a vertical transistor extending in the first direction, and a storage unit coupled to the vertical transistor; and
a second bonding interface between the second semiconductor structure and the third semiconductor structure in the first direction, wherein the second array of memory cells is coupled to the peripheral circuit across the first and second bonding interfaces.

8. The 3D memory device of claim 7, wherein
the storage units in the first array of memory cells are disposed between the second bonding interface and the vertical transistors in the first array of memory cells; and
the storage units in the second array of memory cells are disposed between the second bonding interface and the vertical transistors in the second array of memory cells.

9. The 3D memory device of claim 7, wherein
the third semiconductor structure further comprises a pad-out interconnect layer; and
the vertical transistors in the second array of memory cells are disposed between the storage units in the second array of memory cells and the pad-out interconnect layer.

10. The 3D memory device of claim 1, wherein the bit lines are disposed between the vertical transistors and the first bonding interface.

11. The 3D memory device of claim 1, wherein the vertical transistors are disposed between the storage units and the first bonding interface.

12. The 3D memory device of claim 1, wherein
the second semiconductor structure further comprises a plurality of word lines each extending in a third direction perpendicular to the first direction and the second direction; and
the vertical transistor comprises:
a semiconductor body extending in the first direction; and
a gate structure in contact with one or more sides of the semiconductor body.

13. The 3D memory device of claim 12, wherein the vertical transistor further comprises a source and a drain disposed at two ends of the semiconductor body, respectively, in the first direction.

14. The 3D memory device of claim 13, wherein
one of the source and the drain of the vertical transistor is coupled to the storage unit in a respective memory cell; and
another one of the source and the drain of the vertical transistor is coupled to the respective bit line.

15. The 3D memory device of claim 12, wherein two ends of the semiconductor body in the first direction extend beyond the gate structure, respectively.

16. The 3D memory device of claim 12, wherein one end of the semiconductor body in the first direction is flush with the gate structure.

17. The 3D memory device of claim 12, wherein:
the gate structure comprises a gate electrode, and a gate dielectric between the gate electrode and the semiconductor body in the second direction; and
the gate dielectrics of two adjacent vertical transistors of the vertical transistors in the third direction are continuous.

18. The 3D memory device of claim 12, wherein:
the gate structure comprises a gate electrode, and a gate dielectric between the gate electrode and the semiconductor body in the second direction; and
the gate dielectrics of two adjacent vertical transistors of the vertical transistors in the third direction are separate.

19. The 3D memory device of claim 1, wherein the memory cells comprise at least a dynamic random-access memory (DRAM) cell, a phase-change memory (PCM) cell, or a ferroelectric RAM (FRAM) cell.

20. A memory system, comprising:
a memory device configured to store data, and comprising:
  a first semiconductor structure comprising a peripheral circuit;
  a second semiconductor structure comprising:
    an array of memory cells, wherein each of the memory cells comprises a vertical transistor extending in a first direction, and a storage unit coupled to the vertical transistor; and
    a plurality of bit lines coupled to the memory cells and each extending in a second direction perpendicular to the first direction, wherein a respective one of the bit lines and a respective storage unit are coupled to opposite ends of each one of the memory cells in the first direction; and
  a first bonding interface between the first semiconductor structure and the second semiconductor structure in the first direction, wherein the array of memory cells is coupled to the peripheral circuit across the first bonding interface; and
a memory controller coupled to the memory device and configured to control the array of memory cells through the peripheral circuit and the bit lines.

* * * * *